US007045833B2

(12) United States Patent
Campbell et al.

(10) Patent No.: US 7,045,833 B2
(45) Date of Patent: May 16, 2006

(54) AVALANCHE PHOTODIODES WITH AN IMPACT-IONIZATION-ENGINEERED MULTIPLICATION REGION

(75) Inventors: Joe C. Campbell, Austin, TX (US); Ping Yuan, Piscataway, NJ (US)

(73) Assignee: Board of Regents, The University of Texas System, Austin, TX (US)

( * ) Notice: Subject to any disclaimer, the term of this patent is extended or adjusted under 35 U.S.C. 154(b) by 457 days.

(21) Appl. No.: 09/969,133

(22) Filed: Oct. 1, 2001

(65) Prior Publication Data

US 2003/0047752 A1 Mar. 13, 2003

Related U.S. Application Data

(60) Provisional application No. 60/236,952, filed on Sep. 29, 2000.

(51) Int. Cl.
*H01L 21/00* (2006.01)
(52) U.S. Cl. .............. 257/186; 257/187; 257/188; 257/185; 257/430; 257/431; 257/432; 257/429; 438/48; 438/50; 438/63; 438/65
(58) Field of Classification Search ............ 257/186, 257/187, 185, 184, 438, 53–55, 191, 18, 257/22, 21; 438/48, 50, 63, 65; 2/430, 431, 2/432, 429
See application file for complete search history.

(56) References Cited

U.S. PATENT DOCUMENTS

| 4,731,641 | A |   | 3/1988  | Matsushima et al. |          |
|-----------|---|---|---------|-------------------|----------|
| 4,839,706 | A | * | 6/1989  | Brennan           | 257/21   |
| 4,982,255 | A |   | 1/1991  | Tomita            |          |
| 5,187,553 | A | * | 2/1993  | Makita            | 257/187  |
| 5,204,539 | A | * | 4/1993  | Tsuji et al.      | 257/21   |
| 5,338,947 | A | * | 8/1994  | Watanabe          | 257/186  |
| 5,349,599 | A | * | 9/1994  | Larkins           | 372/50   |
| 5,369,292 | A |   | 11/1994 | Yoo et al.        |          |
| 5,432,361 | A | * | 7/1995  | Taguchi           | 257/186  |
| 5,457,327 | A | * | 10/1995 | Taguchi           | 257/21   |
| 5,539,221 | A |   | 7/1996  | Tsuji et al.      |          |
| 5,543,629 | A | * | 8/1996  | Nakamura et al.   | 257/21   |
| 5,744,849 | A | * | 4/1998  | Sugawa            | 257/438  |
| 5,847,418 | A |   | 12/1998 | Nakamura et al.   |          |
| 6,326,650 | B1| * | 12/2001 | Allam             | 257/186  |

OTHER PUBLICATIONS

International Search Report, PCT/US01/30775, mailed Jul 18, 2002.
R.J. McIntyre, "A New Look at Impact Ionization-Part I: A Theory of Gain, Noise, Breakdown Probability, and Frequency Response," *IEEE Trans. on Electron Dev.*, vol. 46, No. 8, pp. 1623-1631, 1999.

(Continued)

*Primary Examiner*—Nathan J. Flynn
*Assistant Examiner*—Fazli Erdem
(74) *Attorney, Agent, or Firm*—Meyertons, Hood, Kivlin, Kowert & Goetzel, P.C.; Eric B. Meyertons

(57) ABSTRACT

An avalanche photodiode including a multiplication layer is provided. The multiplication layer may include a well region and a barrier region. The well region may include a material having a higher carrier ionization probability than a material used to form the barrier region.

81 Claims, 82 Drawing Sheets

OTHER PUBLICATIONS

Yuan et al., "A New Look at Impact Ionization-Part II: Gain and Noise in Short Avalanche Photodiodes," *IEEE Trans. on Electron Dev.*, vol. 46, No. 8, pp. 1632-1639, 1999.

Yuan et al., "Impact Ionization Characteristics of III-V Semiconductors for a Wide Range of Multiplication Region Thicknesses," *IEEE Journal of Quantum Electronics*, vol. 36, No. 2, pp. 198-204, 2000.

Wang et al., "Avalanche photodiodes with an Impact-Ionization-Engineered multiplication region," 2000 IEEE Annual Meeting Conference Proceedings, 13$^{th}$ Annual Meeting, Rio Grande, Puerto Rico, 13-1 pp. 9-10 vol. 1, XP002204728, 2000.

Campbell et al., "High-Speed, Low-Noise Avalanche Photodiodes," Optical Fiber Communication Conference. Technical Digest Postconference Edition. Trends in Optics and PH, pp. 114-116 vol. 4, XP002204729, 2000.

Arndt et al., "Comparison measurements for selection of suitable photodetectors for use in Nd:YAG LDA systems," *Exp. In Fluids*, vol. 20, pp. 460-465, 1996.

Hayden et al., "Overview of laser communication technology at NASA Goddard space flight center," in *Proc. SPIE*, vol. 1866, pp. 45-55, 1993.

J.B. Johnson, "Thermal Agitation of Electricity in Conductors", *Phys. Rev.*, vol. 32, pp. 97-109, 1928.

H. Nyquist, "Thermal Agitation of Electric Charge in Conductors", *Phys. Rev.*, vol. 32, pp. 110-113, 1928.

Bowers et al., "High-speed Photodetectors," *Handbook of Optics*, vol. 1, McGraw-Hill, New York, 1995.

Wey et al., "108 GHz GaInAs/InP p-I-n Photodiodes with Integrated Bias Tees and Matched Resistors," *IEEE Photon. Tech. Lett.*, vol. 5, No. 11, pp. 1310-1312, 1993.

Chou et al., "Nanoscale tera-hertz metal-semiconductor-metal photodetectors," *IEEE J. Quantum Electron.*, vol. 28, No. 10, pp. 2358-2368, 1992.

Emeis et al., "High-Speed GaInAs Schottky Photodetector," *Electron. Lett.*, vol. 21, No. 5, pp. 181-180, 1985.

S. Forrest, "Sensitivity of Avalanche Photodetector Receivers for High-Bit-Rate Long-Wavelength Optical Communication Systems," *Semiconductors and Semimetals, vol. 22, Lightwave Communications Technology*, Orlando, FL, Academic, pp. 329-387, 1985.

R.J. McIntyre, "Multiplication noise in uniform avalanche diodes," *IEEE Trans. on Electron Dev.*, vol. 13, No. 1, pp. 164-168, 1966.

Chin et al., " Multilayer Reflectors by Molecular Beam Epitaxy for Resonance Enhanced Absorption in Thin High-Speed Detectors," *J. Vac. Sci. and Tech.*, vol. 8, No. 2, pp. 339-342, 1990.

Kishino et al., "Resonant Cavity Enhanced (RCE) Photodetectors," *IEEE J. Quantum Electron.*, vol. 27, No. 8, pp. 2025-2034, 1991.

Corzine et al., "Design of Fabry-Perot surface-emitting lasers with a periodic gain structure," *IEEE J. Quantum Electron.*, vol. 25, No. 6, pp. 1513-1524, 1989.

Dentai et al., "High-quantum efficiency, long-wavelength, InP/InGaAs microcavity photodiode," *Electron. Lett.*, vol. 27, No. 23, pp. 2125-2127, 1991.

Barron et al., "Resonant-Cavity enhanced p-i-n photodetector with 17 GHz bandwidth-efficiency product," *Electron. Lett.*, vol. 30, pp. 1796-1797, 1994.

Forrest et al., "Evidence for tunneling in reverse-biased III-V photodetector diodes," *Appl. Phys. Lett.*, vol. 36, pp. 580-582, 1980.

Forrest et al., "$In_{0.53}Ga_{0.47}As$ photodiodes with dark current limited by generation-recombination and tunneling," *Appl. Phys. Lett.*, vol. 37, pp. 322-324, 1980.

Nishida et al., "InGaAsP Heterostructure Avalanche Photodiodes with High Avalanche Gain," *Appl. Phys. Lett.*, vol. 35, No. 3, pp. 251-252, 1979.

Tarof et al., "Planar InP/InGaAs Avalanche Photodetectors with Partial Charge Sheet in Device Periphery," *Appl. Phys. Lett.*, vol. 57, No. 7, pp. 670-672, 1990.

Tarof et al., "High-Frequency Performance of Separate Absorption Grading, Charge, and Multiplication InP/InGaAs Avalanche Photodiodes," *IEEE Photon. Tech. Lett.*, vol. 5, No. 6, pp. 672-674, 1993.

N.R. Howard, "Avalanche Multiplication in Silicon Junctions",*J. Electron. Contr.*, vol. 13, pp. 537-544, 1962.

Lee et al., "Ionization Rates of Holes and Electrons in Silicon", *Phys. Rev.*, vol. 134, pp. A761-773, 1964.

R.J. McIntyre, "The distribution of gains in uniformly multiplying avalanche photodiodes: Theory," *IEEE Trans. on Electron Dev.*, vol. ED-19, pp. 703-713, 1972.

R.B. Emmons, "Avalanche-Photodiode Frequency Response," *J. Appl. Phys.*, vol. 38, No. 9, pp. 3705-3714, 1967.

Emmons et al., "The Frequency Response of Avalanching Photodiodes," *IEEE Trans. on Electron Dev.*, vol. 13, No. 3, pp. 297-305, 1966.

W.T. Read, Jr., "A Proposed High-Frequency, Negative-Resistance Diode", Bell System Tech. J., vol. 37, pp. 401-446, 1958.

Stillman et al., "Avalanche Photodiodes," *Semiconductors and Semimetals, vol. 12, Infrared Detectors*, New York, Academic, pp. 291-393, 1977.

Bulman et al., "Experimental determination of impact ionization coefficients in (100) GaAs," *IEEE Electron Dev. Lett.*, vol. 4, No. 6, pp. 181-185, 1983.

Bulman et al., "The Determination of Impact Ionization Coefficients in (100) Gallium Arsenide Using Avalanche Noise and Photocurrent Multiplication Measurements," *IEEE Trans. Electron Dev.*, vol. 32, No. 11, pp. 2454-2466, 1985.

Bulman et al., "Determination of impact ionization coefficients in InP by analysis of photomultiplication and noise measurements," *International Electron Devices Meeting 1981*, pp. 288-291, 1981.

Robbins et al., "Impact ionization in $Al_xGa_{1-x}As$ for x=0.1-0.4," *Appl. Phys. Lett.*, vol. 52, No. 4, pp. 2996-2998, 1988.

Watanabe et al., "Impact ionization rates in (100) $Al_{0.48}In_{0.52}As$," *IEEE Electron Dev. Lett.*, vol. 11, No. 10, pp. 437-438, 1990.

Armiento et al., "Impact ionization in (100)-, (110)-, (111)-oriented InP avalanche photodiodes," *Appl. Phys. Lett.*, vol. 43, No. 2, pp. 198-200, 1983.

Cook et al., " Electron and hole impact ionization coefficients in InP determined by photomultiplication measurements," *Appl. Phys. Lett.*, vol. 40, No. 7, pp. 589-591, 1982.

Osaka et al., "Impact ionization coefficients of electrons and holes in (100)-oriented $Ga_{1-x}In_xAs_yP_{1-y}$," *IEEE J. Quantum Electron.*, vol. 21, No. 9, pp. 1326-1338, 1985.

Taguchi et al., "Temperature dependence of impact ionization coefficients in InP," *J. Appl. Phys.*, vol. 59, No. 2, pp. 476-481, 1986.

Wu et al., "Design of Silicon Hetero-Interface Photodetectors," *IEEE J. Lightwave Technol.*, vol. 15, No. 8, pp. 1608-1615, 1997.

Jhee et al., "The effect of nonuniform gain on the multiplication noise of InP/InGaAsP/InGaAs avalanche photodiodes," *IEEE J. Quantum Electron.*, vol. 21, No. 12, pp. 1858-1861, Dec. 1985.

Campbell et al., "Multiplication noise of wide-bandwidth InP/InGaAsP/InGaAs avalanche photodiodes." *J. Lightwave Technol.*, vol. 7, No. 3, pp. 473-477, 1989.

Hu et al., "Noise characteristics of thin multiplication region GaAs avalanche photodiodes," *Appl. Phys. Lett.*, vol. 69, No. 24, pp. 3734-3736, 1996.

Anselm et al., "Performance of Thin Separate Absorption, Charge, and Multiplication Avalanche Photodiodes," *IEEE J. Quantum Electron.*, vol. 34, No. 3, pp. 482-490, 1998.

Li et al., "Avalanche multiplication noise characteristics in thin GaAs $p^+$-i-$n^+$diodes," *IEEE Trans. Electron Dev.*, vol. 45, No. 10, pp. 2102-2107, 1998.

Campbell et al., "High-Speed InP/InGaAsP/InGaAs Avalanche Photodiodes Grown by Chemical Beam Epitaxy," *IEEE J. Quantum Electron.*, vol. 24, No. 3, pp. 496-500, 1988.

Campbell et al., "Frequency Response of InP/InGaAsP/InGaAs Avalanche Photodiodes," *IEEE J. Lightwave Technol.*, vol. 7, No. 5, pp. 778-784, 1989.

Ekholm et al., "High Bandwidth Planar InP/InGaAs Avalanche Photodiodes," *IEEE Trans. on Electron Dev.*, vol. 35, No. 12, pp. 2434, 1988.

Kagawa et al., "A Wide-Bandwidth Low-Noise InGaAsP-InAlAs Superlattice Avalanche Photodiode with a Flip-Chip Structure for Wavelengths of 1.3 and 1.55 μm," *IEEE J. Quantum Electron.*, vol. 29, No. 5, pp. 1387-1392, 1988.

Watanabe et al., "Gain-Bandwidth Product Analysis of InAlGaAs-InAlAs Superlattice Avalanche Photodiodes," *IEEE Photon. Tech. Lett.*, vol. 8, No. 2, pp. 269-271, 1996.

Watanabe et al., "High-Speed and Low-Dark-Current Flip-Chip InalAs/InAlGaAs Quaternary Well Superlattice APD's with 120 GHz Gain-Bandwidth product," *IEEE Photon. Tech. Lett.*, vol. 5, No. 6, pp. 675-677, 1993.

Watanabe et al., "Design and Performance of InAlGaAs/InAlAs Superlattice Avalanche Photodiodes," *IEEE J. Lightwave Technol.*, vol. 15, No. 6, pp. 1012-1019, 1997.

Nie et al., "High-Speed Resonant-Cavity Separate Absorption and Multiplication Avalanche Photodiodes with 130 GHz Gain-Bandwidth Product," *Appl. Phys. Lett.*, vol. 70, No. 2, pp. 161-163, 1997.

Anselm et al., "A Resonant-Cavity, Separate-Absorption-and-Multiplication, Avalanche Photodiode with Low Excess Noise Factor," *IEEE Electron Dev. Lett.*, vol. 17, No. 3, pp. 91-93, 1996.

Li et al., "Low Excess Noise Characteristics in Thin Avalanche Region GaAs Diodes," *Electron. Lett.*, vol. 34, No. 1, pp. 125, 1997.

van Vliet et al., "Theory of carrier multiplication and noise in avalanche devices—Part II: Two-carrier processes," *IEEE Trans. Electron Dev.*, vol. ED-26, pp. 752-764, 1979.

J. S. Marsland, "On the effect of ionization dead spaces on avalanche multiplication and noise for uniform electric field," *J. Appl. Phys.*, vol. 67, pp. 1929-1933, 1990.

Marsland et al., "Lucky drift estimation of excess noise factor for conventional avalanche photodiodes including the dead space effect," *IEEE Trans. Electron Dev.*, vol. 39, pp. 1129-1134, 1992.

Okuto et al., "Ionization coefficients in semiconductors: A nonlocal property," *Phys. Rev. B*, vol. 10, pp. 4284-4296, 1974.

Shichijo et al., "Band-structure-dependent transport and impact ionization in GaAs," *Phys. Rev. B*, vol. 23, pp. 4197-4207, 1981.

K. F. Brennan, "Calculated electron and hole spatial ionization profiles in bulk GaAs and superlattice avalanche photodiodes," *IEEE Quantum Electron.*, vol. 24, pp. 2001-2006, 1988.

Sano et al., "Impact-ionization theory consistent with a realistic band structure of silicon," *Phys. Rev. B*, vol. 45, pp. 4171-4180, 1992.

Bude et al., "Thresholds of impact ionization in semiconductors," *J. Appl. Phys.*, vol. 72, pp. 3554-3561, 1992.

Chandramouli et al., "Monte Carlo analysis of bandstructure influence on impact ionization in semiconductors," *Solid State Electron.*, vol. 36, pp. 285-290, 1993.

Kamakura et al., "Impact ionization model for full band Monte Carlo simulation," *J. Appl. Phys.*, vol. 75, pp. 3500-3506, 1994.

Dunn et al., "Monte Carlo simulation of impact ionization and current multiplication in short $GaAsp^+in^+$diodes," *Semicond. Sci. Technol.*, vol. 12, pp. 111-120, 1997.

Ong et al., "A simple model to determine multiplication and noise in avalanche photodiodes," *J. Appl. Phys.*, vol. 83, pp. 3426-3428, 1998.

Spinelli et al., "Dead space approximation for impact ionization in silicon," *Appl. Phys. Lett.*, vol. 68, pp. 3707-3709, 1996.

Spinelli et al., "Mean gain of avalanche photodiodes in a dead space model," *IEEE Trans. Electron Dev.*, vol. 43, pp. 23-30, 1996.

Aspnes et al., "Optical properties of $Al_xGa_{1-x}As$," *J. of Appl. Phys.*, vol. 60, No. 2, pp. 754-767, Jul. 1986.

Garriga et al., "Optical properties of AlAs," *Solid State Comm.*, vol. 61, No. 3, pp. 157-160, 1987.

Aspnes et al., "Dielectric functions and optical parameters of Si, Ge, GaP, GaAs, GaSb, InP, InAs, and InSb from 1.5 to 6.0 eV," *Phys. Rev. B*, vol. 27, No. 2, pp. 985-1009, Jan. 1983.

R. Williams, "Ohmic Contacts," *Gallium Arsenide Processing Techniques*, Ch. 11, pp. 225-257, Artech, House, 1990.

G.A. Samara, "Temperature and pressure dependences of the dielectric constants of semiconductors," *Phys. Rev. B*, vol. 27, No. 6, pp. 3494-3505, 1983.

Fern et al., "Refractive index of AlAs," *J. Appl. Phys.*, vol. 42, No. 9, pp. 3499-3500, 1971.

K. Seeger, "Temperature dependence of the dielectric constants of semi-insulating III-V compounds," *Appl. Phys. Lett.*, vol. 54, No. 13, pp. 1268-1269, 1989.

Gonzalez et al., "Universality of the 1/3 Shot-Noise Suppression Factor in Nondegenerate Diffusive Conductors," *Phys. Rev. Lett.*, vol. 80, No. 13, pp. 2901-2904, 1998.

Reklaitis et al., "Monte Carlo Study of Shot Noise Suppression," *J. Appl. Phys.*, vol. 82, No. 6, pp. 3161-3163, 1997.

Starikov et al., "Transfer Impedance Calculations of Electronic Noise in Two-Terminal Semiconductor Structures," *J. Appl. Phys.*, vol. 83, No. 4, pp. 2052-2066, 1998.

Kagawa et al., "InGaAsP-InAlAs Superlattice Avalanche Photodiode," *IEEE Journal of Quantum Electronic*, vol. 28, No. 6, p. 1420, Jun. 1, 1992.

Hanatani et al., "Flip-Chip InAlAs/InGaAs Superlattice Avalanche Photodiodes with Back-Illuminated Structures," *Microwave and Optical Technology Letters*, vol. 7, No. 3, pp. 103-107, Feb. 20, 1994.

Yuan et al., "High-Speed and Low-Noise Avalanche Photodiode Operating at 1.06 μm," *IEEE Journal of Selected*

*Topics in Quantum Electronics*, vol. 6, No. 3, pp. 422-425, May/Jun. 2000.

Yuan et al., "High-Speed Quantum-Dot Resonant-Cavity SACM Avalanche Photodiodes Operating at 1.06 μm," IEEE/LEOS Summer Topical Meeting, San Diego, California, Jul. 1999.

Yuan et al., High-Speed Quantum-Dot Resonant-Cavity SACM Avalanche Photodiodes Operating at 1.06 μm, 57th Device Research Conference, Santa Barbara, California, Jun., 1999.

Nie et al., "High Speed and High Gain-Bandwidth-Product Resonant-Cavity InGaAs/InAlAs Avalanche Photodiodes for Optical Fiber Communications," OFC '99, San Diego, California, Feb., 1999.

Hayat et al., "Effect of dead space on gain and noise of double-carrier-multiplication avalanche photodiodes," *IEEE Trans. Electron Dev.*, vol. 39, pp. 546-552, 1992.

Hayat et al., "Effect of dead space on gain and noise in Si and GaAs avalanche photodiodes," *IEEE J. Quantum Electron*, vol. 28, pp. 1360-1365, 1992.

Lenox et al., "Resonant-Cavity InGaAs/InAlAs Avalanche Photodiodes with Gain-Bandwidth-Product of 290 GHz," *IEEE Photonics Technology Letters*, vol. 11, No. 9, pp. 1162-1164, Sep. 1999.

S.D. Personik, "Receiver Design for Digital Fiber-Optic Communication Systems, Part I and II," *Bell Syst. Tech. J.*, vol. 52, pp. 843-886, 1973.

Kasper et al., "Multigigabit-per-Second Avalanche Photodiode Lightwave Receivers," *J. Lightwave Tech.*, vol. 5, No. 10, pp. 1351-1364, 1987.

Campbell et al., "Quantum dot resonant cavity photodiode with operation near 1.3 mm wavelength," *Electron. Lett.*, vol. 33, pp. 1337-1339, 1997.

Nie et al., "Quantum-Dot Resonant-Cavity Separate Absorption, Charge, and Multiplication Avalanche Photodiode Operating at 1.06 μm," *IEEE Photonics Tech. Lett.*, vol. 10, No. 7, pp. 1009-1011, 1998.

Campbell et al., "Resonant-Cavity Separate Absorption and Multiplication Avalanche Photodiodes with High Speed and High Gain-Bandwidth Product," Ph.D. dissertation, University of Texas at Austin, 1998.

Baklenov et al., "Multi-stacked quantum dot resonant-cavity photodetector operating at 1.06 um," Electronics Letters, vol. 34, No. 7, pp. 694-695, Apr. 1998.

Hildebrand et al., "$Ga_{1-x}Al_xSb$ avalanche photodiodes: resonant impact ionization with very high ratio of ionization coefficients," *IEEE J. Quantum Electron.*, vol. 17, No. 2, pp. 284-288, 1981.

Hildebrand et al., "Resonant enhancement of impact in $Ga_{1-x}Al_xSb$," *Appl. Phys. Lett.*, vol. 37, No. 9, pp. 801-803, 1980.

* cited by examiner

AVALANCHE PHOTODIODES WITH AN IMPACT-IONIZATION-ENGINEERED MULTIPLICATION REGION

PRIORITY CLAIM

This application claims priority to U.S. Provisional Application No. 60/236,952 entitled "Avalanche Photodiodes With An Impact-Ionization-Engineered Multiplication Region," filed Sep. 29, 2000. The above-referenced provisional application is hereby incorporated by reference as if fully set forth herein.

BACKGROUND OF THE INVENTION

1. Field of the Invention

This invention generally relates to avalanche photodiodes with an impact-ionization-engineered multiplication region. Certain embodiments relate to avalanche photodiodes having higher impact ionization in a first portion of the multiplication region and lower impact ionization in a second portion of the multiplication layer.

2. Description of the Related Art

Light has been used for communication since signal fires were first used to send messages thousands years ago. In the 1960's and 1970's, the invention of the laser and the development of the low-loss optical fiber have ushered in a new era of optical communication. In the past 20 years, fiber optic communication systems have become the dominant backbone of the information-carrying infrastructure across the world due, at least in part, to their high capacity, high speed, relatively low cost, and security. The booming communication market, especially Internet-related systems, has imposed a serious challenge to the capacity of current systems.

Optical communication systems may include a transmitter, a receiver, and a transmission medium to convey energy from the transmitter to the receiver. A laser may be located at the transmitter end of the system and may be modulated with an input electric signal. The output beam may be coupled to an optical fiber through which the optical signal may propagate to the receiver. The receiver may be a photodetector, which may convert the optical signal to an electric signal. The photodetector may be an essential component of the receiver in a fiber optic communication system. In the future, development of relatively high-speed, low-noise, sensitive and low-cost optoelectronic devices may be key to meet future capacity requirements.

An appropriate photodetector for high-bit-rate, long-haul fiber optic communications may be an avalanche photodiode ("APD"). For example, an APD may have an internal gain that provides higher sensitivity than PIN photodiodes. It is important to achieve high sensitivity to maximize the separation between optical repeaters and, thus, reduce the overall system cost. APDs may achieve about 5 dB to about 10 dB better sensitivity than PINs, provided that the multiplication noise is low and the gain-bandwidth product of the APD is sufficiently high. The multiplication region of an APD may play a role in determining the gain, the multiplication noise, and the gain-bandwidth product.

SUMMARY OF THE INVENTION

A reduction in the avalanche noise with decreasing multiplication region thickness was investigated on GaAs AlGaAs, InAlAs and InP APDs. This investigation may provide a new approach to increase the sensitivity of photodiodes. The increased sensitivity may be explained in terms of a newly developed analytical history-dependent avalanche theory proposed by R. J. McIntyre. By incorporating relatively low-noise multiplication regions into resonant-cavity, separate-absorption-charge-multiplication-region ("SACM") APDs, a series of relatively high-speed devices were demonstrated with relatively low avalanche noise, relatively low dark current, relatively high quantum efficiency, and relatively high gain on both GaAs and InP substrates. The wavelengths include about 800 nm to about 900 nm, about 1.06 μm, about 1.3 μm, and about 1.55 μm. Among these devices, the highest near-unity-gain bandwidth observed may be about 35 GHz, while the highest gain-bandwidth product may be about 290 GHz. These APDs may have the best performance reported to date. These APDs may be the only APDs that may operate at about 20 GB/s and with minimal optimization at about 40 GB/s.

Due to its high performance, the SACM avalanche photodiode may be an appropriate device for long-haul, high-bit-rate fiber optic communications. The length of an optical link may be determined by the minimum optical signal that may be detected at the transmitted bit-rate. In comparison to photoconductors, metal-semiconductor-metal photodetectors, and PIN photodiodes, the internal gain of avalanche photodiodes may greatly increase the signal-to-noise ratio and simplify the preamplifier design of such photodiodes. On the other hand, the introduction of the resonant cavity may circumvent the trade-off between quantum efficiency and bandwidth for normal-incidence, single-pass PINs and APDs.

The conventional avalanche theory has been widely accepted and has proven to be an extremely useful model for a wide variety of avalanche devices. Based on reported ionization coefficients of most semiconductors and conventional theory, the philosophy of APD design has previously favored long multiplication regions in order to keep the electric field low.

High-speed SACM APDs may also be important. Self-assembled quantum-dots grown on GaAs substrates may provide a narrower bandgap than quantum wells. In order to fill the low-performance region near about 1 mm of commercially available avalanche photodiodes, quantum-dot stacks may be incorporated into a SACM structure as the absorption region. Enhanced by a resonant cavity tuned at about 1.06 μm, the device may produce a quantum efficiency as high as about 58%. By employing an $Al_{0.2}Ga_{0.8}As$ low-noise multiplication region, a low noise level (k=0.24) and a gain-bandwidth product of about 220 GHz may be obtained with a unity-gain bandwidth of about 35 GHz. The quantum-dot ("QD") absorption layers and the resonant cavity may allow this device to achieve a quantum efficiency of about 58% at about 1.06 μm.

An embodiment of the invention relates to an avalanche photodiode that includes a multiplication layer. The multiplication layer may include a well region and a barrier region. The well region may include a material having a carrier ionization probability that may be higher than a carrier ionization probability of a material used to form the barrier region. The carrier ionization probability of the material of the well region and the carrier ionization probability of the material of the barrier region may be selected to modulate the multiplication layer such that impact ionization may occur substantially in the well region proximate boundaries of the well region. In addition, the carrier ionization probability of the material of the well region and the carrier ionization probability of the material of the barrier region may be selected to modulate the multiplication layer such that the boundary region may be configured as an acceleration field for carriers.

In an embodiment, the multiplication layer may also include heterojunctions configured to increase impact ionization in a first portion of the multiplication layer and to reduce impact ionization in a second portion of the multiplication layer. The multiplication layer may also include multiple semiconductor materials configured to increase impact ionization in a first area of the multiplication layer and to reduce impact ionization in a second area of the multiplication layer.

In an embodiment, the multiplication layer may have a thickness of less than about 0.5 µm. In this manner, a probability of ionization in the barrier region may be reduced. In addition, the well region may have a thickness of less than about 100 nm. The barrier region may have a thickness less than about 100 nm. The multiplication layer may also include a second well region. The first well region may be spaces from the second well region by the barrier region. The second well region may also include a material having a higher carrier ionization probability than the material used to form the barrier region.

In an embodiment, the well region may include a binary compound of Group IIIB and Group VB elements. For example, the well region may include gallium and arsenic or indium and phosphorus. Alternatively, the well region may include a ternary compound of Group IIIB and Group VB elements. In an example, the well region may include indium, gallium, and arsenic. The barrier region may include a binary compound of Group IIIB and Group VB elements. Alternatively, the barrier region may include a ternary compound of Group IIIB and Group VB elements. For example, the barrier region may include aluminum, gallium, and arsenic. In addition, the barrier region may include aluminum, indium, and arsenic.

In an embodiment, the photodiode may also include a substrate layer. The substrate layer may include gallium and arsenic or indium and phosphorus. The photodiode may also include p and n regions. The p and n regions may include aluminum, gallium, and arsenic.

In an embodiment, an average electric field for a gain in the multiplication layer may be less than an average electric field for the gain in an additional multiplication layer. The additional multiplication layer may include the material of the well region.

Another embodiment relates to an avalanche photodiode that may include a multiplication layer including aluminum, gallium, and arsenic. For example, the multiplication layer may include $Al_xGa_{1-x}As$, where x may be at least about 0.7. The multiplication layer may have a thickness of less than about 200 nm. The photodiode may also include a p layer. The p layer may include $Al_xGa_{1-x}As$. $Al_xGa_{1-x}As$ of the p layer may have an x of at least about 0.6. A thickness of the p layer may be less than about 0.2 µm. In addition, a thickness of the multiplication layer may be substantially less than a thickness of the p layer. A noise of the photodiode may be less than about twice a shot noise of the photodiode. The photodiode may include a $Al_xGa_{1-x}As/GaAs$ SACM avalanche photodiode.

In an embodiment, the photodiode may also include an absorption region. The absorption region may include GaAs. Alternatively, the absorption region may include $In_xGa_{1-x}As$. Such a photodiode may be configured to detect light having a wavelength in a range of about 0.85 µm to about 1 µm.

In an embodiment, the photodiode may include a long-wavelength absorber wafer bonded to the multiplication layer. The long-wavelength absorber may include InAsP, GaInAsSb, and/or $In_{0.83}Ga_{0.17}As$ quantum wells compensated by $In_{0.83}Ga_{0.17}P$ barrier layers.

Another embodiment relates to an avalanche photodiode including a multiplication region that may include indium, aluminum, and arsenic. For example, the multiplication layer may include $In_{0.52}Al_{0.48}As$. A thickness of the multiplication region may be less than about 0.3 µm. A gain-bandwidth product of the photodiode may be about 300 GHz at a wavelength of about 1.55 µm. The photodiode may include a resonant-cavity avalanche photodiode, and the multiplication layer may be separated from absorption and charge regions of the photodiode. A k factor, a figure of merit for multiplication noise, of the photodiode may be less than about 0.5. A bandwidth of the photodiode may be greater than about 20 GHz at gains of less than about 10. A unity-gain external quantum efficiency of the photodiode may be about 65% at a wavlength of about 1.5 µm. A bias voltage of the photodiode may be about 20 V to about 50 V. The avalanche photodiode may be include a resonant-cavity structure.

In an embodiment, the avalanche photodiode may include an absorber. The avalanche photodiode may be configured to detect light having a wavelength of about 1.55 µm. The absorber may include $In_{0.53}Ga_{0.47}As$. A peak quantum efficiency of the photodiode may be greater than about 60%. A dark current of the photodiode may be less than about 10 nA biased at about 90% breakdown. A gain of the photodiode may be greater than about 50. In addition, a thickness of the multiplication layer may be less than about 0.4 µm. In this manner, a gain-bandwidth product of the photodiode may be about 130 GHz.

Another embodiment relates to a resonant-cavity photodiode that may include a Fabry-Perot cavity and top dielectric mirrors coupled to the cavity. The top dielectric mirrors may be configured for monolithic wavelength selection. The top dielectric mirrors may also be configured as broadband reflectors. The top dielectric mirrors may have an absorption minimum at a peak wavelength of a spectral response of the photodiode. In this manner, the top dielectric mirrors may form a spectral notch filter. A quantum efficiency of the a peak wavelength of a spectral response of the photodiode may be greater than about 90%.

BRIEF DESCRIPTION OF THE DRAWINGS

Other objects and advantages of the invention will become apparent upon reading the following detailed description and upon reference to the accompanying drawings in which.

Figure 1:
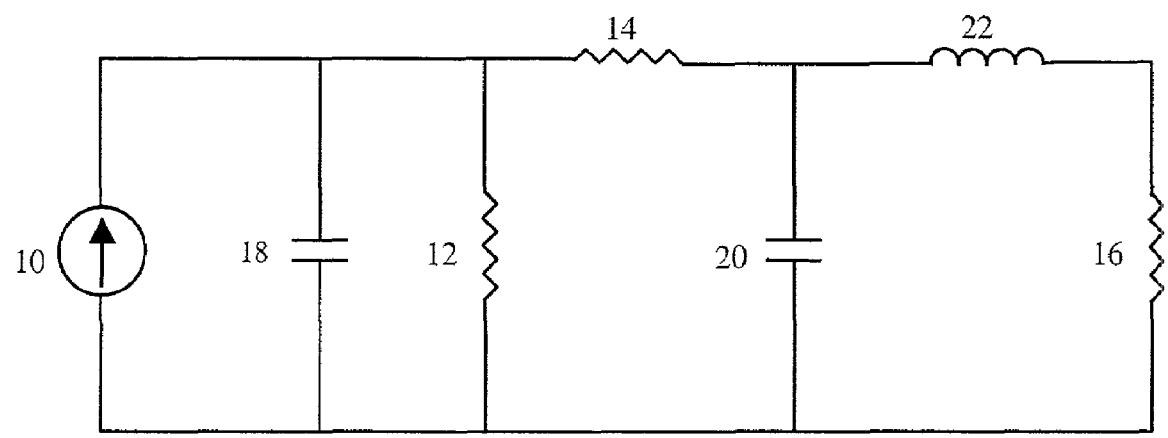
FIG. 1 depicts an equivalent circuit of a PIN photodiode.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Operating wavelength may be one of the most significant specifications for a photodetector. For example, operating wavelength may determine an absorption material of a photodetector, and thus a material system for the whole device. In this manner, a semiconductor photodetector may be specified for an operating wavelength range. A long-wavelength cut-off of a spectral response may be determined by the absorption edge, or bandgap, of the absorption material of a photodetector. A short-wavelength cut-off may be observed because of recombination near the surface. Since optical fibers demonstrate minimum dispersion and attenuation at about 1.3 µm and about 1.55 µm, respectively, these wavelengths have become standards for long-haul high-bit-rate fiber optic telecommunication applications. For short-haul communications, such as local area networks ("LAN"), operating wavelengths may vary from about 800 nm to about 1 µm since the relatively inexpensive and well-developed $Al_xGa_{1-x}As$ and Si technologies are available. In addition, there may also be a wide range of applications for Nd:YAG lasers, for example, in industrial manufacturing, medicine, remote sensing, space communications, and the military requiring high-performance photodetectors that operate at about 1.06 µm. The demand for such photodetectors may also lead to advances in high-performance photodetectors working at about 1 µm.

The responsivity, R, normally expressed in terms of A/W, may be defined as the current generated by unit incident light power. This characteristic may be equivalently described by the external quantum efficiency $\eta_{ext}$, which is 100% when every incident photon excites an electron-hole pair that may be eventually collected by the electrodes. Based on the above description, the relation between R and $\eta_{ext}$ may be written as $$\eta_{ext} = \frac{I/e}{P/h\nu} = \frac{h\nu}{e} R, \tag{1}$$

where I is the photo-generated current, P is the incident power, hv is the photon energy, and e is the electron charge. In order to make receivers with a high signal-to-noise ratio and maximize the separation between optical repeaters, photodetectors with a relatively high responsivity or external quantum efficiency may be required. Quantum efficiency may be the most useful characteristic to utilize.

To reduce the number of repeaters and amplifiers in a long-haul giga-bits fiber optic communication system, the photodetectors may need to be relatively sensitive. The ultimate detection capability of a receiver may be limited by noise and dark current. The ability to detect the presence or absence of a signal, or the sensitivity, may depend upon the ability to discriminate between a signal and noise. Noise may be described in terms of $<i^2>$, the quadratic mean of the current. The noise appearing in an infrared system may arise from a variety of sources, which may be classified into three categories: photodetector noise, amplifier noise, and radiation fluctuation from the background.

For photodetectors operating at high frequency, thermal noise and shot noise may be the two main noise sources, and they may be characterized by uniform spectral densities. Thermal noise may appear when current flows through any resistive material, and its noise may be presented as $$\langle i_{thermal}^2 \rangle = \frac{4kT}{R} B, \quad (2)$$

where B is the observation bandwidth, T is the absolute temperature, k is the Boltzmann's constant, and R is the load resistor. Shot noise may be associated with the discrete nature of the charge carriers, and it may be expressed as $$\langle i_{shot}^2 \rangle = 2eIB, \quad (3)$$

where e is the electron charge. Since these two noise sources are statistically independent, the summation of their quadratic mean values gives the total fluctuation, $\langle i_n^2 \rangle$, $$\langle i_n^2 \rangle = \langle i_{thermal}^2 \rangle + \langle i_{shot}^2 \rangle = \frac{4kT}{R} B + 2eIB. \quad (4)$$

From this equation, it may be seen that high resistance may be desirable in order to reduce the thermal noise and enhance the sensitivity of photodetectors. A high resistance, however, may result in a high RC constant in the circuit, which may reduce the bandwidth of a device and system. In high-speed applications, the effects of such a reduction in the bandwidth of a device and system may be reduced, and even eliminated, by circuit-level and/or device-level solutions. The signal-to-noise ratio S/N may be generally defined as the power ratio of signal to noise.

To support a high transmission bit-rate in long-haul fiber optic telecommunication systems, the bandwidth of every component may need to be relatively high. Therefore, bandwidth may be another important parameter for high-performance photodetectors. Generally speaking, a bandwidth of a photodetector may be determined by the following factors: carrier transit time, RC time constant, diffusion current, carrier trapping at heterojunctions, and packaging.

When significant absorption occurs out of the high-field region, the carrier-diffusion current may reduce the transient response of a photodiode. Those carriers within about one diffusion length of the depletion region may have an opportunity to diffuse into the active region. Since the diffusion process may last as long as the carrier lifetime, this current may contribute a slow tail to the impulse response. For relatively high-speed devices, this problem may be reduced, and even eliminated, with a double-heterojunction design that limits the absorbing region in the high-field intrinsic region.

To avoid a long tail in an impulse response due to carrier diffusion, the absorption layer of high-speed photodetectors may be placed in a depletion region. In response to absorbed light, photo-generated electron-hole pairs may quickly drift across this high-field region and may be collected by the electrodes. A reduced, and even minimum, transit time may be achieved with an electric field that may be high enough so that carriers may travel at their saturation velocities. During this transport process, the applied bias may be substantially constant. According to Gauss's law, the electric field in the depleted region may be disturbed by the movement of the carriers, which may result in a significant displacement current relative to the carrier current. Such a disturbance may start from about a time when the generation of carriers begins and may be reduced as the generated carriers are collected at the boundaries of the depletion region. In this case, the transit time may be determined primarily by the length of the depletion region and the saturation velocities of the carriers.

When heterostructures are used in photodetector designs, carrier trapping at discontinuities of the conduction band or the valence band may also affect device bandwidth. When carrier trapping is significant, an impulse response may not end until the trapped carriers have recombined or have escaped by thermionic emission, which may be a very slow process. Hole trapping may be significant in long-wavelength photodetectors due to a large valence band discontinuity at InP/InGaAs heterojunctions. Since an applied bias may reduce the barrier height, a sufficient electric field across the heterojunction may increase the emission rate. To reduce interface trapping, the barrier may be reduced by superlattice or compositional grading.

RC time constant and packaging may also influence photodetector performance. FIG. 1 shows an equivalent circuit of a PIN photodiode. Generally, the circuit following current source 10 may include resistors 12, 14, and 16, capacitors 18 and 20, and inductor 22, and may serve as a low band-pass filter. As shown in FIG. 1, capacitor 18, $C_J$, is the junction capacitance that may originate from the depletion region, and capacitor 20, $C_p$, may be the parasitic capacitance. Inductor 22, $L_s$, may be the total series inductance, which may arise from the leads. Resistor 12, $R_D$, which may normally be large under reverse bias, may be the diode shunt resistance or junction resistance caused by carriers within the depletion region. Resistor 14, $R_s$, may be the series resistance of the diode, and resistor 16, $R_L$, may be the load resistance. If the device short-circuit current, current source 10 as shown in FIG. 1, has a frequency response $J(\omega)$, then the spectrum of the output current $J_{out}(\omega)$ may be expressed with the transfer function $H(\omega)$ of the equivalent circuit as:

$$J_{out}(\omega) = H(\omega) J(\omega). \quad (5)$$

$H(\omega)$ may be found from simple circuit analysis. For the circuit shown in FIG. 1, $H(\omega)$ may be given by $$H(\omega) = \frac{R_D}{a + j\omega(b - c\omega^2) - d\omega^2}, \text{ with} \quad (6)$$

$$a = R_S + R_L + R_D$$
$$b = R_S R_L C_p + L_S + (R_S + R_L) R_C C_j + R_L R_D C_j$$
$$c = R_S L_S C_p R_D C_j$$
$$d = (R_S R_L C_p + L_S) R_D C_J + R_S L_S C_p + R_D C_p L_S.$$

Another problem introduced by packaging is that a photodiode may be a high impedance load and may have a reflection coefficient close to unity. An impedance mismatch between the device, the load, and the transmission line may result in resonance in the circuit and may determine the photodetector's frequency response.

The photoconductor is the simplest photodetector that may exhibit an internal gain mechanism. Since carrier density in an active region may be modulated by an optical signal, detection of the photoconductor may be based on a subsequent conductivity change of the material. A thickness of the active region may be large enough to absorb a significant fraction of the incident light and small enough to avoid a low resistance and to reduce, and even minimize, thermal noise. Another trade-off of the photoconductor may be between gain and bandwidth. Since the photo-generated current may persist until all carriers are collected at the electrodes or recombine in the active region, the bandwidth B of the photoconductor may be proportional to the reciprocal of the slower carriers' lifetime τ.

$$B \propto \frac{1}{\tau}. \tag{7}$$

Assuming that holes travel with a lower saturation velocity, an appropriate carrier lifetime, τ, in Equation 7 may be the carrier lifetime of holes, $\tau_h$. Continued existence of holes in the channel may attract electrons to the channel thereby maintaining charge neutrality in the channel. The attraction of electrons to the channel may result in a photocurrent gain, G, which may be expressed as $$G = \frac{\tau}{t_{tr}}, \tag{8}$$

where $t_{tr}$ is the electron transit time. Then, the gain-bandwidth product may be constant and may be determined by $t_{tr}$. To improve the gain-bandwidth product, the photoconductor may include a relatively short active region, which, in turn, may result in lower quantum efficiency and lower resistance. A lateral dimension of an active region, and thereby performance, of the photoconductor may be determined by resolution capability of a lithography process and/or system used to form the active region. As such, in fiber optic communication systems, where relatively high bandwidth and relatively high sensitivity are essential, photoconductors may be seldom used.

The simplest photodetector with a junction may be the Metal-Semiconductor-Metal ("MSM") photodiode. An MSM photodiode may include two Schottky contacts formed on an undoped semiconductor layer. Since an MSM photodiode may be inherently substantially planar, an MSM photodiode may be relatively easy to integrate with a metal-semiconductor FET ("MESFET") preamplifier.

Under normal operation conditions for an MSM photodiode, a region between the two contacts may be almost completely depleted, and photo-generated carriers may be swept to the two contacts by this electric field. Since transit of the carriers may be a drift process, a bandwidth of the photodiode may be determined by a transit time of the carriers and a charge-up time of the diode. The charge-up time may be determined by junction and parasitic RC constants. An equivalent circuit of an MSM photodiode may be similar to an equivalent circuit of a PIN photodiode, as shown in FIG. 1. Since a junction capacitance of a MSM diode may be much smaller than that of a PIN diode, a MSM diode may have a higher bandwidth than a PIN diode for a comparable device area. The transit time of a MSM diode may be determined by the distance between the contacts. With interdigitated finger contacts and a spacing of approximately 1 µm, MSM photodiodes may have a bandwidth of about 20 GHz to about 50 GHz. Using submicron lithography techniques, a bandwidth of about 510 GHz may be achieved. The avalanche multiplication effect may be observed under relatively strong electric field, which may correspond to an increase in tunnel current, especially in narrow-bandgap materials.

For low electric fields, the dark current of MSM devices may be due primarily to thermionic emission over the barrier. In GaAs devices, the barrier may be reasonably high such that the dark currents of MSM diodes and PIN diodes may be comparable. In the long-wavelength region, InGaAs MSM diodes may exhibit relatively high dark currents due to a relatively low Schottky barrier height at the metal/InGaAs interface. An InAlAs layer may be included at the interface to increase the barrier height, and a graded bandgap layer may be included at the InGaAs/InAlAs interface to reduce hole trapping. In addition, since the contacts may be formed on the device surface, almost half of the incident photons may be blocked. The number of incident photons that may be blocked may be reduced if the contacts are substantially transparent contacts. MSM photodiodes may not typically be used in long-haul fiber optic communication although they may demonstrate relatively high bandwidths and compatibility for integration with preamplifiers.

A structure that may be most widely used in fiber optic communication is a PIN photodiode, which may demonstrate relatively high speed, relatively low dark current, relatively low noise, and a reasonable quantum efficiency. The PIN photodiode may be a junction diode in which a lightly doped region (n- or p- depending on the junction formation technique) may be formed between $p^+$ and $n^+$ regions. Due to relatively low density of free carriers in the "intrinsic" region, the region may be fully depleted at approximately zero or a very low reverse bias. Consequently, the electric field may be substantially confined to this region. The PIN diode may have a relatively stable depletion region thickness with respect to the variation of the applied voltage.

For high-speed operation, to avoid slow carrier diffusion, an absorption layer may be placed in the depleted intrinsic region where photo-generated carriers may drift with saturation velocities. Similar to MSM photodiodes, a bandwidth of a PIN photodiode may be determined by carrier transit time and RC constants. The transit time may be reduced, and even minimized, with relatively thin depletion regions. A relatively small junction capacitance may be normally achieved by reducing the device area to a value consistent with the desired bandwidth. For optimal design, it may be customary to keep a balance between the transit time and the RC time constant:

$$t_{tr} = \tau_{RC} = RC \tag{9}$$

$$t_{tr} = \frac{T_M}{2},$$

where $T_M$ is the signal modulation period.

For a PIN diode with an absorption layer in the depletion region, the external quantum efficiency $\eta_{ext}$ may be expressed as $$\eta_{ext} = \eta_i(1-R)(1-e^{-\alpha d}), \tag{10}$$

where $\eta_i$ is the internal quantum efficiency, d is the width of the absorption region, α is the absorption coefficient, and R is the reflectivity of the top surface. According to Equation 10, reducing reflectivity on the top surface and increasing width of the absorption region may increase quantum efficiency. Increasing width of the absorption region, however, may reduce bandwidth by increasing transit time. Consequently, speed and quantum efficiency of PIN photodiodes may be inversely related. Such an inverse relationship may be addressed by decoupling the widths of the absorption and depletion layers and by including a resonant cavity.

The main noise sources of PIN photodiodes may be shot noise and thermal noise, which are described in Equation 2 and 3. Considering an incident optical signal, $P_{inc}$, according to Equation 1, the photocurrent $I_{ph}$ is expressed as $$I_{ph} = \frac{e\eta_{ext} P_{inc}}{hv}, \tag{11}$$

where hv is the photon energy. Since the photocurrent $I_{ph}$, the response to the background radiation $I_B$, and the dark current $I_D$ increase shot noise, the current I in Equation 3 is the summation of the three. Thermal noise may be caused by resistors in the diode circuit, as shown in FIG. 1. For this circuit, the resistance R in Equation 2 may be $$R = \left(\frac{1}{R_D} + \frac{1}{R_L} + \frac{1}{R_i}\right)^{-1}, \tag{12}$$

where $R_D$ is the shunt resistance, $R_L$ is the load resistance, and $R_i$, which is parallel to $R_L$, is the input resistance of the following preamplifier. Since the two noise sources, shot noise and thermal noise, may be statistically independent, the total noise may be the summation of the two as shown in Equation 4. The signal power may be calculated with $i^2_{ph}R$, and the noise power is $<i^2_n>R$. Therefore, the signal-to-noise power ratio may be expressed as $$\left(\frac{S}{N}\right)_{power} = \frac{\left(\frac{e\eta_{ext} P_{inc}}{hv}\right)^2}{2e(I_{ph} + I_B + I_D)B + \frac{4kT}{R}B} \tag{13}$$

$$= \frac{I_{ph}^2}{2e(I_{ph} + I_B + I_D)B + \frac{4kT}{R}B}.$$

A conventional measure of sensitivity is the noise equivalent power ("NEP"), which may be presented as the minimum detectable power $(P_{inc})_{min}$ at unity signal-to-noise ratio. For a given signal-to-noise ratio S/N and bandwidth B, $(P_{inc})_{min}$ and NEP may be defined as $$(P_{inc})_{min} = \frac{hv}{e\eta_{ext}} \left(\frac{S}{N}\right)^{1/2} \left(2e(I_{ph} + I_B + I_D) + \frac{4kT}{R}\right)^{1/2} B^{1/2}, \tag{14}$$

and $$NEP = \frac{hv}{e\eta_{ext}} \left(2e(I_{ph} + I_B + I_D) + \frac{4kT}{R}\right)^{1/2} B^{1/2}.$$

To increase the sensitivity of a PIN photodiode, external quantum efficiency $\eta_{ext}$ and total resistance R may be increased, and unwanted currents, $I_B$ and $I_D$, may be decreased.

Another widely used structure in fiber optic communication is the avalanche photodiode ("APD"). An avalanche photodiode may be a reverse-biased pn junction that may be operated close to the breakdown voltage. Photo-generated carriers injected into the depletion region may drift at their saturation velocities. If the carriers gain sufficient energy from the electric field, ionizing collisions with the lattice may occur. Secondary electron-hole pairs may be generated in this process. The primary and secondary carriers may create additional carriers until they exit the high field region. This process may be generally referred to as impact ionization. A typical field intensity for such a process may be in the range from about $10^4$ V/cm to about $10^6$ V/cm. The typical field intensity may vary, however, depending on, for example, the material and the structure of the multiplication region.

A central issue for photodetectors in fiber optic communication may be detection of weak optical signals. Often, a length of an optical link may be determined by a minimum optical signal that may be detected at the transmission bit-rate. As opposed to PIN photodetectors, the internal gain introduced by the avalanche process may increase the signal-to-noise ratio and thus the sensitivity of receivers that employ APDs. This gain may also relax the requirements on the following amplifiers.

At relatively low bias, APDs may be essentially PINs, and main sources of noise for the APDs may be shot noise and thermal noise. As the gain of an APD increases, the main source of noise may be the multiplication process. For example, the statistical nature of the multiplication process may result in random fluctuation in the total number of secondary carriers generated by each primary carrier injected into the gain region. This random fluctuation may cause excess noise in the total signal current, and it may be generally referred to as multiplication noise. The shot noise term may be modified to include the multiplication noise as follows $$<i_{av}^2> = 2e(I_{ph} + I_B + I_D) B M^2 F, \tag{15}$$

where F is the excess noise factor, which may be commonly used as the noise figure of merit of an APD. Similar to Equation 4, the total noise $<i_n^2>$ of an APD may be written as $$\langle i_n^2 \rangle = \langle i_{thermal}^2 \rangle + \langle i_{av}^2 \rangle = 2e(I_{ph} + I_B + I_D) B M^2 F + \frac{4kT}{R} B. \tag{16}$$

The power signal-to-noise ratio S/N becomes $$\left(\frac{S}{N}\right)_{power} = \frac{\left(\frac{e\eta_{ext} P_{inc}}{hv}\right)^2 M^2}{2e(I_{ph} + I_B + I_D) B M^2 F + \frac{4kT}{R} B} \tag{17}$$

$$= \frac{\left(\frac{e\eta_{ext} P_{inc}}{hv}\right)^2}{2e(I_{ph} + I_B + I_D) B F + \frac{4kT}{RM^2} B}.$$

An upper bound of the signal-to-noise ratio may be reached if F=1, and the thermal noise $4kT/RM^2$ and unwanted currents ($I_B$ and $I_D$) may be neglected compared to the contribution of the photocurrent $I_{ph}$. This limit may be generally referred to as the quantum noise limit of detection, and it is defined as $$\left(\frac{S}{N}\right)_{power} = \frac{\left(\frac{e\eta_{ext}P_{inc}}{hv}\right)^2}{2eI_{ph}B} = \frac{I_{ph}}{2eB}. \quad (18)$$

Similar to the definition in Equation 14, we can define the NEP for APDs as $$NEP = \frac{hv}{e\eta_{ext}}\left(\frac{S}{N}\right)^{1/2}\left(2e(I_{ph} + I_B + I_D)F + \frac{4kT}{RM^2}\right)^{1/2}B^{1/2}. \quad (19)$$

As demonstrated in these equations, increasing gain M may reduce the contribution of thermal noise and may increase the final signal-to-noise ratio. A noise penalty may occur, however, with increasing F. Consequently, there may be an optimum value of the gain which may increase, and may even maximize, the signal-to-noise ratio. In addition, the internal gain from the photodetector may reduce a gain requirement of a subsequent preamplifier and may produce higher bandwidth and lower noise from a simpler amplifier. Therefore, APDs may achieve about 5 dB to about 10 dB better sensitivity than PINs. For high-bit-rate, long-haul fiber optic systems, an avalanche photodiode may be the photodetector of choice.

The demand for gigabit fiber-optic communication and the rising popularity of fiber optics in RF/microwave systems have led to many advances in high-speed photodetector technology. Specific application requirements have spurred developments of novel device structures to improve the speed and responsivity of high-speed photodetectors. Traditional high-speed photodiodes, both PINs and APDs, may be designed around a trade-off between bandwidth and quantum efficiency. For example, to increase bandwidth, the transit time of photo-generated carriers across the high-field depletion region may be reduced thereby placing an upper limit on the absorption layer thickness. The external quantum efficiency $\eta_{ext}$ of conventional photodetectors may be determined by the optical absorption coefficient $\alpha$, the thickness d of the active layer, and the surface reflectivity R.

To increase quantum efficiency, a thickness of the active layer may be increased, and an anti-reflective coating may used. Assuming $\alpha$ is approximately $10^4$ cm$^{-1}$, to achieve $\eta_{ext}$ greater than about 95%, a relatively thick (e.g., greater than about 3 µm) active layer may be required. Increasing a thickness of the absorption region may increase transit time and may reduce the device speed. Therefore, it may be desirable to increase quantum efficiency without reducing the bandwidth. Such an increase in $\eta_{ext}$ may be achieved by utilizing a resonant cavity structure, in which an optical signal may be recirculated across a relatively thin absorbing layer to effectively increase the optical path length.

Figure 2:
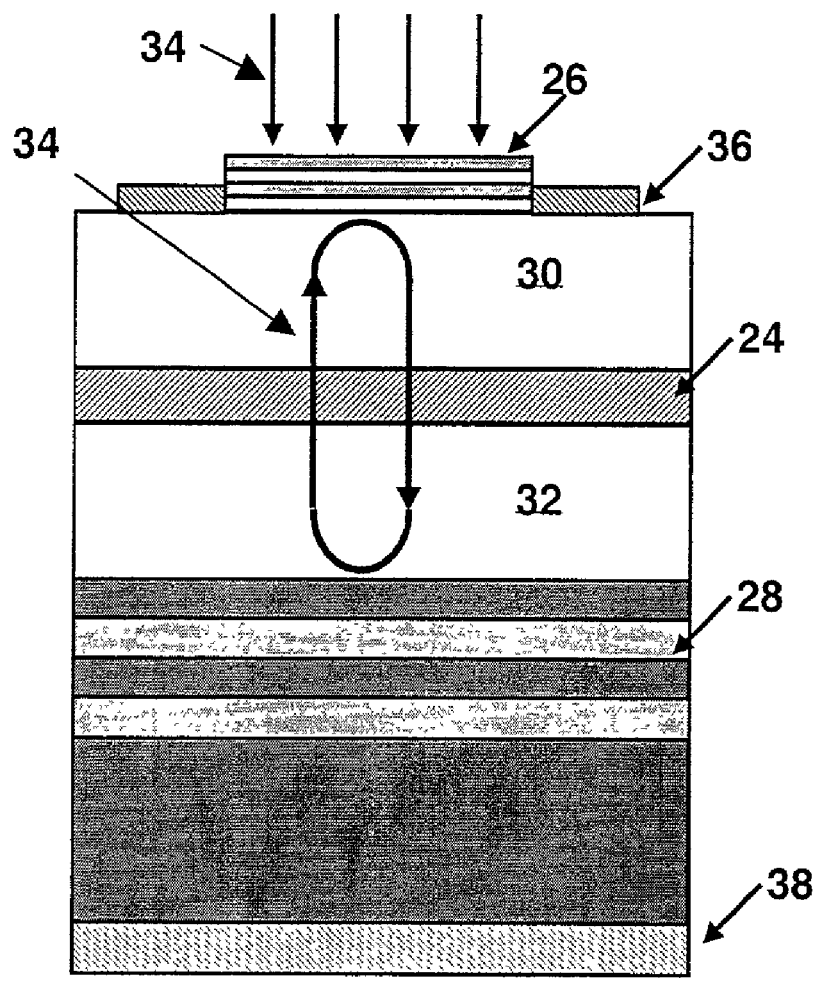
FIG. 2 depicts a partial cross-sectional view of an embodiment of a resonant-cavity photodetector using an InAlAs—InGaAs Schottky device.

Resonant-cavity photodetectors were first demonstrated using an InAlAs-InGaAs Schottky device. A cross-sectional view of an embodiment of a resonant-cavity photodetector is shown in FIG. 2. As shown in FIG. 2, a basic resonant-cavity enhanced ("RCE") device may include relatively thin, narrow-bandgap absorption layer 24 sandwiched between two mirrors 26 and 28 and transparent spacer layers 30 and 32. Optical signal 34 may enter the device through mirror 26 and may be recirculated across relatively thin, narrow bandgap absorption layer 24 and transparent spacer layers 30 and 32 between mirrors 26 and 28. The device may also include contacts 36 and 38. Contacts 36 and 38 may be formed laterally proximate mirrors 26 and 28, respectively. The resonant wavelength may be determined by an optical length of a GaAs substrate or InGaAs/InAlAs on InP. Since top mirror 26 may be deposited at the very end of the process, a relatively large and tunable reflectivity may be achieved with a few pairs of dielectric layers. In the following context, $R_1$ and $R_2$ may be used to describe the power reflectivities of top and bottom mirrors, 26 and 28, respectively.

The external quantum efficiency for resonant-cavity photodetectors may be expressed as $$\eta_{ext} = \frac{(1 + R_2 \cdot e^{-\alpha d})(1 - R_1)(1 - e^{-\alpha d})}{1 - 2\sqrt{R_1 R_2} \cdot e^{-\alpha d}\cos(2\beta L + \psi_1 + \psi_2) + R_1 R_2 e^{-2\alpha d}} \quad (20)$$

where $\alpha$ is the optical absorption coefficient and $\psi_1$ and $\psi_2$ are the phase shifts at the mirrors. Since the propagation constant $\beta$ ($\beta = 2n\pi/\lambda_0$, where $\lambda_0$ is the vacuum wavelength and n is refractive index) is dependent upon wavelength, $\eta_{ext}$ may change periodically with the inverse of the wavelength. The peak quantum efficiency $\eta_{peak}$ may be reached when the cosine term is 1:

$$\eta_{peak} = \frac{(1 + R_2 e^{-\alpha d})(1 - R_1)(1 - e^{-\alpha d})}{\left(1 - \sqrt{R_1 R_2}\,e^{-\alpha d}\right)^2} \quad (21)$$

Figure 3:
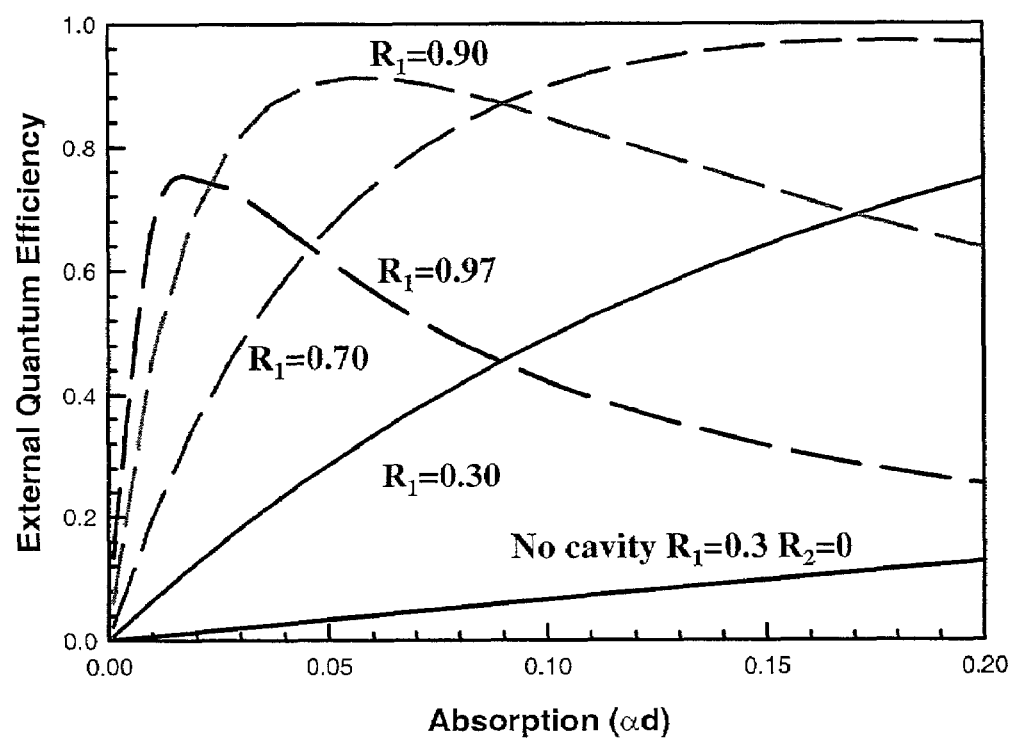
FIG. 3 depicts quantum efficiency as a function of $\alpha d$ for several values of top mirror reflectivity.

FIG. 3 shows the external quantum efficiency of a resonant-cavity device as a function of absorption, $\alpha d$, for several values of top mirror reflectivity. The top mirror reflectivities may correspond to different numbers of pairs of dielectric quarter-wave layers with more pairs producing higher reflectivities. The bottom mirrors may include quarter-wave stacks of GaAs/AlAs. The bottom mirror reflectivity $R_2$ is 99%, except for the "no cavity" case, in which $R_2$ is set to 0, and $R_1$ is set to 30%. The range of $\alpha d$ shown may correspond to relatively thin absorption layers (about tens of nanometers to about hundreds of nanometers) with absorption coefficients typical for In$_{0.53}$Ga$_{0.47}$As at near-infrared wavelengths (e.g., $\alpha$ of about 0.5 µm$^{-1}$ to about 2 µm$^{-1}$). The four different values for top mirror reflectivity shown in FIG. 3 may correspond to a typical semiconductor-air interface plus 1, 2, and 3 pairs of dielectric quarter-wave layers. In all cases shown, a resonant cavity may dramatically improve the peak quantum efficiency. Except for very narrow absorption layers, selection of an appropriate top mirror may increase peak external quantum efficiencies to greater than about 80%. In comparison, the external quantum efficiency may less than about 15% without a cavity. The optimum top mirror reflectivity for high $\eta_{max}$ occurs at $$R_1 = R_2 e^{-2\alpha d}. \quad (22)$$

Figure 4:
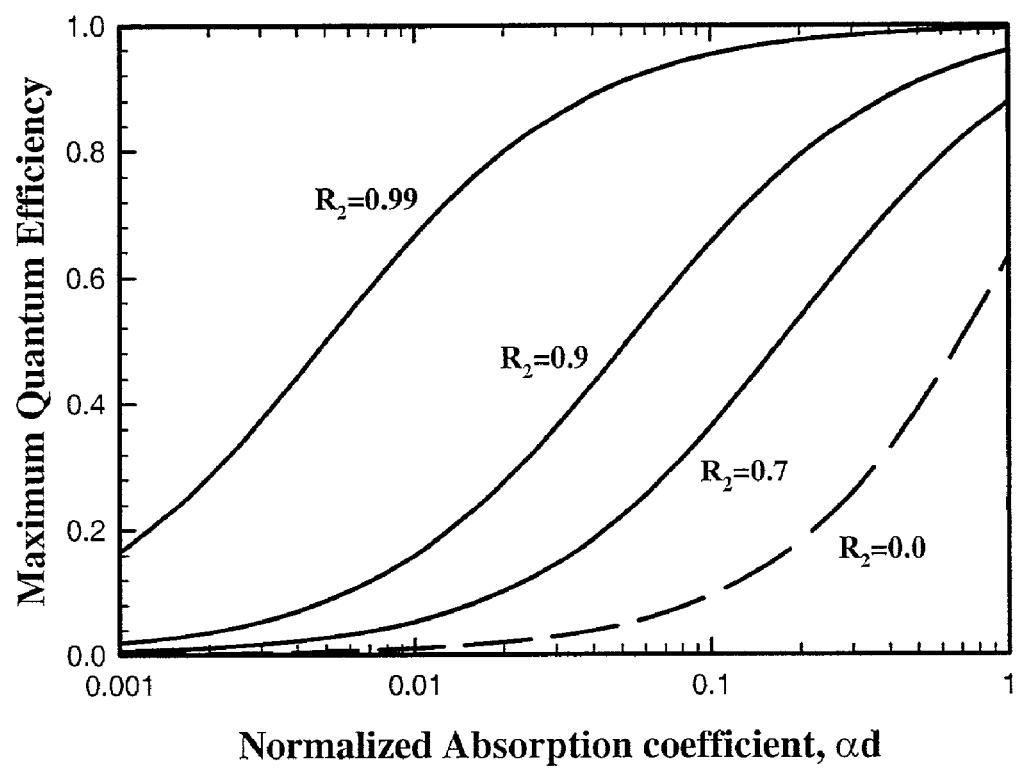
FIG. 4 depicts a plot of $\eta_{max}$ as a function of $\alpha d$ for various $R_2$ values.

FIG. 4 shows maximum quantum efficiency, $\eta_{max}$, of a resonant-cavity device as a function of normalized absorption coefficient, $\alpha d$, for various bottom mirror reflectivities, $R_2$ with top mirror reflectivity, $R_1$, determined by Equation 22. The curve for a conventional photodetector (having a $R_2$ of about 0), as shown by the dashed line in FIG. 4, may exceed about 90% external quantum efficiency only if a thickness of the absorption layer is greater than about 2 µm. Such a photodetector may have a lower bandwidth due to a longer carrier transit time. The longer carrier transit time may also increase the carriers' recombination probability thereby reducing quantum efficiency. In contrast, resonant-cavity photodetectors having an $R_2$ of about 0.99 may have a quantum efficiency greater than about 90% with a relatively thin absorption layer. From FIGS. 3 and 4, it may be seen that resonant-cavity photodetectors with relatively thin absorption regions may have higher bandwidths than conventional photodetectors without sacrificing the quantum efficiency.

In the above calculations, spatial distribution of the optical field inside the cavity was neglected. Interference between upward and downward propagating waves may create a standing wave inside the cavity. Since the optical field inside the cavity may not be uniform, the actual absorbed power may be a function of a position of the absorption layer. When the absorption layer spans several periods of a standing wave in the cavity, the standing wave effect may be averaged out. But for a relatively thin absorption layer, quantum efficiency of a resonant-cavity device may be affected by a position of the absorption layer. An effective absorption coefficient, $\alpha_{eff}$, may be introduced to simplify the calculation, which may defined as $$a_{eff} = \frac{\frac{1}{d}\int_0^d dz a(z)|E(z,\lambda)|^2}{\frac{2}{\lambda}\int_0^{\lambda/2} dz |E(z,\lambda)|^2} \quad (23)$$

where $\lambda=\lambda_0/n$, $E(z, \lambda)$ is the electrical field profile at a given wavelength $\lambda$ and the denominator is the average of the standing wave. For a relatively thin absorption region in a cavity with relatively highly-reflective mirrors, $\alpha_{eff}$ may vary from almost twice the bulk absorption coefficient at an anti-node of an optical standing wave to only a fraction of the optical standing wave at a node.

Due to this configuration, resonant-cavity photodiodes may demonstrate intrinsic wavelength selectivity. Intrinsic wavelength selectivity may be useful in some wavelength-division multiplexing ("WDM") applications. For WDM applications, important characteristics may include, but are not limited to, the free spectral range ("FSR"), the finesse of the cavity F, and full width at half maximum ("FWHM") of the spectral response. FSR specifies the wavelength separation between two adjacent resonant bands. Under linear phase approximations, the FSR may be approximated by the expression $$FSR = \frac{\lambda^2}{2n_{eff}L_{eff}} \quad (24)$$

where $n_{eff}$ is the effective refractive index and $L_{eff}$ is the effective optical cavity length. The finesse F and FWHM ($\Delta\lambda_{1/2}$) of the resonance peak may be defined as $$F = \frac{FSR}{\Delta\lambda_{1/2}} \quad (25)$$

$$FWHM = \Delta\lambda_{1/2} = \frac{\lambda_0^2}{2\pi n_{eff}L_{eff}} \frac{1-\sqrt{R_1R_2}\,e^{-\alpha d}}{\sqrt[4]{R_1R_2}\,e^{-\alpha d/2}}.$$

Figure 5:
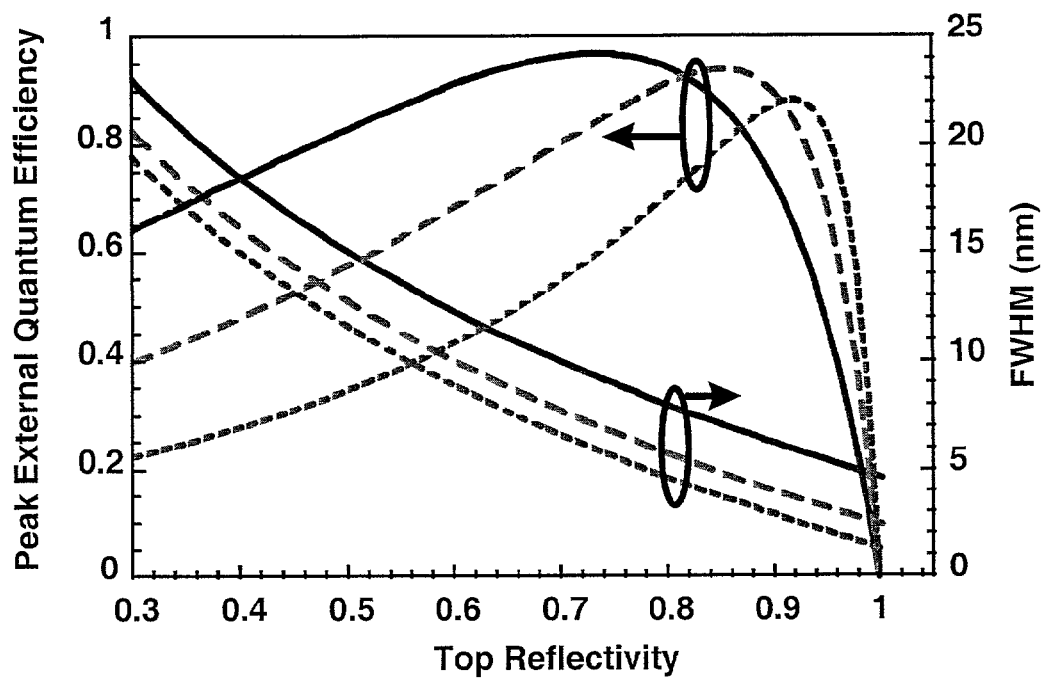
FIG. 5 depicts spectral linewidth of resonant-cavity photodiodes as a function of top mirror reflectivity.

FIG. 5 shows peak external quantum efficiency and spectral linewidth of a resonant-cavity photodiode as a function of the top mirror reflectivity. The three different sets of curves correspond to three different absorption layer thicknesses using the effective absorption at about 1.3 μm of an $In_{53}Ga_{47}As$ layer located at approximately an anti-node of a cavity's optical standing wave. The solid line corresponds to an absorption layer thickness of about 50 nm. The medium dashed line corresponds to an absorption layer thickness of about 25 nm. The small dashed line corresponds to an absorption layer thickness of about 12 nm. The bottom mirror reflectivity is approximately 0.99, and the effective length of the cavity is about 1.5 μm. As shown in FIG. 5, spectral linewidth decreases with increasing reflectivities and decreasing absorption coefficients.

Although relatively high reflectivity mirrors may result in a high-finesse cavity and narrow linewidth, such mirrors may also lead to relatively narrow angle detection. The quantum efficiencies of resonant-cavity photodetectors given above are for normal incidence. Peak quantum efficiency may decrease with incident angle, $\theta_i$. The resonance wavelength may also shift from the normally incident case. The angle dependency of $\eta$ may be expressed as a function of the cavity finesse F, the wavelength $\lambda$, the effective cavity length $L_{eff}$ and effective refractive index $n_{eff}$ as follows $$\frac{\Delta\eta}{\eta} = \left[\frac{2n_{eff}L_{eff}}{\lambda}F\left(\frac{\theta_i}{n}\right)^2\right]^2. \quad (26)$$

Quantum efficiency may be more sensitive to the angle of incidence for a high-finesse cavity at shorter wavelengths than for longer wavelengths. Although this phenomenon may be very useful for special applications such as high-response-angle detection, this phenomenon effectively decreases the numerical aperture of resonant-cavity photodetectors and imposes limitations for fiber optic communications. However, the quantum efficiency may not change appreciably within an incident angle of about 5° even for a high-finesse cavity. In practice, fiber couplers and integrated microlenses may be used to increase the numerical aperture of resonant cavity photodetectors.

In a resonant cavity, photons may be reflected by mirrors and may cross the absorption region several times. Photo-generated carriers, however, may drift across this region only once. By decoupling optical and electrical path lengths, a resonant-cavity structure may achieve relatively high external quantum efficiency with a thin absorption layer. In this manner, a relatively high quantum efficiency may be achieved without a reduction in carrier transit time.

An appreciable gain from an APD may be achieved with a relatively high electric field in the multiplication region. At relatively high electric field intensities, tunneling current $I_{tunnel}$ may be the dominant component of the dark current, and its expression for direct bandgap semiconductors is $$I_{tunnel} \cong \gamma A \exp\left[-\frac{\Theta m_0^{\frac{1}{2}} E_g^{\frac{3}{2}}}{e\hbar E_m}\right], \quad (27)$$

where $m_0$ is the free electron mass, e is the electron charge, h is the reduced Planck's constant, $E_m$ is the maximum junction electric field, and $E_g$ is the bandgap of the semiconductor. The parameter $\Theta$ is a dimensionless quantity on the order of unity, and depends on the effective electron mass and the detailed shape of the tunneling barrier. The prefactor A is a constant, and γ depends on the initial and final states of the tunneling carrier.

Figure 6:
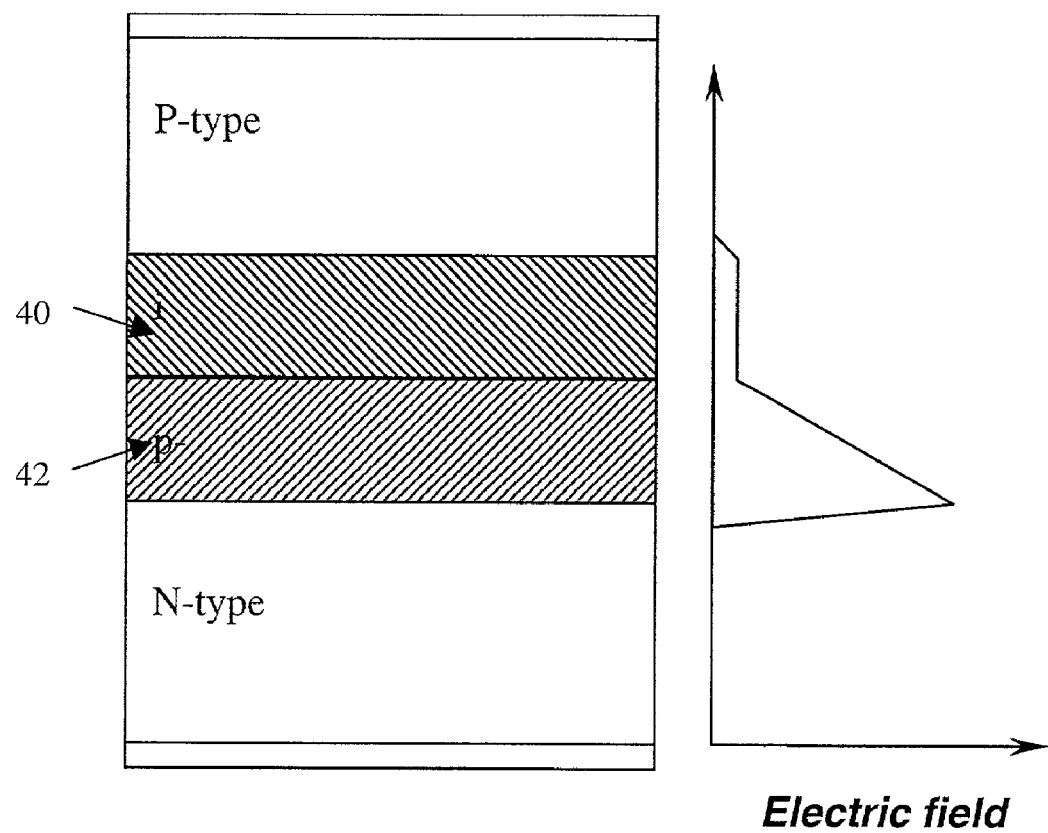
FIG. 6 depicts a partial cross-sectional view of an embodiment of a generic structure and electric field profile of a SAM APD.

A modified APD structure may be generally referred to as a separate-absorption-multiplication ("SAM") APD. FIG. 6 illustrates a partial cross-sectional view of an embodiment of a generic structure and electric field profile of a SAM APD. As shown in FIG. 6, a SAM APD may include absorption region 40 separated from multiplication region 42. In practice, a field may be applied across narrow-bandgap absorption layer 40 to avoid a slow carrier-diffusion process. A relatively high electric field applied on a narrow-bandgap material may result in a relatively high tunneling current. To avoid excessive dark current, especially from narrow-bandgap absorption materials such as $In_{0.53}Ga_{0.47}As$, it may be necessary to separate the multiplication and absorption regions and to alter the profile of the electric field. In such a structure, a relatively high electric field may be applied only to the wide-bandgap material in multiplication region 42, as shown in FIG. 6. Such a structure with such an applied electric field may lead to a substantially lower tunneling current. In 1979, the first InGaAsP SAM avalanche photodiode was demonstrated to have a gain of about 3000 and a dark current density of approximately 1 $\mu A/cm^2$ at relatively low voltage.

Figure 7:
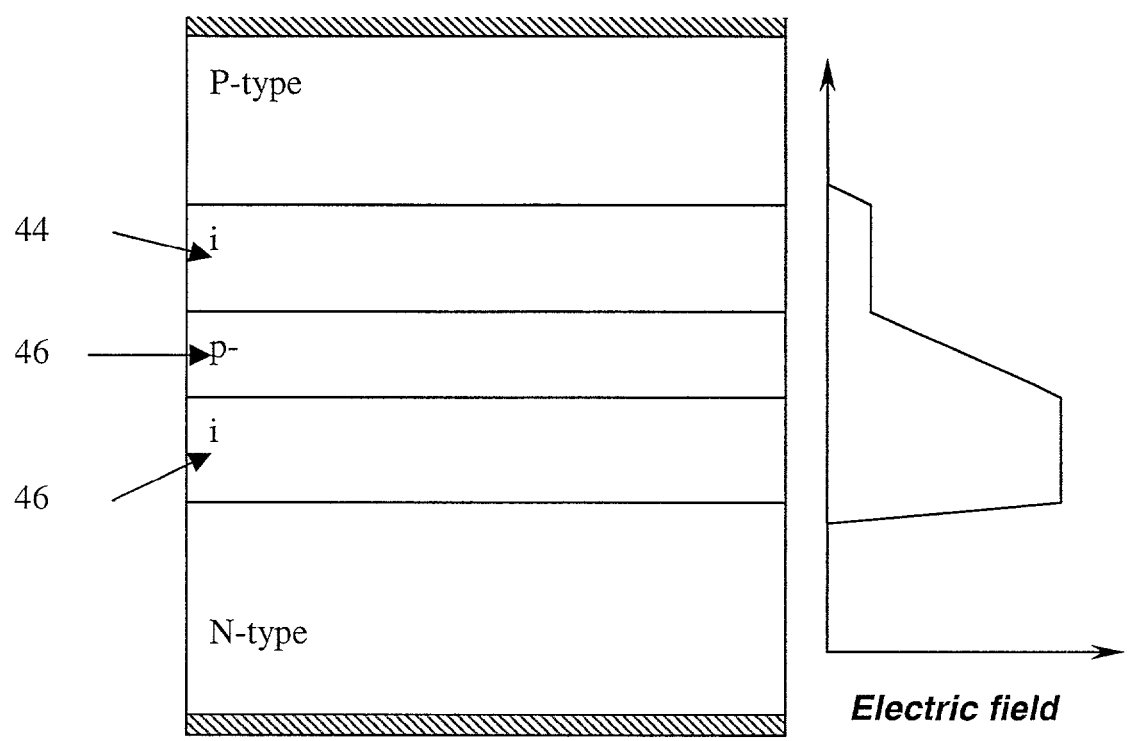
FIG. 7 depicts a partial cross-sectional view of an embodiment of a generic structure and electric field profile of a SACM APD.

A partial cross-sectional view of an embodiment of a generic structure and electric profile of a separate-absorption-charge-multiplication-region ("SACM") APD is shown in FIG. 7. To achieve higher performance from relatively thin multiplication regions and to alleviate a tunneling current that may originate from a relatively high field, wide-bandgap intrinsic multiplication region 48 and charge region 46 may be used to replace the lightly doped gain region in SAM APDs. The SACM may also include absorption region 44. As a result of the several heterointerfaces in this structure, carrier trapping may broaden an impulse response and reduce a bandwidth of the APD. Graded layers may be formed at these interfaces to change the bandstructure gradually. Such a device may be generally referred to as a separate-absorption-graded-charge-multiplication-region ("SAGCM") APD. Due to the similarity of the two structures and the wide application of graded layers in high-performance devices, the term SACM may often be used for both SACM and SAGCM structures. With an InP SAGCM planar structure, a gain-bandwidth product of about 122 GHz was achieved.

Combining the resonant cavity and the SACM structure, high-performance APDs with relatively high quantum efficiency, relatively high speed, relatively low dark current, relatively high gain-bandwidth products, and relatively low multiplication noise may be achieved.

The widespread development of optical fiber and other optical communication and data processing systems in the visible and near-infrared spectral regions has excited wide interest in solid-state avalanche photodiodes. Continuous effort has been made to understand the mechanism of this ionization process since the first successful avalanche theory was published. This theory is generally referred to as the local-field theory. A main assumption of the local-field theory is that impact ionization is a continuous, local process, and that ionization probability only depends on the local electric field irrespective of a carrier's ionization history. This theory has been widely accepted and has proved to be an extremely useful model for a wide variety of avalanche devices.

In the conventional theory, two parameters, ionization coefficients α and β, may be introduced to describe the ionization probability density of electrons and holes in a material. In other words, in an element distance dx, the probability for an electron to cause an impact ionization event is αdx, and the corresponding probability for a hole is βdx. The assumption of locality may be the most important approximation in this theory, and this assumption may greatly simplify calculations. Under this assumption, the ionization coefficients are functions of the position in a specific structure under a given bias. Since excessive defects may cause a premature breakdown, it may be reasonable to assume that the carrier recombination in the depletion region may be negligible when a device exhibits good gain characteristics.

Figure 8A:
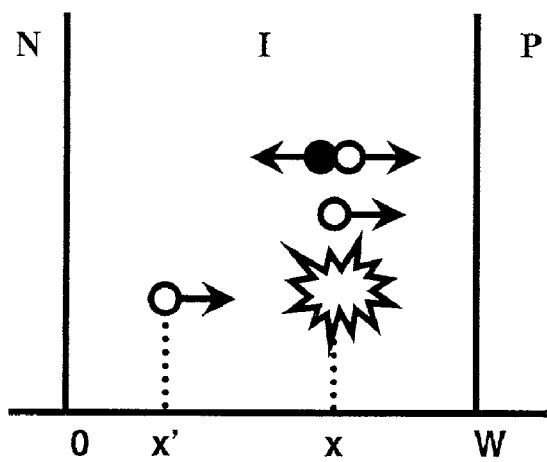
FIG. 8a depicts a schematic of spatial notation for holes in conventional local-field multiplication theory.
Figure 8B:
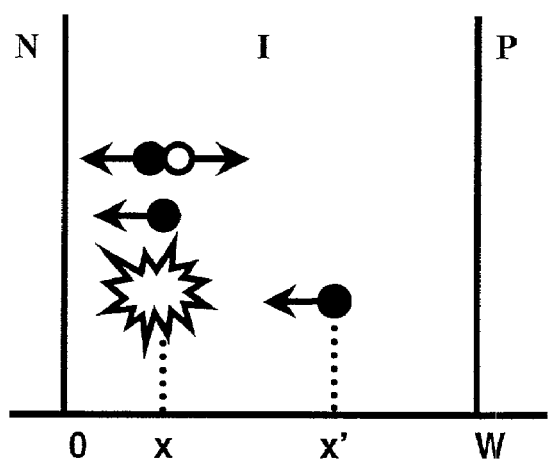
FIG. 8b depicts a schematic of spatial notation for electrons in conventional local-field multiplication theory.

The gain calculation in the local-field avalanche theory may start from the consideration of an electron-hole pair injected at x' within the depletion region. M(x') may be used to represent the gain or average total number of pairs that may be generated in the multiplication region as a result of the original pair injected at x'. Since this pair may eventually reach the boundaries of the multiplication region, its contribution to the gain may be 1. On its way to the boundary, the electron may have a probability of α(x)dx to generate another electron-hole pair at x within a distance element dx. FIGS. 8*a* and 8*b* illustrate schematic diagrams of spatial notation for holes and electrons, respectively, in conventional local-field multiplication theory. In FIGS. 8*a* and 8*b*, holes are indicated by open circles, and electrons are indicated by filled circles. As shown in these Figures, carriers may be created at x' and ionization may occur at x.

This new pair may initiate another reaction chain with a gain of M(x), and its contribution to the total gain is M(x)α(x)dx. After integrating all the ionization probabilities of the initial electron and hole, $$M(x') = 1 + \int_0^{x'} dx M(x)\alpha(x) + \int_{x'}^{w} dx M(x)\beta(x). \tag{28}$$

Differentiating, $$\frac{dM(x')}{dx'} = (\alpha(x') - \beta(x'))M(x'). \tag{29}$$

The solution is $$M(x') = M(0)\exp\left[\int_0^{x'} dx(\alpha(x) - \beta(x))\right] \tag{30}$$
$$= M(w)\exp\left[-\int_{x'}^{w} dx(\alpha(x) - \beta(x))\right].$$

Substituting Equation 30 into Equation 28 and setting x=w, may determine the value of M(w). This gives $$M(x') = \frac{\exp\left[-\int_{x'}^{w} dx(\alpha(x) - \beta(x))\right]}{1 - \int_0^{w} dx\alpha(x)\exp[-\int_{x}^{w} dx''(\alpha(x'') - \beta(x''))]}. \tag{31}$$

In 1966, R. J. McIntyre proposed the first successful multiplication noise theory based on the locality assumption.

This theory has been widely accepted and has been proven to be a useful model for a wide variety of avalanche devices. The consideration of avalanche noise may start from the pairs generated in a distance element dx. Since carriers may be always generated in pairs, only electrons or holes may be counted. The change of the hole current $I_p$ in dx is $$dI_p = (\alpha I_n + \beta I_p + g)dx, \quad (32)$$

where $I_n$ is the electron current and g is the thermal or optical generation rate in dx. In a bandwidth element df, the shot noise of this current increment may be given by $$\langle [dI_p - \langle dI_p \rangle]^2 \rangle = 2edI_p df. \quad (33)$$

Normally, the multiplication noise may be described in terms of the noise spectral density with units of $A^2$/Hz. Since this element of noise current may experience the same multiplication as any other current generated in dx, its contribution to the total noise spectral density $\phi$ may be $$d\phi(x) = \frac{\langle [M(x)dI_p - \langle M(x)dI_p \rangle]^2 \rangle}{df} = 2eM^2(x)dI_p(x). \quad (34)$$

Integration yields $$\phi = 2e\left[I_p(0)M^2(0) + I_n(w)M^2(w) + \int_0^w dx \frac{dI_p}{dx} M^2(x)\right], \quad (35)$$

where $I_p(0)$ and $I_n(w)$ are the hole and electron currents, respectively, that may arise from injection at the boundaries. Solving provides a complete expression for the total noise spectral density $$\phi = 4e\left[I_p(0)M^2(0) + I_n(w)M^2(w) + \int_0^w dxg(x)M^2(x)\right] + \quad (36)$$
$$2eI\left[2\int_0^w dx\alpha M^2(x) - M^2(0)\right],$$

where I is the total current. With M(x) obtained in the above gain calculation, the total current may be expressed as $$I = I_p(0)M(0) + I_n(w)M(w) + \int_0^w dxg(x)M(x). \quad (37)$$

In the case where $\beta = k\alpha$ (k is a constant$\neq$1), $\phi$ may be simplified:

$$\phi = 4e\left[I_p(0)M^2(0) + I_n(w)M^2(w) + \int_0^w dxg(x)M^2(x)\right] + \quad (38)$$
$$\frac{2eI}{1-k}[kM^2(w) - M^2(0)].$$

Assuming k<1, we get M(w)>M(0). Then, the noise of a given injection current $I_0$ under a specific gain $M=I/I_0$ may be minimized under pure electron injection, in which g(x)=0. Under this condition, $$\phi = 2eI_n(w)M^3(w)\left[1 - (1-k)\left(\frac{M-1}{M}\right)^2\right] \quad (39)$$
$$= 2eI_n(w)M^2(w)\left[kM + (1-k)\left(2 - \frac{1}{M}\right)\right].$$

The excess noise factor F(M) may be used to represent the noise figure of merit of an avalanche device.

$$F(M) = kM + (1-k)\left(2 - \frac{1}{M}\right). \quad (40)$$

For pure hole injection, the noise and the excess noise factor may be obtained by substituting 1/k for k.

Figure 9:
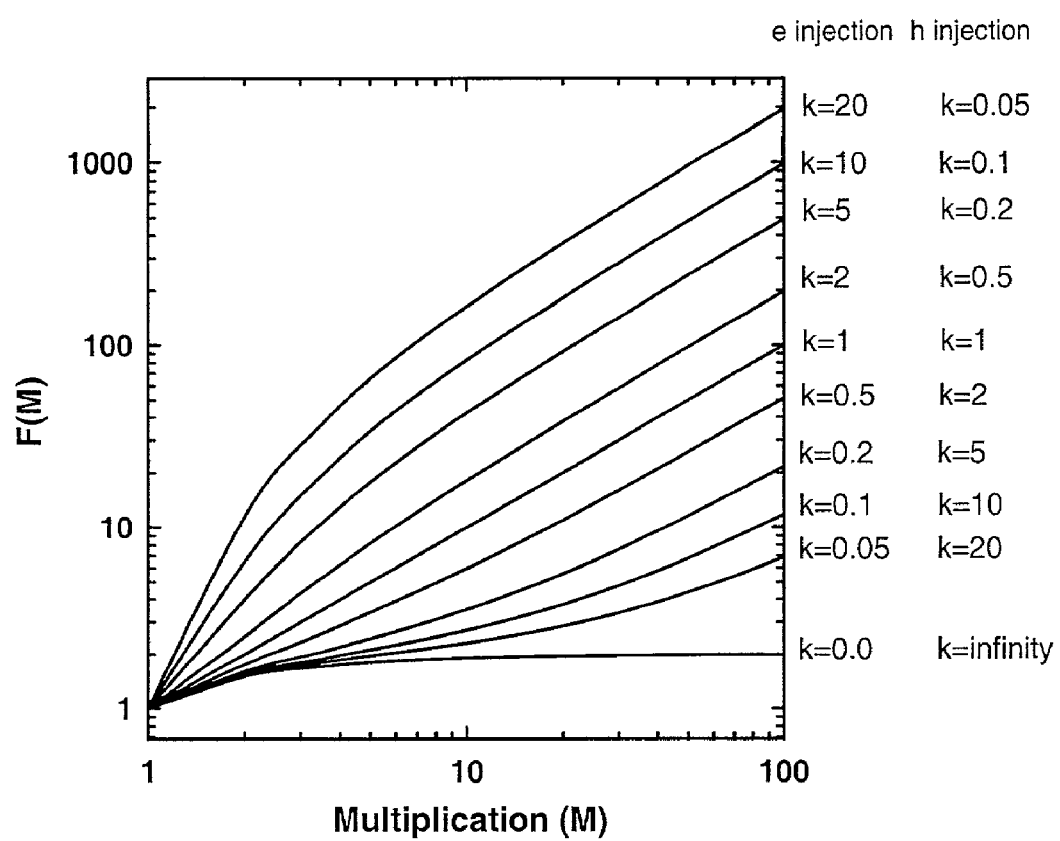
FIG. 9 depicts a plot of excess noise factors as a function of gain for different k's.

Excess noise factor, F(M), may be plotted as a function of gain for different k's for pure electron and hole injections if $\beta = k\alpha$, as shown in FIG. 9. As shown in FIG. 9, the avalanche noise at a given gain M may be less if most carriers that enter the multiplication region are those with higher ionization coefficients (for example, electrons in Si and GaAs, holes in InP). The strong dependence of the noise on the k value may also be demonstrated in FIG. 9. Under the injection of carriers with higher ionization coefficient, the avalanche noise may increase as the k value approaches unity.

Equations to calculate the bandwidth of avalanche photodiodes have also been developed within the framework of the local-field avalanche theory. The calculation of the transient current response of a PIN structure may start from the fluid equation $$\frac{\partial N(x,t)}{\partial t} = G(x,t) - \nabla \cdot J(x,t), \quad (41)$$

where N(x,t) is the particle density, G(x,t) is the generation rate per volume, and J(x,t) is the flux density. Applying this equation to the 1-D model shown in FIGS. 8a and 8b and considering electrons and holes separately, the time-dependent equations for electron density n(x,t), hole density p(n,t), electron current density $j_n$(x,t), and hole current density $j_p$(x,t) may be expressed as $$e\frac{\partial n(x,t)}{\partial t} = \gamma(x,t) + \frac{\partial j_n(x,t)}{\partial x} \quad (42)$$
$$e\frac{\partial p(x,t)}{\partial t} = \gamma(x,t) - \frac{\partial j_p(x,t)}{\partial x},$$

where e is the electron charge, and $\gamma$(x,t) is the local net e-h pair current generation rate density. Under normal operation, the i region may be fully depleted and electrons and holes may be driven by the electric field at the saturation velocities $v_n$ and $v_p$, respectively. The carrier diffusion in the i region may thus be negligible. With this saturation-velocity assumption, the Fourier transform of Equation 42 and subsequent integral over the area of the photodiode may be $$\frac{j\omega i_n(x, \omega)}{v_n} = g(x, \omega) + \frac{\partial i_n(x, \omega)}{\partial x} \quad (43)$$

$$\frac{j\omega i_p(x, \omega)}{v_p} = g(x, \omega) - \frac{\partial i_p(x, \omega)}{\partial x},$$

where g(x, ω) is the corresponding transform result of γ(x,t). The general solution with injection currents $i_n(w, \omega)$ and $i_p(0, \omega)$ from the boundaries may be expressed as $$i_n(x, \omega) = \quad (44)$$

$$i_n(w, \omega)\exp[-j\omega\tau_n(w|x)] + \int_x^w dx' g(x', \omega)\exp[-j\omega\tau_n(x'|x)]$$

$$i_p(x, \omega) = i_p(0, \omega)\exp[-j\omega\tau_n(0|x)] +$$

$$\int_0^x dx' g(x', \omega)\exp[-j\omega\tau_n(x'|x)],$$

where $$\tau_n(x'|x) = \int_x^{x'} \frac{dx''}{v_n(x'')}$$

and $$\tau_p(x'|x) = \int_{x'}^{x} \frac{dx''}{v_p(x'')}$$

are the transit-times of electrons and holes from x' to x. With the assumptions of locality and no optical generation in the multiplication region, the current density generation rate γ(x,t) in this region is $$\gamma(x,t) = \alpha(x)j_n(x,t) + \beta(x)j_p(x,t), \quad (45)$$

and the integral of its Fourier transform over the device surface gives $$g(x,\omega) = \alpha(x)i_n(x,\omega) + \beta(x)i_p(x,\omega). \quad (46)$$

Therefore, the two equations in Equation 44 are linked to each other by g(x,ω), and the electric field profile may be incorporated through α(x) and β(x) in these equations. The general analytical solution of Equation 44 with Equation 46 is quite complex, and details of the solution are known in the art. With this solution, the total current $i_{ac}$ in the junction, which includes both the carrier current and the displacement current, is $$i_{ac}(x, \omega) = i_n(x, \omega) + i_p(x, \omega) + \int ds \varepsilon \varepsilon_0 \frac{\partial E(x, \omega)}{\partial t}, \quad (47)$$

and $$d s \varepsilon \varepsilon_0 \frac{\partial E(x, \omega)}{\partial t}$$

is integrated across the junction interface. The current of interest is the external short-circuit current, which may be expressed as $$i(\omega) = \frac{1}{w}\int_0^w dx[i_n(x, \omega) + i_p(x, \omega)], \quad (48)$$

where the third term in Equation 47 is dropped because the dc bias applied across the device does not change with the input signal.

With the assumption used in Equation 45 that impact ionization may be the only carrier generation mechanism in the multiplication region, the alternating current at unity gain, $i_0(0, \omega)$, may be $$i_0(\omega) = i_n(w,\omega) + i_p(0,\omega). \quad (49)$$

Based upon this definition, the ac gain of the device M(ω) is $$M(\omega) = \frac{i(\omega)}{i_0(\omega)}, \quad (50)$$

and the dc gain M(ω=0) under pure electron or hole injection, which may be calculated with Equation 31 (M(x=0) or M(x=w)), may also be expressed as $$M(\omega = 0) = \lim_{\omega \to 0} M(\omega) = \lim_{\omega \to 0} \frac{i(\omega)}{i_0(\omega)}. \quad (51)$$

With these concepts, the frequency response figure of merit F(ω) of an APD may be defined as $$F(\omega) = \left|\frac{M(\omega)}{M(\omega = 0)}\right| = \left|\frac{i(\omega)}{M(\omega = 0)i_0(\omega)}\right|. \quad (52)$$

Figure 10:
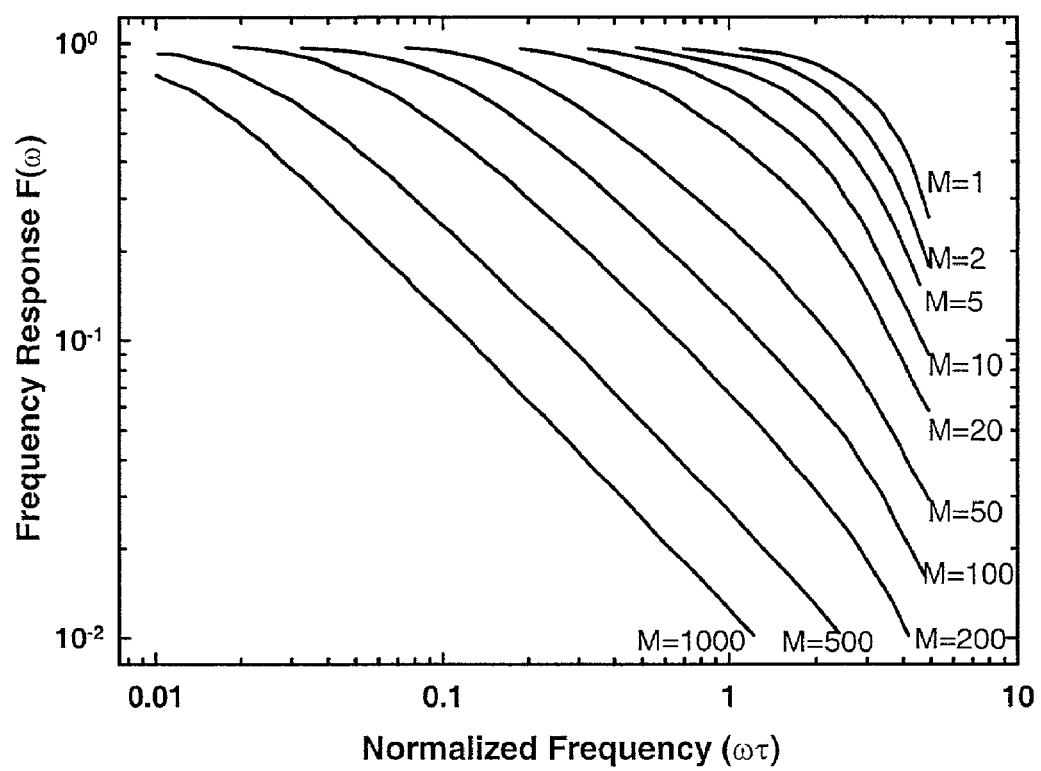
FIG. 10 depicts frequency response of an avalanche photodiode with $\beta/\alpha=0.1$ under pure electron injection.
Figure 11:
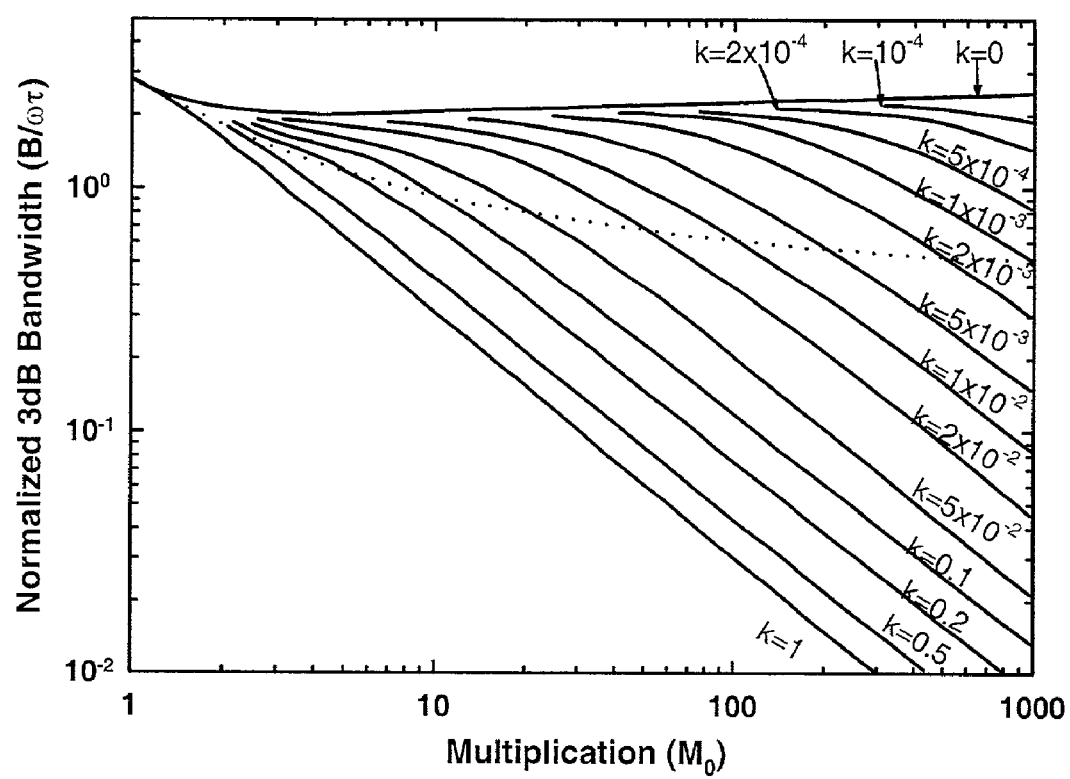
FIG. 11 depicts bandwidth as a function of avalanche gain at different k values in a PIN structure.

Since the analytic solution of Equation 44 may be quite complicated, a more revealing summary may be shown in FIGS. 10 and 11, which are plots of the numerical results of the solution. For simplicity, saturation velocities of electrons and holes are assumed to be substantially equal. FIG. 10 illustrates the frequency response of an APD with β/α=0.1 under pure electron injection at different dc gain M versus the normalized frequency ωτ, where τ is the carrier transit time. As shown in FIG. 10, bandwidth may decrease as the gain increases. FIG. 11 illustrates the bandwidth as a function of avalanche gain at different k values in a PIN structure. The dotted line in FIG. 11 is the M=α/β curve. FIG. 11 illustrates the influence of the k=β/α value to the 3 dB bandwidth of an APD. The M=α/β curve superimposed on these curves illustrates that multiplication may have little effect on bandwidth when M<α/β. For M>α/β, the curves may be nearly straight lines thereby indicating a constant gain-bandwidth product, which may also strongly depend on the β/α value. As further illustrated in FIG. 11, a higher gain-bandwidth product may be expected in a device with a lower β/α value under pure electron injection.

A simple physical picture may be obtained in extreme cases. For example, in the best case, where k is greater than or equal to about 0, a duration of the response may be the sum of the transit times of an electron and a hole through the depletion region. While in the worst case, where k is greater than or equal to about 1, secondary carriers may continuously recycle through the multiplication region, which may result in relatively long response times at high gains. Such a long avalanche buildup time, which gives rise to the constant gain-bandwidth product, may determine the frequency response at high gains. Therefore, the gain-bandwidth product may be greater in APDs that include materials having smaller ionization coefficient ratios (assuming α>β).

As described herein, ionization coefficients of electrons and holes of the multiplication-region material, especially the ratio of the ionization coefficients, may largely determine the gain, noise and bandwidth of substantially the entire APD structure. To characterize ionization properties of materials, a series of measurement methods may be determined based on the conventional avalanche theory. In most cases, the avalanche gains under different injection conditions, for example, pure electron and pure hole injections, may be utilized. Several measurement methods are known in the art. However, only two structures, PIN junctions and abrupt PN junctions, may be commonly used in such measurements.

The simplest configuration for measurement and analysis may be a PIN structure such as the PIN photodiode shown in FIG. 1. Near the breakdown voltage, the i region may be fully depleted, and the electric field may be substantially uniform across this region. Since α(x) and β(x) may be constant throughout the high-field region in this case, Equation 31 may be greatly simplified. The electron-injection gain M(w,V) and hole-injection gain M(0,V) as functions of the reverse bias may be given by $$M(w, V) = \frac{\alpha - \beta}{\alpha \exp[-(\alpha - \beta)w] - \beta} \quad (53)$$

$$M(0, V) = \frac{\beta - \alpha}{\alpha \exp[-(\beta - \alpha)w] - \alpha},$$

where α=α(E)=α(V/w) and β=β(E)=β(V/w). After measurement of the two gains, α(E) and β(E) may be solved as $$\alpha(E) - \beta(E) = \frac{1}{w} \ln\left(\frac{M(w, V)}{M(0, V)}\right) \quad (54)$$

$$\alpha(E) = \frac{1}{w}\left(\frac{M(w, V) - 1}{M(0, V) - M(w, V)}\right)\ln\left(\frac{M(w, V)}{M(0, V)}\right)$$

$$\beta(E) = \frac{1}{w}\left(\frac{M(w, V) - 1}{M(0, V) - M(w, V)}\right)\ln\left(\frac{M(w, V)}{M(0, V)}\right)$$

$$E = \frac{V}{w}.$$

Figure 12:
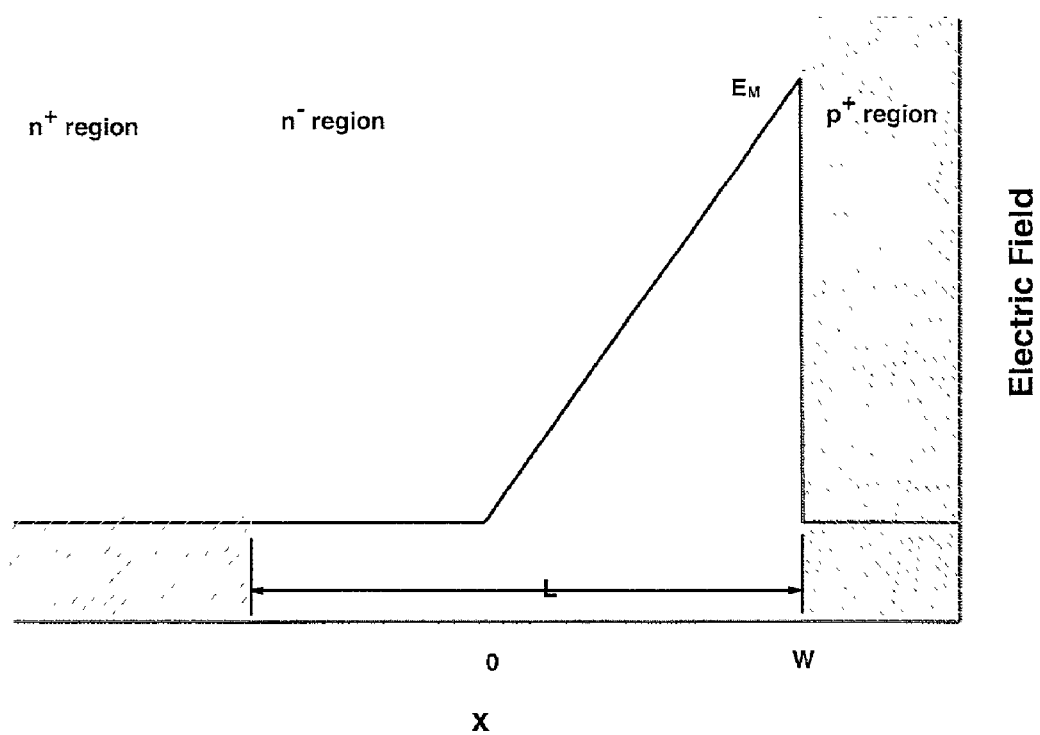
FIG. 12 depicts a schematic of an abrupt PN junction used for determining electron and hole ionization coefficients from photo-multiplication measurements.

Due to limitations of growth techniques, early ionization coefficient measurements were generally performed on an abrupt PN structure. FIG. 12 illustrates a schematic of an abrupt PN junction that may be used for determining electron and hole ionization coefficients from photo-multiplication measurements. In the structure shown in FIG. 12, the depletion region thickness w may be shorter than that of the n region L. In addition, the electric field, E(x), and its maximum, $E_M$, may also be determined by the applied bias V. Using Poisson's equation, we may obtain the following equations $$w_0 = \left(\frac{2\varepsilon_0 \varepsilon}{eN}\right)^{1/2} \quad (55)$$

$$V_D = \frac{k_B T}{e} \ln\left(\frac{N_{n+}N_{p+}}{n_i^2}\right)$$

$$w = w_0(V + V_D)^{1/2}$$

$$E_M = \frac{2}{w_0}(V + V_D)^{1/2}$$

$$E(x) = E_M\left(1 - \frac{x}{w}\right),$$

where $V_D$ is the built-in bias between the p⁺ and n⁺ regions, $w_0$ is a constant used to simplify the presentation, and N, $N_{n+}$, and $N_{p+}$ are the doping levels in the n⁻, n⁺ and p⁺ regions, respectively. As before, e is the electron charge, while $\varepsilon_0$ and $\varepsilon$ are the static dielectric constants of vacuum and the semiconductor, respectively. Similar to the calculation for PIN junctions, the electron-injection gain M(w,V) and hole-injection gain M(0, V) may be represented by α and β. Solving these two equations, we may calculate the ionization coefficients with measured gain curves $$\beta(E_M) = E_M \frac{1}{M(0, V)M(w, V)} \frac{dM(0, V)}{dV} \quad (56)$$

$$\alpha(E_M) = E_M\left[\frac{1}{M(w, V)}\frac{dM(w, V)}{dV} - \frac{1}{M(0, V)}\frac{dM(0, V)}{dV}\right] + \beta(E_M).$$

The above two methods may be based on measurements of gain under pure electron injection and hole injection. The two curves may be relatively close to each other, and the calculation in Equations 54 and 56 may depend on the difference between the two gain curves. Therefore, the accuracy of the final result may be subject to the influence of many factors in the experiment. To avoid deviations caused by variations in crystal growth, the two gain curves may be measured on the same device. An appropriate device for such measurement may include heterojunctions, which may result in a higher-than-zero punch-through voltage. As such, it may be difficult to determine the unity-gain reference. In this context, gain and noise measurements may be made under pure electron or hole injection to determine the ionization coefficients of electrons and holes in the region where the local-field avalanche theory may be effective. In the following derivation, pure electron injection, which may be used in the measurements of most III-V semiconductors, will be considered. The equations for pure hole injection may be deduced similarly.

In a PIN structure as shown in FIG. 1, an electric field may be constant in the intrinsic region. According to Equation 53, the gain under pure electron injection may be written as $$M(w, V) = \frac{\alpha - \beta}{\alpha \exp[-(\alpha - \beta)w] - \beta} = \frac{1}{1 - \frac{1}{1-k}[1 - \exp[-w\alpha(1-k)]]}. \quad (57)$$

In the noise measurement, the physical parameter obtained is the noise power spectral density S. According to Equations 36 and 40, it may be given by $$S = 2eI_o M^2 F(M) R(\omega) \quad (58)$$

$$F(M) = kM + (1-k)\left(2 - \frac{1}{M}\right),$$

where M is the gain M(w,V). From the noise measurement, k near breakdown may be determined according to Equation 58. Since the electric field range in which an APD has a considerable gain may be relatively narrow, k may be considered constant in the range, where the avalanche noise is measured as a function of gain. Then, combined with Equation 57, the ionization coefficients $\alpha(E)$ and $\beta(E)$ may be calculated by $$\alpha = \frac{-\ln\left[1 - \frac{(M(w, V) - 1)(1 - k)}{M(w, V)}\right]}{(1-k)w} \quad (59)$$

$$\beta = k\alpha$$

$$V = Ew.$$

Since the 1960's, significant work has been devoted to understanding the avalanche process, and the ionization characteristics of most semiconductors have been measured with at least one of the methods mentioned above. Following is a brief review of the reported ionization coefficients of Si, GaAs, $Al_xGa_{1-x}As$, $In_{0.52}Al_{0.48}As$, and InP.

Figure 13:
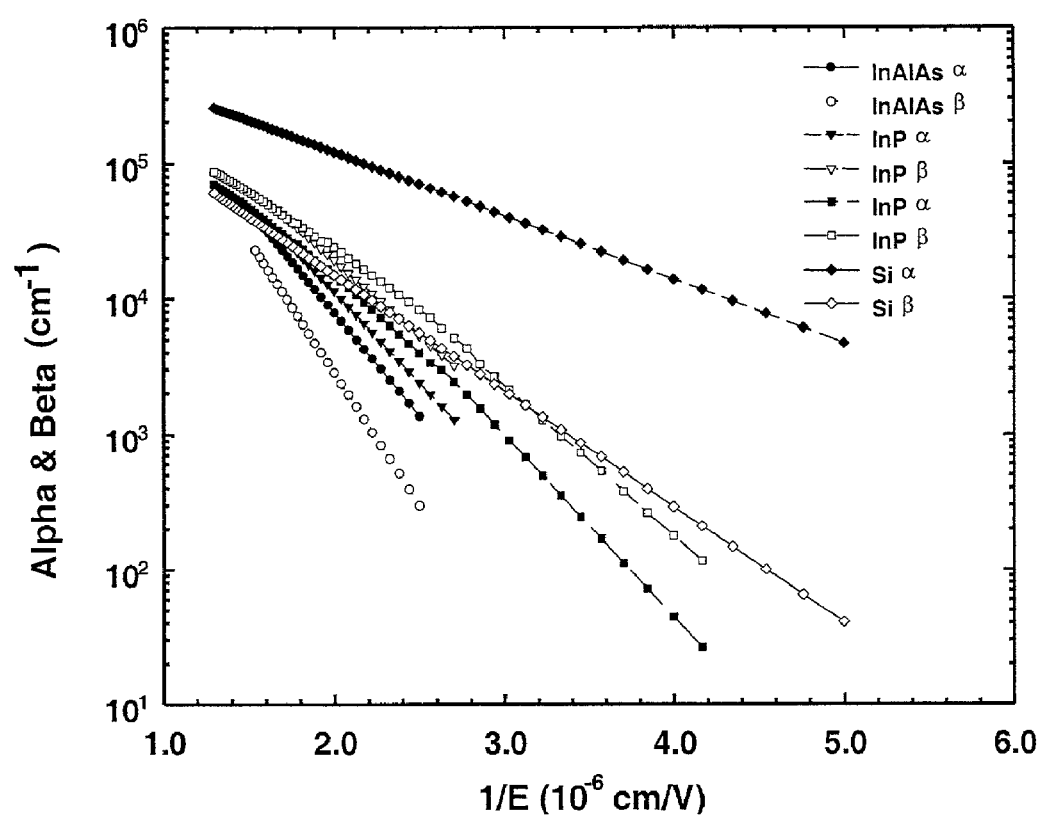
FIG. 13 depicts ionization coefficients of Si, InP, and InAlAs as a function of electric field.
Figure 14:
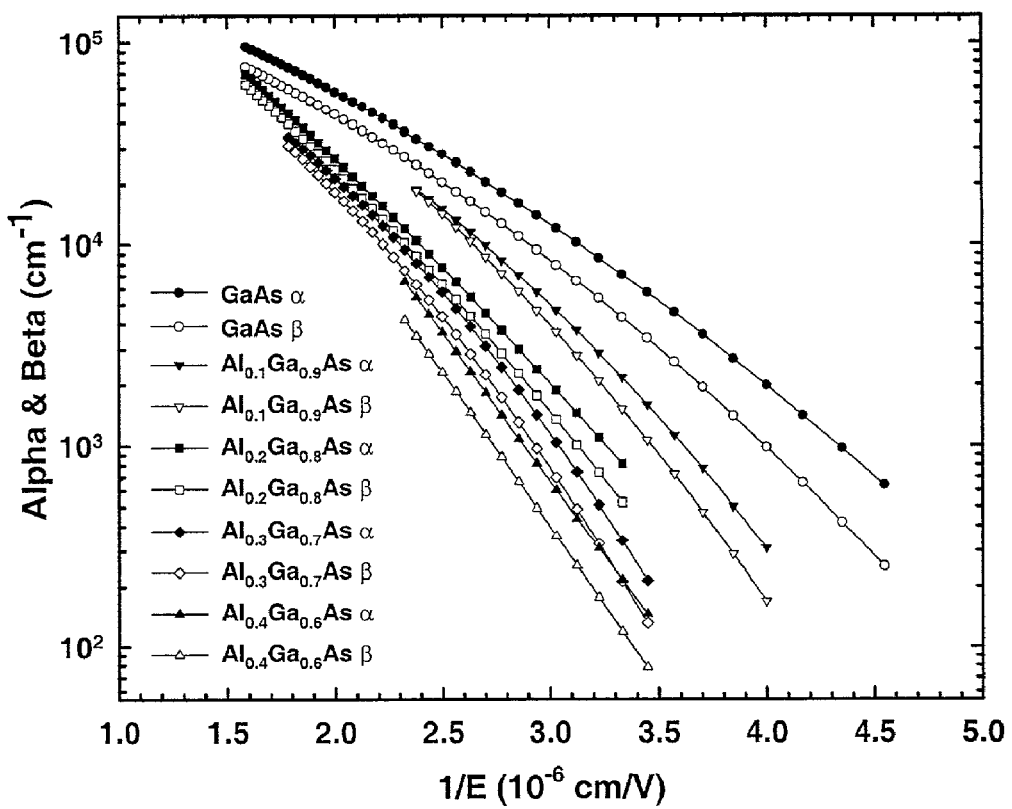
FIG. 14 depicts ionization coefficients of GaAs and $Al_xGa_{1-x}As$ as a function of electric field.

In the framework of the local-field avalanche theory, the ionization coefficients may be assumed to be functions of only a local electric field. A widely used parameterization is given by $$\alpha(E) = A_e \exp\left[-\left(\frac{E_{c,e}}{E}\right)^{m_e}\right] \quad (60)$$

$$\beta(E) = A_h \exp\left[-\left(\frac{E_{c,h}}{E}\right)^{m_h}\right].$$

where E is the local electric field, and $A_e$, $A_h$, $E_{c,e}$, $E_{c,h}$, $m_e$, and $m_h$ are constants. The reported parameters of the ionization coefficients of Si, GaAs, $Al_xGa_{1-x}As$, $In_{0.52}Al_{0.48}As$, and InP are listed in Table 1. The parameters for ionization characteristics are of semiconductors in (100) orientation. According to these values, the ionization coefficients are plotted in FIGS. 13 and 14 as functions of 1/E. FIG. 13 illustrates ionization coefficients of Si, InP, and InAlAs as a function of electric field. FIG. 14 illustrates ionization coefficients of GaAs and $Al_xGa_{1-x}As$ as a function of electric field. These plots illustrate that for every material listed here a larger difference between $\alpha$ and $\beta$ may be obtained at relatively low electric field intensities. In addition, silicon demonstrates an extremely low k value. For semiconductors with $\alpha > \beta$, lower k's may be expected in a low electric field. Based on this observation and the local-field theory, the multiplication region may need to keep a relatively low near-breakdown electric field for low avalanche noise and high gain-bandwidth product. Consequently, for a long time, APD designs may have favored long multiplication regions to keep the electric field low.

TABLE 1

| Material | Carrier Type | A ($10^5$ cm$^{-1}$) | $E_c$ ($10^5$ V/cm) | M | k = β/α | E Range ($10^5$ V/cm) |
|---|---|---|---|---|---|---|
| Si | e | 10.4 | 10.8 | 1.0 | 0.0086~ | 2.0–5.0 |
|  | h | 7.7 | 19.7 | 1.0 | 0.12 |  |
| GaAs | e | 2.99 | 6.85 | 1.6 | 0.40~ | 2.2–6.3 |
|  | h | 2.22 | 6.57 | 1.75 | 0.77 |  |
| $Al_{0.1}Ga_{0.9}As$ | e | 1.81 | 6.31 | 2.0 | 0.54~ | 2.5–4.2 |
|  | h | 3.05 | 7.22 | 1.9 | 0.98 |  |
| $Al_{0.2}Ga_{0.8}As$ | e | 10.9 | 13.7 | 1.3 | 0.64~ | 3.0–6.3 |
|  | h | 6.45 | 11.1 | 1.5 | 0.89 |  |
| $Al_{0.3}Ga_{0.7}As$ | e | 2.21 | 7.64 | 2.0 | 0.61~ | 2.9–5.6 |
|  | h | 2.79 | 8.47 | 1.9 | 0.90 |  |
| $Al_{0.4}Ga_{0.6}As$ | e | 174 | 33.9 | 1.0 | 0.54~ | 2.9–4.3 |
|  | h | 30.6 | 20.7 | 1.2 | 0.64 |  |
| $In_{0.52}Al_{0.48}As$ | e | 86 | 35 | 1.0 | 0.29~ | 4.0–6.5 |
|  | h | 230 | 45 | 1.0 | 0.50 |  |
| InP | e | 55.5 | 31.0 | 1.0 | 1.42~ | 3.7–6.0 |
|  | h | 32.1 | 25.6 | 1.0 | 2.49 |  |
| InP | e | 112 | 31.1 | 1.0 | 1.87~ | 2.4–3.8 |
|  | h | 47.9 | 25.5 | 1.0 | 4.41 |  |
|  | e | 29.3 | 26.4 | 1.0 | 1.43~ | 3.6–5.6 |
|  | h | 16.2 | 21.1 | 1.0 | 2.41 |  |
|  | e | 2.32 | 8.46 | 2.0 | 1.25~ | 5.3–7.7 |
|  | h | 2.48 | 7.89 | 2.0 | 1.49 |  |

Photodiode sensitivity may be an issue in long-haul fiber optic communications. As discussed above, SACM APDs may provide higher avalanche gain, lower dark current and better sensitivity compared to PINs. The common design process for a SACM APD may start with material selection of the absorption region for the specified operation wavelength. Due to the availability of semiconductor substrates and formation or growth techniques, this selection may be limited. The substrate may be determined depending on the selected absorption layer. For example, since the multiplication layer may seldom be thinner than about 0.1 μm, a lattice match may reduce, and even avoid, a high defect density. To apply a relatively high electric field to this region and suppress tunneling current, the bandgap of the multiplication layer may be larger than the bandgap of the absorption region. Appropriate candidates for GaAs-based devices may include, but are not limited to, GaAs and $Al_xGa_{1-x}As$, and appropriate candidates for InP-based devices may include, but are not limited to, InP-based devices which may use either InP or $In_{0.52}Al_{0.48}As$.

On the other hand, a multiplication layer may largely determine the performance of substantially an entire SACM APD structure. For example, impact ionization may occur in this layer and may provide avalanche gain. Secondary carriers may be generated in the ionization process, and transport of the secondary carriers may take longer than that of initially injected carriers. As shown herein, the bandwidth of APDs may be greatly influenced by this region. In addition, as described in Equation 39, multiplication noise may increase with gain and may be an important noise source in an optical receiver. Therefore, the ionization process may be investigated to optimize the structure of the multiplication region.

As discussed herein, reducing a k value for a multiplication region may reduce avalanche noise and may increase bandwidth. Most semiconductors may demonstrate larger differences between α and β at lower electric fields. Historically, a common design strategy for high-performance APDs may be to increase a length of multiplication regions and to reduce electric fields to reduce, and/or to maintain a low, k.

This design strategy was not challenged until the end of the 1980's. Since then, relatively low noise and relatively high gain-bandwidth products were reported on devices with relatively thin multiplication regions of various semiconductors. To describe or parameterize this phenomenon, several models have been proposed. Due to the strong influence of the local-field theory, there has been no systematic experimental investigation of the effect of reducing the thickness of the multiplication region. All of the observations mentioned above, however, suggest that either the conventional avalanche theory or the reported ionization coefficients may not be applied to relatively thin multiplication regions.

Since ionization coefficients may not be measured directly, reported values of ionization coefficients may be based on a multiplication theory and measurement of some physical parameter such as gain or noise. As described herein, traditional methods for measuring gain curves under pure electron injection and hole injection may be relatively sensitive to experimental errors. As further described herein, the gain and noise of PINs under pure electron injection (or pure hole injection for InP) were measured. According to Equation 58 in the conventional avalanche theory, the excess noise factor and the k value were calculated.

Figure 15:
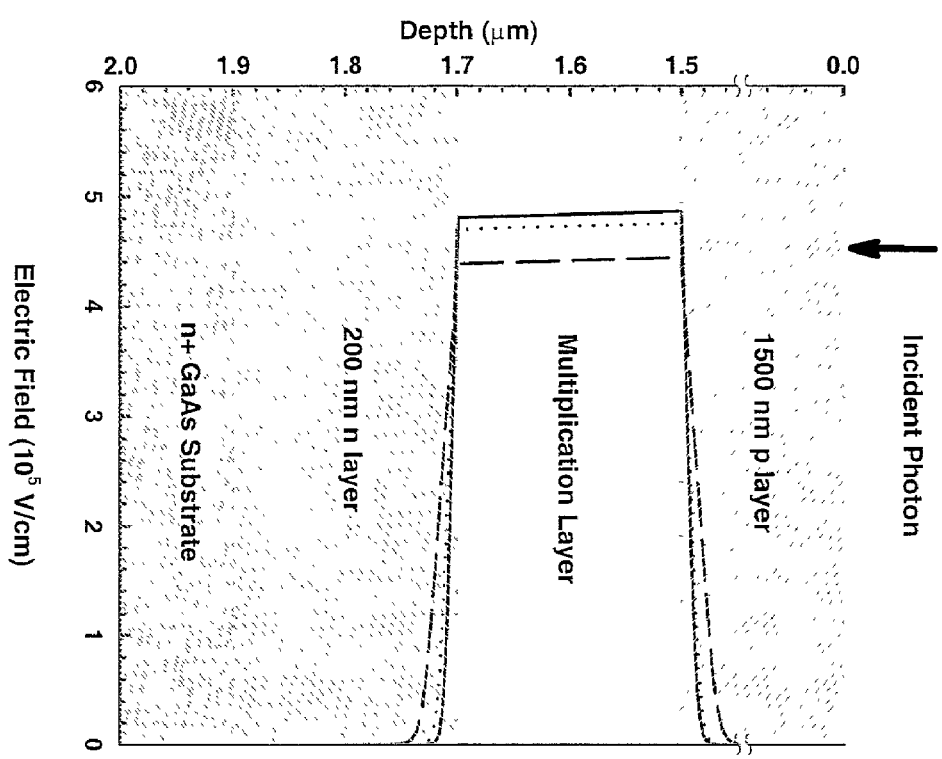
FIG. 15 depicts a homojunction PIN structure used in gain and noise measurements.

Homojunction PINs were used for the simplicity of process and analysis. A typical PIN structure employed in this study is shown in FIG. 15. As shown in FIG. 15, the solid, dotted, and dashed lines show the near-breakdown electric field profile of the devices with n and p doping levels at $4\times10^{18}$, $2\times10^{18}$, and $1\times10^{18}$ cm$^{-3}$, respectively. In most semiconductors such as GaAs, $Al_xGa_{1-x}As$, and $In_{0.52}Al_{0.48}As$ the ionization coefficient of an electron, α, may be greater than that of a hole, β. According to Equation 40 and FIG. 9, the lowest multiplication noise may be achieved under pure electron injection. In the device shown in FIG. 15, the injected electrons may be generated by incident photons. To ensure pure electron injection, a thickness of the absorptive p layer may need to be much larger than the absorption length of the photons.

On the other hand, the device quantum efficiency may need to be high enough to ensure measurement accuracy. To achieve such a quantum efficiency, a thickness of the p region may be comparable to the diffusion length of the minority carriers. So, there may be a tradeoff in the thickness of the p region. Because holes demonstrate a higher ionization coefficient than electrons in InP, a similar NIP structure was designed for InP devices to ensure pure hole injection.

The devices described herein were designed such that the external quantum efficiency, $\eta_{ext}$, may be approximately 5% and not less than about 0.5% and such that the ratio of the unwanted carrier injection may be lower than about 1%. By assuming that substantially every photon not absorbed in the p region may generate a hole that may be injected into the multiplication region, an upper limit of the ratio of unwanted carrier injection $R_h$ may be obtained from $$R_h = \frac{I_h}{I_{total}} < \frac{(1-R)e^{-\alpha_0 d}}{\eta_{ext}}, \quad (61)$$

where R is the reflectivity of the top surface, $\alpha_o$ is the optical absorption coefficient, and d is the thickness of the p region. $R_h$ may be relatively low (e.g., less than about 1%), and injected carriers may be primarily injected from the top p layer. Using the coordinate system as shown in FIG. 15, the collection efficiency, $\eta_c(x)$, of an electron generated at x between 0 and d may be $$\eta_c = \exp\left(-\frac{d-x}{L_e}\right), \quad (62)$$

where $L_e$ is the minority carrier diffusion length in the p layer. Thus, the overall quantum efficiency, $\eta_{ext}$, may be estimated with $$\eta_{ext} = (1-R)\int_0^d dx\alpha_o \exp(-\alpha_o x)\eta_c(x) \quad (63)$$

$$\approx \frac{\alpha_o L_e}{1-\alpha_o L_e}\left(\exp(-\alpha_o d) - \exp\left(-\frac{d}{L_e}\right)\right) + \exp(\alpha_o d).$$

Due to variations in crystal growth conditions, minority carrier diffusion length in the p layer may vary over a wide range, and it may be difficult to accurately calculate the quantum efficiency before growth. Therefore, in practice, a thickness between about 0.75 μm and about 1.5 μm, according to the calculation of the mixed-carrier-injection ratio, may be used and tuned later if quantum efficiency was found to be much lower.

To increase accuracy of experimentation, quantum efficiency may be increased and the mixed-injection ratio may be reduced. As such, an optical absorption length may be shorter than the minority carrier diffusion length. Alternatively, if the absorption length is too long or if the diffusion length is too short, a wavelength of an optical source used in the experimentation may be reduced to reduce the absorption length. A thickness of the p layer thickness may be altered in response to the reduced wavelength of the optical source. An appropriate optical source may include, but is not limited to, a continuous-wave ("cw") laser having a wavelength of about 630 nm, about 530 nm, or about 350–365 nm. Table 2 lists reported optical data, including the optical absorption coefficient $\alpha_o$, the optical absorption length $L_o$, the typical p-layer thickness d, and the top-layer photon leakage $e^{-\alpha_o d}$ at these wavelengths for most devices.

doping levels on the sides may be increased. The doping levels, however, may be restricted to maintain good crystal quality. Examples of appropriate doping levels may be approximately $1 \times 10^{18}$ cm$^{-3}$ to approximately $5 \times 10^{18}$ cm$^{-3}$. To form a good top contact, a relatively thin (e.g., about 20 nm to about 50 nm) GaAs or In$_{0.53}$Ga$_{0.47}$As layer with relatively high doping (e.g., greater than about $10^{19}$ cm$^{-3}$) may be grown at the end of the MBE growth for a GaAs-based or InP-based device. Since bandwidth may not be a concern in these devices, an appropriate ohmic contact may be a bottom contact that may cover substantially an entire chip surface except the mesa area.

Due to availability of semiconductor substrates and formation and/or growth techniques, devices may be typically GaAs-based or InP-based. GaAs and Al$_x$Ga$_{1-x}$As may be lattice-matched to GaAs substrates. Typically, GaAs-based

TABLE 2

| Material | Wavelength (nm) | Absorption Coefficient ($\mu$m$^{-1}$) | Absorption Length ($\mu$m) | Typical Thickness ($\mu$m) | Photon Leakage $e^{-\alpha_o d}$ |
|---|---|---|---|---|---|
| GaAs | 633 | 4.28 | 0.234 | 1.5 | $1.6 \times 10^{-3}$ |
|  | 532 | 7.46 | 0.134 |  | $1.4 \times 10^{-4}$ |
|  | 351~363 | 71.5 | 0.0140 |  | $2.6 \times 10^{-47}$ |
| Al$_{0.2}$Ga$_{0.8}$As | 633 | 2.39 | 0.418 | 1.5 | $2.8 \times 10^{-2}$ |
|  | 532 | 5.65 | 0.177 |  | $1.6 \times 10^{-3}$ |
|  | 351~363 | 72.9 | 0.0137 |  | $3.2 \times 10^{-48}$ |
| Al$_{0.4}$Ga$_{0.6}$As | 633 | 1.19 | 0.840 | 0.75 | 0.41 |
|  | 532 | 4.14 | 0.242 |  | 0.04 |
|  | 351~363 | 70.4 | 0.0142 |  | $1.2 \times 10^{-23}$ |
| Al$_{0.6}$Ga$_{0.4}$As | 633 | 0.001 | 10$^3$ | 0.75 | 0.99 |
|  | 532 | 2.94 | 0.340 |  | 0.11 |
|  | 351~363 | 60.4 | 0.0166 |  | $2.1 \times 10^{-20}$ |
| Al$_{0.8}$Ga$_{0.2}$As | 633 | — | — | 0.75 | — |
|  | 532 | 0.064 | 15.6 |  | 0.95 |
|  | 351~363 | 30.7 | 0.0326 |  | $1.0 \times 10^{-10}$ |
| Al$_{0.9}$Ga$_{0.1}$As | 633 | — | — | 0.75 | — |
|  | 532 | — | — |  | — |
|  | 351~363 | 10~20 | 0.1~0.05 |  | $5.5 \times 10^{-4}$~$3.1 \times 10^{-7}$ |
| InP | 633 | 6.43 | 0.156 | 0.75 | $8.0 \times 10^{-3}$ |
|  | 532 | 9.69 | 0.103 |  | $7.0 \times 10^{-4}$ |
|  | 351~363 | 71.0 | 0.0141 |  | $7.5 \times 10^{-24}$ |

Since InP and In$_{0.52}$Al$_{0.48}$As have a similar bandgap and dielectric constant, the corresponding data for In$_{0.52}$Al$_{0.48}$As may be estimated using the data of InP. Since the minority diffusion length in In$_{0.52}$Al$_{0.48}$As may be longer than that in InP, about 1.5 $\mu$m thick P layers may be used in InAlAs devices such that the mixed injection ratio under illumination at about 530 nm may be negligible. As shown in Table 2, a UV source (e.g., having a wavelength of about 350 nm to about 365 nm) may be appropriate for measuring Al$_x$Ga$_{1-x}$As (where x is greater than about 0.2) devices, and a YAG laser (having a wavelength of about 530 nm) may be appropriate for measuring other materials. For higher quantum efficiency, a He—Ne laser (having a wavelength of about 630 nm) may be used for measurements of GaAs devices.

Doping levels in the p and n regions may also be important in the design. As shown in FIG. 15, electric field profiles of devices with an about 0.2 $\mu$m thick intrinsic region and different doping levels on the two sides were simulated with Medici, commercially available from Technology Modeling Associates, Inc., Sunnyvale, Calif. For simplicity of analysis, the electric field in the i region may be restricted. On the other hand, the depletion approximation may not be accurate at the edges of the depletion region. To reduce this error, devices may operate at wavelengths between about 800 nm and about 900 nm by including GaAs or strained InGaAs as the absorption layer. Molecular beam epitaxy ("MBE") growth techniques may make it possible to grow a thin layer of self-aligned InGaAs quantum dots ("QD") on a GaAs substrate. Such GaAs devices may operate at wavelengths of about 1.0 $\mu$m to about 1.3 $\mu$m. For fiber optic applications at about 1.3 and about 1.55 $\mu$m, In$_{0.53}$Ga$_{0.47}$As, which may be lattice matched to InP substrates, may be used as the absorption material for an InP-based device. On such substrates, examples of an appropriate material for a multiplication region may include, but are not limited to, lattice-matched In$_{0.52}$Al$_{0.48}$As and lattice-matched InP. As discussed herein, the multiplication region of an APD may significantly affect the gain, multiplication noise, and gain-bandwidth product of the APD. To optimize this layer, the impact ionization characteristics of GaAs, Al$_x$Ga$_{1-x}$As, In$_{0.52}$Al$_{0.48}$As, and InP may be investigated.

To investigate multiplication characteristics of APDs with thin multiplication regions, a series of GaAs, Al$_x$Ga$_{1-x}$As, and InAlAs PIN homojunction devices may be grown in a molecular beam epitaxy reactor such as a solid-source Varian GEN II molecular beam epitaxy reactor on n$^+$ GaAs or InP substrates, and the InP devices may be grown on p$^+$ InP substrates. Si may be used as the n dopant, and Be may serve as the p dopant. The doping levels of each layer may be calibrated with Hall effect measurements, and the error may be conservatively estimated to be within about 50% due to run-to-run fluctuations. Reflection High-Energy Electron Diffraction ("RHEED") may be employed to calibrate a thickness of each layer.

Figure 16:
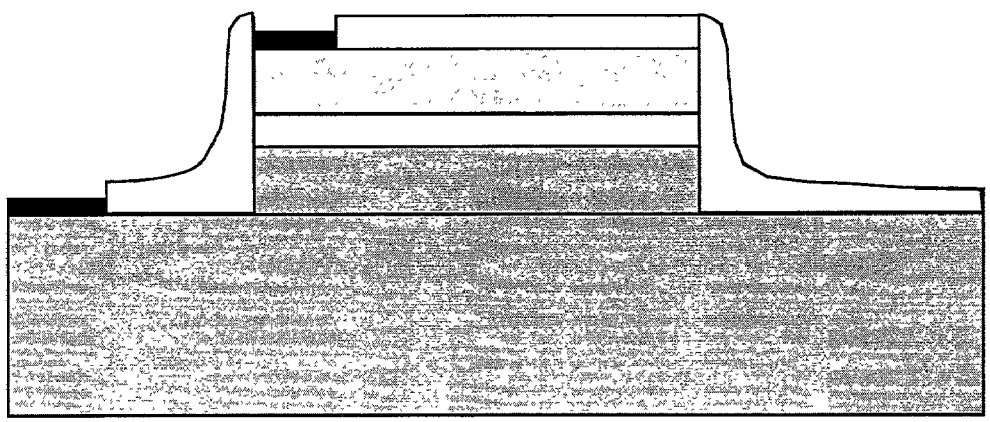
FIG. 16 depicts a partial cross-sectional view of a PIN structure used in gain and noise measurements.
Figure 17:
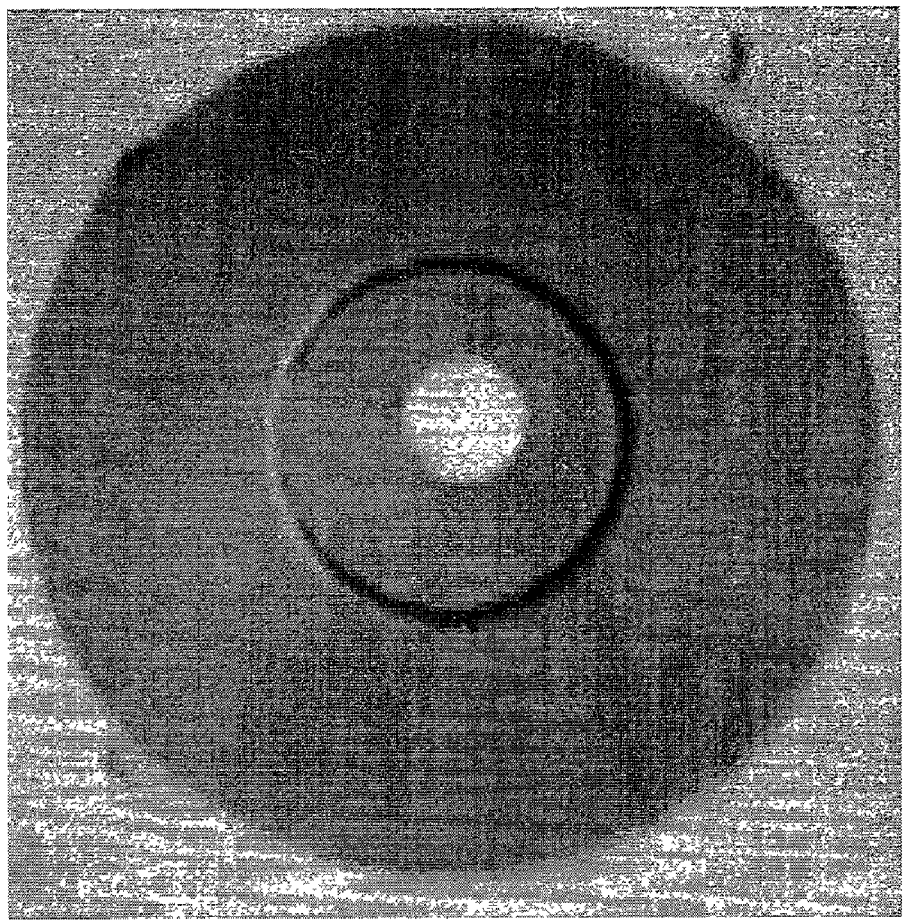
FIG. 17 depicts a top view of a PIN device after processing.

A cross section of a PIN device that may be used for gain and noise measurements is shown in FIG. 16. A top view of the PIN device is illustrated in FIG. 17.

Prior to the MBE growth, In may be used to mount the wafer to a growth chuck. After the growth, the backside of the as-grown wafer may be rough due to residual In coating. Since a relatively large amount of pressure may be applied to the wafer during subsequent photolithography on a contact aligner, uniformity of the pressure across the wafer may keep the wafer from breaking. To ensure good contact to the mask during exposure while maintaining the integrity of the wafer, In on the backside of the wafer may be removed or smoothed prior to the beginning of the process.

Since the melting point of In is about 156.6° C. in the atmosphere, the wafer may be heated, for example, on a hot plate at a temperature between about 200° C. and about 300° C. In on the backside of the wafer may then be removed or smoothed. The backside surface of the wafer may be covered with a substantially uniform relatively thin In layer. In addition, for some relatively large-area, mechanically weak substrates such as InP, wax bonding to a silicon wafer after Indium removal may reduce breakage of the wafer thereby increasing the final yield.

Solvent cleaning may be the most frequently used step in the process. For example, solvent cleaning may be performed prior to every photolithography step. The process may include rinsing a wafer in acetone, isopropyl alcohol ("ISO"), and de-ionized water ("DI") for 2 minutes each, and blowing the wafer dry in nitrogen.

Appropriate photoresists ("PR") may include, but are not limited to, AZ 5209 and 5214 commercially available from Clariant Corporation, Somerville, N.J., AZ 5214 is used as an example in the following description, but should not be considered limiting. After solvent cleaning, the wafer may be heated in an oven at a temperature of about 120° C. for about 10 minutes. Photoresist AZ 5214 may be spun on the wafer at a speed of about 4000 rpm for about 40 seconds. The wafer may be baked at about 90° C. for about 10 minutes. The wafer may be aligned to a mask using, for example, a Karl-Suss contact aligner. The wafer may be exposed for approximately 40 seconds under UV illumination. Development of the exposed wafer may take about 25 seconds.

Contacts may be formed on the wafer by the lift-off process. Before wet etching, the wafer may be heated during an additional post-bake at a temperature of about 120° C. for about 30 minutes to suppress undercut of the photoresist during wet etching. The resulting photoresist layer may be approximately 1.4 µm thick. A thickness of the photoresist layer may vary, however, depending on, for example, the photoresist and process conditions used for forming the photoresist layer. For example, a thinner (e.g., 0.9 µm thick) photoresist layer may be obtained with AZ 5209, and a lower spinning speed (e.g., about 2000 rpm) with AZ 5214 may produce a thicker photoresist layer (e.g., about 2.1 µm). In addition, other process conditions may be altered in response to a thickness of the resist. For example, exposing and developing times may be altered in response to a thickness of the resist.

The photoresists described above are positive resists. Image reversal, however, may also be achieved with these photoresists. For example, the wafer may be baked at a temperature of about 90° C. for approximately 1 minute after exposure with the mask as described above. After this baking step, the wafer may be exposed by flood exposure for approximately the same exposure time as the first exposure. In practice, subsequent development and other steps may be performed as described above.

Most contacts to III-V semiconductors may include Au. Since Au etchants may attack semiconductors, a lift-off process may be the primary method to form contacts to III-V semiconductors. If linewidth is reduced by such a lift-off process, such a linewidth reduction may be tolerable for most optoelectronic applications.

A contact pattern may be formed by photolithography without the about 120° C. post-bake. The top contact may be patterned with a dark-field mask having about 60 µm diameter holes, and the bottom contact, which may cover substantially the whole surface except the mesa region, may be formed with a clear-field mask on which opaque dots having a diameter of about 100 µm may be formed. Before loading the wafer into the chamber of a CHA electron-beam ("E-beam") evaporator, if there may not be a substantial amount of deposited $SiO_2$ on the semiconductor, the wafer may be dipped in buffered-HF ("BHF") for about 15 seconds followed by an about 1 minute DI water rinse. BHF may remove residual surface oxide from the wafer thereby improving metal contact. If a $SiO_2$ coating may be present on the wafer, a contact window may be opened using the photoresist pattern for either wet or dry etching of the $SiO_2$.

The wafer may then be loaded into the E-beam evaporator. The E-beam evaporator may be pumped to a pressure below about $5 \times 10^{-6}$ Torr, and the metals for p or n contact may be deposited. An appropriate p-metal for relatively high-speed devices may include Ti(about 20 nm)/Pt(about 40 nm)/Au(about 100 nm), which may form a very shallow ohmic contact alloy with the thin $p^+$-contact layer after annealing. In devices for gain and noise measurements, in which the contact may be relatively large, Cr(about 20 nm)/Au(about 70 nm) may be used, for example, due to its easier deposition. An appropriate n-metal may be Ni(about 10 nm)/AuGe(about 20 nm)/Au(about 100 nm). Gold-Germanium may be applied in proportions corresponding to an eutectic alloy (about 88% Au, and about 12% Ge by weight), and Ge may be used to dope the semiconductor during alloying. Ni may be an appropriate adhesive agent and may reduce, and even prevent, "balling" of the AuGe during annealing. After E-beam evaporation, metal covering the patterned photoresist may be "lifted-off" in acetone with an ultrasonic bath, and the wafer may be cleaned with solvents and DI water.

Annealing the formed contacts after metal deposition may reduce a resistance of the p and n contacts. For example, annealing a wafer at a temperature of approximately 440° C. with a rapid thermal anneal ("RTA") process for about 20 seconds may yield a p-contact resistivity of about $2 \times 10^{-6}$ $\Omega$ $cm^2$ and an n-contact resistivity of about $5 \times 10^{-7}$ $\Omega$ $cm^2$ on GaAs. The RTA process may include an about 10 second sustaining step inserted into the ramp up to reduce, and even avoid, temperature overshoot. On $In_{0.53}Ga_{0.47}As$ and InP, similar low contact resistivities may be obtained with the same process.

Wet etching may be relatively easier and quicker than dry etching. Wet etching may be a common method used to form mesas and vias if the resulting undercut may be tolerable. If a patterned photoresist may be used as an etch mask, the wafer may baked at a temperature of approximately 120° C. for at least about 30 minutes after photolithography to reduce undercut of the pattered photoresist during wet etching.

In addition, an about 90 nm thick PECVD deposited $SiO_2$ layer may be used for a passivation or sacrificial layer. The passivation or sacrificial layer, however, may include any appropriate material known in the art. In addition, such a layer may be deposited using any process known in the art. An about 40 second BHF etch process with stirring may be used to open a window in the $SiO_2$. An appropriate etch process, however, may include any etch process known in the art. Most III-V semiconductors may be etched with a sulfuric acid-based $H_2SO_4$:$H_2O_2$:$H_2O$ mixture, which may have a ratio of about 1:1:10. An etch rate of the wafer may be approximately 1 µm/min to approximately 2 µm/min after the mixture was cooled to room temperature. Such a sulfuric acid solution, however, may leave a rough surface after etching. A moderate and reproducible etch rate (about 0.3 µm/min) and a smooth final surface may be obtained with a citric-acid:$H_2O_2$:$H_2O$ solution having a ratio of about 1:1:8. Since the solution may not etch InP, a Br:methanal solution may be used to achieve a smooth surface and low leakage current for InP mesas.

In most cases, wet etching may be substantially homogeneous. Devices for gain and noise measurements may have a diameter of about 60 µm to about 100 µm, and undercut may not be important. Relatively high-speed devices may have smaller dimensions to reduce device capacitance. Dry etching may be used for GaAs and $Al_xGa_{1-x}As$. Pattern and linewidth of features for relatively high-speed devices may be controlled by estimating the amount of undercutting and alignment error in the mask design.

If the device structure does not have an etch-stop layer, etching may be calibrated using an Alpha Step Profiler.

A relatively thin layer of $SiO_2$ may be deposited by plasma-enhanced chemical vapor deposition ("PECVD") or any other technique known in the art. In most cases, the layer of $SiO_2$ may be used to passivate sidewalls of PIN mesas or as a mask for subsequent etching of semiconductors or polymers. Typically, an about 90 nm thick $SiO_2$ layer may be deposited within about 5 minutes using, for example, $SiH_4$ and $N_2O$ at approximately 285° C.

Figure 18:
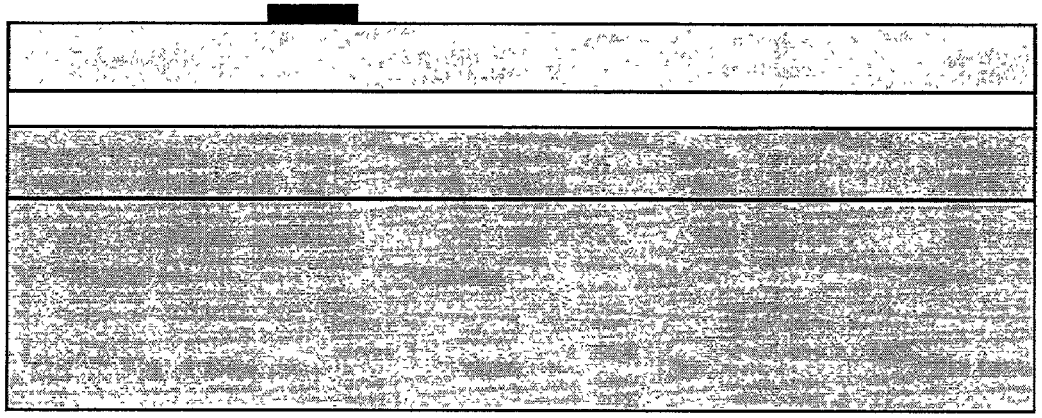
FIG. 18 depicts a partial cross-sectional view of a PIN structure after formation of a p-contact.
Figure 19:
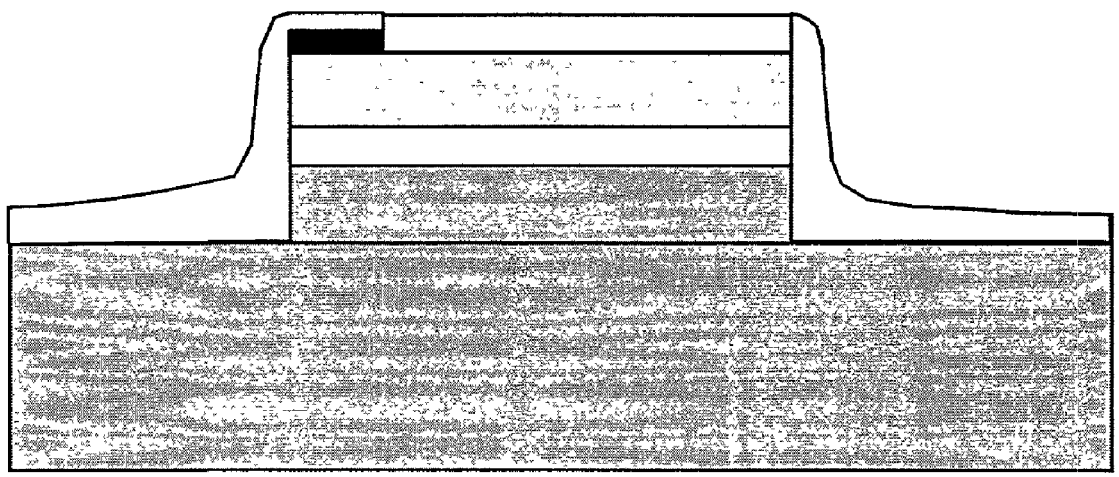
FIG. 19 depicts a partial cross-sectional view of a PIN structure after formation of a mesa.
Figure 20:
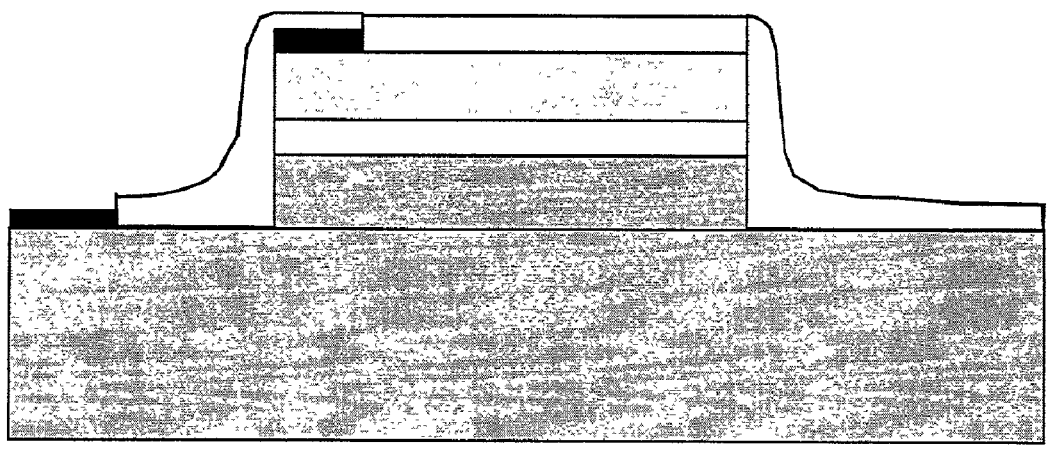
FIG. 20 depicts a partial cross-sectional view of a PIN structure after formation of a n-contact.

With the steps described above, a brief description of the process flow of devices used in gain and noise measurements follows. The description may be based on PIN structures used for GaAs, $Al_xGa_{1-x}As$, and $In_{0.52}Al_{0.48}As$. The process for the InP NIP structures may be similar except that the n contacts may be formed first. P-contact formation may include indium removal, solvent cleaning, photolithography for p metal, and P-contact deposition with Ti/Pt/Au. FIG. 18 illustrates a cross-sectional view of a PIN structure after P-contact formation. Device mesa formation may include photolithography for device mesa with an about 120° C. post-bake, wet etching with profile monitoring, solvent cleaning, and PECVD $SiO_2$ deposition after etching. The SiO2 may be deposited relatively soon after etching. FIG. 19 illustrates a cross-sectional view of a device after device mesa formation. N-contact formation may include photolithography for n metal with an about 120° C. post-bake, $SiO_2$ wet etching using BHF, and N-contact deposition with Ni/AuGe/Au. FIG. 20 illustrates a cross-sectional view of a device after N-contact formation. P-contact window opening may include photolithography with the p-metal mask with an about 120° C. post-bake, $SiO_2$ wet etching by BHF, and RTA Annealing.

An example cross section of the device is shown in FIG. 16. A top view of the device is shown in FIG. 17. By moving the photolithography and metal deposition steps for p-contact formation after device mesa formation, the number of photolithography steps may be reduced by at least one. A p-contact formed after $SiO_2$ etching, however, may have a higher contact resistance than a p-contact formed as described above.

For the devices described herein, the photocurrent and dark current as functions of voltage may be measured to obtain gain curves. These measurements may be used to select the appropriate devices for subsequent noise measurements. The excess multiplication noise factor may be determined with measured noise spectral density. There may be relatively little difference between the nominal and as-grown thicknesses of the intrinsic region, indicating little dopant diffusion during MBE growth. Higher accuracy of the thickness of the depletion region may be obtained by measuring the C-V characteristics at low bias.

Figure 21:
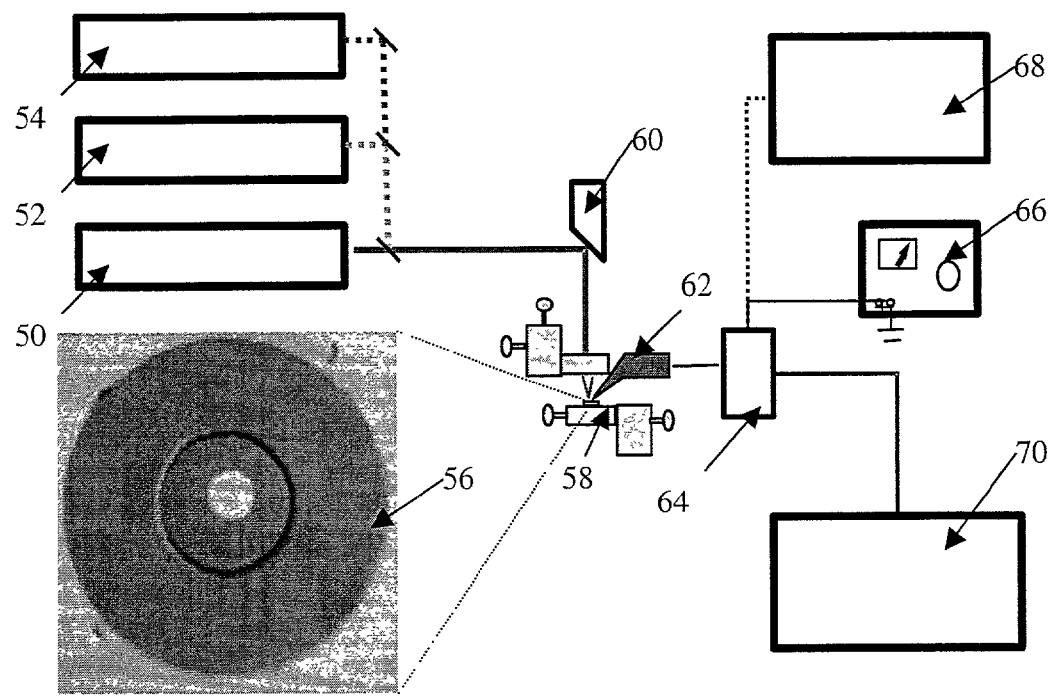
FIG. 21 depicts a schematic diagram of a gain and noise measurement apparatus.

FIG. 21 shows a block diagram of an embodiment of an apparatus that may be used to measure gain and avalanche noise. As mentioned herein, three stable continuous-wave ("cw") lasers 50, 52, and 54 may be employed to control optical absorption length in different materials. The apparatus, however, may include one or more of these lasers and any additional lasers known in the art. Laser 50 may be a He—Ne laser configured to operate at approximately 633 nm. Laser 52 may be a YAG laser configured to operate at approximately 532 nm. Laser 54 may be an Ar laser configured to operate from about 351 nm to about 363 nm. The output power of the He—Ne laser may be approximately 7 mW at about 630 nm, and the output power of the YAG laser may be about 5 mW at about 530 nm. The Argon UV laser beam may include two lines at about 350 nm and about 365 nm, and the total power may reach about 500 mW.

To ensure pure electron/hole injection, the He—Ne laser may be used for GaAs devices. Data for $In_{0.52}Al_{0.48}As$, InP, and $Al_{0.2}Ga_{0.8}As$ devices may be measured with the about 532 nm YAG laser beam, and $Al_xGa_{1-x}As$ devices with higher Al ratios (e.g., x is greater than about 0.2) may be measured under UV illumination. Output from lasers 50, 52, and 54 may be directed to device 56 by mirror assembly 60. Device 56 may be support by mechanical device 58. Mechanical device 58 may be configured to alter a position of device 56 in the x, y, and z directions. For pure electron or hole injection, the beams may be focused onto the top of a mesa of device 56 by a microscope objective (not shown) or another focusing device known in the art, in front of which an iris may be placed to shield all but the central beam. For a small focal spot and a large working distance, an appropriate microscope objective may be a 40× Zeiss objective for visible beams. A 10× UV objective may be used to alleviate insertion loss in the UV region.

Since dark current may be negligible and the photocurrent of an avalanche photodiode may not increase with voltage at low bias, the total current may usually be selected as the unity-gain reference $I_{unity}$. With the total current $I_{total}$ under the same illumination and the dark current $I_{dark}$ at different voltages, the avalanche gain M(V) as a function of voltage may be determined as $$M(V) = \frac{I_{total} - I_{dark}}{I_{unity}}. \tag{64}$$

For convenience, the photocurrent and dark current as functions of bias may normally be measured with two needle probes, which may be arranged within probe head 62. Probe head 62 may be coupled to bias tee 64. Probe head may also be coupled to power supply 66 through bias tee 64. Since this is a dc measurement, a signal from the probes may be sent to semiconductor parameter analyzer 68 such as an HP 4145 semiconductor parameter analyzer.

In an experiment, current noise power spectral density S may be measured, and the equation for S may be deduced from Equation 15

$$S = \frac{\langle i_{av}^2 \rangle R(\omega)}{B} = 2eIM^2 F(M) R(\omega), \qquad (65)$$

where $R(\omega)$ is the impedance of the device and measurement circuit. To determine the coefficient $2eR(\omega)$, the shot noise of the photodiode at unity gain, when M=1 and F(M)=1, may be measured as a function of the photocurrent I. This calibration step may be included since the circuit impedance, especially the contact resistance to the device, may vary from device to device. The noise power density and the DC current may be measured under illumination and in the dark alternately at the same voltage. The avalanche noise power density S. as shown in Equation 65, may be determined as the difference between the total noise power density under illumination and that in the dark. Due to careful growth and processing, devices may be relatively stable and may demonstrate dark current and dark noise power density less than the corresponding photocurrent and noise power density under illumination, until the devices are biased very close to breakdown. Owing to the rapid increase of S as a function of gain M in Equation 65, the measured noise level may vary over a wide range (from about −0.5 dB to about 15 dB) with respect to a standard noise source. Consequently, care may be required to ensure the linearity of the whole system.

To check system linearity and to reduce, and even eliminate, dependence on it, a second noise measurement method may be developed. In this method, the response of the system may be assumed only monotonic to the device noise spectral density, which is obviously a much-relaxed requirement, and the function of noise figure meter 70 may be only a monitor of the noise level. In the beginning of this measurement, a given noise level $S_0$ may be selected. By choosing a different photocurrent I, the noise level $S_0$ may be established at a different gain M. Since the excess noise factor is defined as unity at the unity gain, i.e., F(1)=1, a series of equations may be obtained with Equation 65

$$S_0 = 2eR(\omega) I_1 = 2eR(\omega) I_2 F(2) 2^2 = \ldots = 2eR(\omega) I_M F(M) M^2, \qquad (66)$$

where $I_1, I_2, \ldots,$ and $I_M$ are the photocurrents at gain=1, 2, ..., and M, respectively. Since the coefficient $2eR(\omega)$ may be cancelled, the measurement of the shot-noise variation with photocurrent may be unnecessary. With the measured photocurrents and gains, the excess noise factors at different gain may be determined. Since $F(M)M^2$ may increase rapidly with gain M, for a single noise level $S_0$, the photocurrent may change over a relatively wide range, which may be frequently limited by the sensitivity of the instruments and the power limit of the device. In practice, for a typical about 1 to about 20 gain range, the excess noise factors may be measured in sections with various noise levels. Overlaps of these sections may be employed to connect the sections to complete the curve.

Figure 22:
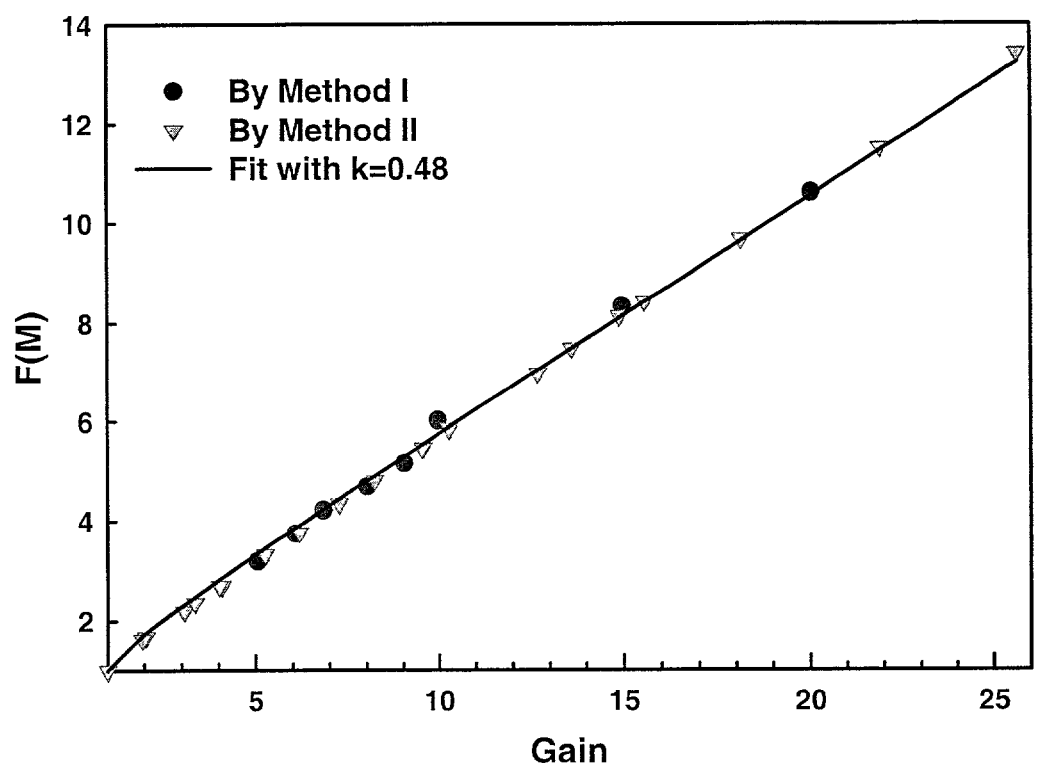
FIG. 22 depicts a plot of excess noise factor for GaAs APDs with about a 0.8 µm thick multiplication region.

FIG. 22 illustrates a plot of the excess noise factor for GaAs APDs with an about 0.8 μm thick multiplication region. The symbols represent the measured results with the two methods, and the solid line represents the results fitted with Equation 40 and a k of 0.48. As shown in FIG. 22, for a GaAs homojunction APD with an about 0.8 μm thick multiplication region, the two methods may agree and also may confirm the linearity of a measurement system. Compared to the first noise measurement method, a more restricted requirement on the device may be traded for a more relaxed requirement to the system. To maintain the accuracy of the measurement and to limit the number of sections, the reference noise level for each section may be as high as possible, but this effort may be bounded by the device quantum efficiency and power limit. For the same reason, the photocurrent at the high end of a gain section may need to be as low as possible, and this may require relatively low dark current at relatively high gain.

Figure 23:
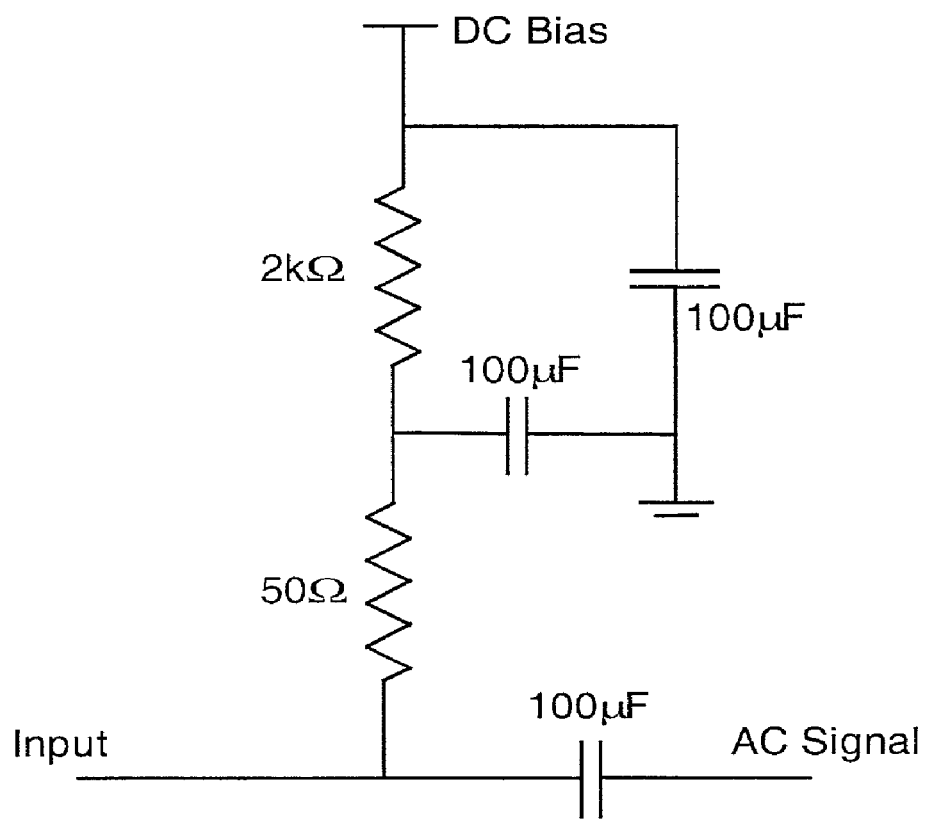
FIG. 23 depicts a schematic diagram of a circuit of the bias-tee used in noise measurement.

In the noise measurement, to reduce, and even eliminate, environmental noise and signal resonances in the transmission line, the device may be contacted with a shielded microprobe and careful impedance matching steps may be adopted. An embodiment of a bias-tee circuit that may be used in noise measurements is shown FIG. 23. A microprobe may be connected to the input port, and an ac signal may be sent to a noise figure meter such as an HP 8970B noise figure meter through the signal port. The dc bias may be applied from the dc port. The device photocurrent and dark current may also be measured by connecting a semiconductor parameter analyzer to this port. The noise power spectral density may be measured at about 50 MHz with a bandwidth window of about 4 MHz. Due to the stochastic characteristics of the noise, the gain of the preamplifier may be selected to avoid transient saturation. Noise from components following the photodiode may be calibrated and normalized with any commercial noise source known in the art.

Due to dopant diffusion (i.e., Be diffusion), during the MBE growth, a thickness of the i region may deviate slightly from the nominal value. Accurate values for the i layer thicknesses may be obtained by measuring C-V characteristics of a series of devices with different diameters at relatively low bias. Such a measurement technique may reduce, and even eliminate, an offset of a LCR meter and the parasitic capacitance of the measurement system. Semiconductor dielectric constants that may be used have been reported with at least three significant digits, and the variation between different sources are within approximately 1%. Errors introduced by uncertainties in the values of the dielectric constants may not be significant. The relatively high degree of accuracy in the determination of the i region thickness may be verified by linearity in a capacitance-versus-area plot. The extent of the depletion region into the p and n layers under bias may not be neglected, especially for thin i-region devices. The i-region thicknesses may be extracted by using the depletion approximation and by subtracting the contribution of the n and p depletion regions. Slight inaccuracy of the depletion approximation near edges of the depletion region may be reduced by using heavy doping in the p and n layers.

Junction capacitance of the devices may be measured with the needle-probe stage used in the I-V measurements. Since the intrinsic region of the PIN devices may be normally depleted at about zero bias, a relatively low dc bias, which may be typically about 2V to about 5 V depending on the breakdown voltage, may be applied to the devices. Under this bias, the i region may be substantially fully depleted, and extension of the depletion region into the p and n layers may be limited. An ac signal with a frequency of about 50 kHz to about 200 kHz may be provided by an LCR meter such as a HP 4275 A multi-frequency LCR meter. Capacitance of the devices may normally be in the range from about 500 fF to about 30 pF, and the influence of the frequency on the results may be found at frequencies above about 1 MHz. To avoid modulation of the bias condition by the ac signal, an amplitude of the signal may normally be about 0.1 V. In practice, a relatively high Q value of the measurement circuit (e.g., greater than about 300) may be considered as a signature of a good measurement. To eliminate errors arising from parasitic capacitance and contact resistance, open- and short-circuit calibrations may be taken before every measurement.

To investigate the impact ionization characteristics of III-V semiconductors, a series of GaAs, $Al_xGa_{1-x}As$, $In_{0.52}Ga_{0.48}As$, and InP homojunction APDs with different multiplication region thicknesses may be fabricated. The gain and noise curves of these APDs are described herein, and thicknesses of the intrinsic regions may be checked with capacitance measurements. The conventional theory may be applied to these results.

Figure 24:
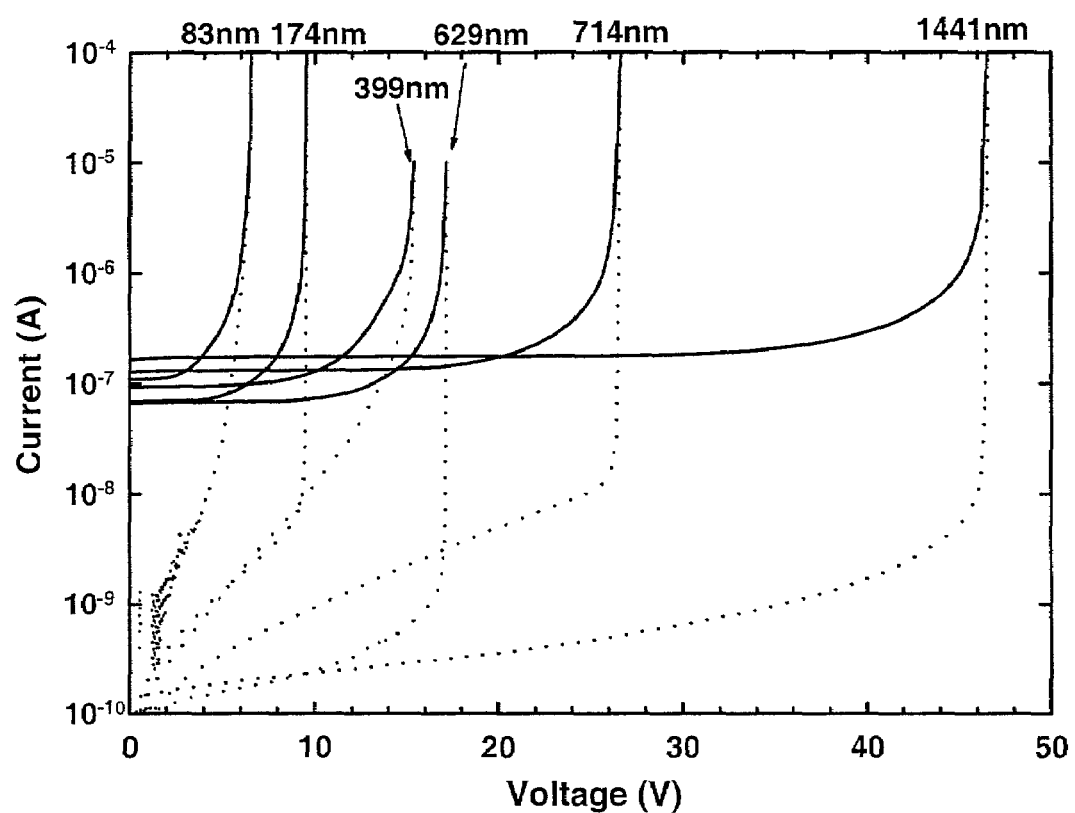
FIG. 24 depicts photocurrent and dark current of about 100 µm diameter GaAs homojunction APDs with multiplication layer thicknesses of about 100 nm to about 1400 nm.
Figure 25:
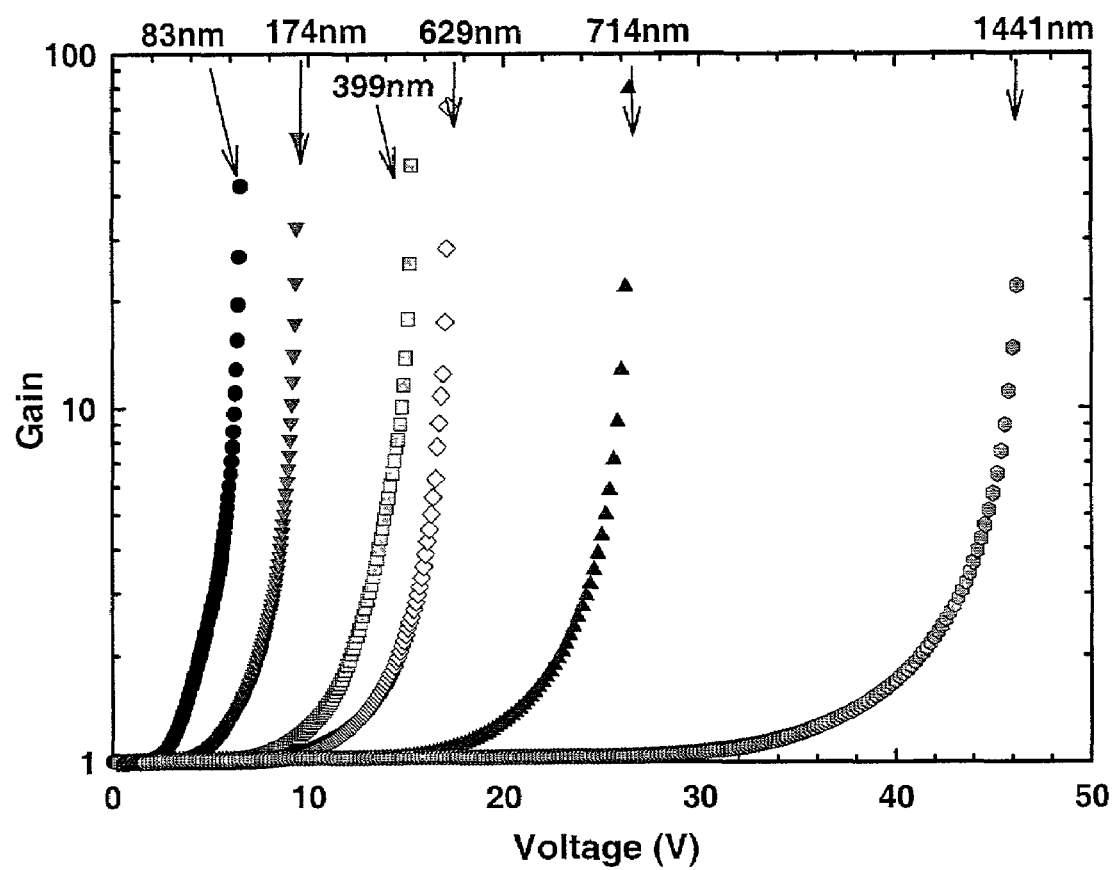
FIG. 25 depicts a plot of measured gains for GaAs APDs.
Figure 26:
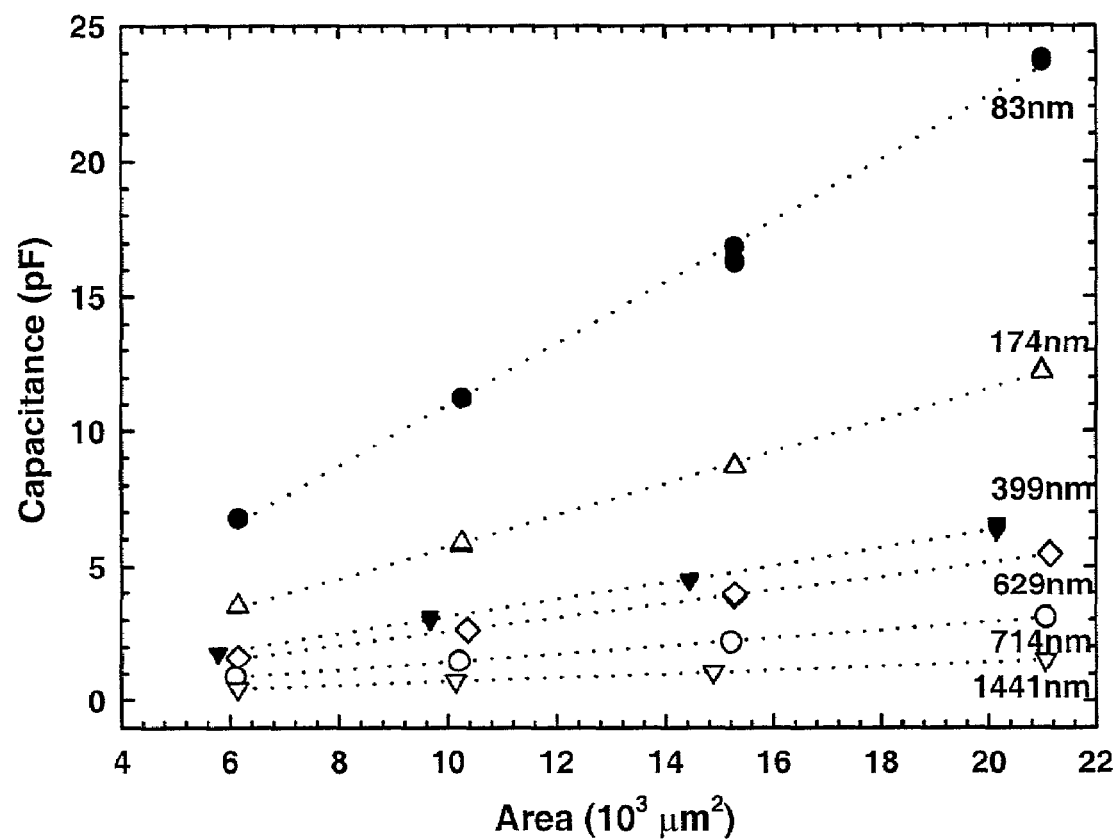
FIG. 26 depicts a plot of junction capacitance and area of GaAs homojunction APDs with multiplication layer thicknesses of about 100 nm to about 1400 nm.

FIG. 24 illustrates the photocurrent and dark current of the about 100 μm diameter GaAs APDs with thickness of about 100 nm to about 1400 nm. The thicknesses obtained from capacitance measurement are marked in FIG. 24. As shown in FIG. 24, at low voltage, the photocurrent response may be relatively flat, which may facilitate the identification of unity gain. FIG. 25 illustrates a plot of measured gains for GaAs APDs. As plotted in FIG. 25, gain may be obtained with the unity-gain reference and Equation 64. All of the devices demonstrate a gain of at least about 30. The dark currents may be less than about 10 nA at about 90% of the breakdown voltage. It may be possible to measure the noise at relatively high gain. FIG. 26 illustrates relations of junction capacitance and area of GaAs homojunction APDs with multiplication layer thicknesses of about 100 nm to about 1400 nm. The symbols represent experimental results, and the dashed lines represent fitted lines. As demonstrated in FIG. 26, capacitance-versus-area plots may be substantially linear, which may permit the thickness of the i region to be determined with a relatively high degree of accuracy.

Figure 27:
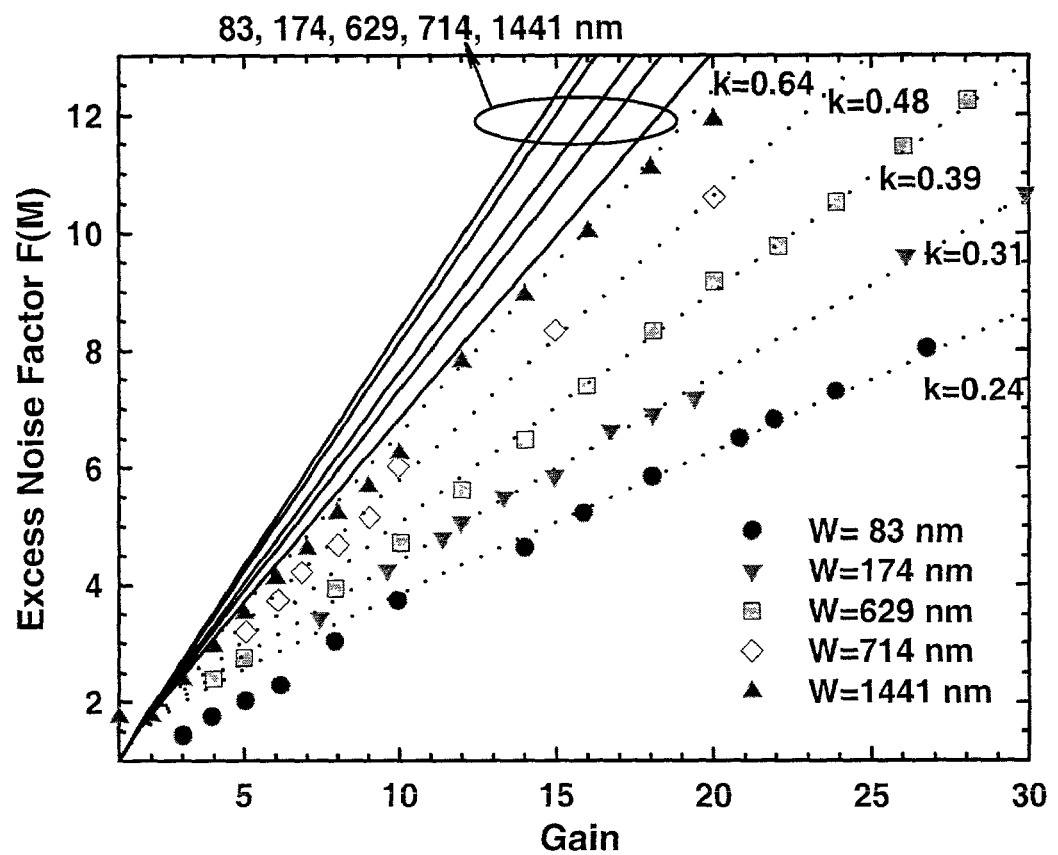
FIG. 27 depicts a comparison plot of measured excess noise factors and calculated values using the conventional theory for GaAs.

Using multiplication noise measured at different voltages, excess noise factors may be extracted with Equation 65 and may be plotted as a function of gain as shown in FIG. 27. FIG. 27 illustrates a comparison of the measured excess noise factors and calculated values using the conventional theory for GaAs. The symbols show the measured excess noise factors, and the dotted lines are the values fitted with modified k's. The solid lines were calculated with reported ionization coefficients of GaAs.

Figure 28:
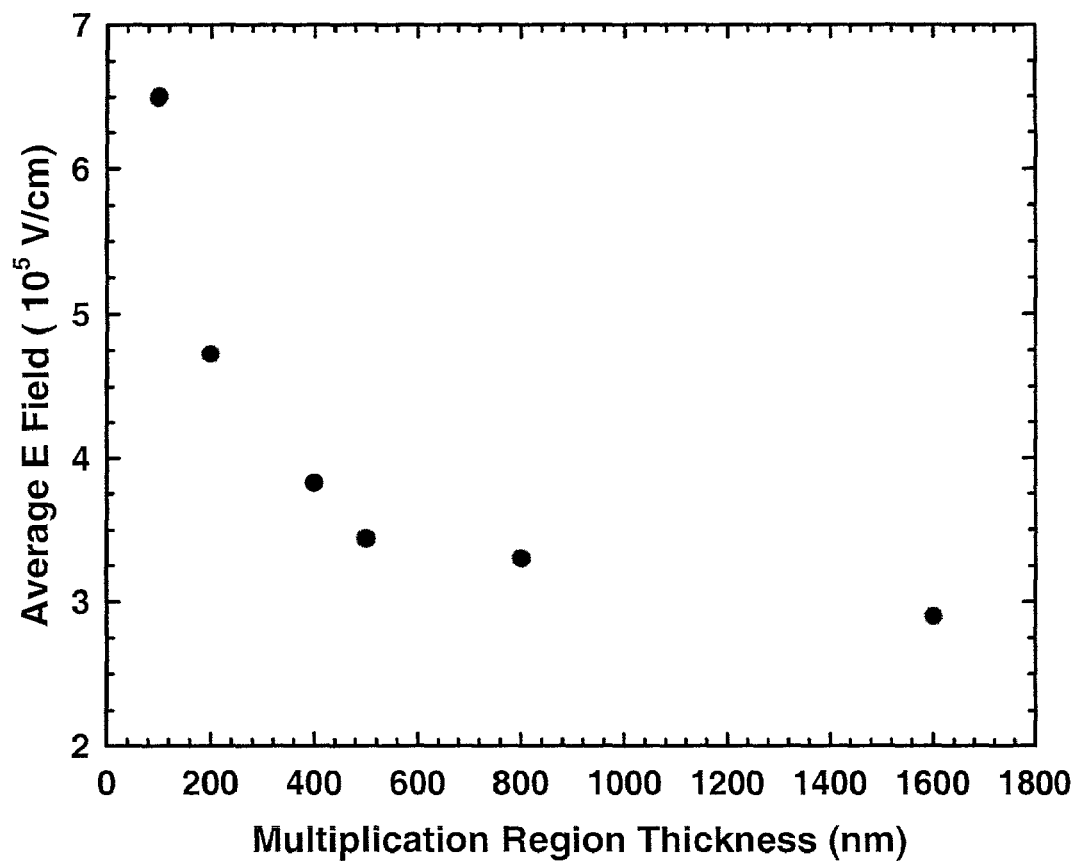
FIG. 28 depicts a plot of average electric field near breakdown of devices with various multiplication layer thicknesses.

FIG. 28 shows plots of the average electric field in the i region at the breakdown voltage of the devices with various multiplication layer thicknesses. For simplicity, the average fields may be determined by the ratio of the breakdown voltage to the i region thickness. A more accurate calculation of the electric field profiles in the devices may be employed in a later fitting. In the local-field avalanche theory, the excess noise may be a function of gain and ionization coefficient ratio k. The reported ionization coefficients of GaAs and the rapid increase of average electric field, as shown in FIG. 28, predict that β/α may approach unity as the multiplication region becomes thinner. On the contrary, if Equation 40 is used with a modified k, measurement of the excess noise factors shows that the effective k may decrease with increasing electric field. In addition, as shown in FIG. 27, the measured excess noise factors may be slightly but consistently lower in the low-gain regime than the curves that have been calculated with the local-field theory.

According to the noise reduction effect, as shown in FIG. 27, an even lower noise level may be expected in thinner layers. However, as the multiplication region thickness is reduced, the rapidly increasing electric field, as shown in FIG. 28, may result in a large dark current and may make the device impractical. A lower thickness bound for GaAs APDs may be approximately about 70 nm to approximately 100 nm. An appropriate lower thickness bound may vary, however, depending on, for example, dark current specification and crystal quality.

For GaAs-based SACM structures, the multiplication region may include a wide-bandgap material to reduce, and even eliminate, optical absorption and excessive dark current from this region. Since $Al_xGa_{1-x}As$ with a low Al ratio x demonstrates ionization coefficients similar to that of GaAs and better stability than those with high Al ratios (x>0.4), $Al_{0.2}Ga_{0.8}As$ may be selected for most of the GaAs-based high-performance devices.

Figure 29:
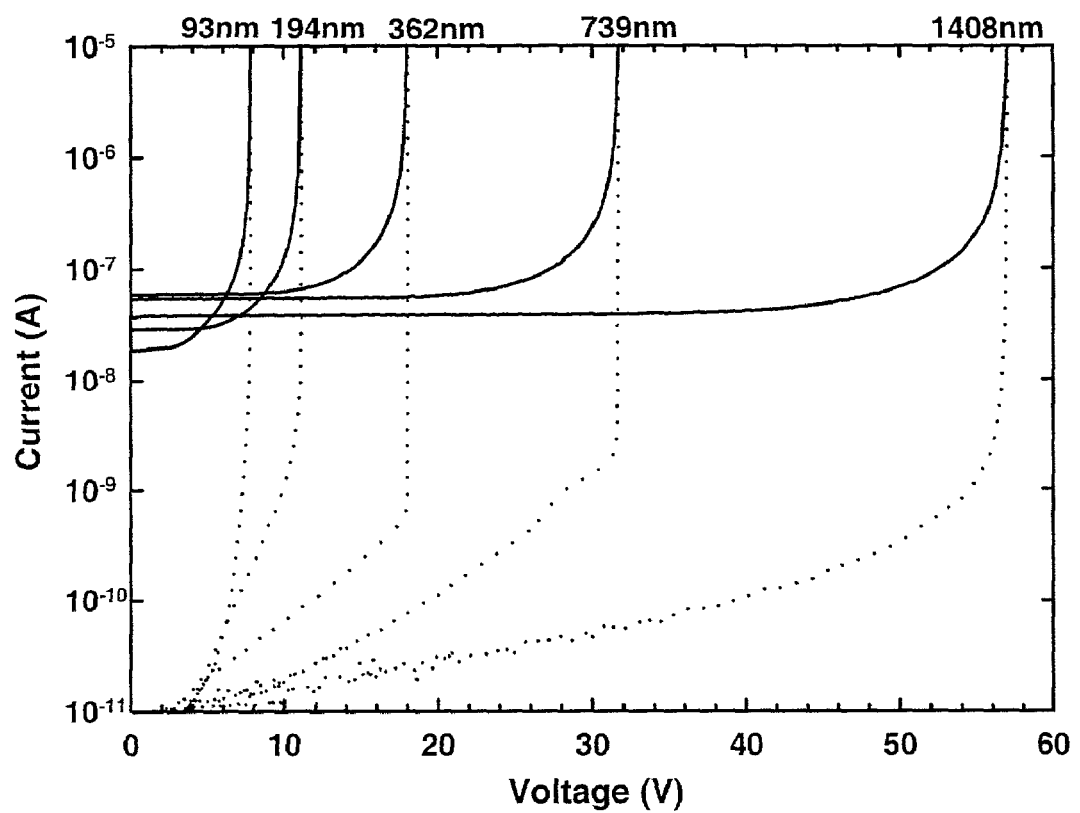
FIG. 29 depicts a plot of photocurrent and dark current of $Al_{0.2}Ga_{0.8}As$ APDs with various multiplication layer thicknesses.
Figure 30:
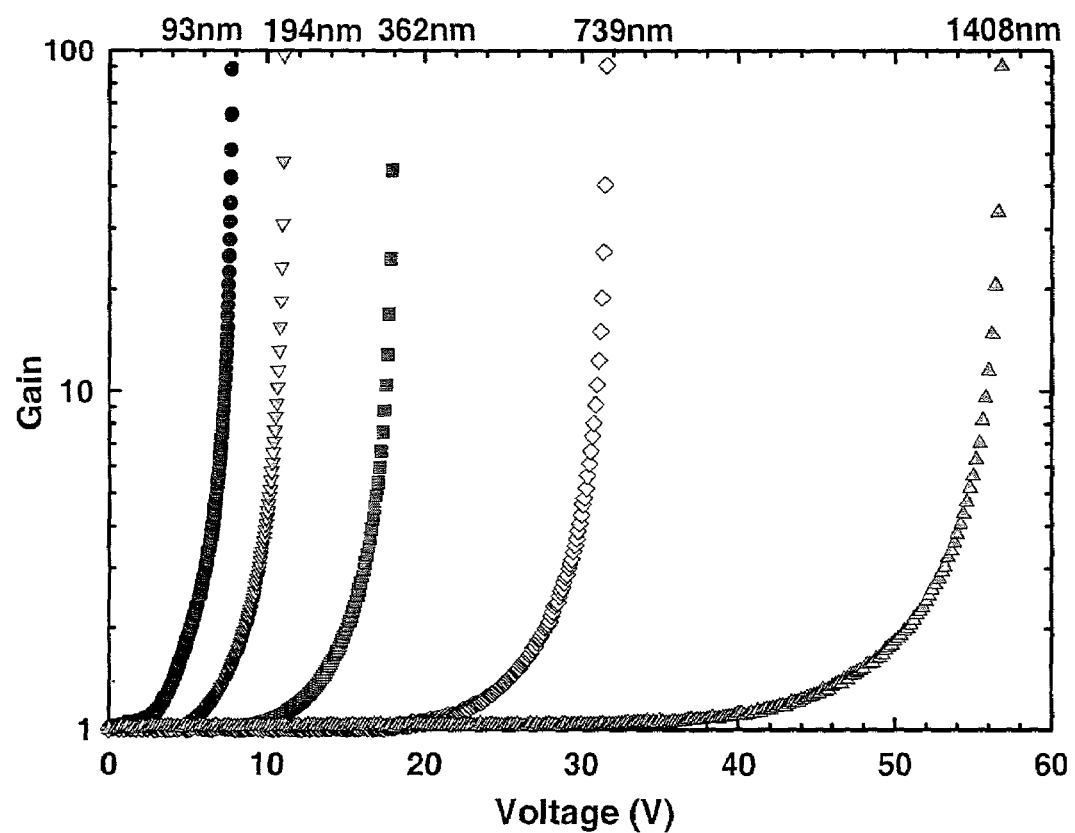
FIG. 30 depicts a plot of gain for $Al_{0.2}Ga_{0.8}As$ homojunction APDs.

FIG. 29 illustrates a plot of photocurrent and dark current of $Al_{0.2}Ga_{0.8}As$ APDs with various multiplication layer thicknesses. FIG. 29 shows that even lower dark currents may be observed in the $Al_{0.2}Ga_{0.8}As$ APDs. FIG. 30 illustrates a plot of gain for $Al_{0.2}Ga_{0.8}As$ homojunction APDs. As indicated in FIG. 30, the gain for a structure may be determined with the dark current and photocurrent measured under illumination from a 532 nm YAG laser. Changes in the gains may not be observed upon regrowth and reprocessing of the structures. The thicknesses marked in FIGS. 29 and 30 may be checked with the junction capacitance measurement described earlier.

Figure 31:
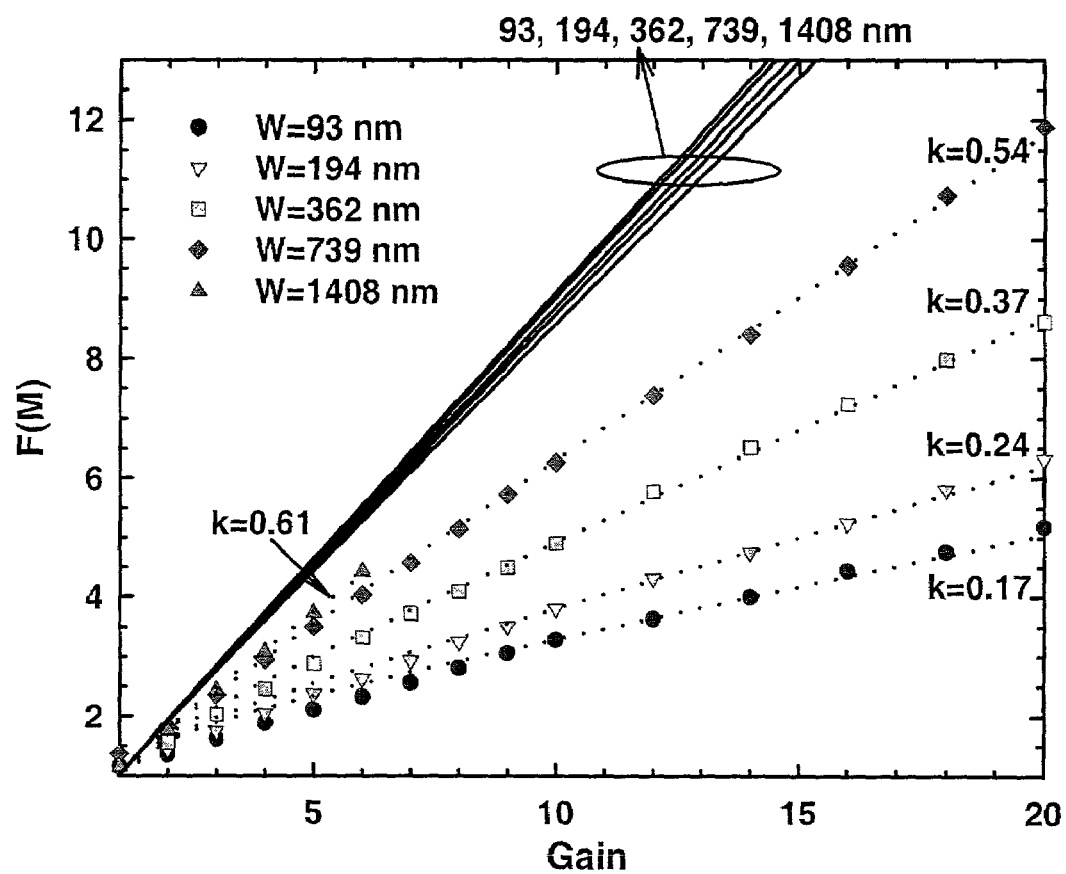
FIG. 31 depicts a plot of measured excess noise factors and calculated values using conventional theory for $Al_{0.2}Ga_{0.8}As$ APDs.

The measured excess noise factors and the calculated values using the conventional theory for the $Al_{0.2}Ga_{0.8}As$ APDs are shown in FIG. 31. The symbols show the measured excess noise factors, and the dotted lines are the values fitted with modified k's. The solid lines were calculated with ionization coefficients of $Al_{0.2}Ga_{0.8}As$ known in the art. The same noise reduction effect with the multiplication thickness may be observed. The calculation with the reported ionization coefficients may demonstrate the same conflict with the experiment as was seen with the GaAs devices.

The natural lattice-matched $Al_xGa_{1-x}As$ to GaAs substrates may provide device designers great flexibility and may make it one of the most valuable material systems for high-performance optoelectronic devices as well as transistors. This material system has attracted lots of attention, but the ionization characteristics have never been explored beyond a range for x of about 0.0 to about 0.4. $Al_xGa_{1-x}As$ in the low Al ratio region and a thin $Al_{0.2}Ga_{0.8}As$ multiplication layer may be included in relatively high-speed SACM APDs. A higher Al ratio, however, may result in better performance. Indeed, as compound semiconductors are applied to circuits with higher speed and higher electric field, the understanding of the avalanche process and the avalanche properties of $Al_xGa_{1-x}As$ in substantially the entire x range may become important.

Figure 32:
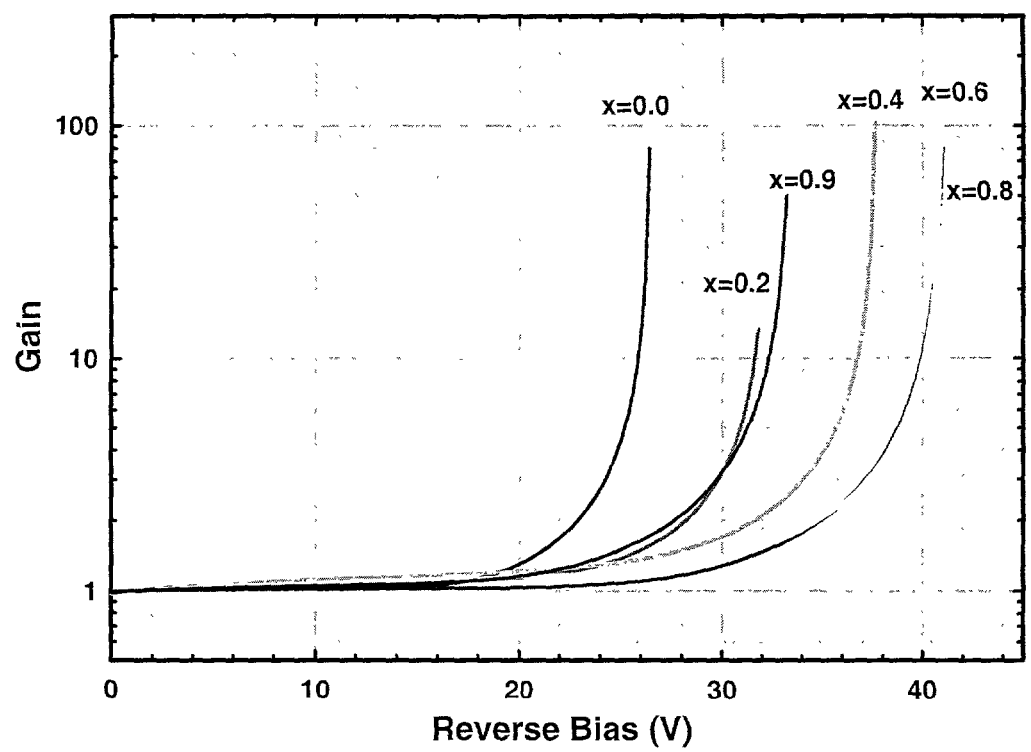
FIG. 32 depicts a plot of measured gains of the $Al_xGa_{1-x}As$ APDs with various Al ratios (x)
Figure 33:
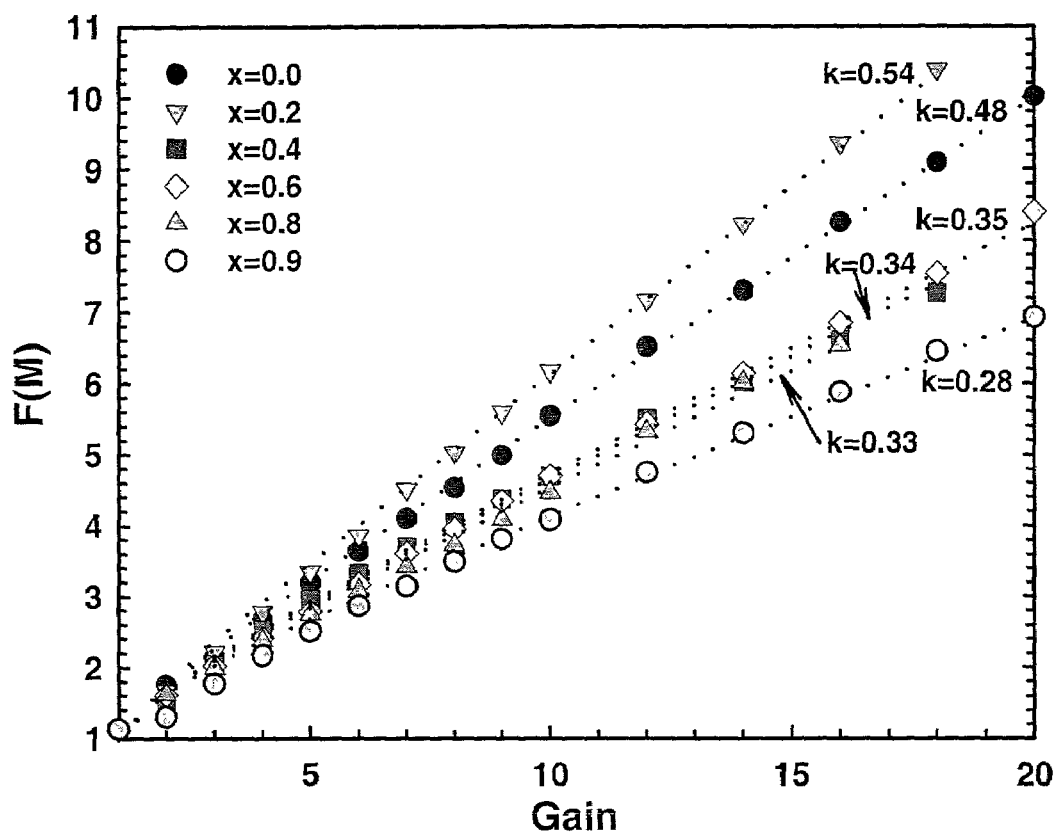
FIG. 33 depicts a plot of measured excess noise factors of $Al_xGa_{1-x}As$ APDs.

As described above, gain and noise measurements on PIN structures may be used to determine ionization coefficients of these materials. To avoid the noise reduction effect observed in relatively thin multiplication regions, a series of $Al_xGa_{1-x}As$ homojunction APDs with an about 0.8 μm thick intrinsic layer may be fabricated, and their Al ratios may vary from about 0.0 to about 0.9. As described herein for GaAs and $Al_{0.2}Ga_{0.8}As$ devices, thicknesses of the intrinsic regions may be verified with capacitance measurements on devices with various mesa sizes. The Al ratios may be checked with Auger Electron Spectroscopy ("AES"). The measured gains of these devices with various Al ratio x are shown in FIG. 32. FIG. 33 illustrates measured excess noise factors of these APDs as a function of gain. The symbols show the measured excess noise factors, and the dotted lines are the values fitted with k's. According to Equation 40, an effective k may be used as an adjustable parameter to fit the noise curves. Following this procedure, k values of 0.48, 0.54, 0.34, 0.35, 0.32, and 0.28 may be obtained for Al ratios of 0.0, 0.2, 0.4, 0.6, 0.8, and 0.9, respectively. The theoretical curves with these k's may be plotted as shown in FIG. 33. Since the multiplication noise of the devices may be measured with the YAG laser with a line at about 532 nm, the data for the $Al_xGa_{1-x}As$ (x greater than about 0.4) may be subject to further verification.

TABLE

| x | 0.0 | 0.2 | 0.4 | 0.6 | 0.8 | 0.9 |
|---|---|---|---|---|---|---|
| $A_e$ ($10^6$/cm) | 3.94 | 3.14 | 2.98 | 2.80 | 3.80 | 3.36 |
| $E_{c,e}$ ($10^6$ V/cm) | 1.80 | 2.14 | 2.37 | 2.57 | 2.70 | 2.11 |
| $A_h$ ($10^6$/cm) | 1.77 | 1.63 | 1.01 | 0.981 | 1.21 | 0.940 |
| $E_{c,h}$ ($10^6$ V/cm) | 1.80 | 2.14 | 2.37 | 2.57 | 2.70 | 2.11 |

Figure 34:
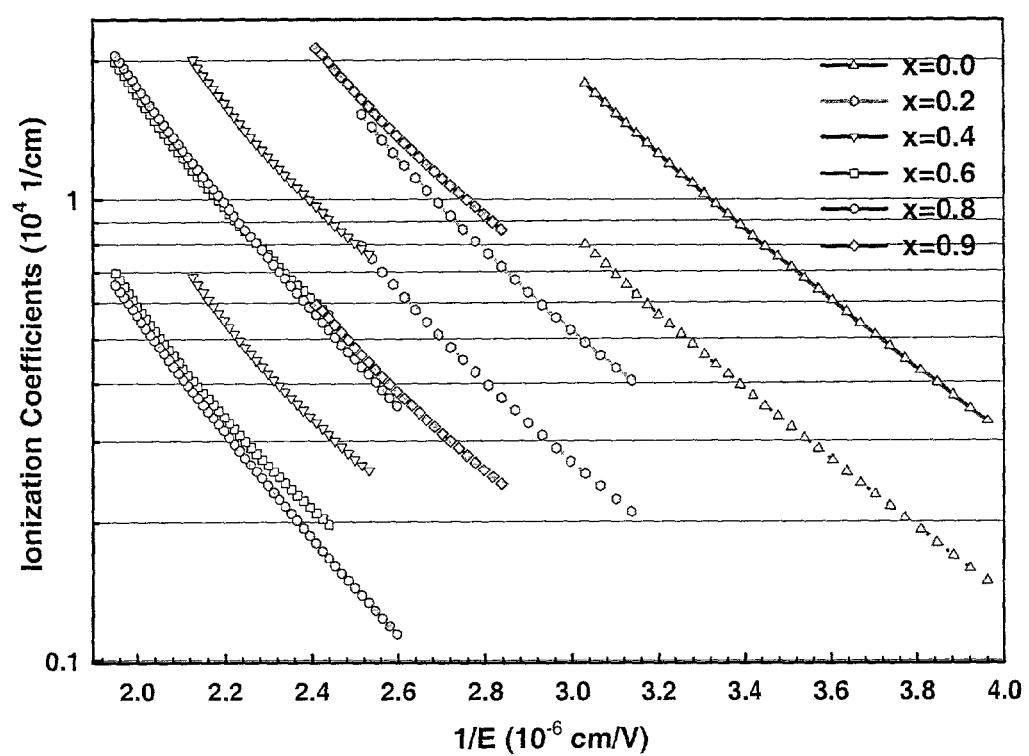
FIG. 34 depicts a plot of ionization coefficients of $Al_xGa_{1-x}As$ extracted from gain curves and F(M) curves with the conventional theory.

According to the gain and k values shown in FIGS. 32 and 33, the ionization coefficients, $\alpha(E)$ and $\beta(E)$, may be determined by the procedure described above. FIG. 34 illustrates a plot of the ionization coefficients of $Al_xGa_{1-x}As$ extracted from the gain curves and F(M) curves with the conventional theory. The solid lines are electron ionization coefficients $\alpha$, and the dashed lines are the corresponding hole ionization coefficients $\beta$. As shown in FIG. 34, the two parameters may be plotted as functions of 1/E. The parameters in the low field region may be relatively sensitive to the selection of the unity gain voltage. In addition, the k values determined in the noise measurement may only reflect the $\beta/\alpha$ of the materials near the device breakdown voltage, which may be a relatively narrow voltage range. Thus, to restrict the error margin, the sections deduced from the low gain regions may be truncated. As shown in FIG. 34, each curve is nearly straight, implying that Equation 60 with m=1 may be a good approximation in a narrow range. Fitting the curves with this equation, the parameters for each material in the electrical field range may be extracted as shown in FIG. 34. The parameters for ionization coefficients of $Al_xGa_{1-x}As$ in a narrow range are listed in Table 3.

As described herein, avalanche-noise may depend on the structure or the thickness of the multiplication region. The general tendency observed is that thinner regions may have lower noise. On GaAs substrates, the Al ratio, x, of $Al_xGa_{1-x}As$ may also be selected. The ionization coefficient ratios of relatively thick multiplication regions, as shown in FIG. 33, illustrate that materials with higher Al ratios may have lower noise. The combination of those two effects may be expected to result in an even lower excess noise factors than those that were measured for the GaAs and $Al_{0.2}Ga_{0.8}As$ devices.

Figure 35:
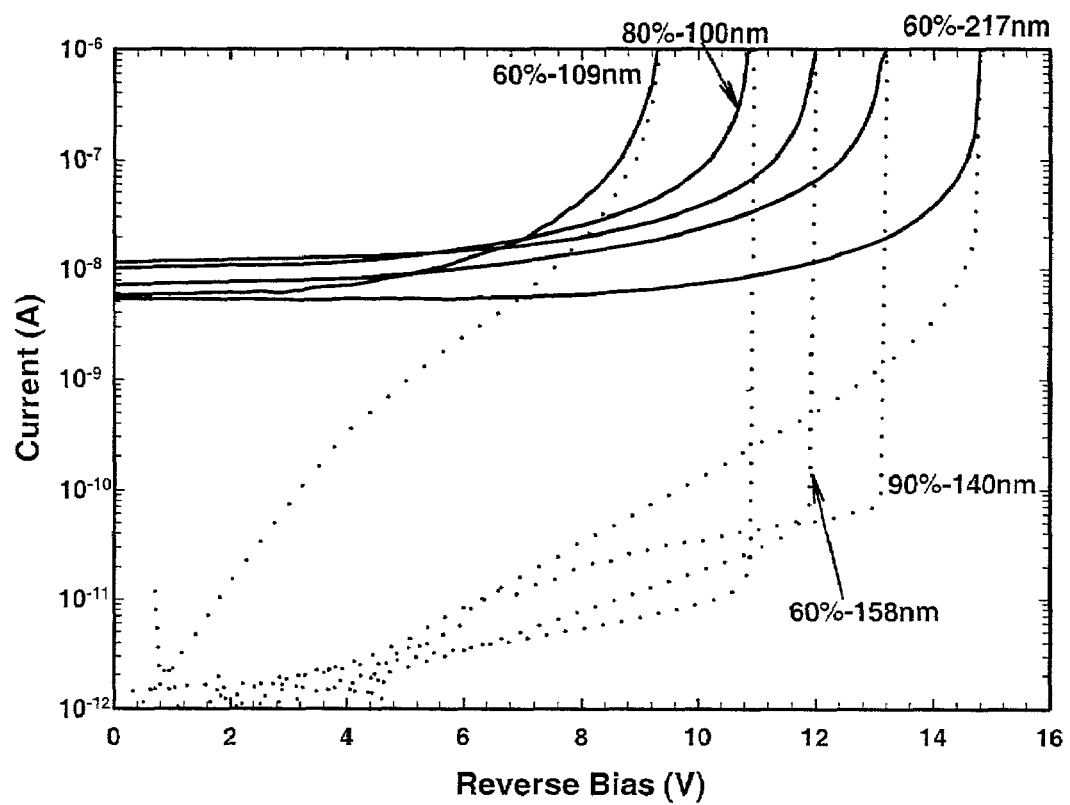
FIG. 35 depicts a plot of photocurrent and dark current Al $Al_xGa_{1-x}As$ APDs with high Al atomic percentages and thin multiplication layer thicknesses.
Figure 36:
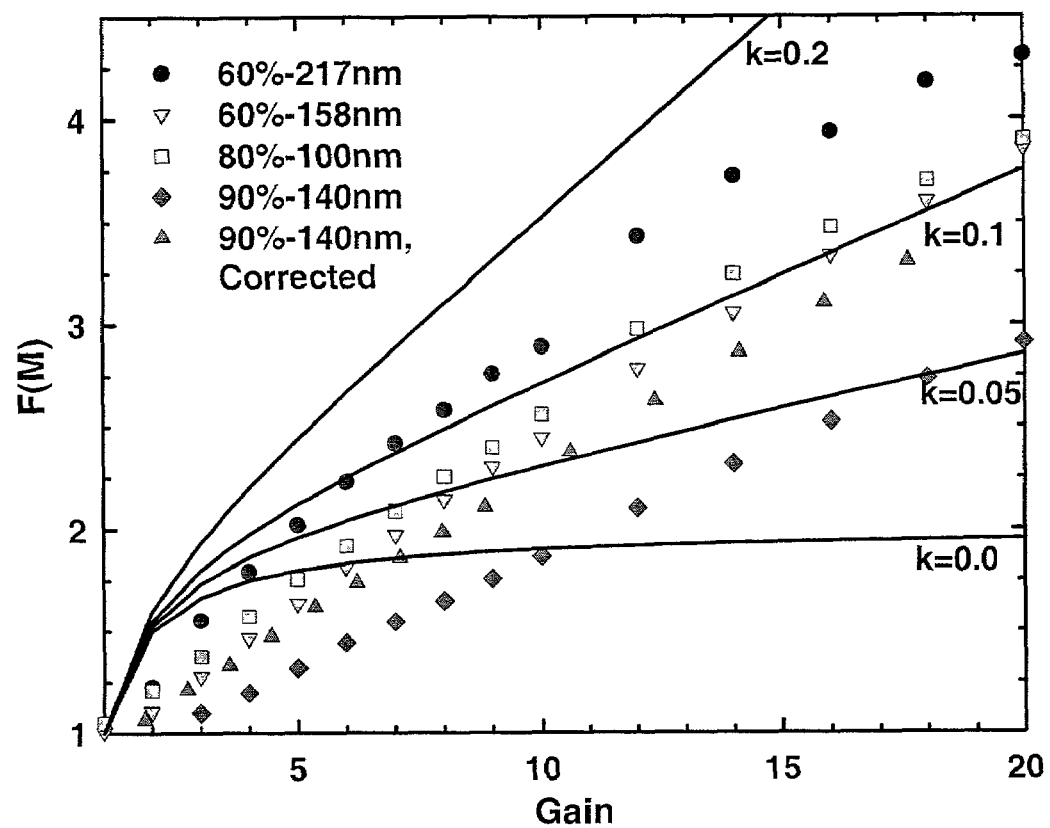
FIG. 36 depicts a plot of measured excess noise factors of $Al_xGa_{1-x}As$ APDs with high Al atomic percentages and thin multiplication layer thicknesses.

FIG. 35 illustrates the photocurrent and dark current of a series of homojunction $Al_xGa_{1-x}As$ APDs with relatively high Al ratios (atomic percentages) and relatively thin multiplication regions. The photocurrent is illustrated by the solid lines, and the dark current is illustrated by the dotted lines. The thickness and Al ratio are marked by the curves. The devices except the about 0.1 μm thick $Al_{0.6}Ga_{0.4}As$ APD demonstrate relatively low dark current and relatively high avalanche gain. FIG. 36 illustrates the measured excess noise of a series of homojunction $Al_xGa_{1-x}As$ APDs with relatively high Al ratios and relatively thin multiplication regions. The symbols shown the measured excess noise factors, and the solid lines are the values calculated with the specified k's. As plotted in FIG. 36, every device shows a lower excess noise factor than the GaAs-based devices described herein. However, comparing the calculated excess noise factors with the specified k values indicates that, as seen for GaAs, the local-field theory (Equation 40) may not accurately describe the relation between the gain and excess noise in the thin devices.

The initial $Al_{0.9}Ga_{0.1}As$ APDs may have the structure as shown in FIG. 15. Due to the relatively short minority carrier diffusion length of $Al_{0.9}Ga_{0.1}As$ devices, as the bias increases, the depletion region may extend into the highly doped region. In this manner, the diffusion distance for carriers that are generated near the surface may be reduced. Since the minority carrier diffusion length may be shorter in $Al_{0.9}Ga_{0.1}As$ than in other $Al_xGa_{1-x}As$ layers with lower Al ratios, this extension may effectively increase the quantum efficiency of the device. As such, the photocurrent may increase with voltage at relatively low bias, whereas it may be relatively flat in this region on other devices. Since $Al_{0.8}Ga_{0.2}As$ may have a similar bandgap and a longer minority diffusion length, replacing the p layer with an about 0.75 μm thick $Al_{0.8}Ga_{0.2}As$ layer on the surface and an about 0.1 μm thick $Al_{0.9}Ga_{0.1}As$ layer near the i region may reduce photocurrent increases with voltage at relatively low bias. The results of the $Al_{0.9}Ga_{0.1}As$ device as shown in FIGS. 35 and 36 were measured on this structure.

Since the depletion region may be much shorter than the whole p region, the resulting enhancement of the quantum efficiency may be considered as a perturbation. In fact, a simulation of this effect may yield an increase that may be nearly linear with respect to bias. With this approximation, the photocurrent slope may be determined in the relatively low bias region. The injected photocurrent at different voltages may be estimated. The corrected excess noise factor of the $Al_{0.9}Ga_{0.1}As$ device is plotted in FIG. 36. Although this noise level may be higher than the uncorrected one, it may be lower than any reported III-V APDs.

Because optic fibers may demonstrate minimum dispersion and attenuation at about 1.3 μm and about 1.55 μm, these wavelengths may be of most interest for long-haul high-bit-rate fiber optic telecommunication. $In_{0.53}Ga_{0.47}As$, which may be grown lattice-matched on InP, has an absorption spectrum extending to about 1.65 μm, which may make it a common selection for the absorption material at about 1.3 and about 1.55 μm. On InP substrates, the growth techniques for $In_{0.52}Al_{0.48}As$ and InP are relatively mature, and their wider bandgaps may make them natural selections for the multiplication regions in SACM structures.

Figure 37:
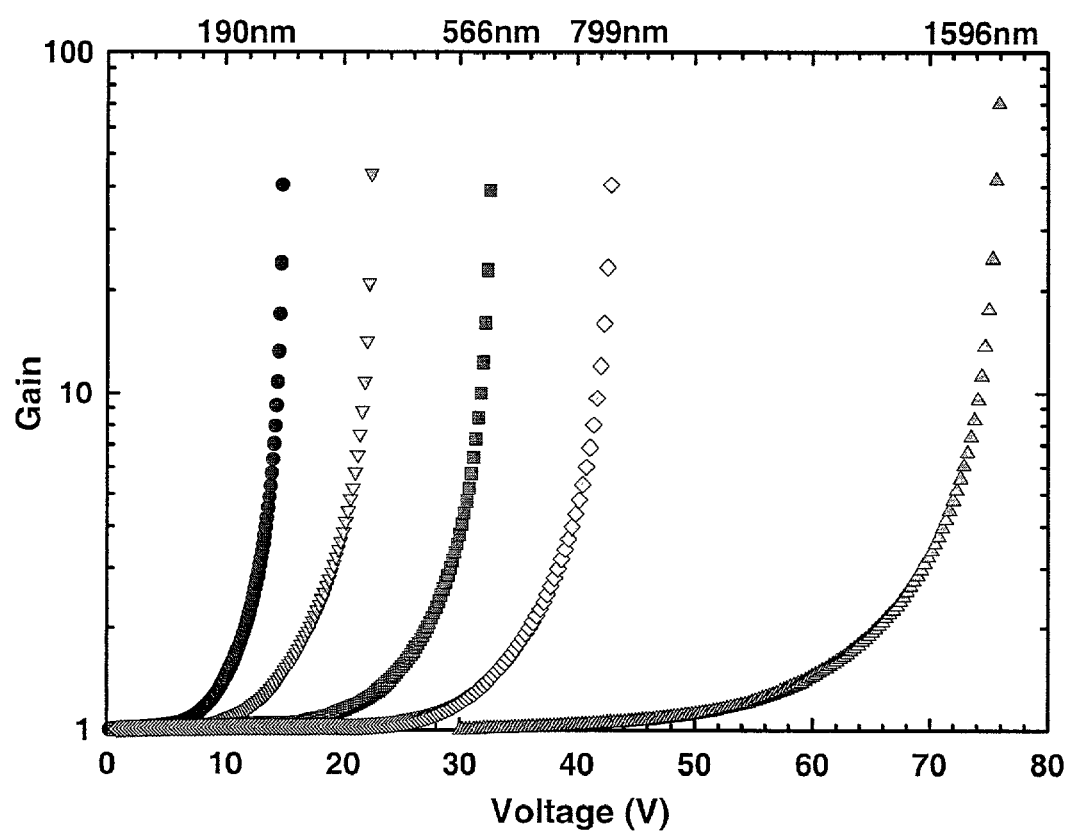
FIG. 37 depicts a plot of gains for $In_{0.52}Al_{0.48}As$ homojunction APDs with various multiplication layer thicknesses.

A series of $In_{0.52}Al_{0.48}As$ homojunction APDs with various multiplication layer thicknesses may be fabricated. Since electrons may have a higher impact ionization probability than holes in $In_{0.52}Al_{0.48}As$, to minimize the avalanche noise the PIN structure shown in FIG. 15 may be used, such that only electrons may be injected into the multiplication region. FIG. 37 illustrates a plot of gains for the $In_{0.52}Al_{0.48}As$ homojunction APDs with the indicated multiplication layer thicknesses. The thicknesses may be verified with capacitance measurements. The minimum thickness that may be used may be limited by the tunneling current.

Figure 38:
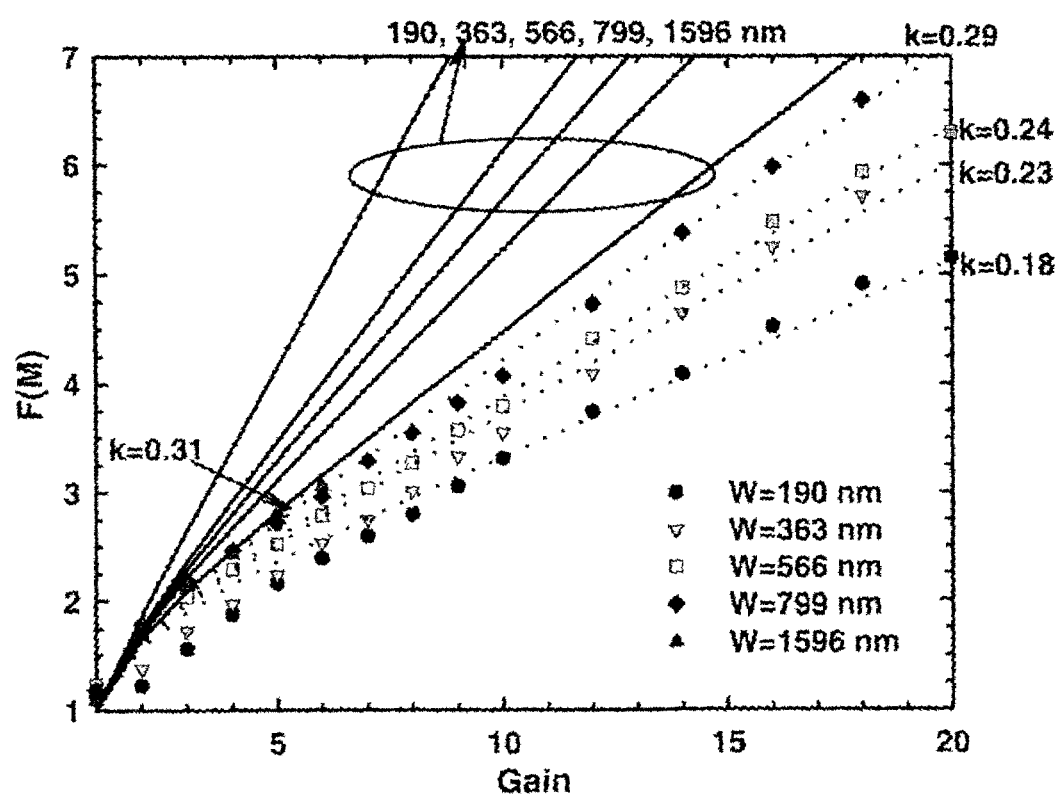
FIG. 38 depicts a plot of measured excess noise factors and calculated values using conventional theory for $In_{0.52}Al_{0.48}As$ homojunction APDs.

The measured excess noise factors of these devices and the calculated values using the conventional theory for the $In_{0.52}Al_{0.48}As$ homojunction APDs are shown in FIG. 38. The symbols show the measured excess noise factors, and the dotted lines are the values fitted with modified k's. The solid lines were calculated with the reported ionization coefficients of $In_{0.52}Al_{0.48}As$. As described herein, for GaAs and $Al_{0.2}Ga_{0.8}As$ devices, the thinner multiplication regions also may demonstrate lower noise, and the contradiction between the calculation results using the reported ionization coefficients and the conventional avalanche theory may remain sharp. The k's may be used as a fitting parameter to fit the noise factors with Equation 40, and they are indicated in FIG. 38.

Figure 39:
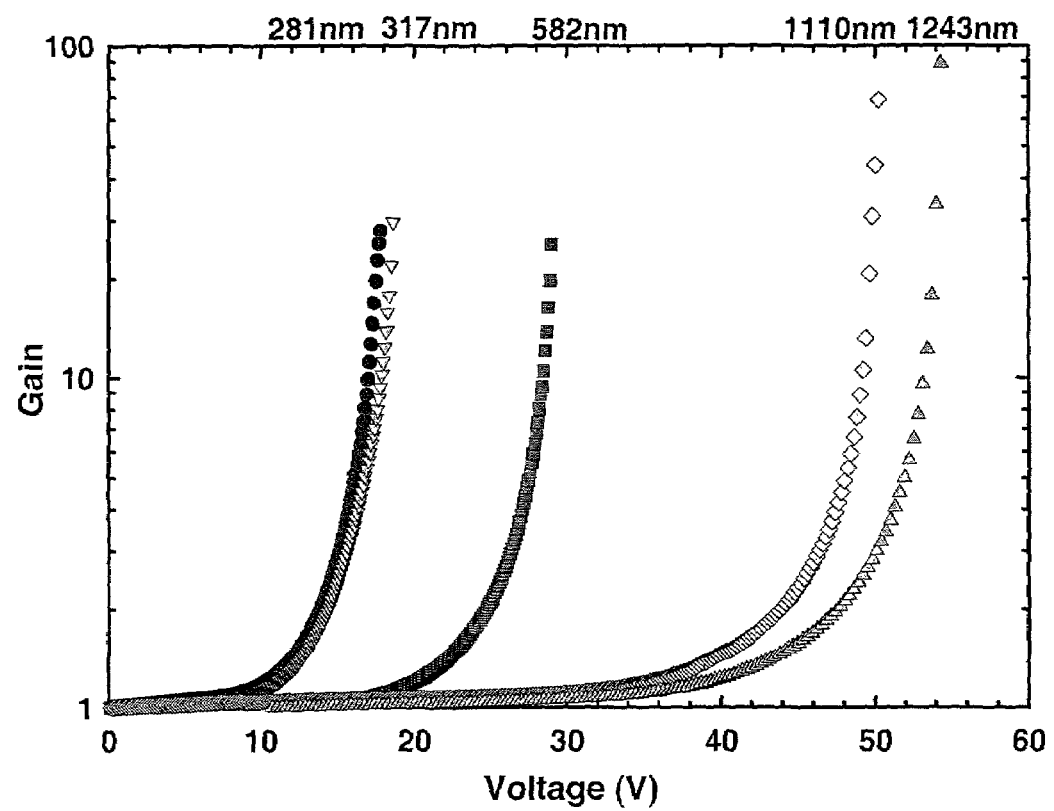
FIG. 39 depicts a plot of gains for the InP NIP homojunction APDs with various multiplication layer thicknesses.
Figure 40:
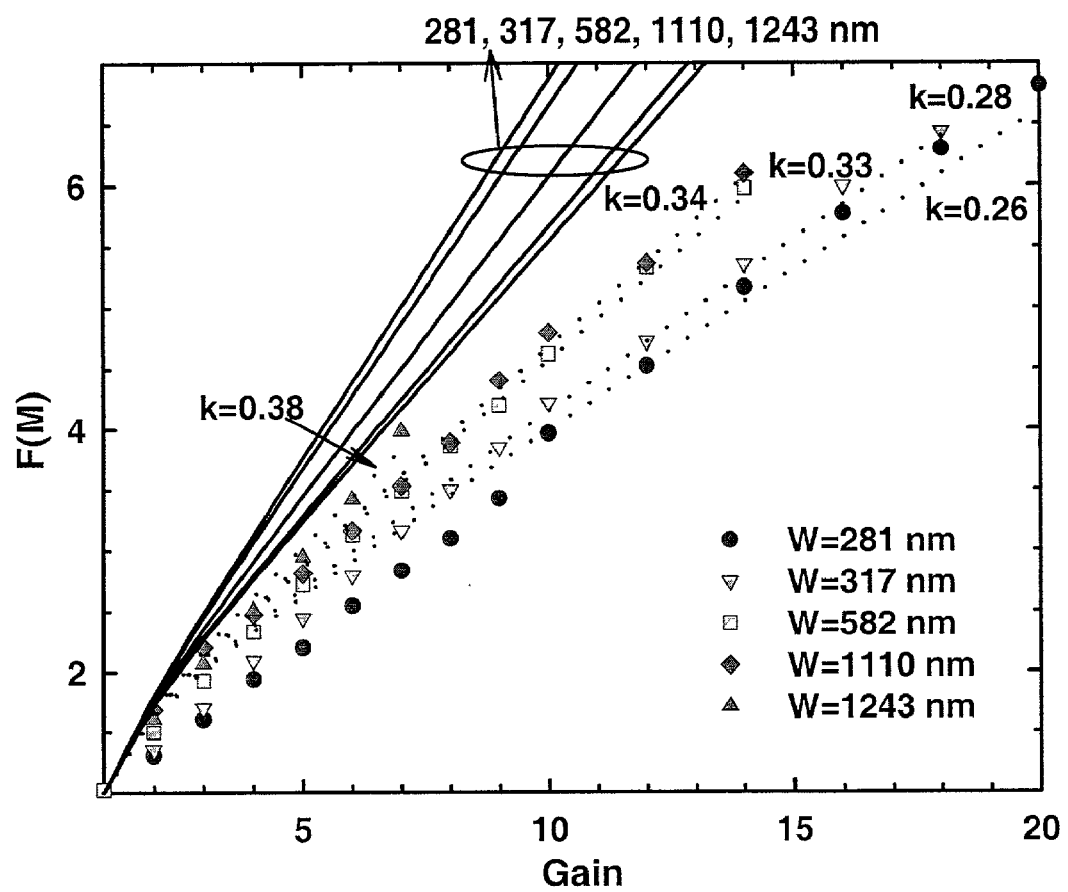
FIG. 40 depicts a plot of measured excess noise factors and calculated values using conventional theory for the InP homojunction APDs.

InP may be another material for a multiplication layer of InP-based APDs. The ionization coefficient of holes may be greater than that of electrons. Therefore, an NIP structure may be taken for the InP APDs to inject holes from the top n layer and to reduce, and even minimize, the multiplication noise. FIG. 39 shows the gain curves of the InP homojunction APDs with the indicated multiplication layer thicknesses. The indicated thicknesses may be obtained from capacitance measurements. FIG. 40 illustrates a plot of measured excess noise factors and calculated values using the conventional theory for the InP homojunction APDs. The symbols show the measured excess noise factors, and the dotted lines are the values fitted with modified k's. The solid lines were calculated with the reported ionization coefficients of InP. As shown in FIG. 40, the noise reduction effect in relatively thin multiplication layers may also be observed on InP APDs. The calculated excess noise factors using reported ionization coefficients of InP may not agree with the experiment.

According to a recent avalanche-theory study, the acceleration distance required for a newly injected/generated carrier to accumulate sufficient energy to cause ionization, which may generally be referred to as "dead length," may play a role in the noise reduction effect described herein. Due to this dead space, more ionization events may happen near boundaries of a relatively thin multiplication region than in near the middle of the region. In contrast, this distribution may be more uniform in a relatively thick layer. Similar to impact ionization in a photo-multiplication tube ("PMT"), the resulting restriction in the ionization position may change the statistics of the multiplication process and result in a noise reduction in thin layers. The details of the history-dependent avalanche theory will be described herein. A similar noise suppression mechanism may also be observed in mesoscopic conductors.

Figure 41:
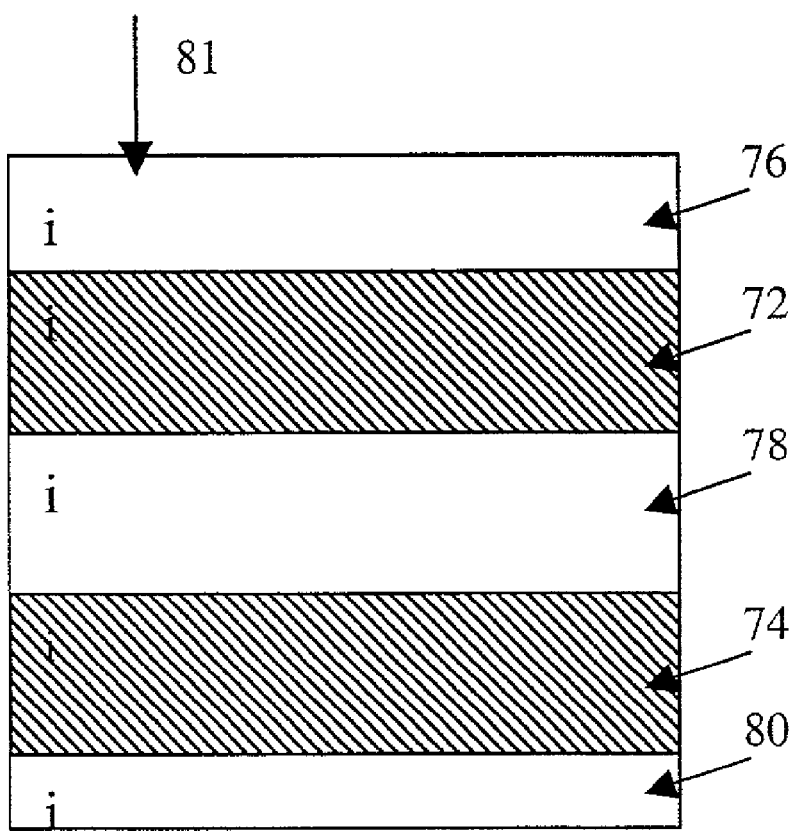
FIG. 41 depicts a schematic diagram of Impact-Ionization-Engineered ("IIE") multiplication region.

One further step to restrict the ionization position may be achieved in the structure as shown in FIG. 41. This structure, which may be generally referred to as an impact-ionization-engineered ("IIE") multiplication region, may modulate the multiplication region with carrier ionization probabilities, such that impact ionization may occur substantially in relatively narrow regions 72, 74 (well) near the boundaries. Barrier regions 76, 78, and 80 may serve substantially as the acceleration field for the carriers. The two wells 72, 74, where ionization occurs, may have higher carrier ionization probabilities, and barrier regions 76, 78, and 80 may include materials with lower carrier ionization probabilities. Electrons 81 may enter the multiplication region at barrier region 76. To restrict ionization in the relatively narrow region, the ionization-probability difference between the wells and barriers may be as large as possible. For the same reason, a total thickness of the multiplication region may be relatively thin (e.g., less than about 0.5 μm) to reduce, and even minimize, the probability of ionization in the barriers. Due to acceleration in the barriers, an electric field for a gain in this structure may be lower than a layer made of the wells alone thereby resulting in lower dark current. In addition, this general structure may not be restricted to a specific material system.

In previously reported/patented periodic superlattice or staircase structures, the focus is on the modulation of the bottom of the Γ valley of semiconductors. Since most electrons are not in the Γ valleys at relatively high electric fields, which may be the case in multiplication regions, the performance improvement may be limited. The IIE structure may be based on the carrier ionization probabilities of materials and may provide tighter control of the ionization positions. The corresponding statistics may greatly suppress multiplication noise. Since no superlattice or multi-quantum-well ("MQW") may be necessary in this structure, the growth requirement may also be relaxed.

In one study, two IIE structures with GaAs wells and $Al_{0.6}Ga_{0.4}As$ barriers were fabricated. A thickness of the wells was about 35 nm, about 42 nm and about 50 nm, and the total thickness of the barriers was about 100 nm in every device. For comparison, another structure with one about 70 nm thick well in the middle was processed as well. To avoid the complexity of hetero-interfaces at edges of the intrinsic region, the p and n regions may consist of $Al_{0.6}Ga_{0.4}As$.

Figure 42:
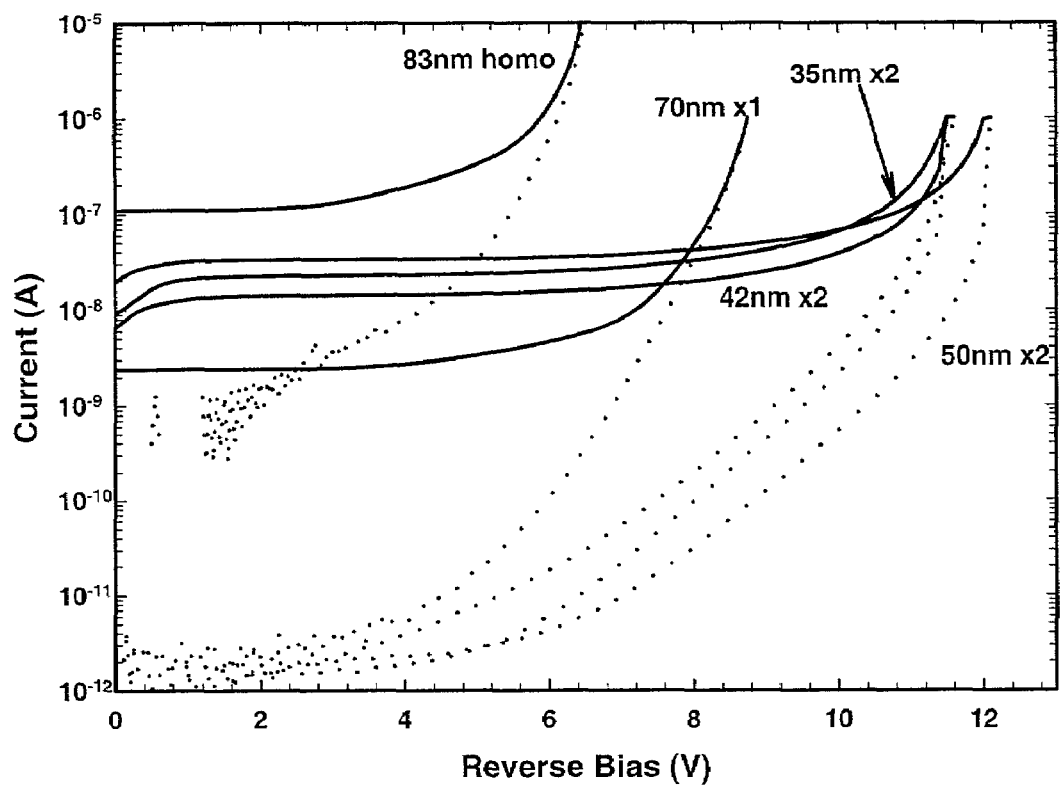
FIG. 42 depicts a plot of photocurrent and dark current of IIE APDs.

FIG. 42 shows the photocurrent and dark current of these devices as well as that of the GaAs device with an about 83 nm thick multiplication layer. The photocurrent is shown as solid lines, and the dark current is shown as dotted lines in FIG. 42. The well thickness and number are marked by the curves. Breakdown voltages of the hetero-structures (35 nm×2, 42 nm×2, 50 nm×2, and 70 nm×1) may be higher than that of the GaAs homojunction device because of the voltage drop over the barriers. The difference of the breakdown voltages of the two twin-well structures may be due to a small thickness-control error in the barrier growth. An average electric field for a given gain in the IIE structure may be lower than the layer made of the well material alone due to the acceleration in the barriers, and thus may result in a lower dark current.

Figure 43:
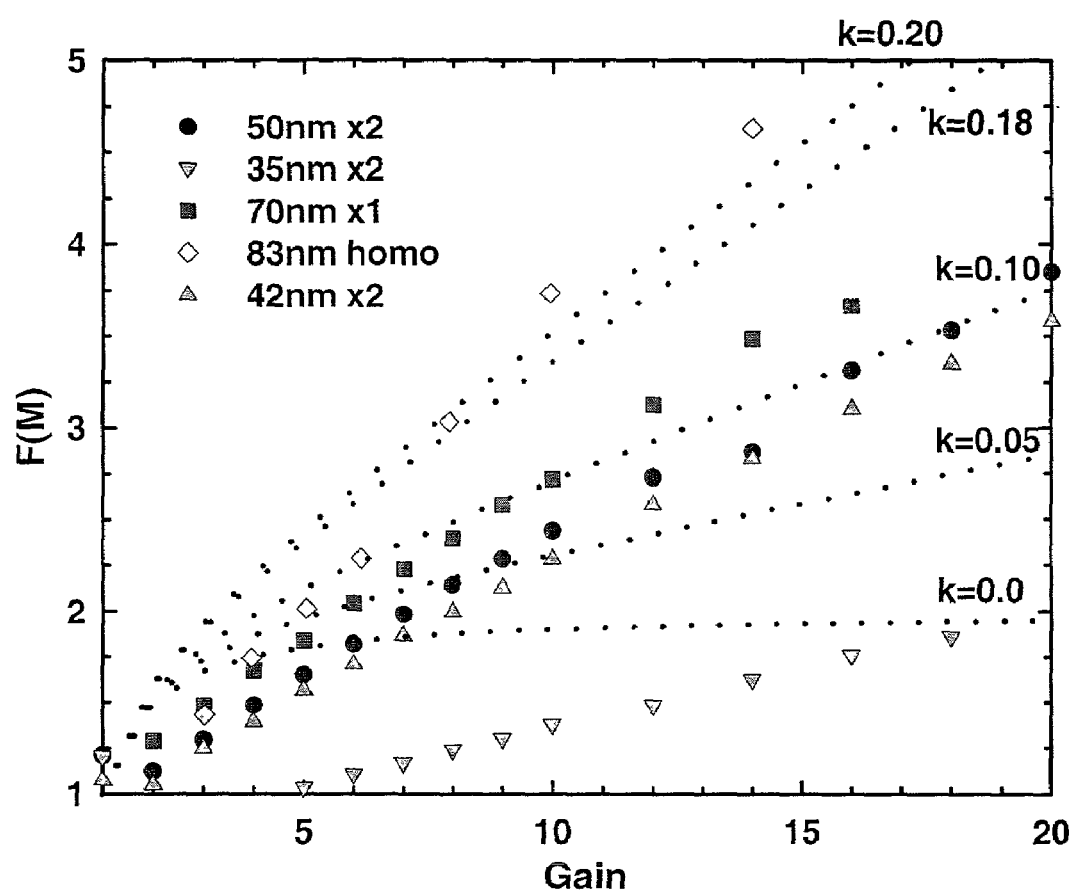
FIG. 43 depicts a plot of measured excess noise factors of IIE APDs and a 83 nm thick GaAs homojunction device.

FIG. 43 illustrates the excess noise factors of the IIE APDs and the about 83 nm thick GaAs homojunction device. The symbols show the measured excess noise factors in FIG. 43, and the dotted lines are the vales calculated with the conventional theory and the specified k's. Since ionization events may happen substantially in the intrinsic GaAs regions in these devices, a comparison between the GaAs homojunction and the one-well structure shows that avalanche noise may decrease substantially even in the sub-100 nm region. However, further effort in thinning the multiplication region may be limited by the tunneling current, which may be already quite severe in the one-well structure. Noise suppression may be dramatic in the relatively thin twin-well structures due to space modulation of impact ionization. Comparing the calculated results with Equation 40 in the conventional theory and the specified k's, it is clear that the equation may not describe the curves. Compared to the relatively thin $Al_xGa_{1-x}As$ layers with relatively high Al ratios described herein, the IIE structures demonstrate lower multiplication noise. In the low gain region, the noise of the 35 nm×2 device may be lower than that of Si devices.

Figure 44:
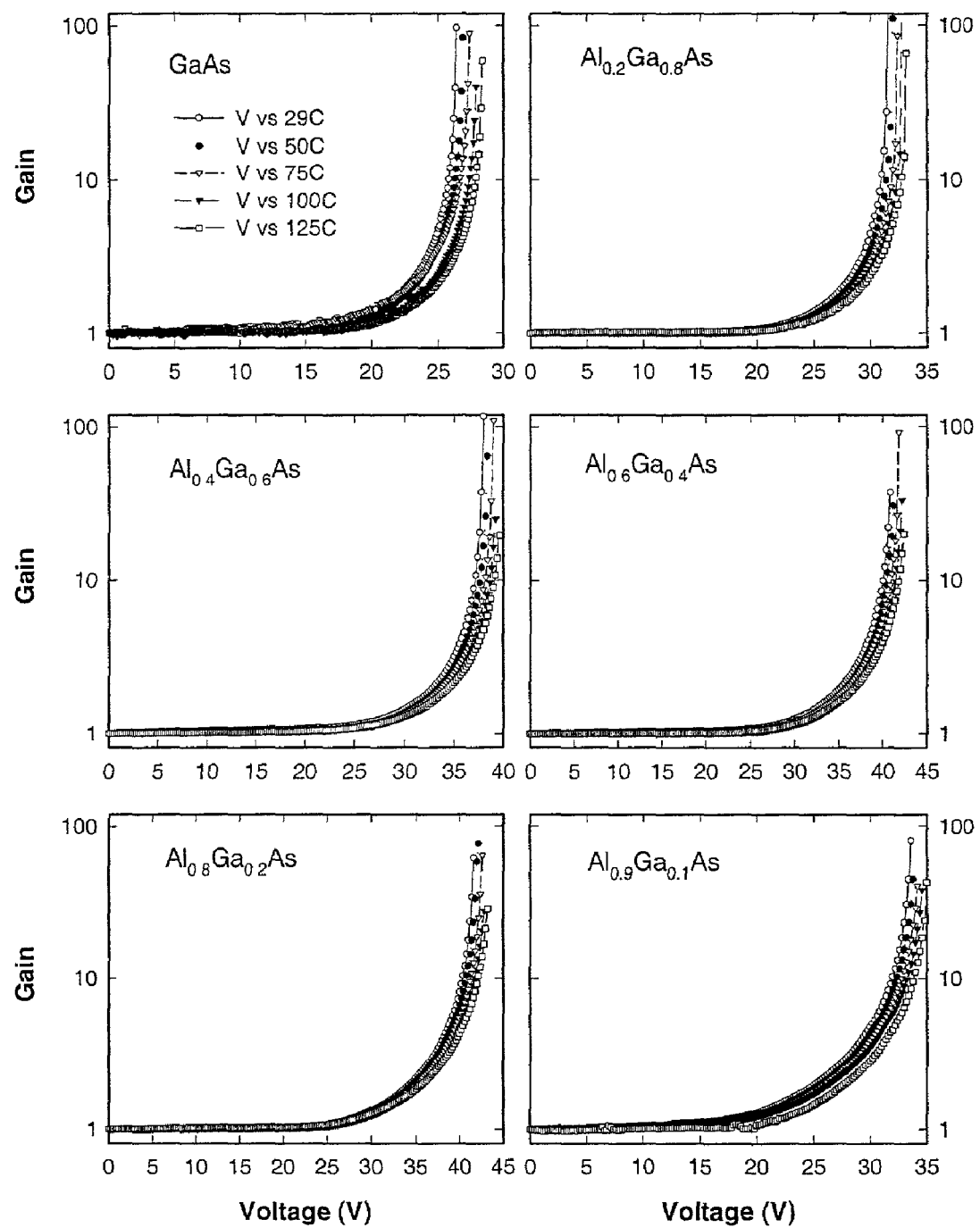
FIG. 44 depicts plots of temperature dependence of gains of $Al_xGa_{1-x}As$ APDs with a 0.8 µm thick multiplication region and various Al ratios.
Figure 45:
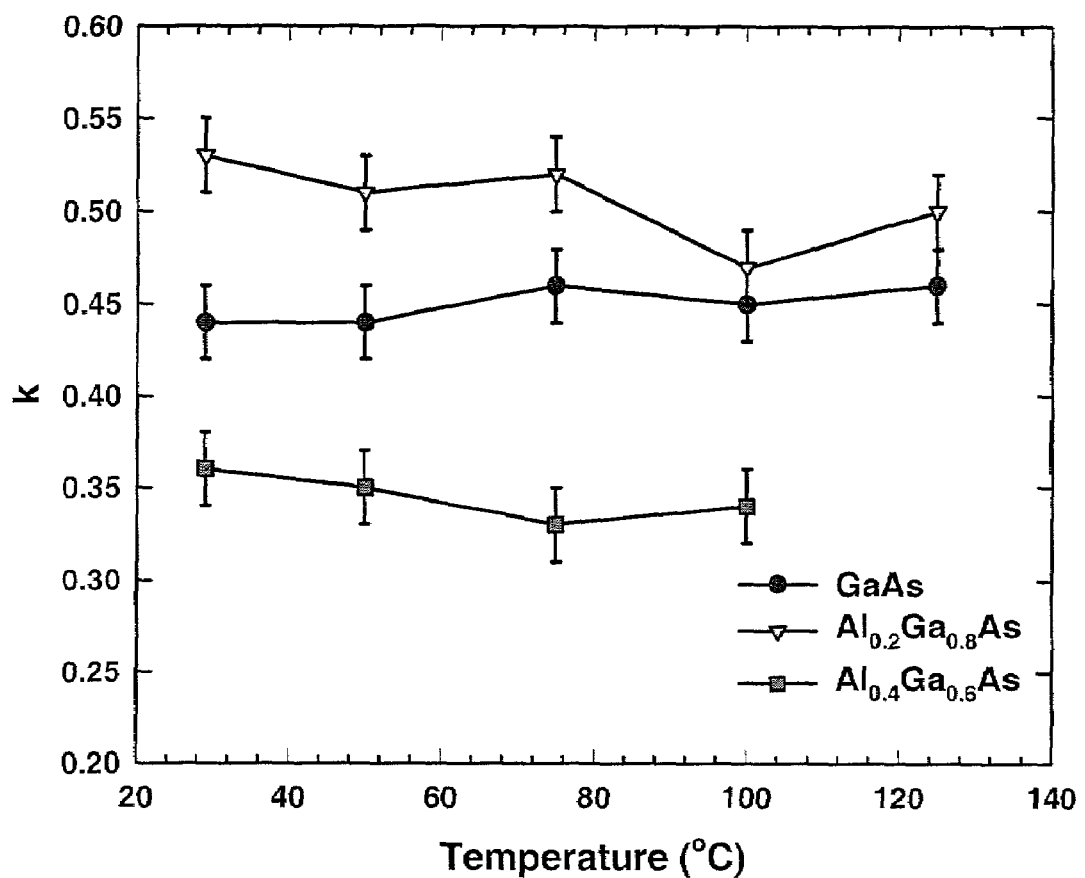
FIG. 45 depicts a plot of temperature dependence of k values fitted with measured excess noise factors of 0.8 µm thick homojunction $Al_xGa_{1-x}As$ APDs.
Figure 46:
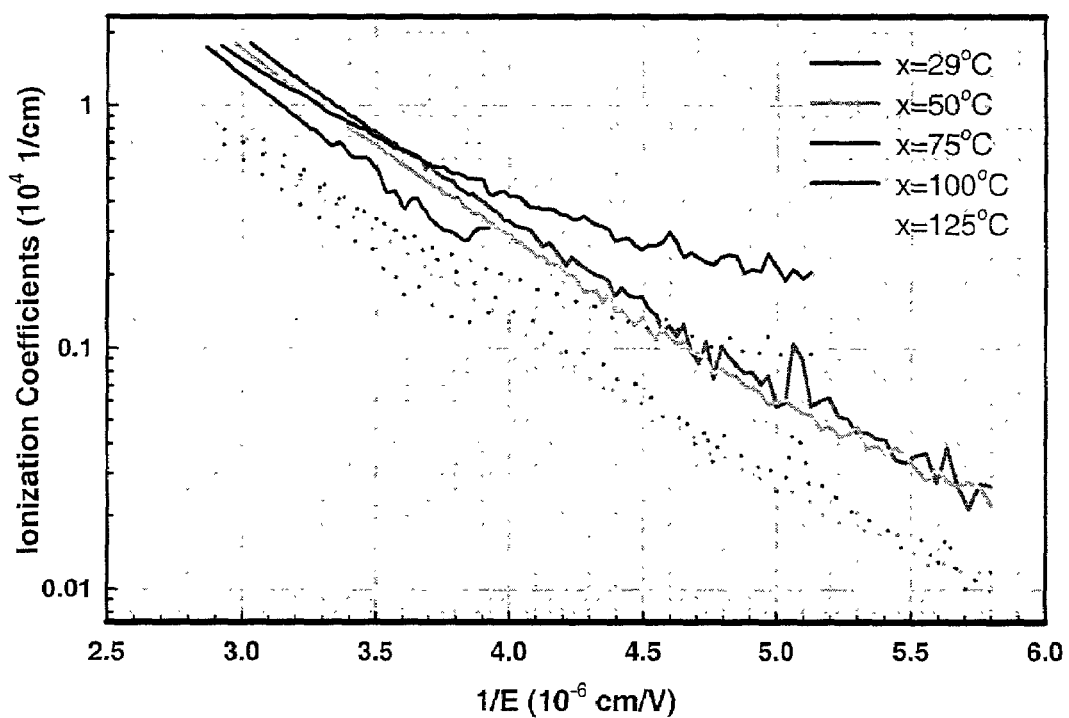
FIG. 46 depicts a plot of ionization coefficients of GaAs at different temperatures.
Figure 47:
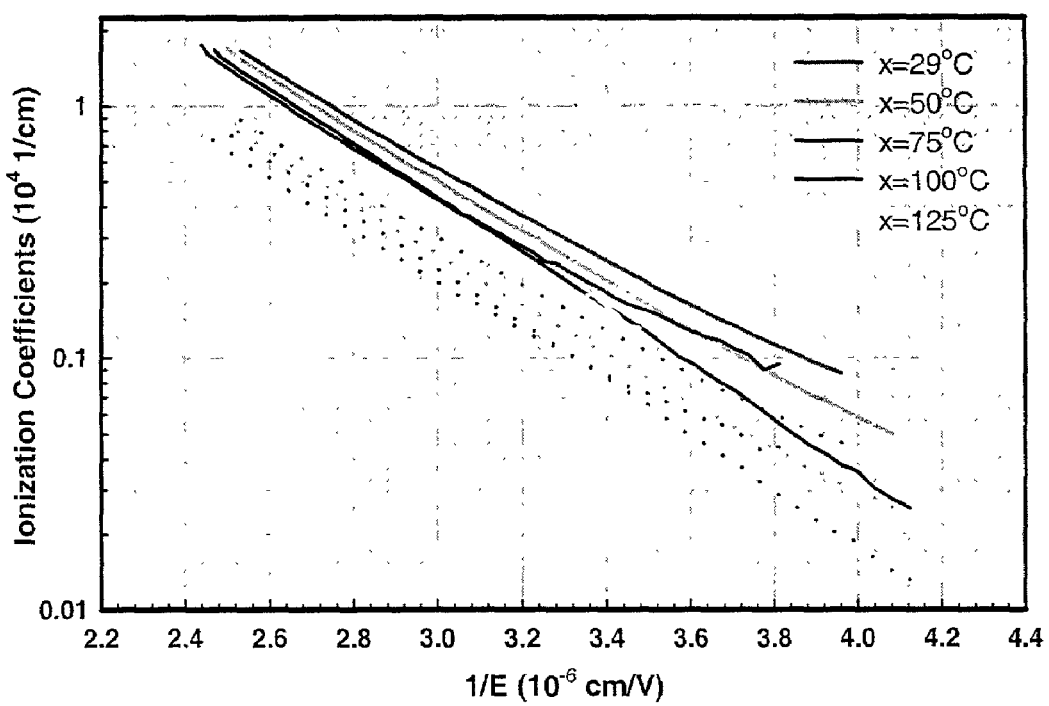
FIG. 47 depicts a plot of ionization coefficients of $Al_{0.2}Ga_{0.8}As$ at different temperatures.
Figure 48:
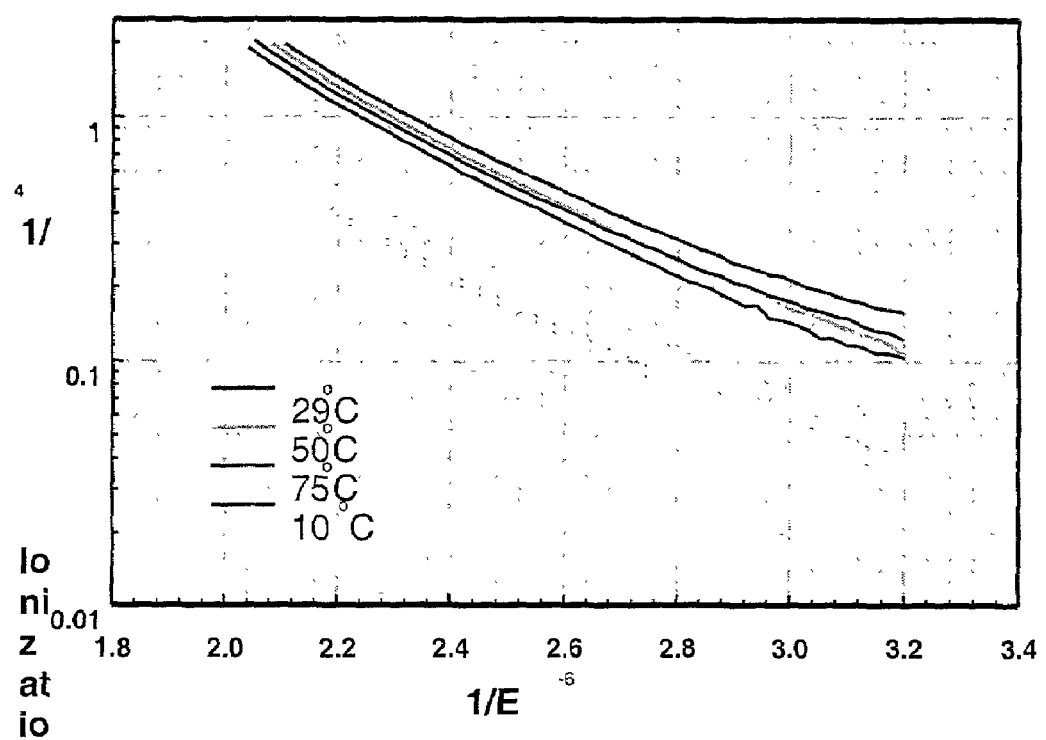
FIG. 48 depicts a plot of ionization coefficients of $Al_{0.4}Ga_{0.6}As$ at different temperatures.

The temperature dependence of impact ionization may be another performance aspect of APDs, and it may also be of interest in the design of high-performance III-V transistors. Since phonon scattering increases with temperature, a carrier may be more likely to lose energy to photons at a higher temperature, and the breakdown voltage of APDs may increase. As shown in FIG. 44, the gain curves of 0.8-μm-thick $Al_xGa_{1-x}As$ devices having various Al ratios at different temperatures demonstrates this temperature dependence. For the same reason, minority-carrier diffusion length may decrease with temperature. Therefore, quantum efficiency may be lower at higher temperatures. To determine the ionization coefficients, excess noise factors of devices with Al ratios of about 0%, about 20% and about 40% were measured on the same devices at these temperatures. These devices demonstrated little variation with temperature, and the difference between the excess noise factors under different temperatures is comparable with the experimental error margin. FIG. 45 illustrates the fitted ionization coefficient ratios, k's, plotted as a function of temperature for 0.8 μm thick homojunction $Al_xGa_{1-x}As$ APDs. With gain and noise measurements, the ionization coefficients, which were calculated with the Equation 59, are plotted in FIGS. 46–48. FIG. 46 illustrates the ionization coefficients of GaAs at different temperatures. The results were calculated with gain and noise measurements under pure electron injection. FIG. 47 illustrates the ionization coefficients of $Al_{0.2}Ga_{0.8}As$ at different temperatures. FIG. 48 illustrates the ionization coefficients of $Al_{0.4}Ga_{0.6}As$.

Figure 49:
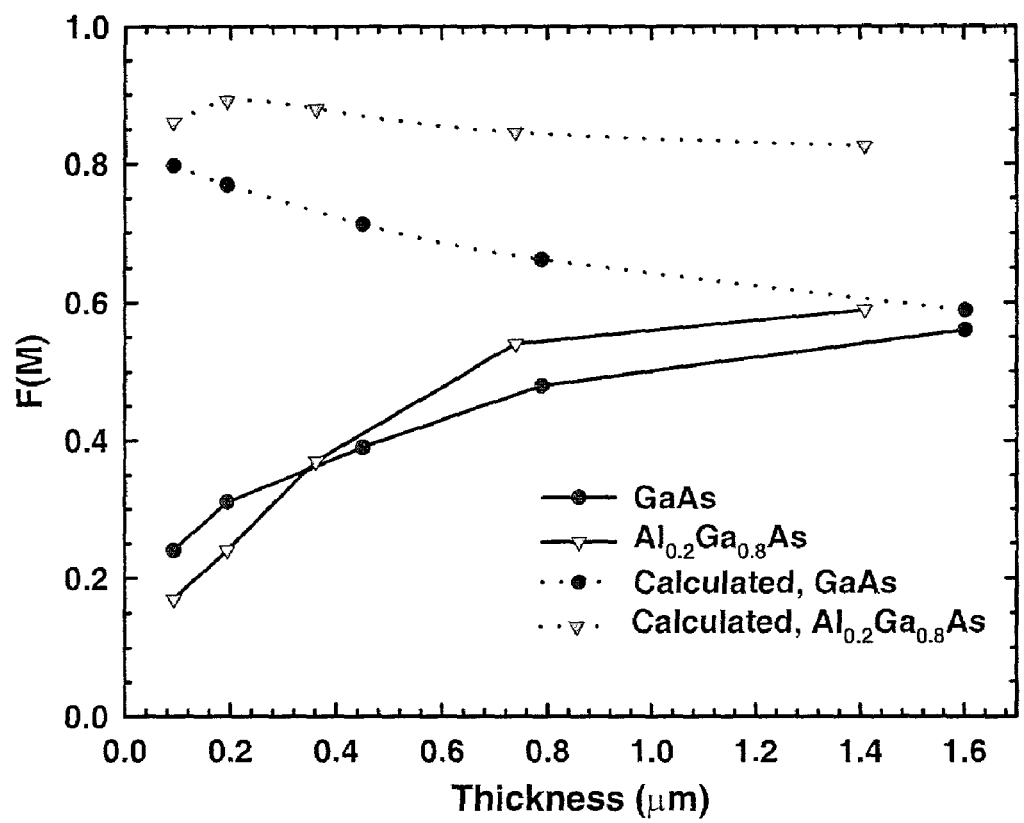
FIG. 49 depicts a plot of fitted and calculated k values versus multiplication region thicknesses on GaAs based APDs.
Figure 50:
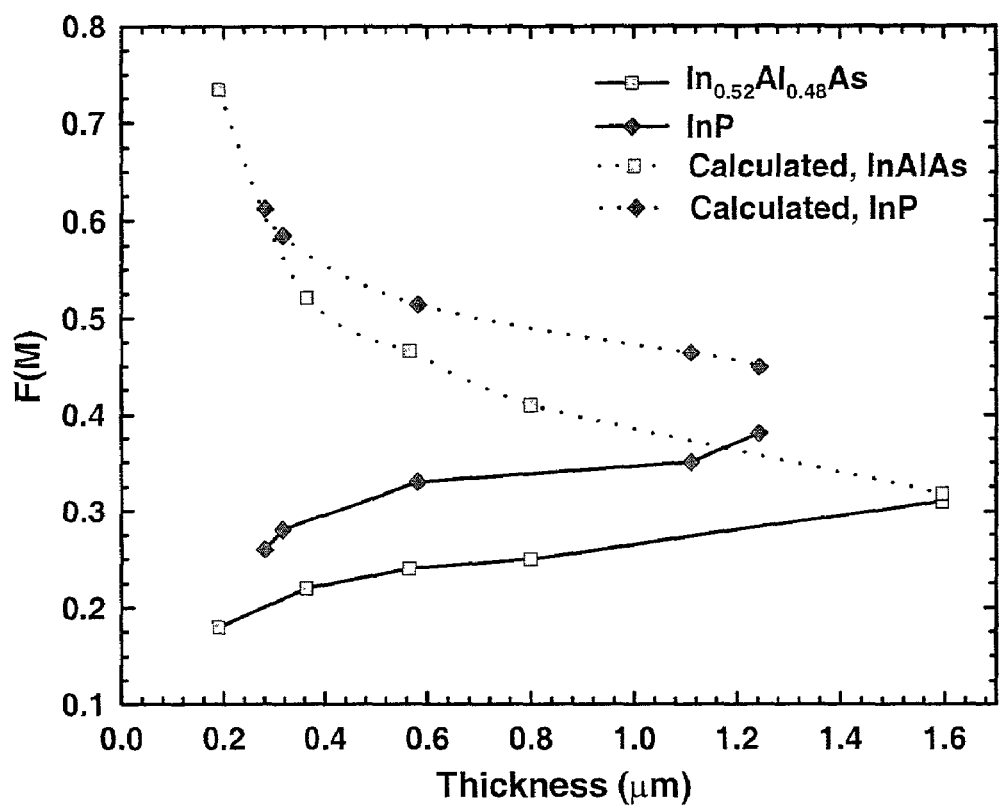
FIG. 50 depicts a plot of fitted and calculated k values versus multiplication region thicknesses on InP based APDs.

Due to wide application of k as the reference in the excess noise factor, the discrepancy with the conventional theory may also be presented with the plot of the k values versus the multiplication region thicknesses. FIG. 49 illustrates the comparison of effective k's and those calculated with reported ionization coefficients on the GaAs-based APDs. The fitted k's were obtained by fitting the excess noise curves with Equation 40 in the conventional theory. The calculated values were ratios of the reported ionization coefficients. The comparison for the InP-based devices is shown in FIG. 50. FIG. 50 illustrates the fitted and calculated k values versus the multiplication region thicknesses on the InP-based APDs. The fitted k's and the calculated values were obtained as described above. The k values for the InP devices shown here are actually $1/k=\alpha/\beta$ because $\beta$ is greater than $\alpha$ in InP and only holes may be injected in these particular InP devices. FIGS. 49 and 50 show that either the conventional theory or the reported ionization coefficients may not be applicable to thin multiplication regions. In addition, the relatively high gain-bandwidth products of devices with relatively thin multiplication regions also may indicate that this theory, which has proven successful in thick layers, may underestimate the gain-bandwidth products of thin multiplication layers and may fail to describe the multiplication process. Therefore, a new theoretical development may be essential for understanding the avalanche process and for furthering performance improvement.

The first successful noise theory for avalanche photodiodes assumed that impact ionization is a continuous, local process, and that ionization probability is only a function of the local electric field irrespective of a carrier's ionization history. This theory has been widely accepted and has proved to be an extremely useful model for a wide variety of avalanche devices. Recently, however, as shown herein, it has been observed that this theory may not provide a good fit to the gain curves and that it may overestimate the multiplication noise and underestimates the gain-bandwidth product for devices with thin multiplication regions. These discrepancies may be due to the assumption of locality. For example, after an ionization event, a carrier may travel a certain distance, which may be generally referred to as the "dead length", before it may gain sufficient energy from the electric field to have a non-negligible ionization probability. This dead length may be ignored if it is small compared to the thickness of the multiplication region.

On the other hand, when a thickness of the multiplication region may be reduced to the point that may become comparable to a "few" dead lengths, the assumption of locality may fail and it may no longer be valid to assume a continuous ionization process. Numerous analytical and numerical techniques have been proposed to address the nonlocal nature of impact ionization. Numerical techniques that utilize the Monte-Carlo technique may be formally exact, but their accuracy may be reduced by the completeness of the bandstructure and the scattering models used in the simulation. As a consequence, adequate fits to the experimental data may require several adjustable parameters thus obviating one of their advantages relative to analytical models. In addition, such techniques may be very computation intensive. It is in this context that a history-dependent analytical avalanche theory was developed. This theory, as described herein, may provide reasonable fits to the gain and noise measurements of III-V semiconductor APDs.

Throughout the calculations described herein, a one-dimensional model may be used and may assume that the n, i, and p regions are arranged from left to right, as shown in FIGS. 8a and 8b. The origin is at the interface of the n and i regions, and the thickness of the i region is w. Thus, electrons are swept to the left and holes are swept to the right. Without losing generality, one may assume that the electron ionization coefficient, $\alpha$, is greater than that of the hole, $\beta$, in this section.

In the history-dependent theory, the ionization coefficient of an electron or a hole at x may be assumed from the outset to depend not only on the field E(x), but also on the location of the point x' at which the carrier was created and on the field profile at all points between x' and x. To describe the impact ionization in semiconductors more accurately, it may be necessary to take the history of the carriers into account and to employ a new set of field-profile-independent parameters to characterize the ionization properties of semiconductors. The parameters should be applicable to any avalanche structure provided the electric field distribution may be known.

By assuming that the carrier that initiates an impact ionization may lose substantially all of its energy relative to the bandedge after each impact ionization event, each event may be considered as annihilation of a "hot" carrier and the generation of three new "cold" carriers, two of one type and one of the other. The newly-generated "cold" carriers may be accelerated in the electric field and become "hot". To accurately represent this process, history-dependent ionization coefficients $\alpha(x'|x)$ and $\beta(x'|x)$ for every set of points x' and x may be defined to represent the local ionization probability density at x for a carrier generated at x'. If an electron generated at x' can survive until it gets to x without ionizing, then the probability for it to ionize in the distance element dx is $\alpha(x'|x)dx$. The ionization probability of this electron in dx, thus depends on the electron survival rate $P_{se}(x'|x)$ which may be defined as $$P_{se}(x' | x) = \exp\left(-\int_{x}^{x'} dx'' \alpha(x' | x'')\right). \tag{67}$$

The ionization probability density function ("PDF") may then be given by $$p_e(x'|x)dx = \alpha(x'|x)P_{se}(x'|x)dx. \tag{68}$$

The survival rate and ionization probability of holes may be defined similarly $$P_{sh}(x'|x) = \exp\left(-\int_{x'}^{x} dx'' \beta(x'|x'')\right) \text{ and} \quad (69)$$

$$p_h(x'|x)dx = \beta(x'|x)P_{sh}(x'|x)dx.$$

To determine $\alpha(x'|x)$ and $\beta(x'|x)$ for a given electric field profile $E(x)$, a model has been proposed by which $\alpha(x'|x)$ and $\beta(x'|x)$ may be determined analytically. The basic routine of the calculation may start from the electric-field profile in a device. The position-dependent ionization coefficients may be represented by a conventional form (Equation 60) in which the field $E$ may be replaced by an effective field $E_{eff}$, which may depend on the recent carrier history. By treating non-local ionization coefficients through an effective field, arbitrary field profiles may be easily accommodated. The effective field may be related to actual fields experienced by the carrier in its recent history by correlation functions. The correlation functions that have been empirically found to provide good fits to experimental data are $$f_{c,e}(x''|x) = \frac{2}{\sqrt{\pi}\lambda_e}\exp\left(-\frac{(x''-x)^2}{\lambda_e^2}\right) \quad (70)$$

$$f_{c,h}(x''|x) = \frac{2}{\sqrt{\pi}\lambda_h}\exp\left(-\frac{(x-x'')^2}{\lambda_h^2}\right),$$

where $\lambda_e$ and $\lambda_h$ are the correlation lengths that may depend on scattering mechanisms and the electric field. Using these correlation functions, the effective electric fields become $$E_{eff,e}(x'|x) = \int_x^{x'} dx'' E(x'') f_{c,e}(x''|x) \quad (71)$$

$$E_{eff,h}(x'|x) = \int_{x'}^{x} dx'' E(x'') f_{c,h}(x''|x),$$

and the ionization coefficients are represented by the conventional parameterization $$\alpha(x'|x) = A_e \exp\left(-\frac{E_{c,e}}{E_{eff,e}(x'|x)}\right) \quad (72)$$

$$\beta(x'|x) = A_h \exp\left(-\frac{E_{c,h}}{E_{eff,h}(x'|x)}\right),$$

where $A_e$, $A_h$, $E_{c,e}$, and $E_{c,h}$ are constant. Since some of the Monte-Carlo simulations may show that the voltage drop across the dead length may remain relatively constant, the correlation lengths $\lambda_e$ and $\lambda_h$ may be expressed in terms of the voltage drops across the dead lengths $V_{de}$ and $V_{dh}$, respectively. However, in most cases, $\lambda_e(E) = V_{de}/E$ and $\lambda_h(E) = V_{dh}/E$ may be good approximations.

In the local-field theory for avalanche devices, the ionization coefficient of an electron or a hole moving in a substantially constant electric field may be defined in any of the following equivalent ways:

1. The ionization probability of the carrier per unit distance;

2. The reciprocal of the mean free path between ionization events;

3. The average ionization probability per unit distance, with the average taken over all carriers of the same type (ensemble average); and 4. The measured ionization coefficient, derived from measurements of gain vs. voltage, under both hole and electron injections.

With the history-dependent ionization probability densities defined above, each of these definitions, while possibly being a valid definition for a particular purpose, may result in a different value of the ionization coefficient. Thus, in discussing history-dependent ionization coefficients, it may be important to keep in mind which of these definitions has been used and for what purpose. This difference may be illustrated with a simple one-dimensional extreme case, in which only holes ionize. In addition, it may be assumed that all of the newly generated holes (either optically or by impact ionization) travel a fixed dead length $l_d$ with no ionization, and the ionization probability density increases in a step function to a constant value $\beta_h$. If the hole originates at x', then with reference to the four definitions of ionization coefficient listed above we have:

Definition 1: $\beta=0$, $x-x'<l_d$, $\beta=\beta_h$ otherwise.

Definition 2: $1/\beta_{av}=l_d+1/\beta_h$, or $\beta_{av}=\beta_h/(1+\beta_h l_d)$.

Definition 3: Ensemble average $\langle x \rangle \sim 5 l_d$) is $\beta_{eff}=\beta_h$ $(2\exp(-\beta_{eff}l_d)-1)\approx \beta_h/(1+2\beta_h l_d)$ for $\beta_h l_d \ll 1$; and Definition 4: $\beta_m=1 \ln M/w$.

So, at least for this example, $\beta_h > \beta_{av} > \beta_{eff} > \beta_m$. In this case, $\beta_{eff}$, which most closely approximates the results of a measurement, $\beta_m$, may be significantly different from $\beta_{av}$. This simple example was chosen only because it was relatively easy to calculate. More realistic cases (two-carrier ionization, more realistic history-dependent ionization coefficients, non-uniform fields) are treated below.

The history-dependent multiplication theory provides two approaches for the gain calculation. Following the corresponding deduction process in the conventional local-field theory, Method I may be focused on calculation of position-dependent gain and current distributions. The total gain may then be determined by the integral over the whole multiplication region. The following frequency response calculation may be developed from this method. Method II traces the initial carriers and considers all the ionization probabilities as the carriers proceed to the edges of the multiplication region. The ionization caused by secondary carriers may be automatically taken into account recursively. The equations for the multiplication noise may be deduced based on this method.

Similar to Equation 32, the increment of the electron and hole current in dx includes three parts $$\frac{di_p(x)}{dx} = -\frac{di_n(x)}{dx} = g(x) = g_e(x) + g_h(x) + g_o(x), \quad (73)$$

where $g_e(x)$ is the net local generation rate due to impact ionization by electrons, $g_h(x)$ is that due to ionization by holes, and $g_o(x)$ is the rate of other mechanisms such as optical and thermal generation. At x, impact ionization by electrons may be caused by cold electrons generated at all points x' between x and w, and their ionization probability density may be $p_e(x'|x)$. Since each ionizing collision by an electron may produce two cold electrons, at x' the total number of cold electrons increases at a rate of $2g_e(x')+g_h(x')+g_o(x')$. Similarly, the total cold-hole generation rate at x' is $g_e(x')+2g_h(x')+g_o(x')$. Thus, one may write $$g_e(x) = \int_x^w [2g_e(x') + g_h(x') + g_o(x')] p_e(x'|x) dx' \quad (74)$$

$$g_h(x) = \int_0^x [g_e(x') + 2g_h(x') + g_o(x')] p_h(x'|x) dx'.$$

Once the probabilities $p_e(x'|x)$ and $p_h(x'|x)$ have been computed from an electric field profile as described herein, $g_e(x)$ and $g_h(x)$ may be computed for any one-dimensional structure, by solving Equation 72 with successive iterations. A straight-forward and practical set of the initial values may be found $g_e(x)=g_h(x)=0$. By using Equation 72, a new set of values for $g_e(x)$ and $g_h(x)$ may be calculated with the old values. The final result may be obtained by repeating this process until the values of $g_e(x)$ and $g_h(x)$ converge to a desired degree of accuracy. The convergence may be fairly rapid at low gains. At higher gains the convergence may be slower, but may be speeded up by extrapolation, using the assumption that the final values may be approached exponentially.

With distributed primary generation, the gain may be easily determined from $$M = \frac{\int_0^w [g_e(x) + g_h(x) + g_o(x)] dx}{\int_0^w g_o(x) dx} \quad (75)$$

$$= 1 + \frac{\int_0^w [g_e(x) + g_h(x)] dx}{\int_0^w g_o(x) dx}.$$

If the primary generation is a δ injection at x'=y, then the position dependent gain may be given by $$M(y) = 1 + \frac{\int_0^w [g_e(y|x) + g_h(y|x)] dx}{g_o(y)}, \quad (76)$$

where $g_e(y|x)$ and $g_h(y|x)$ are the solutions to Equation 72 with a injection $g_o(x)=g_o(y)\delta(x-y)$.

An alternative method of calculating position-dependent gain is known in the art and may be generalized for non-uniform fields and non-step-function dead layers. Calculation of noise and the position-dependent excess noise factor, as described herein, may be based on this method.

The analysis may start from an electron-hole pair generated at x'. As shown in FIGS. 8a and 8b, the electron moves to the left, and the hole moves to the right. If the electron first ionizes at x, two cold electrons and one cold hole may be generated, and each of them may in turn cause more ionizations. Let $n_e(x'|x)$ be the total number in the reaction chain initiated by this initial electron. Then, for that single trial, we may write, $$n_e(x'|x)=n_{e1}(x)+n_{e2}(x)+n_h(x), \quad (77)$$

where $n_{e1}(x)$, $n_{e2}(x)$ and $n_h(x)$ are the final particle numbers of the three sub-chains initiated by the "cooled" initial electron, the secondary cold electron, and the cold hole at x, respectively. Take an ensemble average and obtain $$N_e(x'|x) = 2N_e(x) + N_h(x) \quad (78)$$

$$N_e(x'|x) = \langle n_e(x'|x) \rangle$$

$$N_e(x) = \langle n_e(x) \rangle$$

$$N_h(x) = \langle n_h(x) \rangle.$$

By considering the probability of the first ionization or annihilation of the electron from the injection position x' to 0, the average carrier number in the resulted reaction chain may be presented with a weighted average with $p_e(x'|x)$:

$$N_e(x') = P_{se}(x'|0) + \int_0^{x'} (2N_e(x) + N_h(x)) p_e(x'|x) dx. \quad (79)$$

In this equation, the first term is the probability that the electron survives (without an ionizing collision) through the trip from x' to 0. The similar expression for the number of particles resulting from the initial hole generated at x' is $$N_h(x') = P_{sh}(x'|w) + \int_{x'}^w (2N_h(x) + N_e(x)) p_h(x'|x) dx. \quad (80)$$

Since in each ionization event the extra electron and hole are always generated in pairs, the final number of the electrons in the chain started by the initial pair may be equal to that of the holes. Therefore, the gain due to the initial pair injected at x' is $$M(x')=(N_e(x')+N_h(x'))/2. \quad (81)$$

Since the electron injected at w and the hole injected from 0 leave the multiplication region without ionization, the boundary conditions for Equations 79 and 80 may be written as $$N_e(0)=P_{se}(0|0)=1 \text{ and } N_h(w)=P_{sh}(w|w)=1. \quad (82)$$

For any one-dimensional structure with an electric field profile E(x), after the calculation of $p_e(x'|x)$, $p_h(x'|x)$, $P_{se}(x'|0)$, and $P_{sh}(x'|w)$, M(x) may be obtained by solving Equations 79 and 80 by iteration, as in Method I. The initial values of $N_e(x)$ and $N_h(x)$ may be commonly selected to be unity. The convergence may be fairly rapid for low gains. For higher gains, it may be useful to extrapolate on the assumption that $N_e(x)$ and $N_h(x)$ approach their final values exponentially.

Since the noise power spectral density may be proportional to the ensemble average $\langle n^2 \rangle$, calculation of noise may start from $\langle n_e^2 \rangle$ and $\langle n_h^2 \rangle$ for an electron-hole pair injected at x'. Considering all ionization probabilities for the initial pair and assuming that the carriers may be uncorrelated, i.e., $\langle n_x n_y\rangle = \langle n_x\rangle\langle n_y\rangle$, $\langle n_e^2\rangle$ and $\langle n_h^2\rangle$ may be expressed as an ionization-probability-weighted average $$\langle n_e^2(x')\rangle = P_{se}(x'|0) + \int_0^{x'} dx \langle (n_{e1}(x)+n_{e2}(x)+n_h(x))^2\rangle p_e(x'|x) \quad (83)$$

$$= P_{se}(x'|0) + \int_0^{x'} dx \big[2\langle n_e^2(x)\rangle + \langle n_h^2(x)\rangle +$$

$$2N_e^2(x) + 4N_e(x)N_h(x)\big]p_e(x'|x)$$

$$\langle n_h^2(x')\rangle = P_{sh}(x'|w) + \int_{x'}^{w} dx \big[2\langle n_h^2(x)\rangle + \langle n_e^2(x)\rangle +$$

$$2N_h^2(x) + 4N_e(x)N_h(x)\big]p_h(x'|x).$$

Once $N_e(x)$ and $N_h(x)$ are determined by solving Equations 79 and 80 in the gain calculation, $\langle n_e^2\rangle$ and $\langle n_h^2\rangle$ may be calculated similarly. Then, the excess noise factor of a $\delta$ injection at x' (continuous in time) may be given by the expression $$F(x') = \frac{\langle m^2(x')\rangle}{M^2(x')} = \frac{\left\langle\left(\frac{n_e(x')+n_h(x')}{2}\right)^2\right\rangle}{M^2(x')} \quad (84)$$

$$= \frac{\langle n_e^2(x')\rangle + \langle n_h^2(x')\rangle + 2N_e(x')N_h(x')}{4M^2(x')}.$$

Also starting from the fluid Equation 41, the derivation of the frequency response of avalanche photodiodes in the history-dependent theory follows the same process that has been shown for the conventional local-field theory herein. For a one-dimensional fully depleted region, the time-dependent equations for the electron density n(x,t), the hole density p(n,t), the electron current density $j_n(x,t)$, and the hole current density $j_p(x,t)$ are given by Equations 41 and 42. With the same saturation velocity assumption, the Fourier transform of Equation 42 is shown in Equation 43, while its general solution is provided by Equation 44.

The difference from the conventional theory appears in the calculation of the generation function $g(x, \omega)$. By extending the derivation of the gain calculation in Method I, the generation function of electrons and holes may be written as $$g_e(x, \omega) = \int_x^{w} [2g_e(x', \omega) + g_h(x', \omega) + \quad (85)$$

$$g_o(x', \omega)]\exp[-j\omega\tau_n(x'|x)]p_e(x'|x)dx'$$

$$g_h(x, \omega) = \int_0^{x} [g_e(x', \omega) + 2g_h(x', \omega) +$$

$$g_o(x', \omega)]\exp[-j\omega\tau_p(x'|x)]p_h(x'|x)dx'.$$

Dividing the quantities into their real and imaginary parts yields $$g_e^r(x, \omega) = \int_x^{w} [(2g_e^r + g_h^r + g_o)\cos[\omega\tau_n(x'|x)] + \quad (86)$$

$$(2g_e^i + g_h^i)\sin[\omega\tau_n(x'|x)]]p_e(x'|x)dx'$$

$$g_e^i(x, \omega) = \int_x^{w} [-(2g_e^r + g_h^r + g_o)\sin[\omega\tau_n(x'|x)] +$$

-continued $$(2g_e^i + g_h^i)\cos[\omega\tau_n(x'|x)]]p_e(x'|x)dx'$$

$$g_h^r(x, \omega) = \int_0^{x} [(g_e^r + 2g_h^r + g_o)\cos[\omega\tau_h(x'|x)] +$$

$$(g_e^i + 2g_h^i)\sin[\omega\tau_h(x'|x)]]p_h(x'|x)dx'$$

$$g_h^i(x, \omega) = \int_0^{x} [-(2g_e^r + g_h^r + g_o)\sin[\omega\tau_h(x'|x)] +$$

$$(g_e^i + 2g_h^i)\cos[\omega\tau_h(x'|x)]]p_h(x'|x)dx'$$

$$g(x, \omega) = g_e^r(x, \omega) + g_h^r(x, \omega) + g_o(x, \omega) +$$

$$j(g_e^i(x, \omega) + g_h^i(x, \omega)).$$

For simplicity, all the g functions in the above integrals actually have an argument list (x, $\omega$). Once g(x) has been computed with $p_e$(x'|x) and $p_h$(x'|x) by iteration, the carrier currents $i_n$(x, $\omega$) and $i_p$(x, $\omega$) may be determined with Equation 44. Finally, the short-circuit current in the external circuit may be given by Equation 48, and the system response with the external circuit may be obtained with Equations 5 and 6.

In the above gain and noise calculations following Method II, the carrier injection may be restricted to $\delta$(x) profile. To extend the algorithm to arbitrarily distributed injections, which may be the case with very thin photodiodes, some implicit assumptions used in the local-field theory and the history-dependent theory were found and studied:

I: There is no interaction between any of the carriers in the multiplication region except at the moment of impact ionization.

II: There is no correlation between any carriers, and they contribute to noise independently. Thus, their noise spectral density can be added linearly These assumptions may be quite reasonable for low-level injection, which may be the common operating condition for most APDs. Assumption I also may ensure a linear response to injection. According to this assumption, the gain $M_g$ for an arbitrary injection $g_o(x)$ may be written as a weighted average of the gain of each $\delta$ injection, which yields $$M_g = \frac{I}{I_o} = \frac{\int_0^{w} dx'[g_o(x')M(x')]}{\int_0^{w} dx'[g_o(x')]} \quad (87)$$

$$I_o = \int_0^{w} dx'[g_o(x')],$$

where $I_o$ is the total injected current, and M(x) is the multiplication of a $\delta$ injection at x. M(x) may be calculated with Equation 31 in the conventional local-field theory and with Equation 81 in the new theory.

Similarly, according to Assumption II, the noise power spectral density S for an arbitrary injection profile $g_o(x)$ is $$S = 2e\int_0^{w} dx'[g_o(x')M^2(x')F(x')]R(\omega) = 2eI_oM_g^2F_gR(\omega) \quad (88)$$

$$F_g = \frac{\int_0^{w} dx'[g_o(x')M^2(x')F(x')]}{M_g^2\int_0^{w} dx'g_o(x')},$$

where F(x) is the excess noise factor of a δ injection at x, and its calculation appears in Equation 40 for the local-field theory and in Equation 84 for the history-dependent theory. Therefore, $F_g$, which is a weighted average of F(x), is the measured excess noise factor according to either theory.

As shown herein, the conventional local-field theory has difficulty in explaining the gain and noise measurements in relatively thin multiplication regions. Although the ratios of ionization coefficients of electrons and holes ($\alpha/\beta$, or $\beta/\alpha$ in InP) may not decrease at high electric fields, as might be assumed if the local-field equation for the excess noise were retained, the randomness of the impact ionization locations may strongly restricted in a thin multiplication region. This restriction may result in an apparent suppression of avalanche noise. In addition, as discussed herein, the reported ionization coefficients may not be applied to the gain curves of APDs with relatively thin intrinsic multiplication layers, and the excess noise factor equation in the local-field theory may not accurately express the shape of the measured F(M) curves in the low-gain regime. These phenomena may be observed in the materials described herein. Therefore, the avalanche characteristics of these materials in a relatively thin multiplication layer may not be described accurately by the local-field theory.

As stated herein, the history-dependent model for an ionization property of a material may be characterized with six parameters. After obtaining the gain as a function of voltage and the excess noise factor as a function of gain on devices with different multiplication region thicknesses, a set of six parameters may be determined such that each curve may be fitted by only changing the i-layer thickness. In this fitting, contributions of the depleted p and n regions may be carefully simulated, and the slope of the electric field in the intrinsic region may also be included based on the background doping level of MBE growth.

Figure 51:
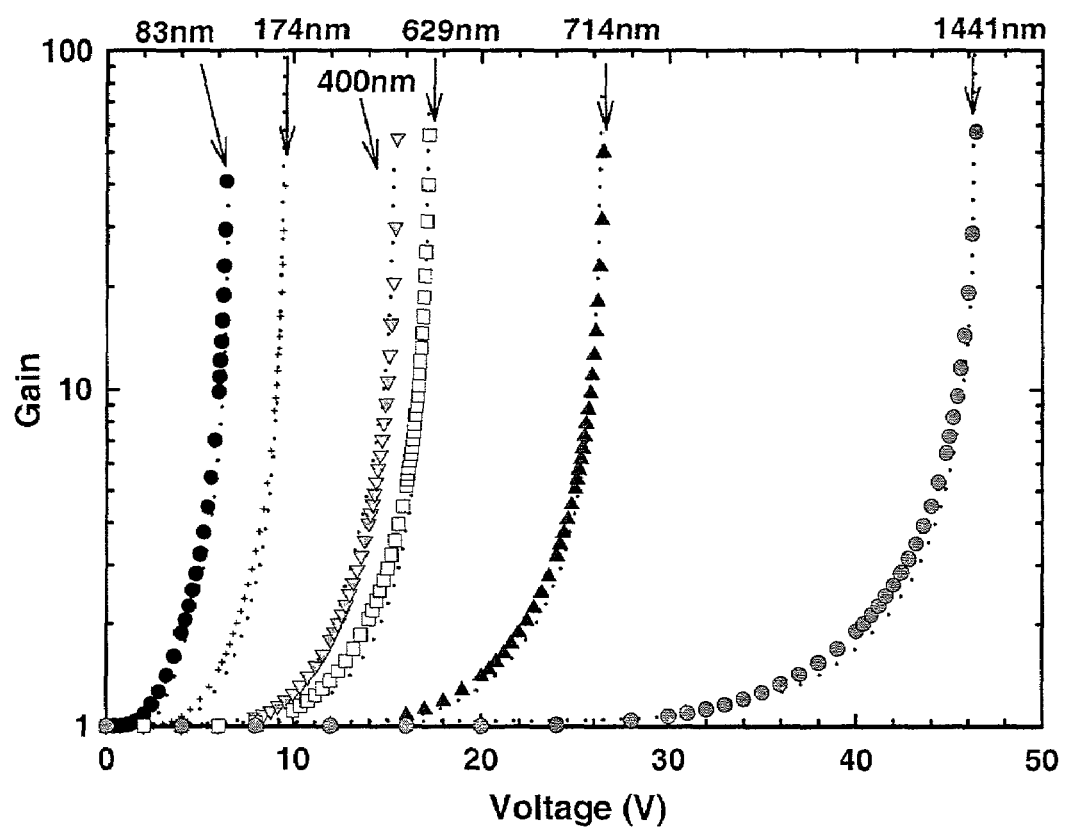
FIG. 51 depicts a plot of measured and fitted gain curves for GaAs homojunction APDs.
Figure 52:
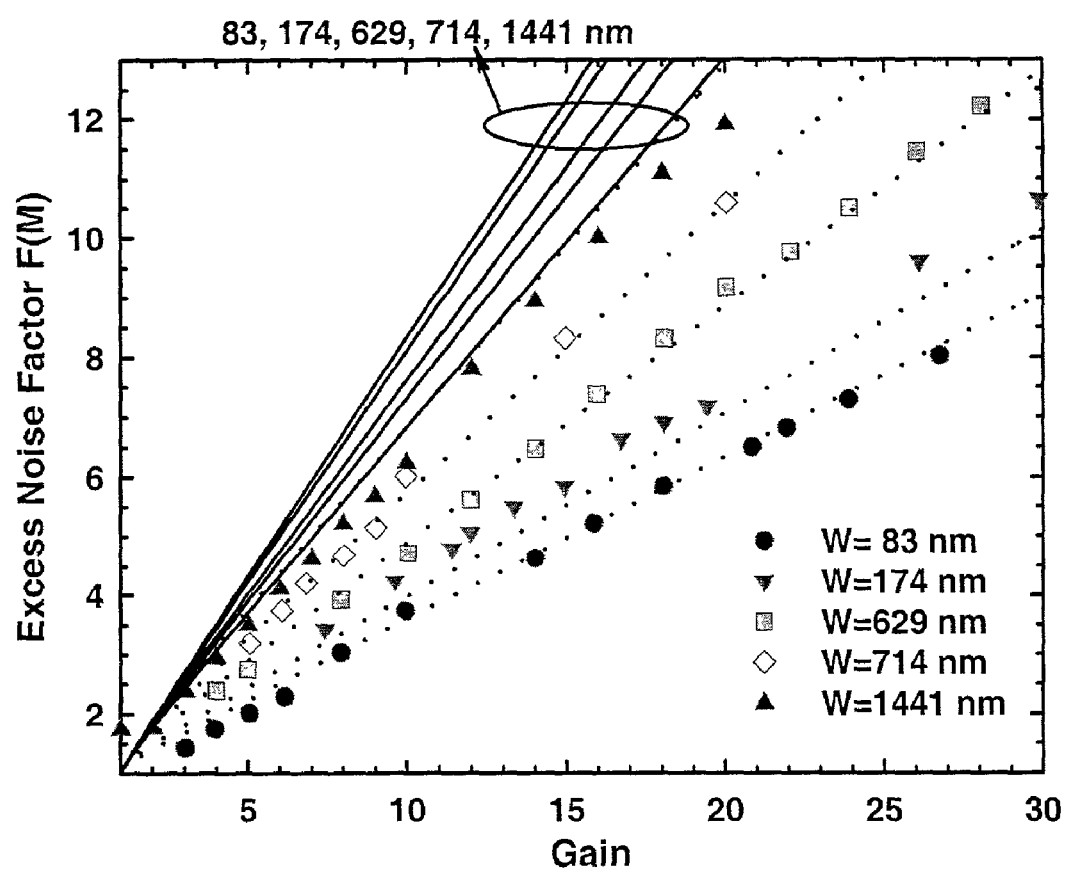
FIG. 52 depicts a plot of measured excess noise factors of GaAs APDs and their fits with a history-dependent model.
Figure 53:
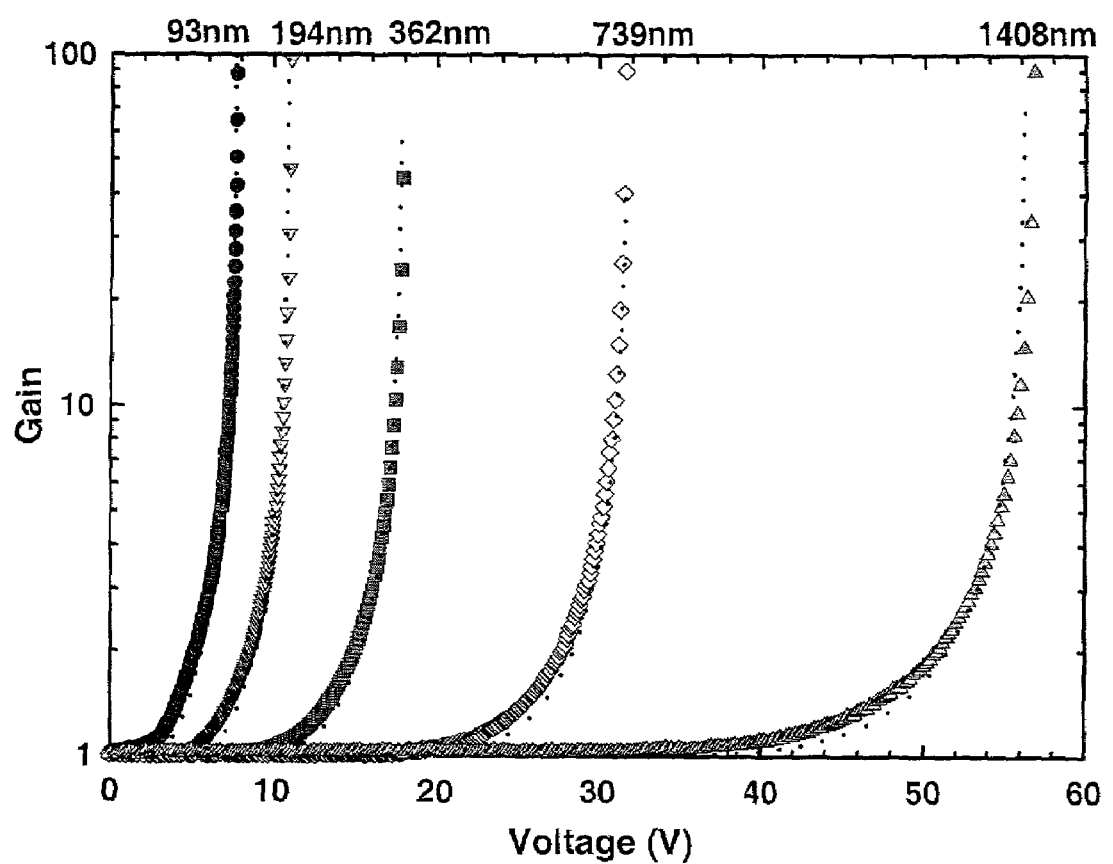
FIG. 53 depicts a plot of measured and fitted gain curves for $Al_{0.2}Ga_{0.8}As$ homojunction APDs.
Figure 54:
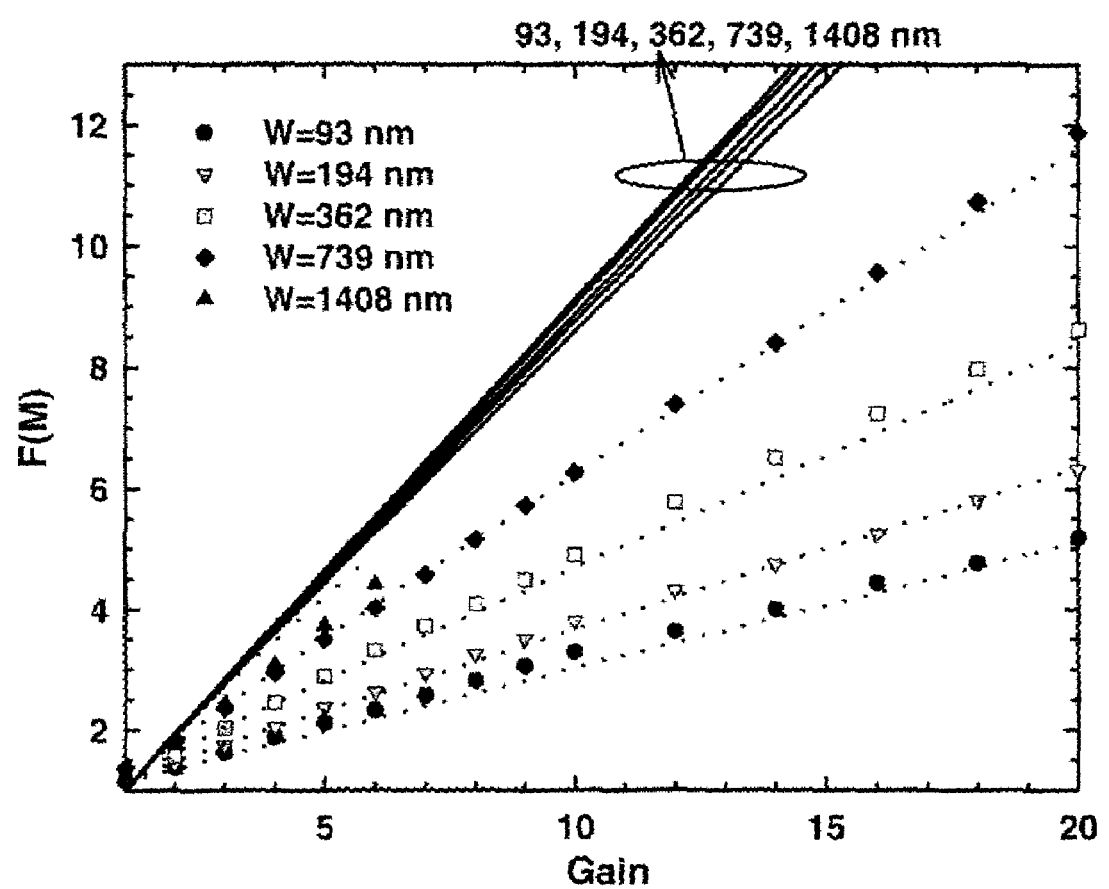
FIG. 54 depicts a plot of measured excess noise factors of $Al_{0.2}Ga_{0.8}As$ APDs and their fits with the history-dependent model.
Figure 55:
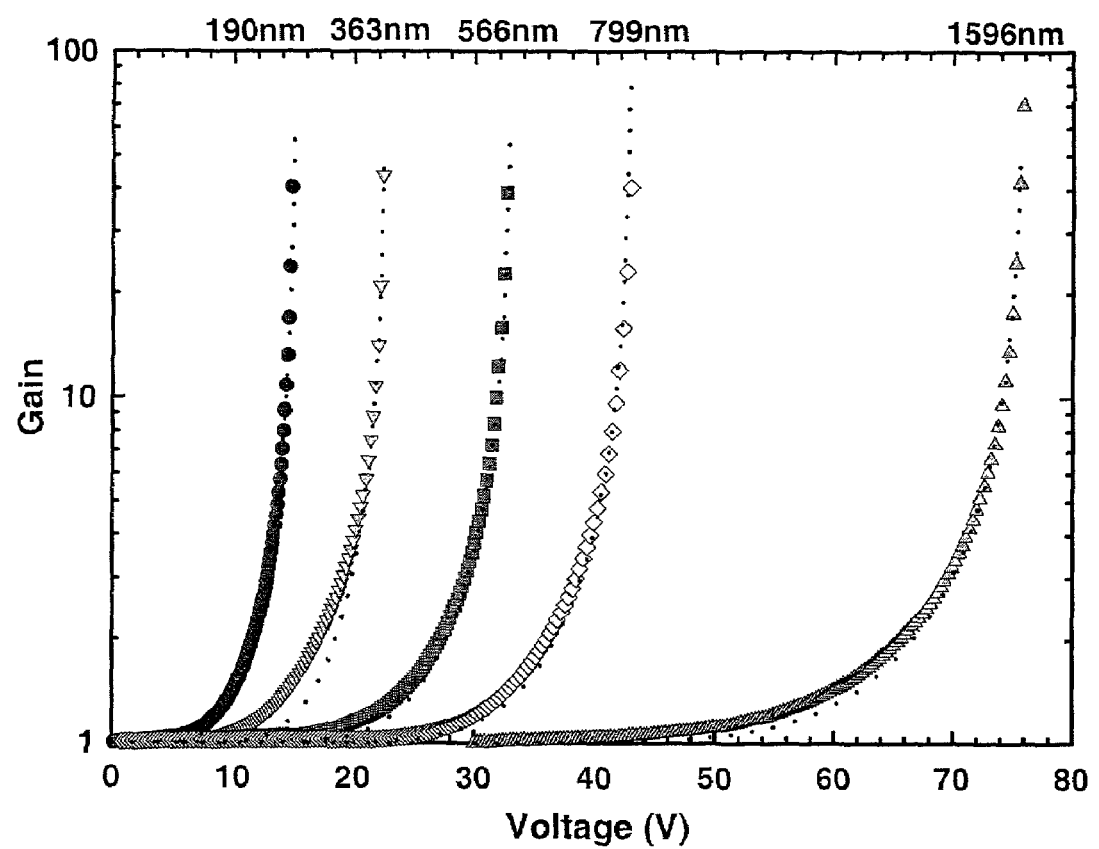
FIG. 55 depicts a plot of measured and fitted gain curves for $In_{0.52}Al_{0.48}As$ homojunction APDs.
Figure 56:
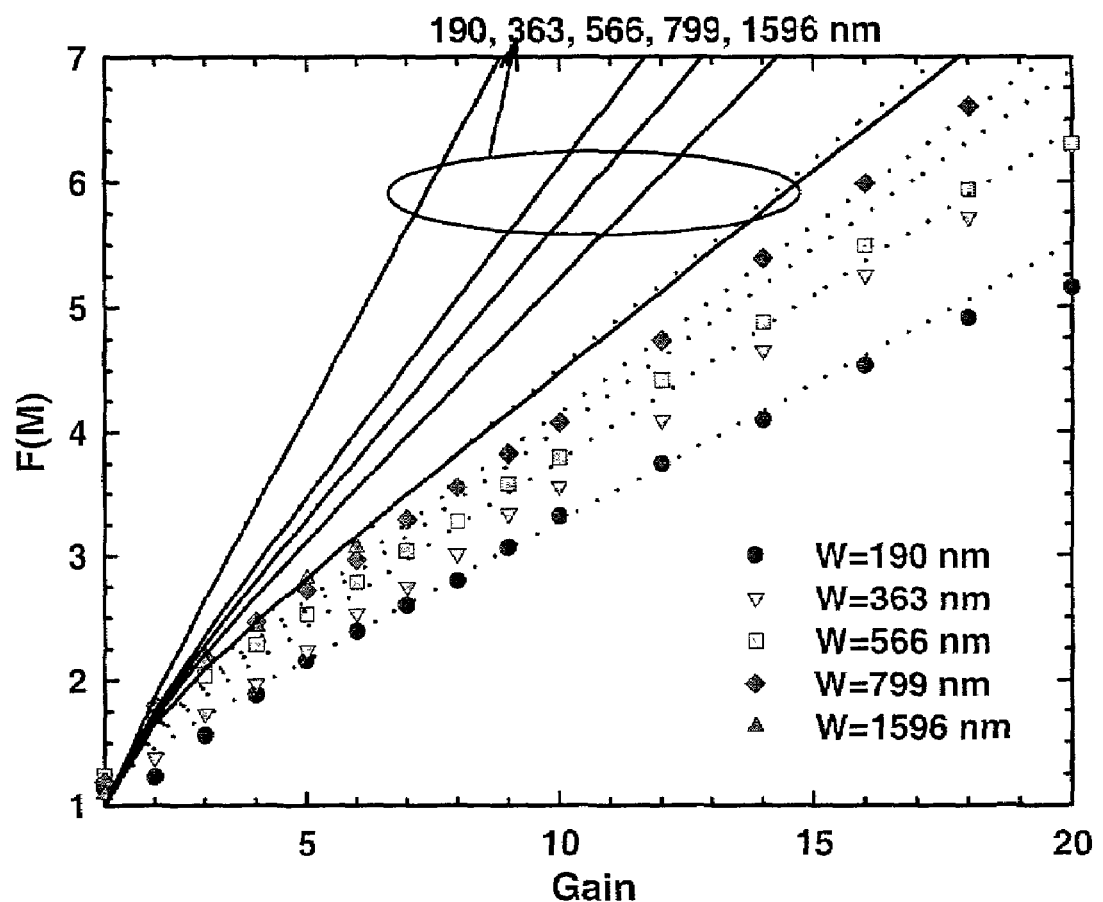
FIG. 56 depicts a plot of measured excess noise factors of $In_{0.52}Al_{0.48}As$ APDs and their fits with the history-dependent model.
Figure 57:
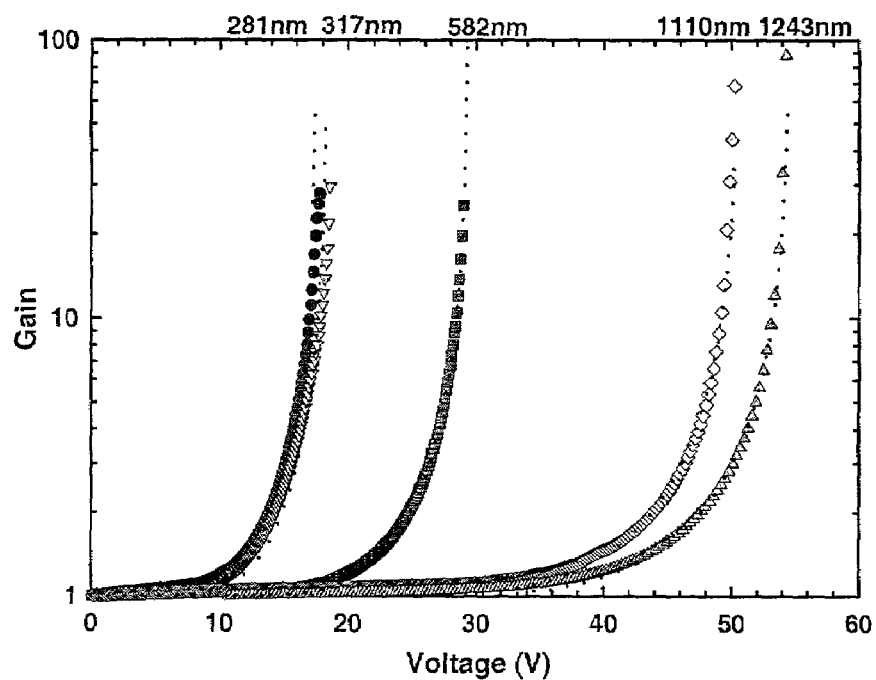
FIG. 57 depicts a plot of measured and fitted gain and noise curves for InP homojunction APDs.
Figure 57:
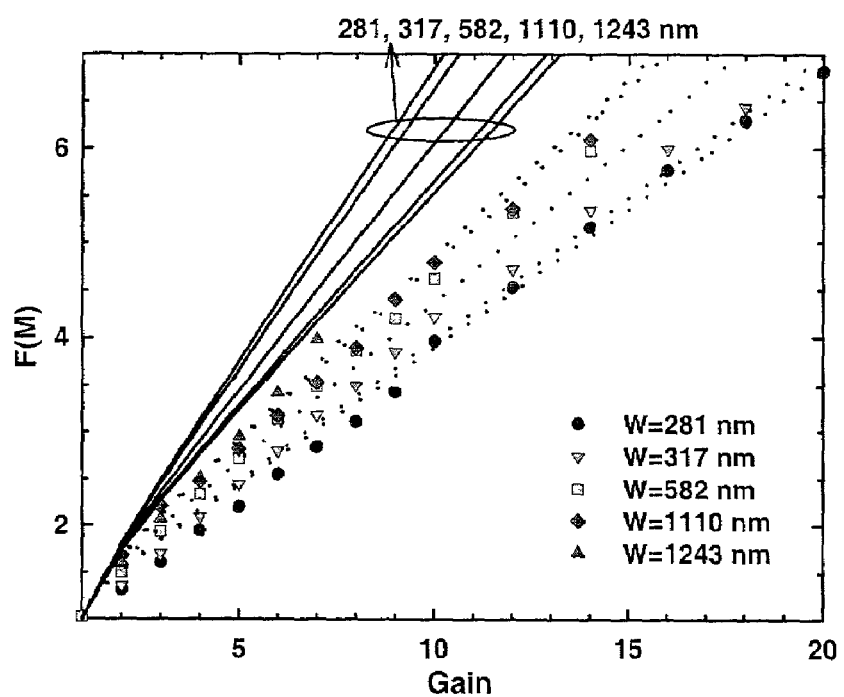

As shown in FIGS. 51–57, substantial agreement with experimental measurements may be achieved on all devices and materials. As shown in FIG. 51, the measured gain curves for GaAs homojunction APDs are indicated by symbols, and the fitted gain curves for the APDs are indicated by dotted lines. FIG. 52 illustrates measured excess noise factors of the GaAs APDs indicated by symbols and their fits with the history-dependent model indicated by dotted lines. The solid lines in FIG. 52 are calculated results with the local-field theory and reported ionization coefficients. FIG. 53 illustrates measured gain curves for $Al_{0.2}Ga_{0.8}As$ homojunction APDs indicated by symbols and fitted gain curves for these APDs indicated by dotted lines. FIG. 54 illustrates measured excess noise factors of $Al_{0.2}Ga_{0.8}As$ APDs indicated by symbols and their fits with the history-dependent model indicated by dotted lines. The solid lines are calculated results with the local-field theory and reported ionization coefficients. FIG. 55 illustrates measured gain curves for $In_{0.52}Al_{0.48}As$ homojunction APDs indicated by symbols and fitted gain curves for the APDs indicated by dotted lines. The curves shown in FIGS. 51, 53, and 55 are fitted with the history-dependent theory and the corresponding model for $\alpha$ and $\beta$, and the measured i-region of each device is indicated in these Figures. FIG. 56 illustrates measured excess noise factors of the $In_{0.52}Al_{0.48}As$ APDs indicated by symbols and their fits with the history-dependent model indicated by dotted lines. The solid lines are the calculated results with the local-field theory and reported ionization coefficients. The upper plot of FIG. 57 illustrates measured gain curves for InP homojunction APDs indicated by symbols and fitted gain curves for the APDs indicated by dotted lines. The lower plot of FIG. 57 illustrates noise curves for the APDs indicated by symbols and fitted noise curves for the APDs indicated by dotted lines. The curves are fitted with the history-dependent theory, and the calculated values are obtained with the local-field theory and reported ionization coefficients are illustrated with the solid lines in the plots.

TABLE 4

| Materials | $A_e$ ($10^6$ cm$^{-1}$) | $E_{c,e}$ ($10^6$ V/cm) | $V_{de}$ (eV) | $A_h$ ($10^6$ cm$^{-1}$) | $E_{c,h}$ ($10^6$ V/cm) | $V_{dh}$ (eV) |
|---|---|---|---|---|---|---|
| GaAs | 3.30 | 1.75 | 2.00 | 0.692 | 1.38 | 2.25 |
| $Al_{0.2}Ga_{0.8}As$ | 88.3 | 3.74 | 2.20 | 6.47 | 2.72 | 2.48 |
| $In_{0.52}Al_{0.48}As$ | 19.9 | 3.62 | 2.00 | 3.21 | 3.23 | 2.25 |
| InP | 2.91 | 2.80 | 1.90 | 12.4 | 3.05 | 2.14 |

The extracted parameters for history-dependent ionization coefficients are listed in Table 4. The uncertainty in these parameters may be estimated to be about 3%. An obvious discrepancy appears in the fit to the excess noise factor of the $Al_{0.2}Ga_{0.8}As$ device with an about 1.4 µm thick i region. In general, however, this model may be very effective for several semiconductor materials and over a relatively wide range of multiplication region thicknesses. The history-dependent theory and the local-field theory may be expected to agree for relatively thick multiplication regions. In addition, as shown in FIGS. 51–57, the excess noise curves of the relatively thick devices calculated with both theories are quite close. However, even for relatively low electric field intensities, the parameters listed in Table 4 may not be the same as previous reports.

This discrepancy may be substantially due to differences between the parameterizations used in the two theories and also to the differences in the device structures upon which the measurements were made.

In both theories, ionization coefficients may be used to describe carriers' ionization probability densities. However, the ionization coefficients may not be measured directly, and the calculated results are based on a particular APD theory and the measurement of physical parameters such as gain or noise. As a result, the ionization coefficients may reflect the characteristics of the model employed and may provide good benchmarks to compare models. In the local-field theory, the ionization coefficients $\alpha(E)$ and $\beta(E)$ may only be functions of the local electric field, whereas in the model described herein they may depend on a carrier's history. For convenience of comparison, the history-dependent ionization coefficients $\alpha(x'|x)$ and $\beta(x'|x)$ in a regime where a carrier has traveled a long distance, relative to the dead length, in a constant electric field without ionizing may be considered. According to the ionization model described in Equations 70 to 72, energy accumulated from the field may be balanced by energy loss through nonionizing scattering events. For such an energetic carrier, which may be referred to as a saturated hot carrier, the $E_{eff}$'s in Equation 71 may become equal to $E(x)$, the local electric field, because the $f_c$'s defined in Equation 70 may be normalized. Correspondingly, Equation 72 returns to the conventional local model form described by Equation 60.

Figure 58:
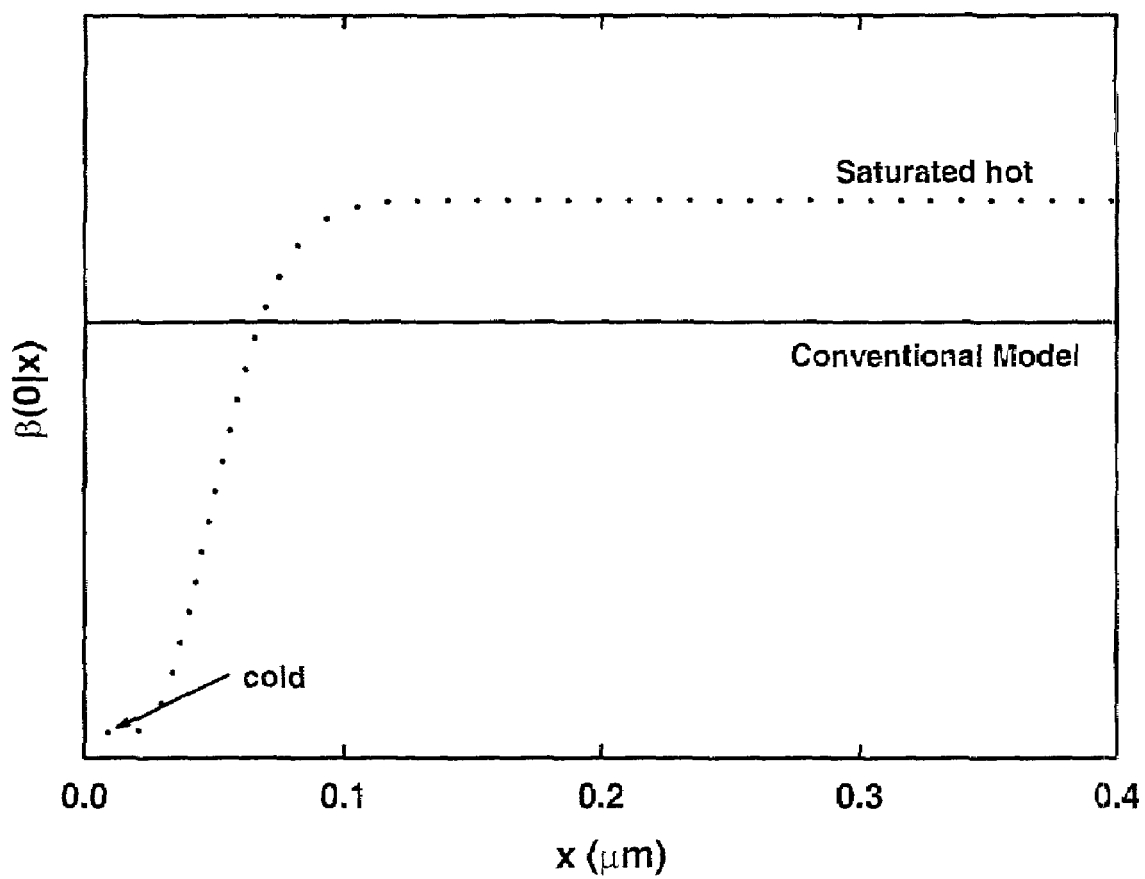
FIG. 58 depicts a plot of spatial variation of ionization probability density $\beta(0|x)$ of a hole traveling along x without ionization.

FIG. 58 illustrates the spatial variation of the ionization probability density $\beta(0|x)$ (the dashed line) of a hole traveling along x without ionization in a constant electric field. In the beginning, the hole may be "cold" and may have little probability to ionize. If the hole travels far enough without ionizing, it may become a "saturated hot" carrier and its ionization probability density may become "saturated" or history insensitive. The ionization coefficient model that is used in the local-field theory is shown in the solid line in this figure. For example, according to the fitting parameters listed in Table 4, in a GaAs PIN structure with a flat electric field in the i region, the ionization coefficients of the saturated hot carriers may have a simple relationship with the electric field $$\alpha(E) = A_e \exp\left(-\frac{E_{c,e}}{E}\right) \qquad (89)$$

$$= 3.298 \times 10^6 \exp\left(-\frac{1.750 \times 10^6 \text{ V/cm}}{E}\right)(\text{cm}^{-1})$$

$$\beta(E) = A_h \exp\left(-\frac{E_{c,h}}{E}\right)$$

$$= 6.924 \times 10^5 \exp\left(-\frac{1.384 \times 10^6 \text{ V/cm}}{E}\right)(\text{cm}^{-1}).$$

Figure 59:
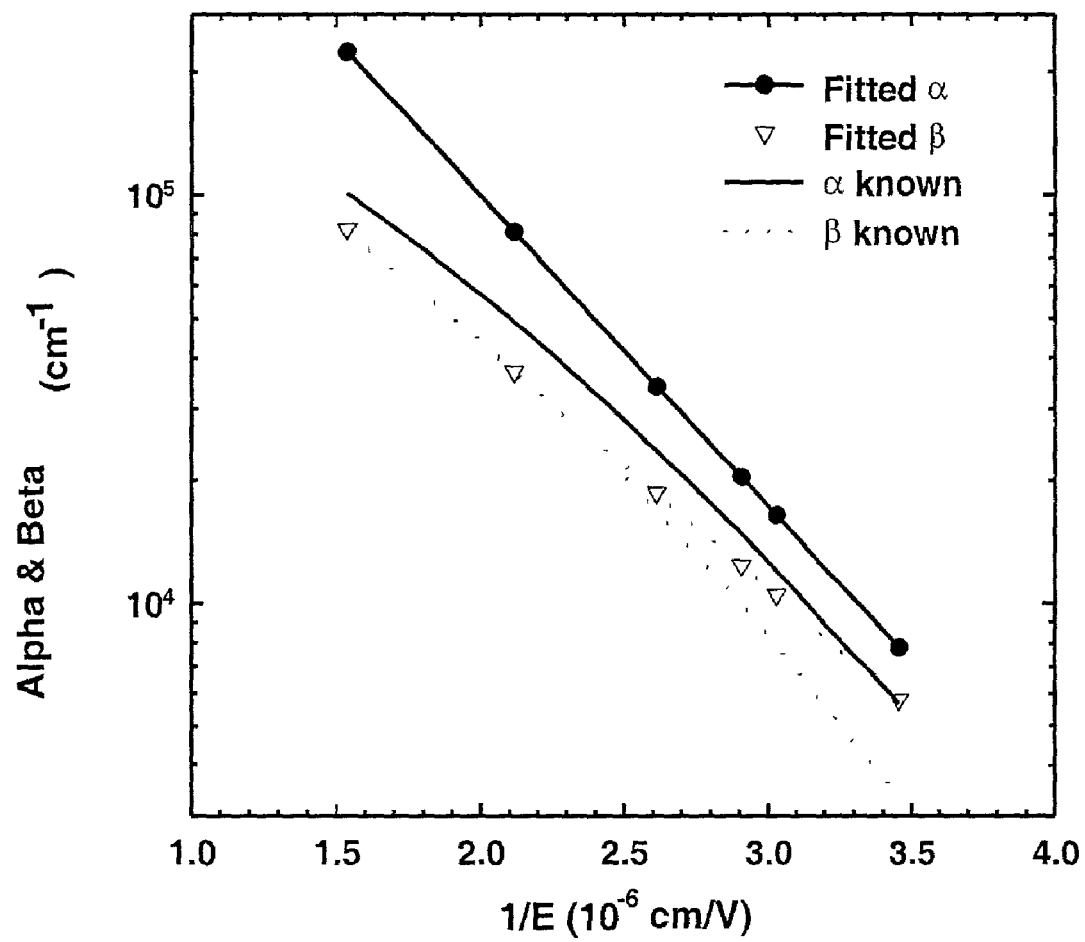
FIG. 59 depicts a comparison plot of measured $\alpha(E)$ and $\beta(E)$ reported in literature with $\alpha(E_{eff,e})$ and $\beta(E_{eff,e})$ of saturated hot carriers in the history-dependent theory.

FIG. 59 illustrates a comparison of the measures a(E) and b(E) known in the art with $\alpha(E_{eff,e})$ and $\beta(E_{eff,e})$ of saturated hot carriers in the history-dependent theory. As shown in FIG. 59, Equation 89 yields coefficients that may be generally parallel to but uniformly greater than those known in the art, and the difference increases with increasing electric fields. There are several factors that may contribute to these differences.

First, Equation 89 may apply only to the ionization coefficients (or ionization probability density) of saturated hot carriers, whereas the data reported is an averaged effect. At any point in the multiplication region, there may always be a spectrum of carriers ranging from cold ones to saturated hot ones. The local-field theory assumes at any point all the carriers of the same type may have substantially the same ionization probability density, which may be an average over the spectrum of the carriers and lower than that of a saturated hot carrier. The solid line in FIG. 58 shows the average, i.e. $\beta(E(x))$, used in the local-field theory. Thus, coefficients for the saturated hot carriers in the history-dependent theory may be generally higher than those known in the art.

A second factor may be the influence of dead-space, particularly at relatively high electric fields, where the mean free path between ionizing collisions may become shorter and closer to the dead length. In devices with relatively thin multiplication regions, the effect of the dead pace may be more important. For example, after traveling a dead length, the carriers may go an additional average distance before ionization. In relatively thin multiplication regions the field may be relatively high and the saturated ionization rate, referred to as $\alpha_h$ and $\beta_h$ herein, may also be very high. Consequently, the carriers may ionize relatively quickly after traversing the dead length. As such, the carriers may spend a larger portion of their lifetime between ionization events acquiring energy from the field and less time as "hot" carriers. At any time, there may be more cold carriers, and the statistical weight of the cold carriers may become more significant. Therefore, in relatively thin devices, the measured ionization coefficients, which may also be averages over the lifetime of the carriers, become even less than the values of the saturated hot carriers.

Figure 60:
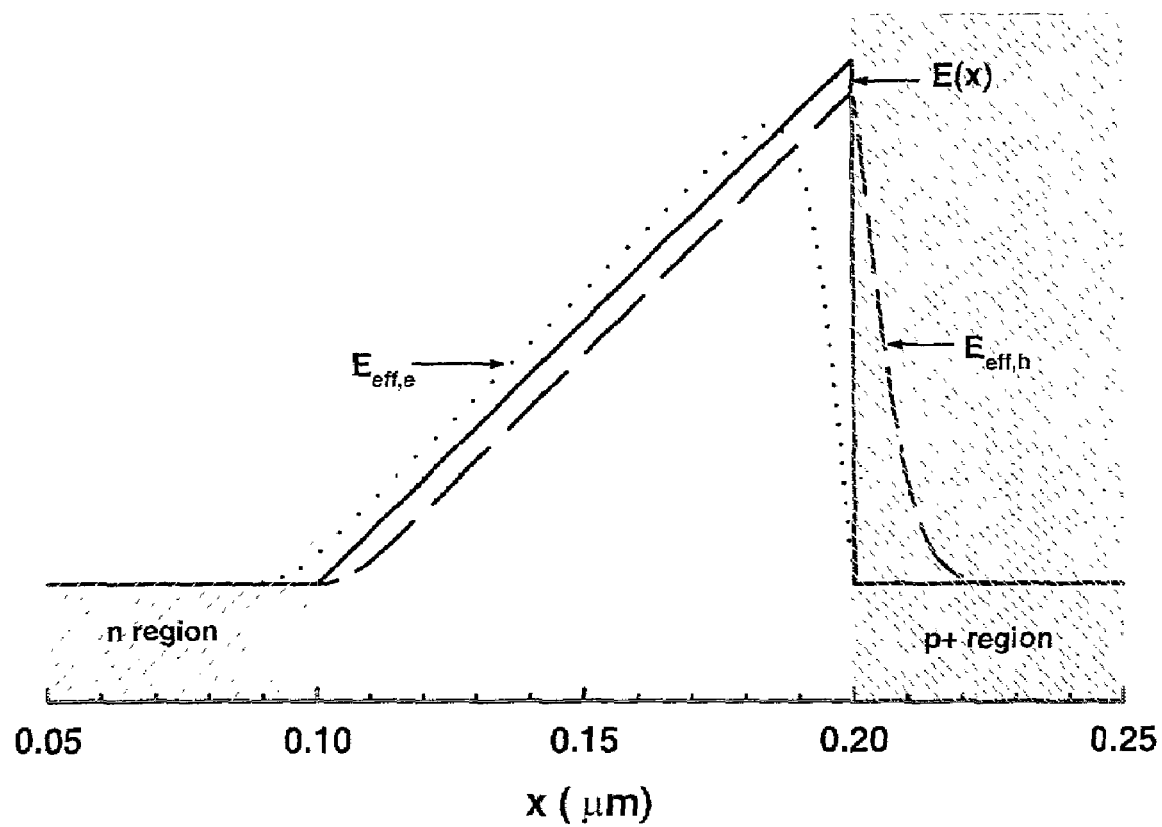
FIG. 60 depicts a plot of electric field profiles of devices reported in literature and corresponding effective electric fields $E_{eff,e}$ of electrons and $E_{eff,h}$ of holes in the history-dependent theory.

Third, the local-field theory, which may be commonly used in the art, may overestimate the contribution of the peak field region in an abrupt $p^+n$ junction. FIG. 60 illustrates the electric field profile in devices known in the art and the corresponding effective electric field $E_{eff,e}$ of electrons and $E_{eff,h}$ of holes in the history-dependent theory. FIG. 60 illustrates the wedge-shaped electric field profile of the $p^+n$ junction, where the solid line is $E(x)$. The local-field theory assumes that all carriers of the same type may have the same ionization probability, which is a function only of the local electric field. Therefore, the ionization may be expected to occur primarily near the peak electric field, and the extracted coefficients may be weighted relatively heavily to that field. However, since the ionization process may be nonlocal, the ionization rates may also be influenced by the slope of the field. The dotted and dashed lines in FIG. 60 illustrate the effective electric field of an electron generated at w and that of a hole injected at 0, respectively. We note that the effective field maxima for both cases are lower than the original peak $E_m$. The net result is that the local-field theory may tend to underestimate the ionization coefficients in a $p^+n$ junction. Therefore, any measurement of an effective ionization coefficient may be an averaged result of the electric field profile and may be valid only for a particular structure. As such, the result may not be applied to other electric field profiles directly without the risk of significant error.

Figure 61:
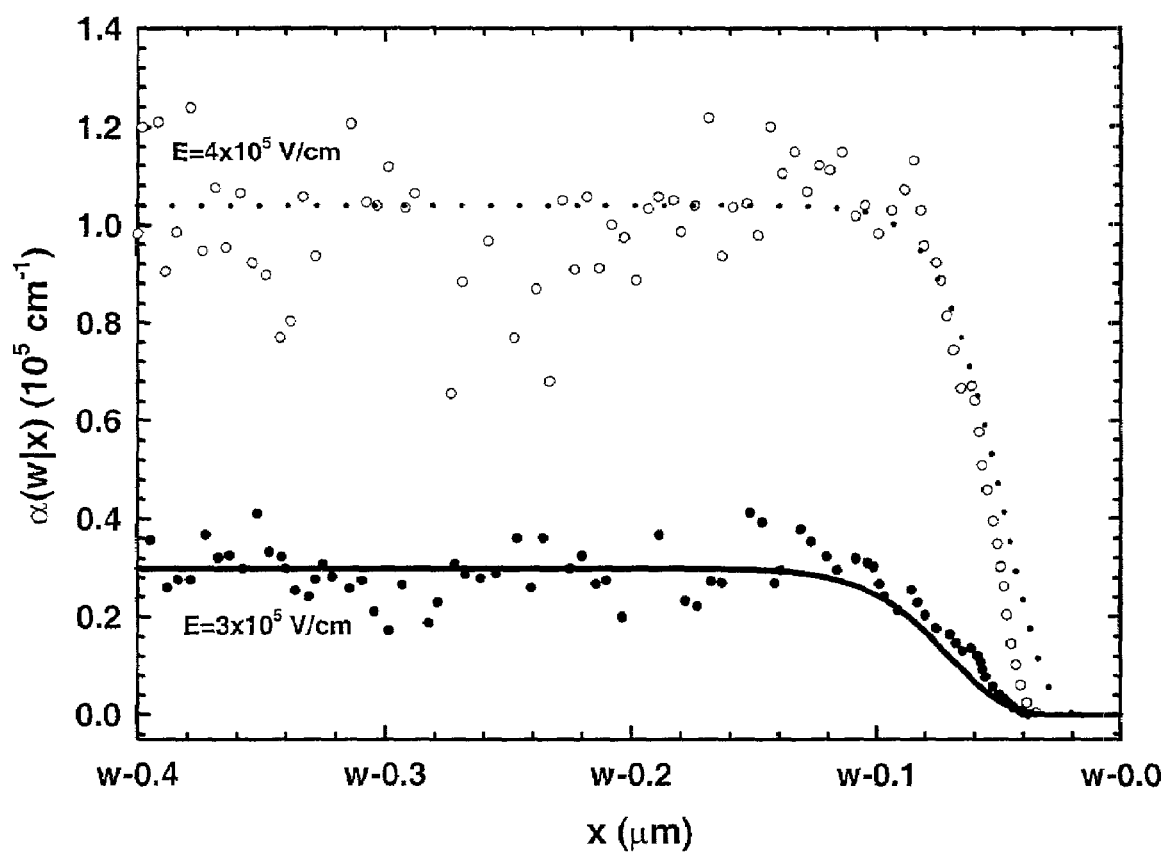
FIG. 61 depicts a plot of a model of the history-dependent $\alpha(w|x)$ compared to Monte Carlo simulations on Si.

The model described by Equations 70 to 72 may be applied to simulations of $\alpha(x'|x)$ of Si devices with different electric field profiles. FIG. 61 illustrates the model of the history-dependent $\alpha(w|x)$ compared to Monte-Carlo simulations on Si. The lines are calculated with the model, and the symbols are the Monte-Carlo simulation results. The parameter of $\alpha(w|x)$ are adjusted for Si. As shown in FIG. 61, the Monte-Carlo results may be substantially fitted by the history-dependent model. The dead space and the rising slope of $\alpha(x'|x)$ may also be substantially described by this model.

According to both the local-field theory and the history-dependent theory, the factors that lead to low excess noise may also result in high gain-bandwidth products. GaAs and InP are two commonly available III-V semiconductor substrates. On GaAs substrates, GaAs and $Al_{0.2}Ga_{0.8}As$ may be materials for the multiplication region of an APD. As described above and illustrated in FIGS. 51–54, $Al_{0.2}Ga_{0.8}As$ may show a lower excess noise factor than GaAs in relatively thin multiplication layers. An about 290 GHz gain-bandwidth product may be demonstrated by utilizing an about 0.1 μm thick $Al_{0.2}Ga_{0.8}As$ multiplication layer in a separate absorption, charge, and multiplication ("SACM") APD structure. On the other hand, on InP substrates, FIGS. 55–57 indicate that a relatively thin $In_{0.52}Al_{0.48}As$ layer with pure electron injection may achieve better performance than InP. By incorporating an about 0.2 μm thick $In_{0.52}Al_{0.48}As$ layer as the multiplication region in an SACM structure, a gain-bandwidth product of about 300 GHz may be achieved at about 1.55 μm.

A central issue for photodetectors in fiber optic communications may be detection of weak optical signals. Often, the length of an optical link may be determined by the minimum optical signal that may be detected at the transmitted bandwidth or bit-rate. Critical characteristics of photodetectors may include, but are not limited to, high sensitivity and high bandwidth. As opposed to p-i-n photodetectors, APDs demonstrate internal gain and may have higher receiver sensitivity. APDs may include a relatively high-field region in which photo-generated carriers may gain enough energy to cause impact ionization, thereby resulting in the generation of additional carrier pairs. The internal gain of the APD may create less stringent requirements for external amplification, which may, in turn, improve the sensitivity of the receiver.

As described earlier, a principal noise source in these devices may be the avalanche process. The statistical nature of the multiplication process may result in random fluctuations in the total number of secondary carriers that may be generated by primary carriers injected into the gain region. These fluctuations may give rise to excess noise, which may reduce to shot noise at unity gain. To achieve the best receiver performance, the excess noise of an APD may be kept as low as possible. As shown above, relatively thin $In_{0.52}Al_{0.48}As$ and relatively high Al ratio $Al_xGa_{1-x}As$ layers may demonstrate relatively low excess noise factors among materials epitaxily grown on GaAs and InP substrates. According to both the local-field theory and the history-dependent theory, factors that may lead to relatively low excess noise may also result in relatively high gain-bandwidth products. Consequently, high gain-bandwidth products may be expected in APDs that include these relatively thin multiplication regions. On GaAs substrates, an about 290 GHz gain-bandwidth product may be achieved by utilizing an about 0.1 µm thick $Al_{0.2}Ga_{0.8}As$ multiplication layer in a separate absorption, charge, and multiplication ("SACM") APD structure. By incorporating an about 0.2 µm thick $In_{0.52}Al_{0.48}As$ layer as the multiplication region in an SACM structure on InP, a gain-bandwidth product of about 300 GHz may be achieved at about 1.55 µm.

Figure 62:
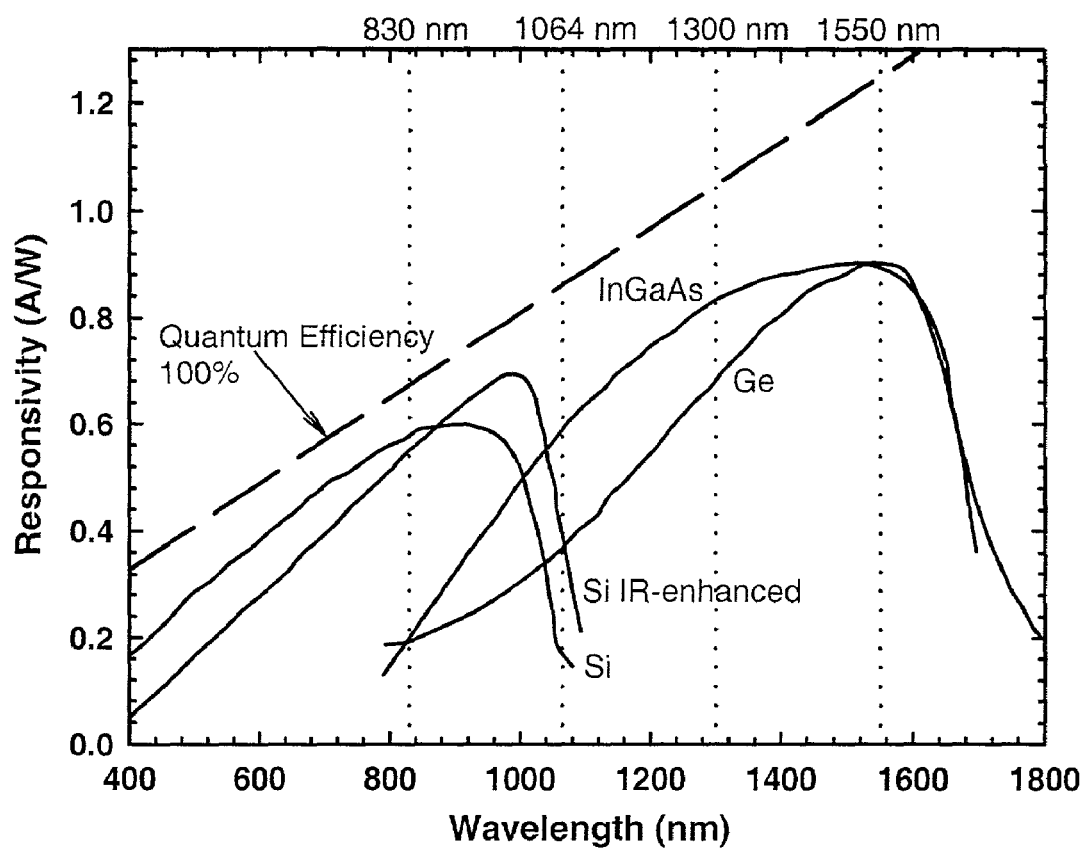
FIG. 62 depicts a plot of spectral response of commercially available InGaAs/InP and Si APDs.

On the other hand, the wide range of applications for Nd:YAG lasers in industrial manufacturing, medicine, remote sensing, space communications, and the military requires high-performance photodetectors that operate at about 1.06 µm. The photodetector requirements for these applications also include relatively high sensitivity, relatively high bandwidth, relatively low noise, and relatively low dark current. The two most commonly used APDs for near-infrared applications are Si reach-through APDs and InGaAs/InP APDs with separate absorption and multiplication ("SAM") regions. However, commercially available Si IR-enhanced APDs may have quantum efficiencies below about 40% and bandwidths less than about 250 MHz, while InGaAs/InP-based APDs may have relatively higher dark current and relatively higher avalanche noise. FIG. 62 illustrates the spectral response of commercially available InGaAs/InP and Si APDs. As shown in FIG. 62, the wavelength region near about 1 µm may be close to the long-wavelength cutoff of Si photodiodes and the short-wavelength end of the spectral response of InGaAs/InP photodiodes. The wavelength of Nd:YAG lasers may fall in this "sensitivity valley." The structures and operating principles of relatively high-speed SACM APDs are described above. In addition, the use of quantum dot absorption regions to achieve relatively high performance APDs at about 1.06 µm is also described herein.

Figure 63:
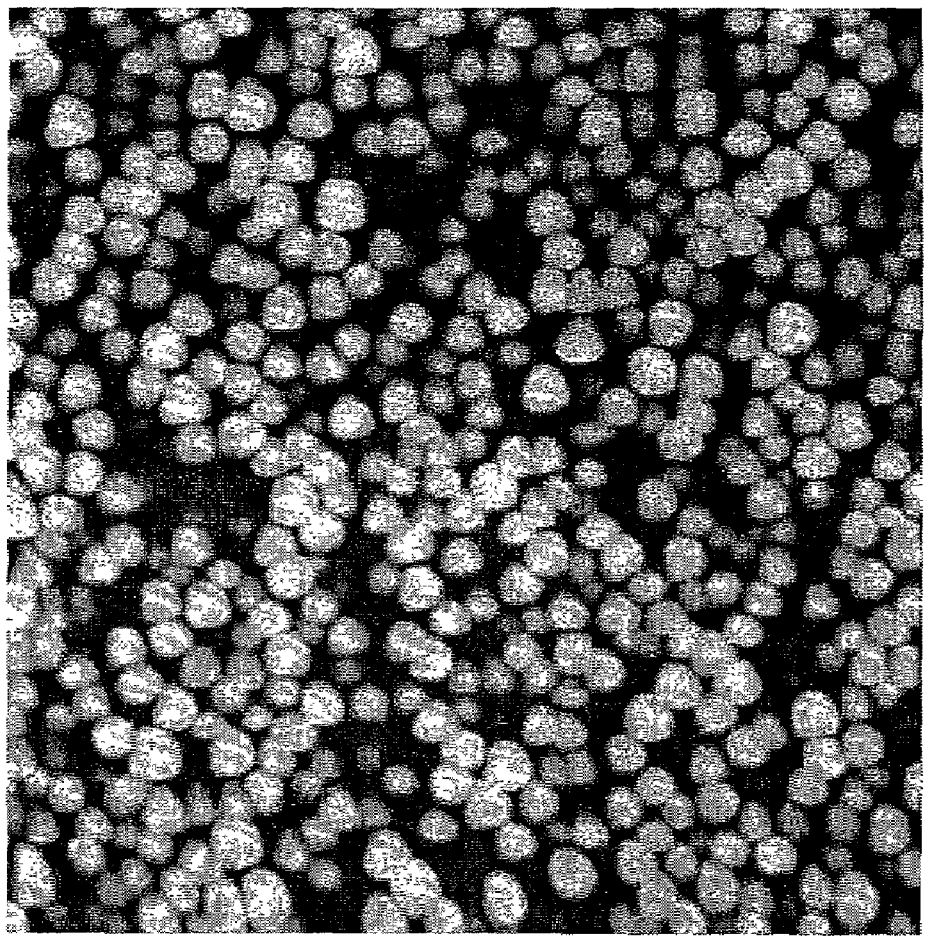
FIG. 63 depicts an AFM top view of a 6 mono-layer self-aligned $In_{0.5}Al_{0.5}As$ layer.
Figure 64:
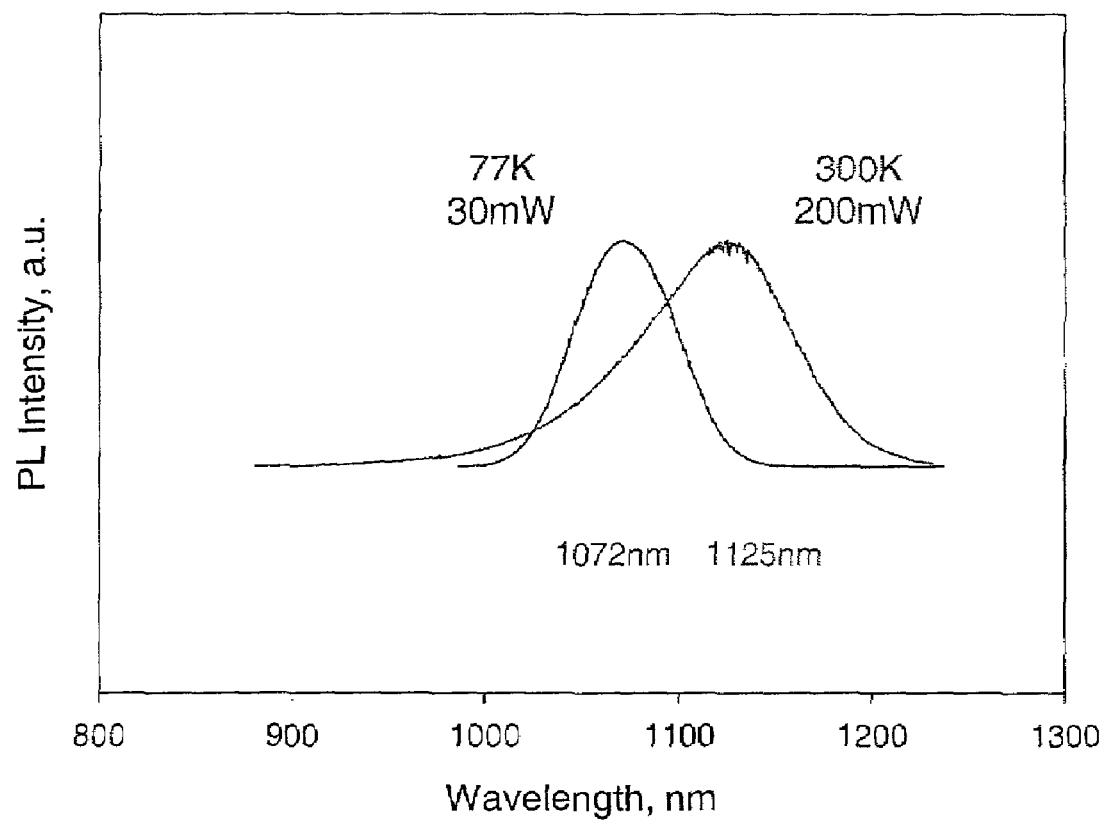
FIG. 64 depicts a plot of photo-luminescence spectrum of the self-aligned $In_{0.5}Al_{0.5}As$ QD layer.

To improve the efficiency of photodetectors at about 1.06 µm, an appropriate absorption material that may be grown on GaAs or InP should be identified. A bandgap of an appropriate absorption material may be sufficiently narrow to absorb efficiently at about 1.06 µm and sufficiently wide such that band-to-band tunneling may not result in excessive dark current. Previously, to reduce defect-related dark current, lattice-matched materials or strained-layer quantum wells were used, which may obviate a strong response at about 1.06 µm. Recently, self-assembled quantum-dots ("QDs") grown on GaAs have demonstrated a narrower bandgap than quantum wells. Resonant-cavity PINs and APDs with QD absorbing layers operating at about 1.06 µm and PINs at about 1.3 µm are known in the art. FIG. 63 illustrates an atomic-force microscope ("AFM") top view of a 6 mono-layer self-aligned $In_{0.5}Ga_{0.5}As$ QD layer. The field is about 1 µm by about 1 µm large, and the dot surface density is about $4.5 \times 10^{10}$ $cm^{-2}$. FIG. 64 illustrates a photo-luminescence spectrum of the self-aligned $In_{0.5}Ga_{0.5}As$ QD layer. As shown in FIG. 64, this material may absorb at about 1.06 µm efficiently at room temperature. By employing this QD absorption layer and the relatively low noise, thin $Al_{0.2}Ga_{0.8}As$ multiplication layer described herein, relatively high-gain, relatively high-bandwidth and relatively low-multiplication-noise APDs may be expected at about 1.06 µm.

Figure 65:
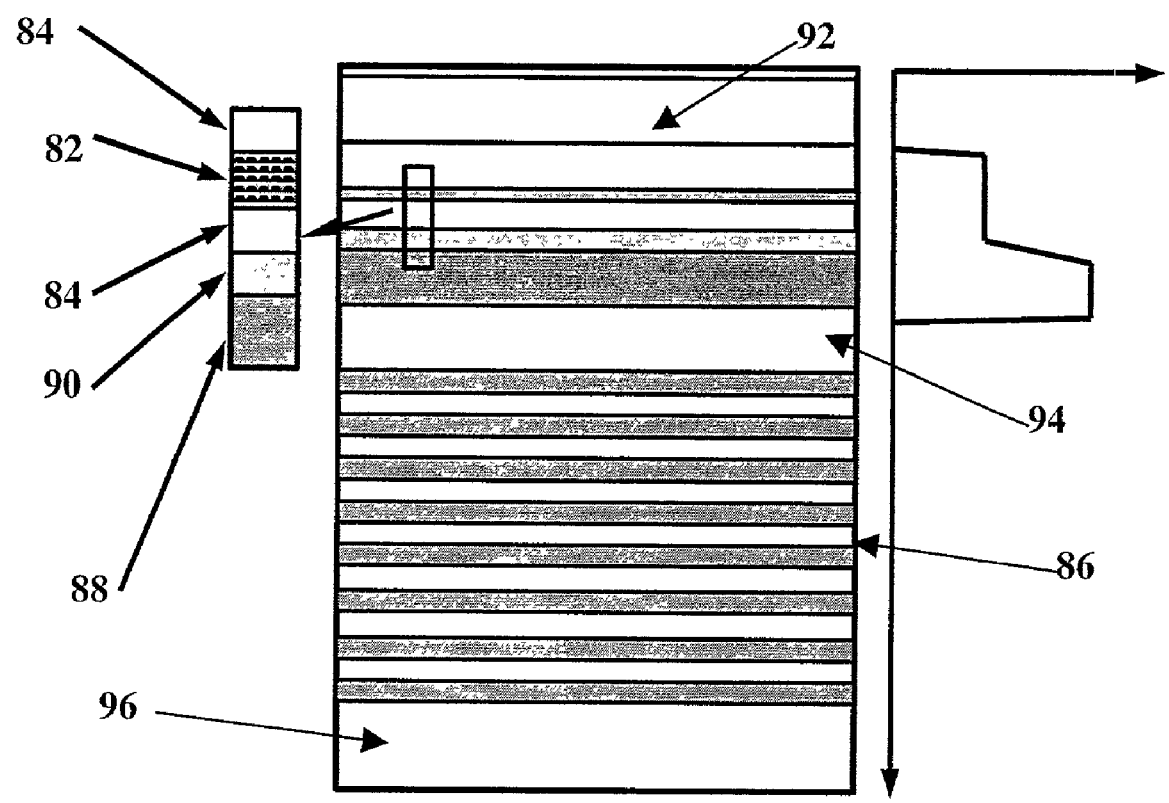
FIG. 65 depicts a partial cross-sectional view and electric field profile near breakdown of a resonant-cavity SACM APD with $In_{0.5}Al_{0.5}As$ QD absorption layers.

FIG. 65 illustrates a cross-sectional view and electric field profile near breakdown of a resonant-cavity SACM APD with $In_{0.5}Ga_{0.5}As$ QD layers. Since a single layer of QDs may be relatively thin, five layer stack 82 of $In_{0.5}Ga_{0.5}As$ QD separated by GaAs spacers 84 may be included in this structure to enhance the absorption. A QD layer may be formed by depositing six monolayers of $In_{0.5}Ga_{0.5}As$ with a sequence of one monolayer deposition of GaAs and InAs alternatively. To improve the quantum efficiency further, the structure may be embedded into a resonant cavity and the absorption layer may be placed at the antinode of the standing wave. Bottom mirror 86 of this cavity may include approximately 25 pairs of an n-type AlAs—GaAs quarter-wave stack, and the top mirror (not shown) may include about 3 pairs of λ/4 $MgF_2$/ZnSe layers that may be deposited proximate the end of the process. Multiplication region 88 may be an undoped about 0.1 µm thick $Al_{0.2}Ga_{0.8}As$ layer, which may yield relatively low avalanche noise and a relatively high gain-bandwidth product. Since this layer may be relatively thin, the electric field across this region near the breakdown voltage may be relatively high (e.g., about $8.6 \times 10^5$ V/cm). The electric field in the absorption region may be high enough for the carriers to quickly attain saturation velocity but may be less than a field strength where the tunneling component of the dark current may become significant. These requirements may be satisfied by controlling the electric field profile with charge layer 90 between the multiplication and absorption regions. An appropriate charge layer may include an about 60 nm thick p-type charge layer. As such, the electric field near breakdown may be relatively high in the multiplication region and relatively low in the absorption region. The thicknesses of the p$^+$ and n$^+$ regions 92 and 94, respectively, may be place the absorber at an antinode of a standing wave in the cavity. Relatively thin top p-GaAs layer 92 may be heavily doped (e.g., about $10^{19}$ $cm^{-3}$) to ensure ohmic contact. The structure may be grown on semi-insulating GaAs substrate 96 by molecular beam epitaxy in a Varian Gen II system.

Figure 66:
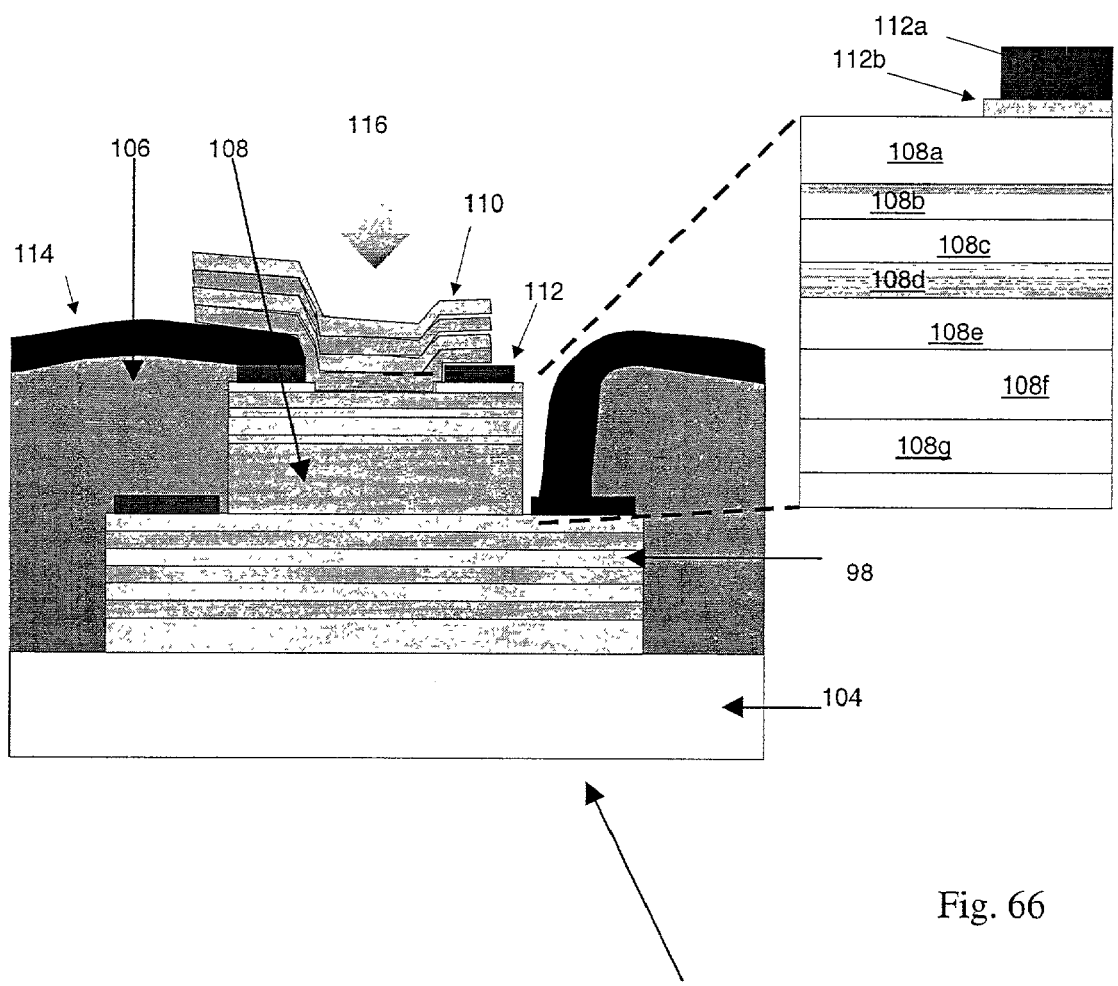
FIG. 66 depicts a partial cross-sectional view of a processed resonant-cavity SACM APD with $In_{0.5}Al_{0.5}As$ QD absorption layers.
Figure 67:
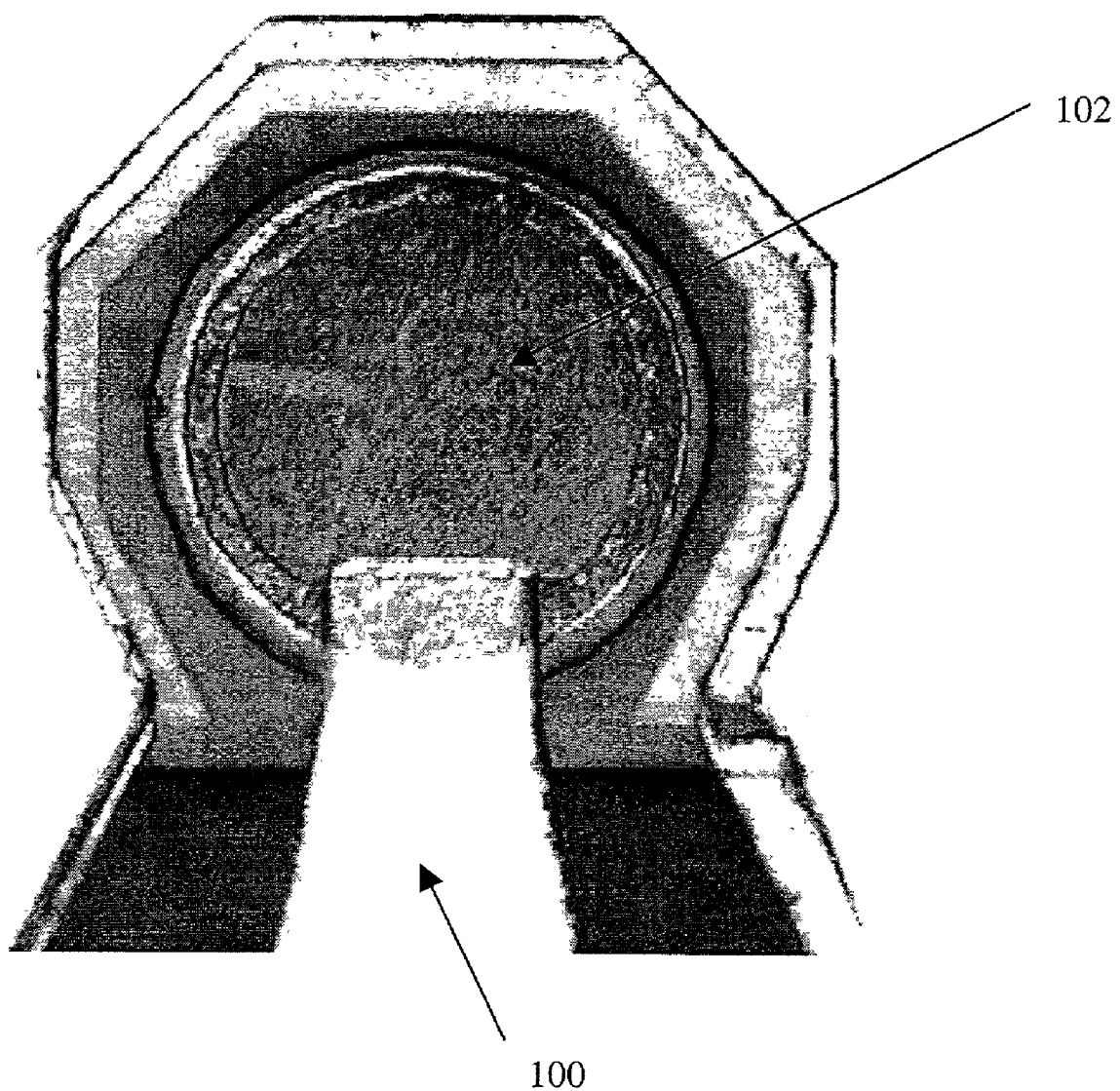
FIG. 67 depicts a top view of a processed resonant-cavity SACM APD.

Fabrication of the relatively high-speed APDs may employ all or some of the processing steps described herein. A cross sectional view of a processed resonant-cavity SACM APD with $In_{0.5}Ga_{0.5}As$ QD absorption layers is shown in FIG. 66, and FIG. 67 is the top view. To limit the junction capacitance, mesa diameters of relatively high speed devices may be about 10 µm to about 20 µm. Bottom mirror 98 of the resonant cavity may be formed with about 20 to about 25 pairs of AlAs/GaAs quarter-wave layers. A reflectivity of bottom mirror 98 may be greater than about 99% at about 1.06 μm. Bottom mirror 98 may be approximately 3 μm thick. FIG. 67 shows on-chip microwave strips 100 and relatively large probe pads 102 on the surface of the APD. This structure facilitates the extraction of the microwave signals from the device. The strips and pads may be substantially larger than the device mesa.

To reduce parasitic capacitance, bottom mirror 98 outside the n contact may be etched down to semi-insulating substrate 104. The surface may be planarized with low-k materials 106, such as polyimide and/or photoresist, to suppress parasitic capacitance and to improve the electric interconnection. APD Active region 108 may be formed on bottom mirror 98, and metal ring contact 112 may also be formed on APD Active Region 108. Probe metal 114 may be formed on low-k material 106 and on a portion of APD active region 108. Deposited dielectric DBR 110 may be formed on a portion of active region 108 interposed between probe metal 114 and metal ring contact 112. Incoming light 116 may strike deposited dielectric DBR 110. Due to the additional complexity of the device structure and the effort in reducing the parasitic capacitance, a longer process flow may be required for these devices. The additional basic steps will be described first, followed by the outline of the whole process.

As shown in the exploded view of FIG. 66, APD active region 108 may include p+ GaAs layer 108a, GaAs i spacer 108b, InGaAs QD stacks 108c, GaAs i spacer 108d, p+ AlGaAs charge region 108e, $Al_{0.2}Ga_{0.8}As$ multiplication region 108f, and n+ GaAs layer 108g. In addition, as shown in the exploded view of FIG. 66, metal ring contact 112 may include ring contact 112a and GaAs cap layer 112b.

To reduce junction capacitance, a diameter of the relatively high-speed devices may be smaller than those used for gain and noise measurements. Ideally, Reactive Ion Etching ("RIE") may be used since wet etching may result in a larger undercut. For GaAs-based APDs, the n-mesa may be etched through the bottom mirror to the semi-insulating GaAs substrate using, for example, a Chlorine-based RIE. A relatively thick layer of photoresist, which may be baked at about 120° C. for at least about 30 minutes, may be used as an etch mask. A thickness of the photoresist may be about 2 μm, which may be achieved, for example, by spinning AZ 5214 at a speed of about 2000 rpm. After photolithography, the sample may be loaded into a RIE chamber for an about 15 minute etch, which may yield about a 3 μm thick mesas. Etching species for GaAs and AlGaAs may include, but are not limited to, a mixture of $SiCl_4$ and $BCl_3$, and each may have a pressure of about 10 mTorr. The RF power may be about 100 W. After RIE, the photoresist may be washed in solvents and an ultrasonic bath.

PECVD deposited $SiO_2$ may be used as a passivation layer or etch mask during processing. For more precise linewidth control, dry etching may be employed. A RIE etch mask for $SiO_2$ may be, for example, patterned photoresist, and the etching species may include, but are not limited to, $CF_4$ and $O_2$. The RF power may be about 120 W. During photoresist ashing and polyimide etching, an $O_2$ plasma with a power of about 80 W may also be introduced into the process.

After etching bottom mirror 98 to semi-insulating substrate 104, the relatively high (e.g., about 3 μm) mesas formed on the surface may complicate subsequent processing. To connect the device to the probe pad, the surface may be planarized with low-k materials 106 such as polyimide and/or photoresist.

Before planarization, an about 100 nm thick sacrificial $SiO_2$ layer may be deposited by PECVD, or any other technique known in the art, to protect the contacts and the semiconductor surface. Ideally, the planarization may be achieved in one step. Due to the height of the mesas, a relatively thick polyimide layer may be used. Such a layer may complicate lithography and may also leave a relatively thick ridge of polyimide on an edge of the wafer, which may be generally referred to as "edge bead". As such, a Dupont DS-HKS-001 polyimide layer may be spun on substantially the whole wafer at about 35K rpm for about 40 seconds. The wafer may be placed in a petri-dish for about 30 minutes to allow the polyimide to reflow on the wafer, which may produce a smooth the surface. The wafer may then be soft-baked on a hot plate at about 90° C. for about 30 seconds. Using the n-mesa mask, substantially the entire polyimide layer except that on top of the n-mesas may be exposed. Since the DS-HKS-001 polyimide may be photosensitive as a negative-toned photoresist, the polyimide on top of the n-mesas may be removed with developer. The development time may be about 30 seconds in a developer such as DE-9040, and the rinse time may be about 15 seconds in DE-9045. After the first polyimide planarization, the wafer surface except the n-mesas may be covered with an about 3 μm thick polyimide layer, which may make subsequent processing easier. The second layer of polyimide may then be spun on substantially the entire wafer at about 35K rpm for about 40 seconds.

After polyimide reflow for about 30 minutes, the wafer may be cured in an oven. Curing the polyimide may improve the quality of polyimide. The curing cycle may include heating to about 120° C. for about 20 minutes, heating to about 200° C. for about 20 minutes, and heating to about 300° C. for about 20 minutes in $N_2$ ambient. The temperature may be ramped-up relatively slowly between each cycle. After curing, the polyimide may be substantially insoluble in solvents that may be used later in processing. An about 1000 Å $SiO_2$ may be deposited by PECVD, or any other technique known in the art, on substantially the entire wafer. After patterning, the $SiO_2$ layer may serve as an etch mask to open contact windows through the polyimide layer. For example, an $O_2$ plasma may be employed to open the windows.

Alternatively, only photoresist may be used in the planarization. In this process, a first low k material layer may be formed by a photoresist such as AZ 5214 photoresist, which may be spun at about 2000 rpm. The photoresist may be patterned with the n-mesa mask by image-reversal photolithography. The resulting layer outside the n mesas may have a thickness of about 2.1 μm. Before formation of a second layer, the photoresist may be cured as described above. A relatively thin AZ 5214 layer may be spun on the surface at about 4000 rpm and may be exposed with the contact mask. Since the contact windows may be formed by photolithography, the PECVD and the $O_2$ plasma steps may not be necessary.

An additional $SiO_2$ dry etch may be employed to etch the $SiO_2$ sacrificial layer deposited in the beginning of the planarization such that the metal contacts may be exposed.

With a set of masks, the process for the relatively high-speed SACM APDs may be started with p-contact formation, followed by formation of device mesas and N contacts as described herein. N-mesa formation may include, but is not limited to, photolithography for n mesa with a about 120° C. post-bake, RIE GaAs/AlGaAs bottom mirror, and solvent cleaning. N-mesa formation may be followed by a planarization step. Probe-pad formation may include, but is not limited to, photolithography for probe-pad metallization, surface cleaning by BHF dip, and p-contact deposition with Ti/Pt/Au.

Figure 68:
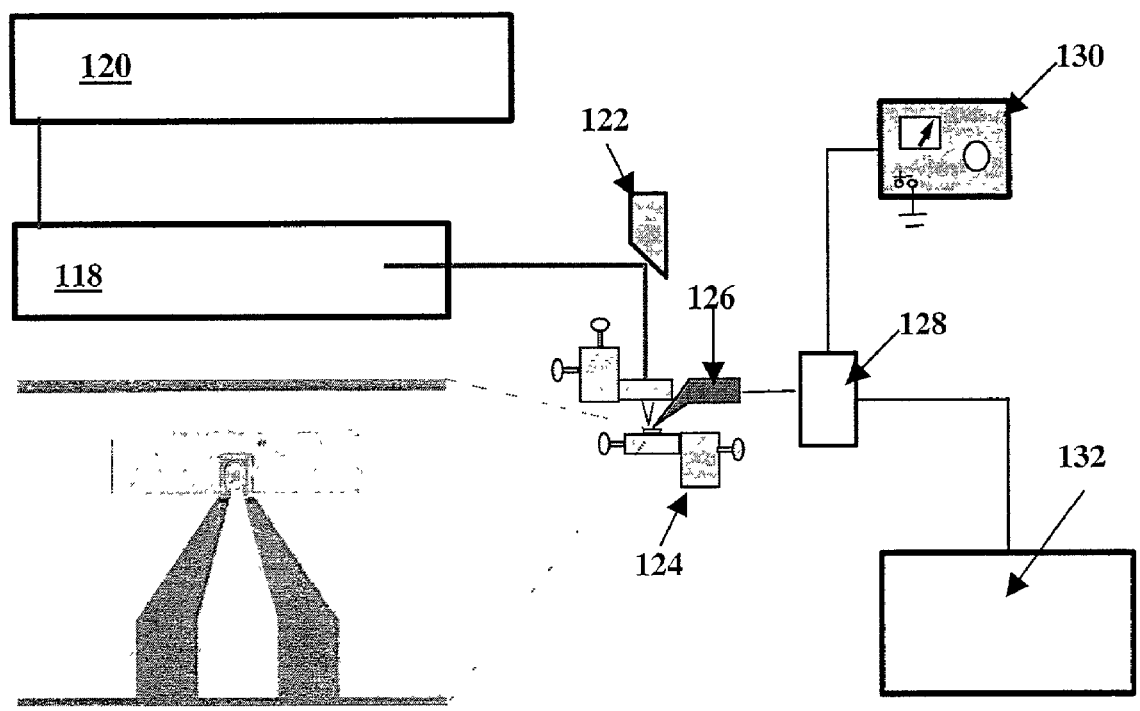
FIG. 68 depicts a schematic diagram of an experimental setup for frequency-response measurements of resonant-cavity SACM APDs.

Gain and noise measurements for resonant-cavity SACM APDs may use an apparatus described in above, and the frequency response of the APDs may be measured by analyzing the photocurrent spectrum. FIG. 68 shows an embodiment of a system configured for bandwidth measurements. Tunable passively mode-locked Ti:sapphire femtosecond laser 118 pumped by Argon laser 120 may be used as an optical source. An appropriate optical source, however, may include any optical source known in the art. The pulse width may be about 200 fs, and the repetition rate may be about 76 MHz. This optical pulse train may have a bandwidth larger than about 1 THz and may be treated as a series of delta-function input for photodiodes. The light may be directed to an APD by mirror assembly 122. The APD may be supported by a stage coupled to mechanical device 124, which may be configured to alter a position of the stage in the x, y, and z directions. Substantially all of the light may be focused onto top of the device in order to avoid a diffusion tail in the photoresponse.

An APD may be contacted by microwave probe 126 with approximately 50 Ω characteristic impedance, which may be biased through an about 50 GHz external bias tee 128. Bias tee 128 may be coupled to power supply 130. The AC signal may be fed into spectrum analyzer 132 such as an about 50 GHz HP5606E spectrum analyzer, and the DC current may be monitored by a precise current meter. This measurement technique may produce a series of spikes that may separated by a pulse repetition rate of about 76 MHz in the response spectrum. A frequency response of a device may superimpose an envelope on a series of delta-functions in the frequency domain, which may yield the bandwidth of the photodiode. Before each measurement, the system may be calibrated with a photodetector such as a Picometrix ultrafast photodetector (about 7 ps, about 60 GHz). Since components in the measurement system may be about 50 GHz compatible, the bandwidth of this measurement system may be sufficient for the devices.

Figure 69:
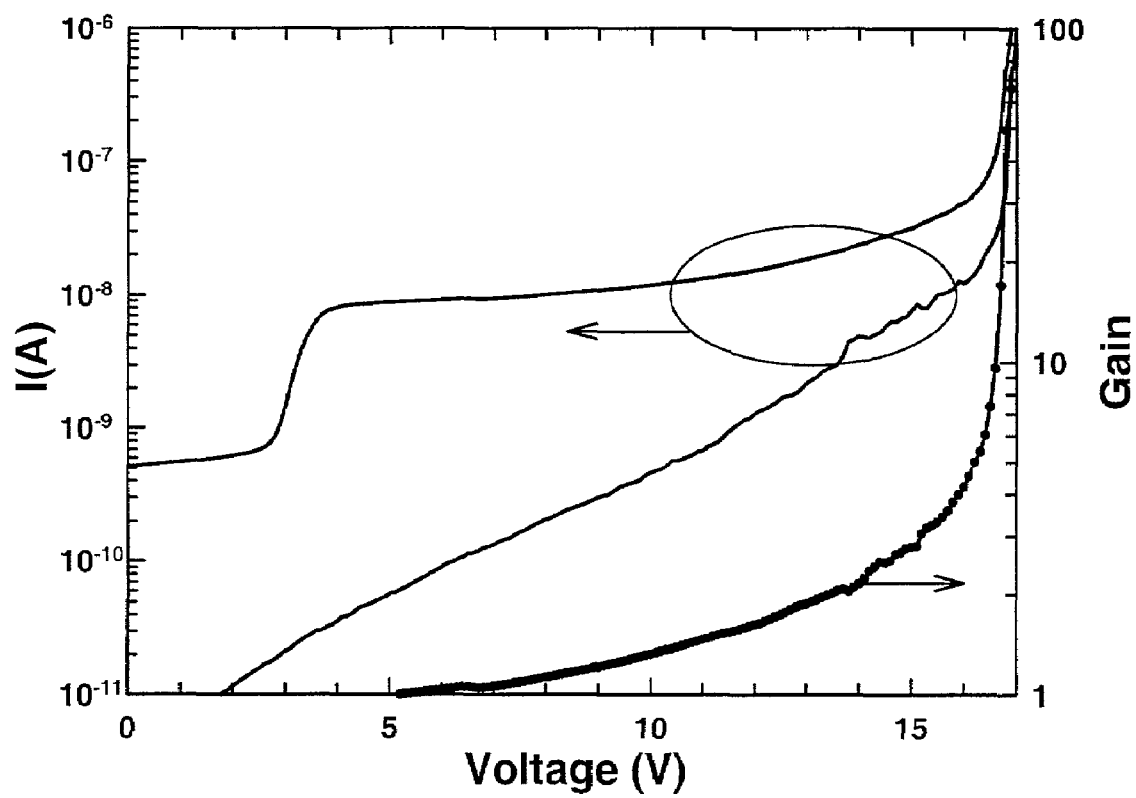
FIG. 69 depicts a plot of measured photocurrent and dark current of the resonant-cavity SACM APDs.

Measured photocurrent and dark current of the relatively high-speed resonant cavity APDs are shown in FIG. 69. According to Equation 65, the gain, shown in FIG. 69, may be calculated by using the photocurrent right after punchthrough as the unity-gain reference. As shown in this FIG. 69, a maximum avalanche gain of these devices may not be less than about 50.

Figure 70:
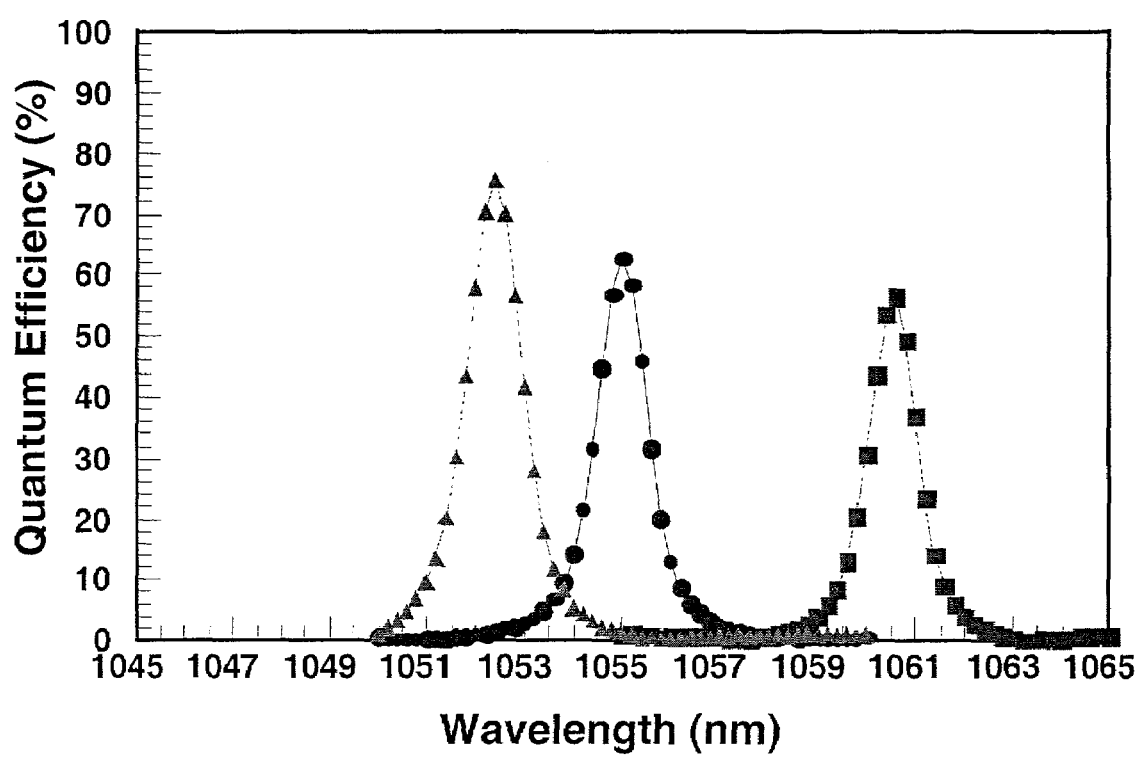
FIG. 70 depicts a plot of quantum-efficiency spectra measured for QD SACM APDs with 3 pair $MgF_2/ZnSe$ top mirrors.

Biased at unity-gain, external quantum efficiency may be measured using a tunable monochromatic light source, a phase-locked amplifier, and a calibrated Ge photodiode. FIG. 70 shows quantum-efficiency spectrum of QD SACM APDs with a 3-pair-$MgF_2$/ZnSe top mirror. The quantum efficiency decreases with the GaAs growth. A peak quantum efficiency of about 58% may be achieved at about 1.06 μm. Although the wafer may be designed for about 1.06 μm with the QD regions at the cavity antinodes, devices fabricated from an as-grown wafer may exhibit a peak efficiency of about 76% at about 1.052 μm. Additional layers of GaAs may be grown on unprocessed portions of the wafer to lengthen the cavity to shift the response to about 1.06 μm. Lengthening of the cavity may yield peak efficiencies of about 64% at about 1.055 μm and about 58% at about 1.06 μm. As shown in FIG. 70, the quantum efficiency may decrease in longer cavities because the QD absorber may no longer be at an antinode of the longer cavities. Nevertheless, efficiencies in the range of about 70% to about 80% at about 1.06 μm may be expected with optimized structures. From the variation of the quantum efficiency with the top-mirror reflectivity, the αd value may be determined to be about 0.013 thereby indicating that without the resonant-cavity structure, the quantum efficiency may be below about 1%.

Figure 71:
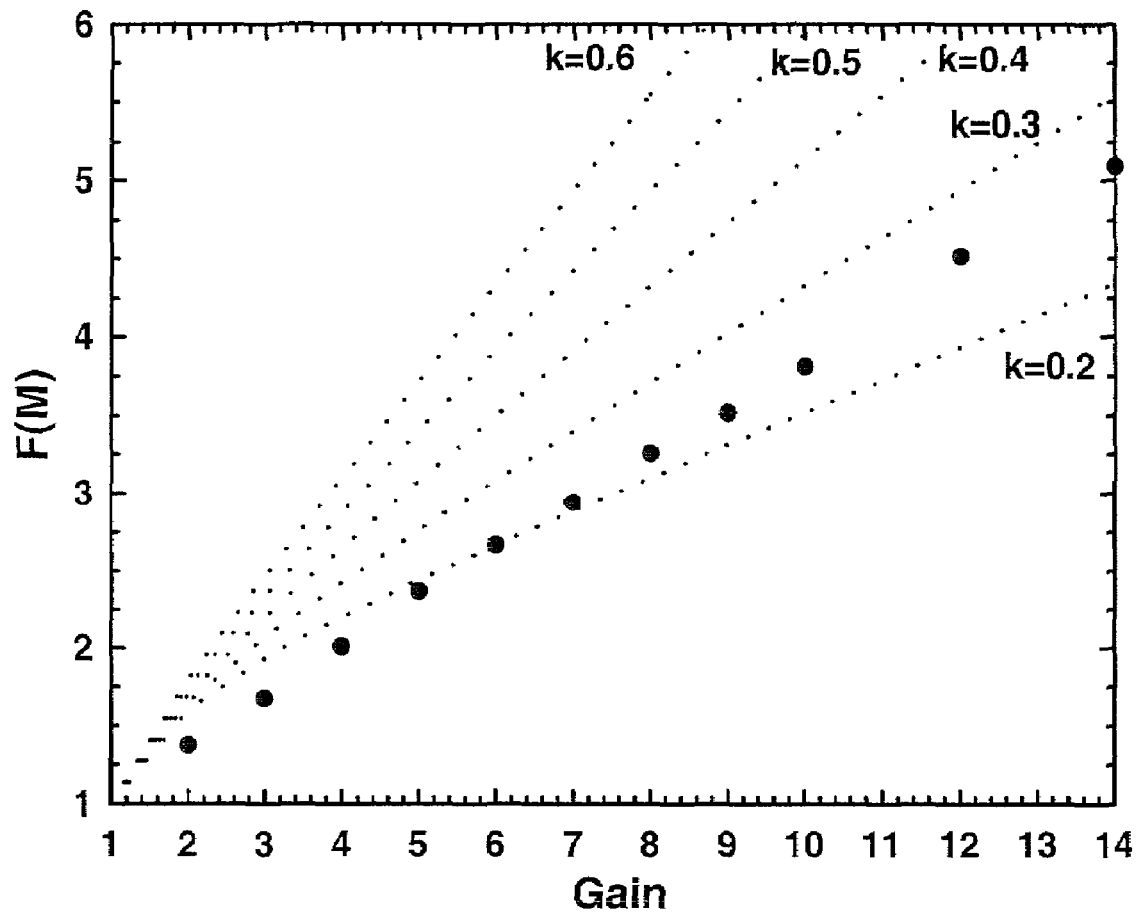
FIG. 71 depicts a plot of excess noise factor of resonant-cavity QD SACM APDs as a function of avalanche gain.

With the setup described herein and the cw YAG laser at about 532 nm, excess noise of the APDs may be measured as a function of multiplication. FIG. 71 illustrates excess noise factor of the resonant-cavity QD SACM APDs as a function of avalanche gain indicated by the symbols. The dashed lines are the excess noise factors calculated with the conventional avalanche noise theory and the specified k's. As illustrated in FIG. 71, the relatively low noise level (e.g., k of approximately 0.24) may be comparable to results obtained from the homojunction devices as shown above.

Bandwidths of the relatively high-speed SACM APDs may be measured under various bias voltages. Before the device reaches punchthrough, the bandwidth may be limited by the carrier diffusion process since the absorption region may not be fully depleted. After punchthrough, photogenerated carriers may drift through the depletion region with saturated velocities. Due to the influence of traps and defects associated with QD growth, the bandwidth may not be maximized until the electric field may be slightly over unity. As the bias increases, multiplication may take place in the relatively high-field regions, and the bandwidth of the device may decrease. At relatively high gains, the device frequency response may be limited by the gain-bandwidth product. Since the gain may be relatively sensitive to the reverse bias at voltages near breakdown, the IV characteristics of these APDs may be measured with a voltage source and current meter.

Figure 72:
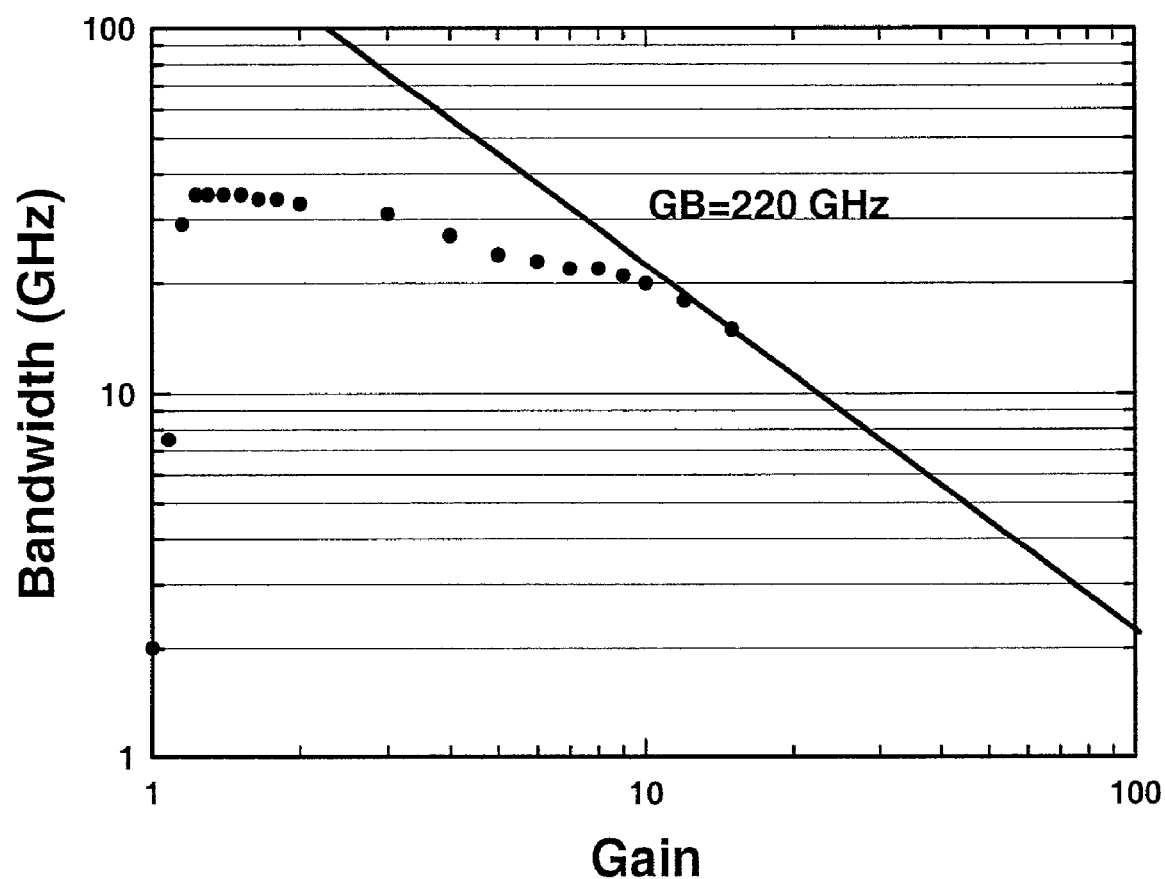
FIG. 72 depicts a plot of measured bandwidth versus gain for SACM APDs.

The measured AC gain versus reverse bias may coincide with that of DC gain measurements using a semiconductor parameter analyzer such as the HP4145B semiconductor parameter analyzer and may confirm accuracy of both gain measurements. The about 3 dB bandwidth at each gain point may be recorded and plotted as a function of the DC gain. The gain-bandwidth product may be extrapolated from a best fit of the bandwidth data at high gains. FIG. 72 illustrates the measured bandwidth as a function of gain for the SACM APDs. As shown in FIG. 72, the RC-limited, relatively low-gain bandwidth may be about 35 GHz, and a gain-bandwidth product of about 220 GHz may be observed in the high-gain regime. This gain-bandwidth product may be a record-high gain-bandwidth product for APDs operating in the region near about 1.0 μm. To put this result in context, the best multiple-quantum-well APDs, which have been deployed for high-bit-rate fiber optic transmission systems, may have gain-bandwidth products of about 150 GHz.

APD structures with relatively thin multiplication regions may have the lowest excess noise and the highest gain-bandwidth products reported for any APD. For example, with $Al_xGa_{1-x}As$ (where x is greater than about 0.8) multiplication regions, excess noise less than that of Si APDs for gains greater than about 10 and comparable noise for higher gains has been achieved. The relatively low noise may be demonstrated both experimentally and theoretically and may due to the nonlocal nature of the impact ionization process and the fact that nonlocality may become a dominant effect in relatively thin high-field regions.

Figure 73:
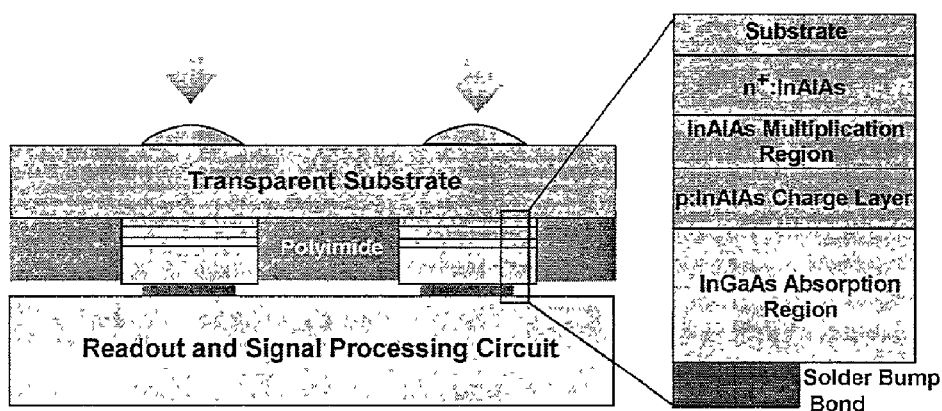
FIG. 73 depicts a partial cross-sectional view of a device structure and proposed integration method for arrays of $In_{0.52}Al_{0.48}As/In_{0.53}Ga_{0.47}As$ resonant-cavity APDs.

For long-wavelength operation (e.g., λ of about 1.58 μm), an about 200 nm $In_{0.52}Al_{0.48}As$ layer may be used as the multiplication layer in a resonant-cavity APD with separate absorption, charge, and multiplication regions ("SACM" structure). An embodiment of such a structure including arrays of such APDs is illustrated in FIG. 73. As shown in FIG. 73, the structure may include readout and signal processing circuit 140. The structure may also include APDs 142. As shown in the exploded view of FIG. 73, APD 142 may include substrate 142a, n+ InAlAs absorption layer 142b, InAlAs multiplication region 142c, p:InAlAs charge layer 142d, and InGaAs absorption region 142e. As farther shown in the exploded view, APD 142 may be coupled to circuit 140 by solder bump 144. Low-k material 146 may be interposed between APDs 142. An appropriate low-k material may include, but is not limited to, polyimide. In addition, the structure may also include transparent substrate 148 coupled to APDs 142 and low-k material 146.

These APDs may have relatively low excess noise factors (k equivalent to about 0.18). For comparison, the k factor, which may be a widely-accepted figure of merit for multiplication noise, of commercially-available III-V compound APDs may typically be greater than about 0.5. These APDs may also have record bandwidths. In the relatively low gain regime (e.g., M less than about 10) the bandwidth may be greater than about 20 GHz. At higher gains, the response may be characterized by a gain-bandwidth product of about 290 GHz. The unity-gain external quantum efficiency may be about 65% at a $\lambda$ of about 1.58 µm. In addition, the bias voltage may be in the range of about 20 V to about 25 V. Such a bias voltage may be approximately five times lower than typical APDs.

With homojunction APDs, even lower noise may be achieved with relatively thin (e.g., about 0.1 µm to about 0.2 µm) $Al_xGa_{1-x}As$ (with x greater than about 0.8) multiplication layers. These devices may have the lowest excess noise reported for any avalanche photodiode. In the relatively low gain regime, the noise may be less than about twice the shot noise. In terms of the local-field model (which may not be applied to thin multiplication regions), a theoretical fit of these values would require negative values of k. This type of multiplication region may be incorporated into APDs to achieve ultra low noise operation. A GaAs-based structure may be used. This structure has the advantage of utilizing lattice-matched epitaxial growth. These devices may utilize GaAs (or strained $In_xGa_{1-x}As$) absorption regions and will, consequently, detect in the near infrared (e.g. at wavelengths greater than about 0.85 µm and less than about 1.0 µm). To extend the response to longer wavelengths (e.g., $\lambda$ of about 2 µm) we may use wafer bonding to combine a relatively long-wavelength absorber with the ultra-low noise $Al_xGa_{1-x}As$ multiplication regions. Materials that may exhibit high sensitivity beyond about 2 µm include, but are not limited to, InAsP, GaInAsSb, GaInAsSb, and $In_{0.83}Ga_{0.17}As$ quantum wells compensated by $In_{0.83}Ga_{0.17}P$ barrier layers.

The third approach may be to wafer bond the relatively long-wavelength absorber to a Si multiplication region. This type of structure has been successfully demonstrated using an $In_{0.53}Ga_{0.47}As$ absorber.

In some instances it may be advantageous to integrate a filtering function into the detection process. Using resonant-cavity photodiodes, the responsivity may be highly wavelength selective. The spectral width may be determined by mirror reflectivities and, for high Q cavities, $\Delta\lambda$ may be about 0.8 nm. The optical cavity length may control the spectral peak. Course tuning may be accomplished during wafer growth, and fine adjustment may be made during device processing by etching or evaporating spacer layers to, respectively, decrease or increase the resonance wavelength. Using more complex mirrors, relatively narrow-band detection may be achieved at multiple wavelengths or out of band signals may be greatly reduced.

Figure 74:
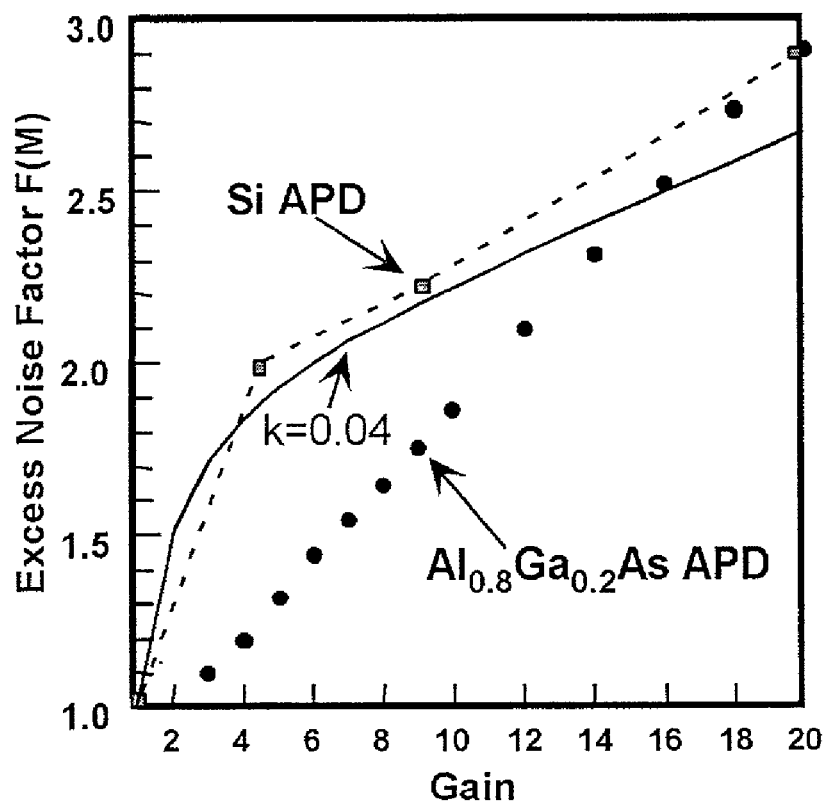
FIG. 74 depicts a plot of excess noise factor versus gain for an $Al_{0.8}Ga_{0.2}As$ APD and a Si APD.

$Al_xGa_{1-x}As$ (with x greater than about 0.8) homojunction APDs have exhibited the lowest noise observed for any avalanche photodiode. FIG. 74 shows the excess noise factor versus gain for an $Al_{0.8}Ga_{0.2}As$ APD indicated by the solid circular data points. For comparison, the noise of a Si APD is plotted as square data points connected by a dashed line. The solid line is a plot of the excess noise factor for k=0.04 using the local field model. As shown in FIG. 74, for M less than about 20, the noise of the $Al_{0.8}Ga_{0.2}As$ APD may be substantially less than that of the Si APD. In fact, for M less than about 12, the noise would correspond to values of k less than about 0. As described above, such values of k may appear unphysical, but, in fact, such values indicate that the non-local field model, in which the excess noise is a function of only the gain and the ratio of the ionization coefficients, k, may not be appropriate for relatively thin multiplication regions where history-dependent ionization coefficients may be required.

Figure 75:
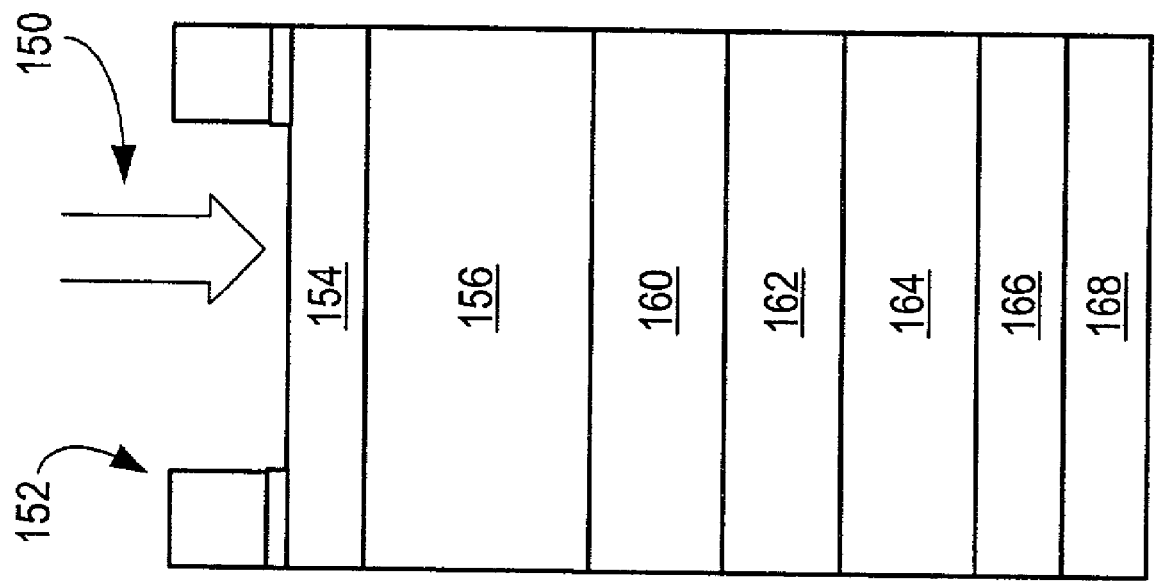
FIG. 75 depicts a partial cross-sectional view of a SACM APD with a $Al_xGa_{1-x}As$, with x greater than about 0.8, multiplication region.

This type of multiplication region may be incorporated into an $Al_xGa_{1-x}As/GaAs$ SACM APD. A cross section of a SACM APD with $Al_xGa_{1-x}As$ (with x greater than about 0.8) multiplication region is shown in FIG. 75. As shown in FIG. 75, optical signal 150 may enter the multiplication region between p-contacts 152. Optical signal may pass through AlGaAs window 154 to the APD. The APD may include GaAs absorption region 156. Alternatively GaAs absorption region 156 may be replaced with wafer-bonded relatively long wavelength (e.g. greater than about 2.0 mm) absorption region 158. For example, once low noise has been confirmed, the GaAs absorber may be replaced with relatively long-wavelength absorber 158. An appropriate long-wavelength absorber may include an $InP/In_{0.53}Ga_{0.47}As$ PIN photodiode bonded to a GaAs/AlAs Bragg mirror. Appropriate long-wavelength absorbers, however, may also include, but are not limited to, InAsP, GaInAsSb, and GaInAsSb, which have exhibited relatively high sensitivity at wavelengths greater than about 2.0 µm. In another embodiment, long-wavelength absorber 158 may include $In_{0.83}Ga_{0.17}As$ quantum wells compensated by $In_{0.83}Ga_{0.17}P$ barrier layers. The APD may also include p:AlGaAs charge layer 160, AlGaAs multiplication region 162, n+:AlGaAs layer 164, substrate 166 and n-contact 168.

When electrons or holes enter a relatively high electric field region such as the multiplication layer of an APD, they may be accelerated and may gain energy from the field. When they have sufficient energy, a collision with a valence band electron may excite it to the conduction band thus creating a new electron and hole. The initialing carrier and the newly created carriers may then create additional electrons and holes by repeating this process as they drift through the high field region. Since the impact ionization process may be random, however, there may be noise associated with the gain. This noise may degrade system performance. A related consideration is the finite build up time that may be required for the gain to achieve its final value. This finite build up time may be due to the regenerative nature of the multiplication process and may give rise to a substantially constant gain-bandwidth product, which, at high gain (e.g., M greater than about 10), may determine the frequency response. In the conventional model for impact ionization in semiconductors, the gain-bandwidth product and the multiplication noise may be related to the electron and hole ionization rates ($\alpha$ and $\beta$, respectively) or, more specifically, to their ratio $k=\beta/\alpha$. The highest performance (e.g., relatively low multiplication noise and relatively high gain-bandwidth product) may be achieved when k<<about 1.

The advantage of using an APD may be seen analytically by comparing the signal-to-noise ratio, S/N, for PIN photodiodes and APDs. For a PIN, the signal may simply be the photogenerated current, $i_{ph}$. The noise terms may be the shot noise associated with the photocurrent and the dark current, $i_d$, and the thermal noise. The mean square shot noise is given by $\bar{i}_s^2 = 2q(i_{ph} + i_d)B$ where B is the device bandwidth. The thermal noise is $\bar{i}_{th}^2 = 4kTB/R$ and R is the effective resistance including the shunt resistance, the series resistance, and the load resistance. Thus, the signal to noise ratio for a PIN is given by $$\left(\frac{S}{N}\right)_{PIN} = \frac{i_{ph}^2}{2q(i_{ph} + i_d)B + 4kTB/R}. \quad (90)$$

For an APD, if it is assumed that the dominant component of the dark current is the multiplied dark current, the shot noise becomes $\bar{i}_s^2 = 2q(i_{ph} + i_d)MF(M)B$ where $F(M)$ is the excess noise factor that arises as a result of the random nature of the multiplication process. It follows that the signal-to-noise for an APD can be written as:

$$\left(\frac{S}{N}\right)_{APD} = \frac{i_{ph}^2 M^2}{2q(i_{ph} + i_d)MF(M)B + 4kTB/R} \quad (91)$$

Comparing Equations 90 and 91, the advantage afforded by the APD becomes apparent. When M is about 1, Equation 91 reduces to the PIN case, as expected. However, as M increases, initially the thermal term $4kTB/R$ will be larger than the shot noise terms. In this regime, the $(S/N)_{APD}$ may increase approximately as $M^2$. This increase will continue until the shot noise terms become comparable to $4kTB/R$. Further increases in M will then degrade $(S/N)_{APD}$ relative to its optimum value. The optimum gain may be, therefore, the gain at which the shot noise and the thermal noise are comparable.

The minimum detectable power, Pmin, is frequently defined in terms of the detected power at which S/N=1. For a PIN, $$P_{min}^{PIN} = \frac{2h\nu}{q\eta}\sqrt{\frac{kTB}{R}} \quad (92)$$

where $h\nu$ is the photon energy and $\eta$ is the external quantum efficiency. For an APD the minimum detectable power can be written as $$P_{min}^{APD} = \frac{1}{M}\left[\frac{2h\nu}{q\eta}\sqrt{\frac{kTB}{R}}\right] = \frac{1}{M}P_{min}^{PIN}. \quad (93)$$

Another figure of merit is the noise equivalent power ("NEP"), which for a PIN is expressed as $$NEP_{PIN} = \frac{h\nu}{q\eta}[2q(i_{ph} + i_d)B + 4kTB/R]^{1/2} \quad (W \cdot Hz^{-1/2}) \quad (94)$$

and the NEP for a APD is $$NEP_{APD} = \frac{1}{M}NEP_{PIN} \quad (95)$$

Figure 76:
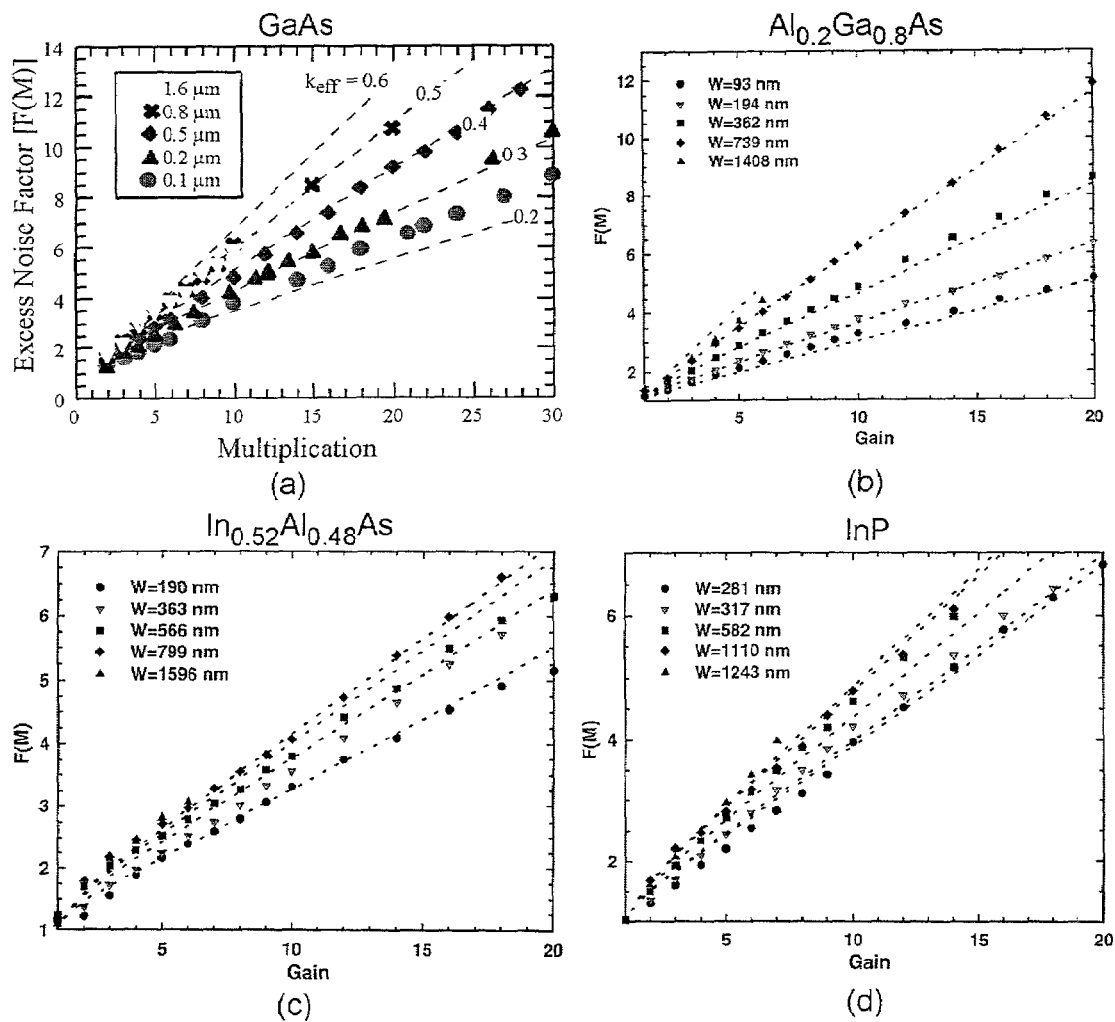
FIG. 76a depicts a plot of measured excess noise factors for GaAs homojunction APDs for various multiplication widths.
FIG. 76b depicts a plot of measured excess noise factors for $Al_{0.2}Ga_{0.8}As$ homojunction APDs for various multiplication widths.
FIG. 76c depicts a plot of measured excess noise factors for $In_{0.52}Al_{0.48}As$ homojunction APDs for various multiplication widths.
FIG. 76d depicts a plot of measured excess noise factors for InP homojunction APDs for various multiplication widths.

Equation 91 shows that an APD may provide a sensitivity margin that may improve with increasing M until the shot noise, which is proportional to MF(M), exceeds the thermal noise. Therefore, it may be advantageous to have a relatively low excess noise factor F(M). A low value of F(M) permits higher gains and thus higher sensitivity before the shot noise equals the thermal noise. The best performance may be achieved by submicron scaling of the thickness of the multiplication region. This approach is in direct contrast to what would have been predicted by the local-field model that has been used, almost universally, for APDs for the past thirty years. FIGS. 76a–76d shows the measured excess noise factor (a figure of merit for multiplication noise) for a series of (a) GaAs, (b) $Al_{0.2}Ga_{0.8}As$, (c) $In_{0.52}Al_{0.48}As$, and (d) InP homojunction APDs with varying multiplication thickness. The dashed lines for GaAs as shown in FIG. 76(a) show plots of the excess noise as calculated from the local field model for different values of k. These dashed lines are not meant to imply a change in the relative ionization coefficients but only to show a noise reference since the k value has come to be a widely accepted figure of merit. As shown in FIG. 76(a), the noise that may arise from the multiplication process decreases with decreasing multiplication width for thicknesses less than about 0.5 μm. Similar results are observed for $Al_{0.2}Ga_{0.8}As$, $In_{0.53}Al_{0.48}As$, and InP APDs, as shown in parts (b), (c), and (d) of the figure, respectively.

Figure 77:
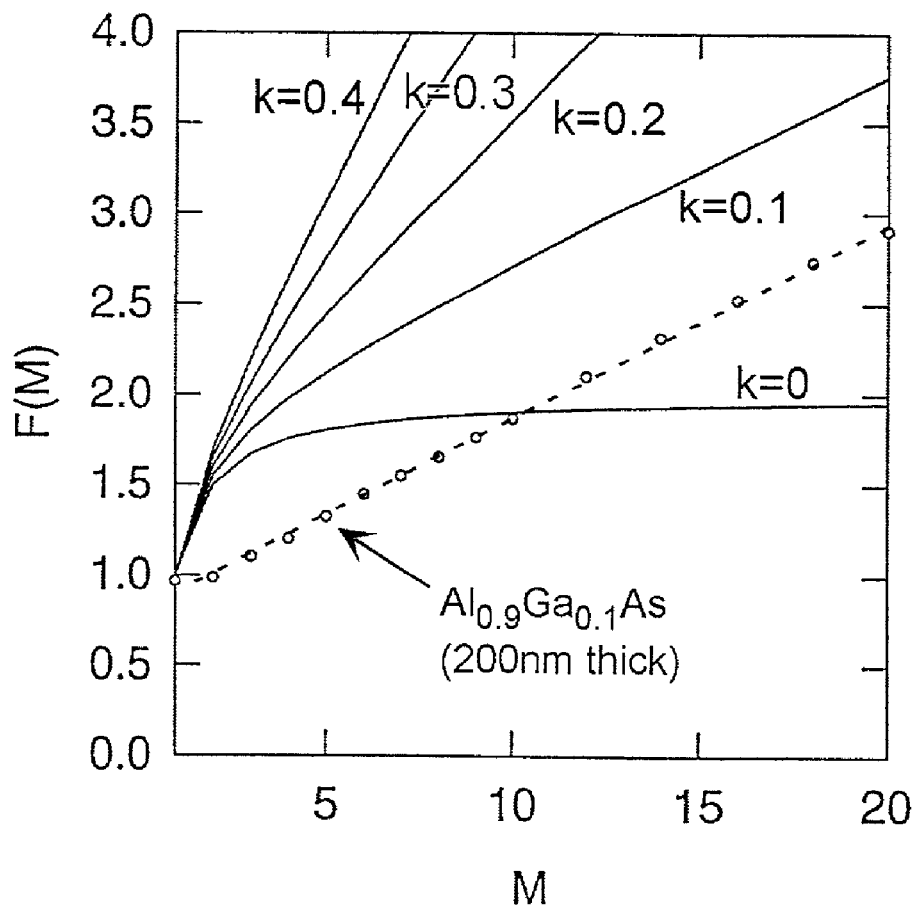
FIG. 77 depicts a plot of excess noise versus gain for an $Al_{0.9}Ga_{0.1}As$ homojunction APD.

For an "ideal" APD, $F(M) \propto M$ and for the "worst" case where $\alpha = \beta$, $F(M) \propto M^2$. $Al_{0.9}Ga_{0.1}As$ homojunction APDs with about 0.2 μm thick multiplication regions have the lowest noise reported for any APD structure (including Si). FIG. 77 shows the measured excess noise factor versus the gain, M, for such structures. As shown in FIG. 77, the relationship may be substantially linear. The solid lines in this figure were computed for various values of k (the ratio of the ionization coefficients $\alpha/\beta$) using the original local-field model. Note that the measured excess noise below M=10 would correspond to negative values of k. This seemingly unphysical condition may be an indication that the local field model may not be applicable for relatively thin multiplication regions where nonlocal effects may become significant. A carrier starting with near zero energy, relative to the band edge, will have almost zero chance of ionizing until it has gained sufficient energy from the electric field. This gives rise to a "dead length" over which the probability for impact ionization may be relatively small. The local-field model ignores this "nonlocal" effect, which is an approximation that may be valid when the thickness of the multiplication region is much greater than the dead length.

A new impact ionization model, which takes the non-local nature of the impact ionization process into account, incorporates history-dependent ionization coefficients. This model may be used with an effective field approach and simple analytical expressions for the ionization probabilities to achieve excellent fits to experimental gain and noise measurements for GaAs, $Al_{0.2}Ga_{0.8}As$, $In_{0.52}Al_{0.48}As$ and InP APDs with a relatively wide range of multiplication widths. A "size-effect" in relatively thin multiplication regions, which may not be adequately characterized by the local-field avalanche theory, may be observed for each of these materials. The magnitude of the noise suppression, however, may be material dependent. For example, $In_{0.52}Al_{0.48}As$ may exhibit lower noise than InP for the same multiplication widths. As such, the low-noise characteristics of APDs may be utilized with relatively thin multiplication regions.

Figure 78:
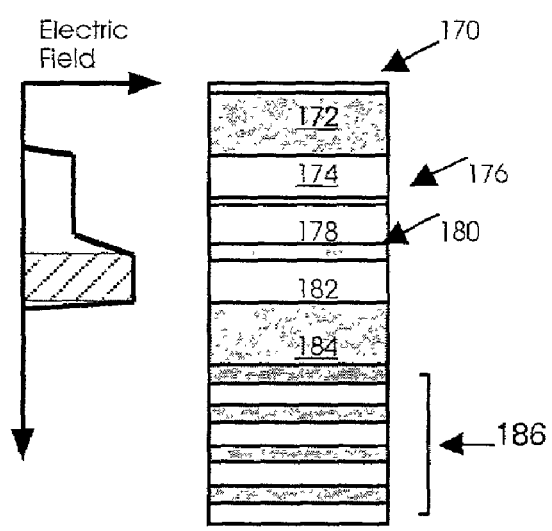
FIG. 78 depicts a schematic of an electric field of a resonant-cavity SACM and a partial cross-sectional view of a resonant-cavity SACM.

To achieve relatively high-speed and relatively low-noise, a relatively thin $Al_{0.2}Ga_{0.8}As$ multiplication region may be incorporated into a resonant-cavity photodetector structure, as shown in FIG. 78. The structure may include p++: GaAs contact layer 170, p+: $Al_{0.2}Ga_{0.8}As$ spacer layer 172, undoped, graded layer 174 having a thickness of about 120 nm, $In_{0.1}Ga_{0.9}As$ absorption layer 176 having a thickness of about 30 nm, undoped, graded layer 178 having a thickness of about 50 nm, p: $Al_{0.2}Ga_{0.8}As$ charge layer 180 having a thickness of about 50 nm, undoped $Al_{0.2}Ga_{0.8}As$ multiplication layer 182, and n+:$Al_{0.2}Ga_{0.8}As$ spacer layer 184. The structure may also include approximately 20 pair AlAs/Ga/As quarter-wave stack 186.

Since the absorption width in this type of photodiode is relatively thin, the depletion width may be relatively short, which may result in a relatively short transit and relatively high bandwidth. On the other hand, the efficiency may be enhanced through multiple reflections between two parallel mirrors in a Fabry-Perot cavity whose length may typically be less than about one wavelength. The lower mirror is an integrated Bragg reflector including alternating λ/4 epitaxial layers, having a reflectivity of greater than about 99%. The top mirror may be a relatively high reflectivity dielectric stack that may be deposited after fabrication and initial characterization.

SACM APDs may be grown by molecular beam epitaxy on semi-insulating GaAs [100] substrates. FIG. 78 also illustrates the electric field profile inside the cavity.

Figure 79:
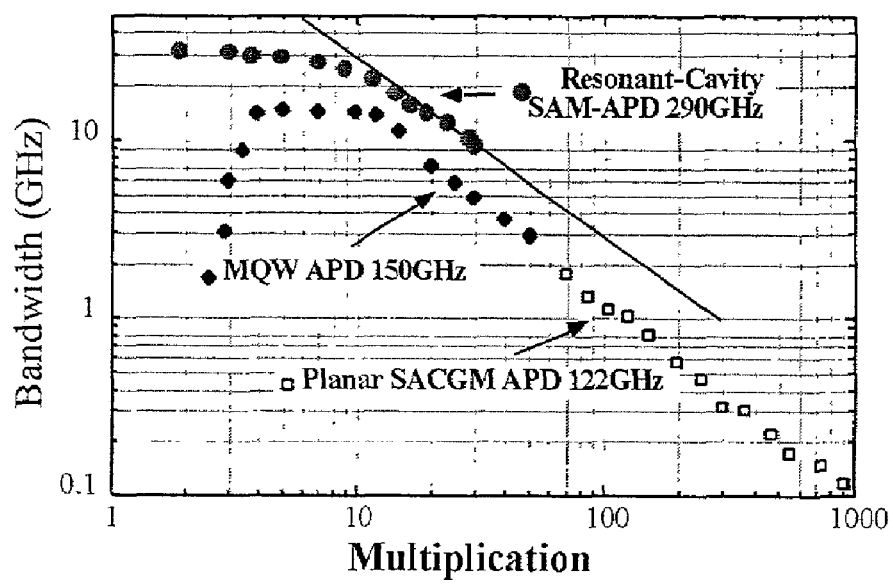
FIG. 79 depicts a plot of measured bandwidth versus DC gain for an SACM APD.

To balance the transit-time and RC components of the bandwidth, the intrinsic region of the device may be about 450 nm. Calculations show that the combined effect of the RC time constant and the transit time may yield a bandwidth of about 33 GHz. The frequency response of SACM APD devices was measured analyzing the photocurrent spectrum with a microwave probe system and an about 50 GHz spectrum analyzer. A passively mode-locked Ti-sapphire laser with about a 200 fs pulsewidth and about a 76 MHz pulse repetition rate was used as the optical source. The measured bandwidth versus DC avalanche gain of a SACM APD device is shown in FIG. 79. A gain-bandwidth of about 290 GHz was observed at high gains. As shown in FIG. 79, the response may be compared to a MQW APD having a gain-bandwidth of about 150 GHz and a planar SACGM APD having a gain-bandwidth of about 122 GHz. This gain-bandwidth product may be the highest ever reported for an APD. The speed in the low gain regime was determined to be about 33 GHz, which is also the highest for an APD.

Figure 80:
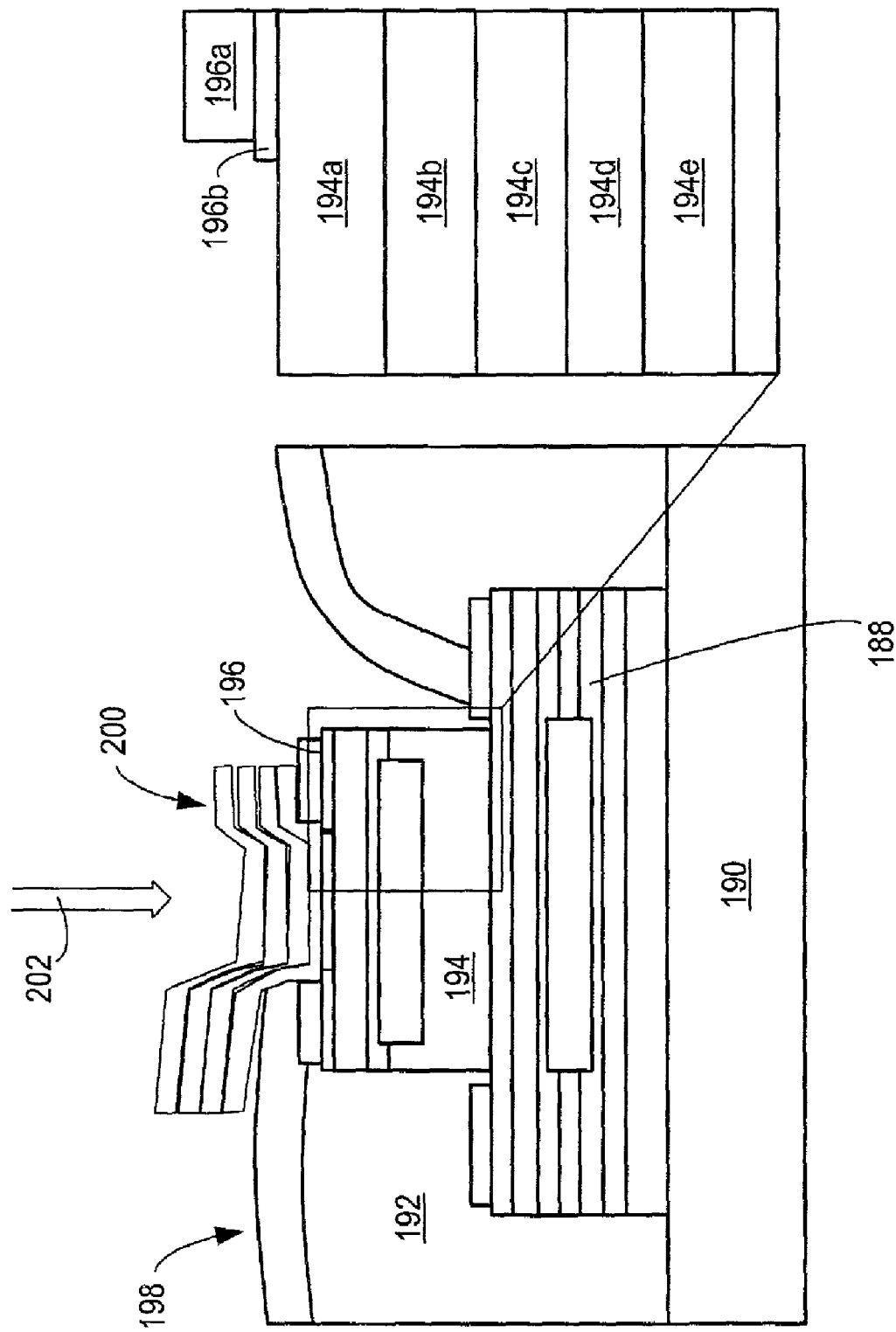
FIG. 80 depicts a partial cross-sectional view of a resonant-cavity $In_{0.53}Ga_{0.47}As/In_{0.52}Al_{0.48}As$ APD.

To extend the wavelength to about 1.55 μm, a similar resonant-cavity structure was designed and fabricated using $In_{0.53}Ga_{0.47}As$ as the absorber and $In_{0.52}Al_{0.48}As$ in the gain region. A cross-sectional view of an embodiment of such a device structure is shown in FIG. 80. Bottom mirror 188 of the resonant cavity may be formed with n+ InAlAs/InGaAs layers. Bottom mirror 188 outside the n contact may be etched down to semi-insulating InP substrate 190. The surface may be planarized with low-k materials 192, such as polyimide and/or photoresist, to suppress parasitic capacitance and to improve the electric interconnection. APD Active region 194 may be formed on bottom mirror 188, and metal ring contact 196 may also be formed on APD Active Region 194. Probe metal 198 may be formed on low-k material 192 and on a portion of APD active region 194. Deposited dielectric DBR 200 may be formed on a portion of active region 194 interposed between probe metal 198 and metal ring contact 196. Incoming light 202 may strike deposited dielectric DBR 200.

As shown in the exploded view of FIG. 80, APD active region 194 may include p+ InAlAs layer 194a, InGaAs absorption region 194b, pInAlAs charge region 194c, InAlAs multiplication region 194d, and n+ InAlAs layer 194e. In addition, as shown in the exploded view of FIG. 66, metal ring contact 196 may include ring contact 196a and GaAs cap layer 196b.

Figure 81:
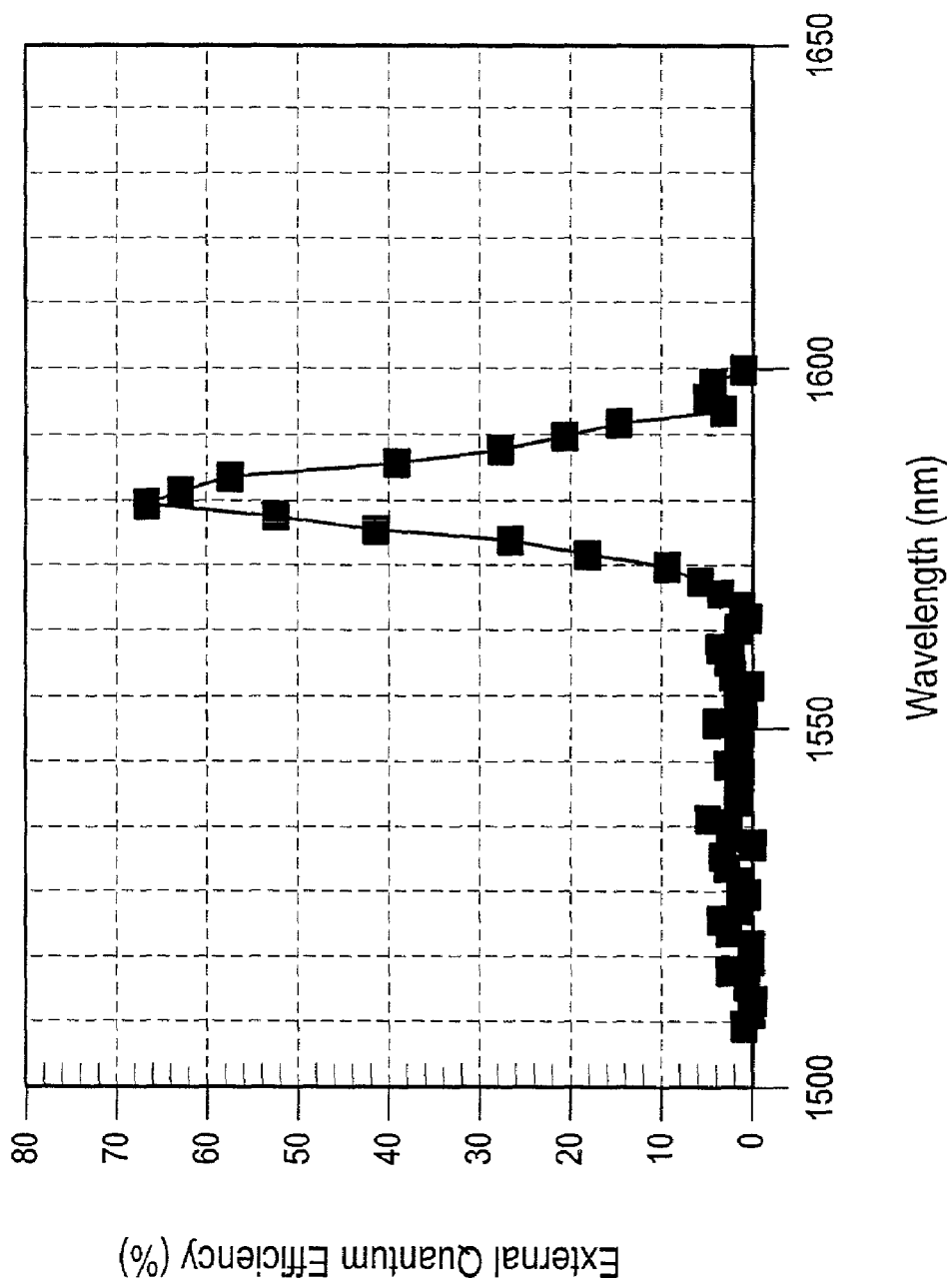
FIG. 81 depicts a plot of external quantum efficiency versus wavelength.
Figure 82:
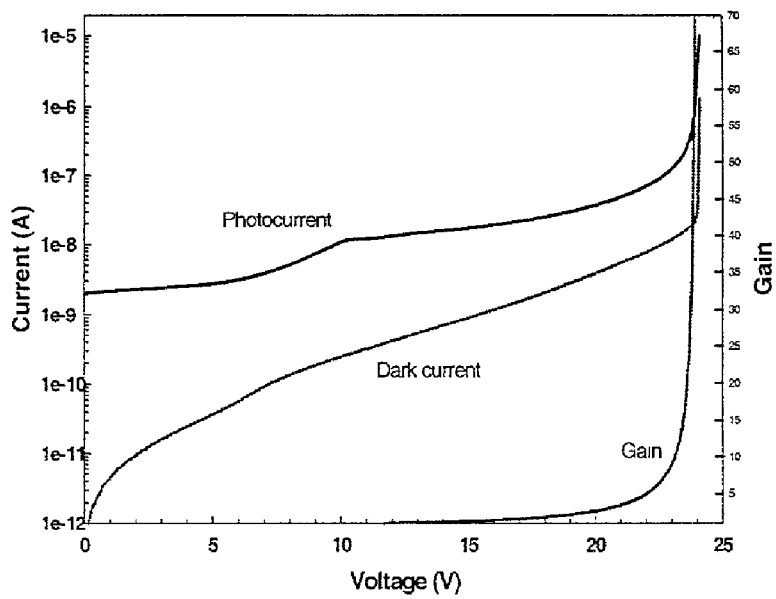
FIG. 82 depicts a plot of photoresponse, dark current, and gain of InAlAs/InGaAs resonant-cavity SACM APD.

FIG. 81 illustrates the external quantum efficiency versus wavelength. The spectral response, as shown in FIG. 81, shows that the peak quantum efficiency was about 70% at unity-gain. For these devices the peak response occurred at about 1.58 μm, which differed slightly from the designed wavelength. The peak response, however, may be tuned to shorter or longer wavelengths after growth of the wafer by etching or evaporating an additional spacer layer, respectively. FIG. 82 shows typical I-V characteristics including photocurrent, dark current, and gain of the $In_{0.52}Al_{0.48}As$/$In_{0.53}Ga_{0.47}As$ resonant-cavity SACM APDs with about 200 nm $In_{0.52}Al_{0.48}As$ multiplication regions. The dark currents were less than about 10 nA biased at about 90% of breakdown for these devices. Gains in excess of about 50 were achieved.

Figure 83:
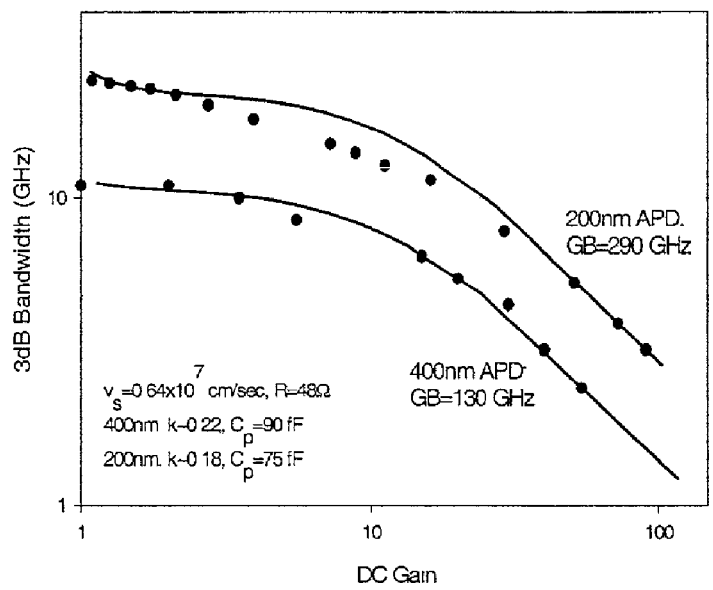
FIG. 83 depicts a plot of bandwidth versus DC gain for InAlAs/InGaAs resonant-cavity SACM APD.

The noise measurements confirmed that the fabricated devices with about 200 nm thick multiplication regions may also exhibit relatively low excess noise characteristics (e.g., k of about 0.18). This noise may be comparable to that of the best MQW APDs and only slightly higher than Si. Even lower noise may be achieved by further decreasing the multiplication region. The simulated and measured frequency response of the $In_{0.52}Al_{0.48}As$/$In_{0.53}Ga_{0.47}As$ resonant-cavity SACM APDs are shown in the plot of bandwidth versus dc gain in FIG. 83. Devices with an about 400 nm thick $In_{0.52}Al_{0.48}As$ multiplication region, exhibited a gain-bandwidth product of about 130 GHz. For devices with an about 200 nm thick $In_{0.52}Al_{0.48}As$ multiplication region and an about 150 nm $In_{0.52}Al_{0.48}As$ charge layer, a unity-gain bandwidth of about 24 GHz and a gain-bandwidth of about 290 GHz were achieved, which is in good agreement with simulations.

The spectral response of a resonant-cavity photodiode is wavelength selective, but in some cases, there may be residual response of a few percent at off-resonance wavelengths. We have shown that monolithic wavelength selection may be achieved by addition of top dielectric mirrors to an existing Fabry-Perot cavity. These mirrors may not tuned to act as λ/4 DBRs, as has been done previously, but rather may be employed as broadband reflectors, having an absorption minimum at the peak wavelength. Extraneous radiation may be reflected while the peak wavelength is transmitted. As such, a spectral notch filter is formed. Using this technique, background quantum efficiencies may be reduced from about 12% to less than about 1% over an about 700 nm range on either side of the peak while the quantum efficiency of the peak remains relatively high (i.e., above 90%).

The following references, to the extent that they provide exemplary procedural or other information or details supplementary to those set forth herein, are specifically incorporated herein by reference.

S. E. Miller, I. P Kaminov, *Optical Fiber Telecommunications II*, Academic Press, 1997.

E. Desurvire, *Erbium-Doped Fiber Amplifiers*, Wiley Inter-Science, 1994.

V. Arndt, H. Muller, and D. Dopheide, "Comparison measurements for selection of suitable photodetectors for use in Nd:YAG LDA systems," *Exp. In Fluids*, vol. 20, pp. 460–465, 1996.

W. L. Hayden, M. A. Krainak, D. M. Cornwell, A. W. Yu, and X. Sun, "Overview of laser communication technology at NASA Goddard space flight center," in *Proc. SPIE*, vol. 1866, pp. 45–55, 1993.

J. B. Johnson, *Phys. Rev.*, vol. 32, pp. 97, 1928.

P. W. Kruse, L. D. McGlauchlin, R. B. McQuistan, *Elements of Infrared Technology: generation, transmission, and detection*, Wiley, New York, 1962.

H. Nyquist, *Phys. Rev.*, vol. 32, pp. 110, 1928.

J. E. Bowers, and Y. G. Wey, "High-speed Photodetectors," *Handbook of Optics*, vol.1, McGraw-Hill, New York, 1995.

Y. G. Wey, K. S. Giboney, J. E. Bowers, M. J. W. Rodwell, P. Silvestre, P. Thiagarajan, and G. Y. Robinson, "108 GHz GaInAs/InP p-I-n Photodiodes with Integrated Bias Tees and Matched Resistors," *IEEE Photon. Tech. Lett.*, vol. 5, no. I 11, pp. 1310–1312, 1993.

P. Bhattacharya, *Semiconductor Optoelectronic Devices*, Prentice-Hall, Englewood Cliffs, N.J., 1994.

S. Y. Chou, M. Y. Liu, "Nanoscale tera-hertz metal-semiconductor-metal photodetectors," *IEEE J. Quantum Electron.*, vol. 28, no.10, pp.2358–2368, 1992.

N. Emeis, H. Schumacher, and H. Beneking, "High-Speed GaInAs Schottky Photodetector," *Electron. Lett.*, vol. 21, no. 5, pp. 181, 1985.

S. Forrest, "Sensitivity of Avalanche Photodetector Receivers for High-Bit-Rate Long-Wavelength Optical Communication Systems," *Semiconductors and Semimetals, vol. 22, Lightwave Communications Technology*, Orlando, Fla., Academic, 1985.

R. J. McIntyre, "Multiplication noise in uniform avalanche diodes," *IEEE Trans. on Electron Dev.*, vol. 13, no. 1, 1966

A. Chin, and T. Chang, "Multilayer Reflectors by Molecular Beam Epitaxy for Resonance Enhanced Absorption in Thin High-Speed Detectors," *J. Vac. Sci. and Tech.*, vol. 8, no. 2, pp. 339–342, 1990.

K. Kishino, M. Unlu, J-I. Chyi, J. Reed, L. Arsenault, and H. Morkoc, "Resonant Cavity Enhanced (RCE) Photodetectors," *IEEE J. Quantum Electron.*, vol. 27, no. 8, pp. 2025–2034, 1991.

S. W. Corzine, R. S. Geels, J. W. Scott, R-H, Yan, L. A. Coldren, "Design of Fabry-Perot surface-emitting lasers with a periodic gain structure," *IEEE J. Quantum Electron.*, vol. 25, no. 6, pp. 1513–1524, 1989.

A. G. Dentai, R. Kuchibhotla, J. C. Campbell, C. Tsai, and C. Lei, "High-quantum efficiency, long-wavelength, InP/InGaAs microcavity photodiode," *Electron. Lett.*, vol. 27, no. 23, pp. 2125–2127, 1991.

C. C. Barron, C. J. Mahon, B. J. Thibeault, G. Wang, W. Jiang, L. Coldren, and J. E. Bowers, "Resonant-Cavity enhanced p-i-n photodetector with 17 GHz bandwidth-efficiency product," *Electron. Lett.*, vol. 30, pp. 1796–1797, 1994.

S. R. Forrest, M. DiDomenico, Jr., R. G. Smith, and H. J. Stocker, "Evidence for tunneling in reverse-biased III-V photodetector diodes," *Appl. Phys. Lett.*, vol. 36, pp. 580–582, 1980.

S. R. Forrest, R. F. Leheny, R. E. Nahory, and M. A. Pollack, "$In_{0.53}Ga_{0.47}As$ photodiodes with dark current limited by generation-recombination and tunneling," *Appl. Phys. Lett.*, vol. 37, pp. 322–324, 1980.

J. L. Moll, *Physics of Semiconductors*, New York: McGraw-Hill, 1964.

K. Nishida, T. Taguchi, and Y. Matsumoto, "InGaAsP Heterostructure Avalanche Photodiodes with High Avalanche Gain," *Appl. Phys. Lett.*, vol. 35, no. 3, pp. 251–252, 1979.

L. E. Tarof, D. G. Knight, K. E. Fox, C. J. Inier, N. Puetz, and H. B. Kim, "Planar InP/InGaAs Avalanche Photodetectors with Partial Charge Sheet in Device Periphery," *Appl. Phys. Lett.*, vol. 57, no. 7, pp. 670–672, 1990.

L. E. Tarof, J. Yu, R. Bruce, D. G. Knight, T. Baird, and B. Oosterbrink, "High-Frequency Performance of Separate Absorption Grading, Charge, and Multiplication InP/InGaAs Avalanche Photodiodes," *IEEE Photon. Tech. Lett.*, vol. 5, no. 6, pp. 672–674, 1993.

N. R. Howard, *J. Electron. Contr.*, vol. 13, pp. 537, 1962.

C. A. Lee, R. A. Logan, R. L. Batdorf, J. J. Kleimack, and W. Wiegmann, Phys. Rev., vol. 134, pp. A761, 1964.

R. J. McIntyre, "The distribution of gains in uniformly multiplying avalanche photodiodes: Theory," *IEEE Trans. on Electron Dev.*, vol. ED-19, pp. 703–713, 1972.

R. J. McIntyre, "Factors affecting the ultimate capabilities of high speed avalanche photodiodes and a review of the state-of-the-art," *Tech. Dig. International Electron Dev. Mtg.*, pp. 213–216, 1973.

R. B. Emmons, "Avalanche-Photodiode Frequency Response," *J. Appl. Phys.*, vol. 38, no. 9, pp. 3705–3714, 1967.

R. B. Emmons, and G. Lucovsky, "The Frequency Response of Avalanching Photodiodes," *IEEE Trans. on Electron Dev.*, vol. 13, no. 3, pp. 297–305, 1966.

R. J. McIntyre, "A New Look at Impact Ionization-Part I: A Theory of Gain, Noise, Breakdown Probability, and Frequency Response," *IEEE Trans. on Electron Dev.*, vol. 46, no. 8, pp. 1623–1631, 1999.

P. Yuan, K. A. Anselm, C. Hu, H. Nie, C. Lenox, A. L. Holmes, B. G. Streetman, J. C. Campbell, and R. J. McIntyre, "A New Look at Impact Ionization-Part II: Gain and Noise in Short Avalanche Photodiodes," *IEEE Trans. on Electron Dev.*, vol. 46, no. 8, pp. 1632–1639, 1999.

W. T. Read, Jr., Bell System Tech. J., vol. 37, pp. 401, 1958.

G. E. Stillman, and C. M. Wolfe, "Avalanche Photodiodes," *Semiconductors and Semimetals, vol. 12, Infrared Detectors*, New York, Academic, 1977.

G. E. Bulman, V. M. Robbin, K. F. Brennan, K. Hess, and G. E. Stillman, "Experimental determination of impact ionization coefficients in (100) GaAs," *IEEE Electron Dev. Lett.*, vol. 4, no. 6, pp. 181–185, 1983.

G. E. Bulman, V. M. Robbin, and G. E. Stillman, "The Determination of Impact Ionization Coefficients in (100) Gallium Arsenide Using Avalanche Noise and Photocurrent Multiplication Measurements," *IEEE Trans. Electron Dev.*, vol. 32, no. 11, pp. 2454–2466, 1985.

G. E. Bulman, L. W. Cook, M. M. Tashima, and G. E. Stillman, "Determination of impact ionization coefficients in InP by analysis of photomultiplication and noise measurements," *International Electron Devices Meeting 1981*, pp. 288–291, 1981.

V. M. Robbins, S. C. Smith, and G. E. Stillman, "Impact ionization in $Al_xGa_{1-x}As$ for x=0.1–0.4," *Appl. Phys. Lett.*, vol. 52, no. 4, pp. 2996–2998, 1988.

I. Watanabe, T. Torikai, K. Fukushima, and Toshio Uji, "Impact ionization rates in (100) $Al_{0.48}In_{0.52}As$," *IEEE Electron Dev. Lett.*, vol. 11, no. 10, pp. 437–438, 1990.

C. A. Armiento, and S. H. Groves, "Impact ionization in (100)-, (110)-, (111)-oriented InP avalanche photodiodes," *Appl. Phys. Lett.*, vol. 43, no. 2, pp. 198–200, 1983.

L. W. Cook, G. E. Bulman, and G. E. Stillman, "Electron and hole impact ionization coefficients in InP determined by photomultiplication measurements," *Appl. Phys. Lett.*, vol. 40, no. 7, pp. 589–591, 1982.

Fukunobu Osaka, Takashi Mikawa, and Takao Kaneda, "Impact ionization coefficients of electrons and holes in (100)-oriented $Ga_{1-x}In_xAs_yP_{1-y}$," *IEEE J. Quantum Electron.*, vol. 21, no. 9, pp. 1326–1338, 1985.

K. Taguchi, T, Torikai, Y. Sugimoto, K. Makita, and H. Ishihara, "Temperature dependence of impact ionization coefficients in InP," *J. Appl. Phys.*, vol. 59, no. 2, pp. 476–481, 1986.

W. Wu, A. R. Hawkins, and J. E. Bowers, "Design of Silicon Hetero-Interface Photodetectors," *IEEE J. Lightwave Technol.*, vol. 15, no. 8, pp. 1608–1615, 1997.

Y. K. Jhee, J. C. Campbell, W. S. Holden, A. G. Dentai, and J. K. Plourde, "The effect of nonuniform gain on the multiplication noise of InP/InGaAsP/InGaAs avalanche photodiodes," *IEEE J. Quantum Electron.*, vol. 21, no. 12, pp. 1858–1861, December 1985.

J. C. Campbell, S. Chandrasekhar. W. T. Tsang, G. J. Qua, and B. C. Johnson, "Multiplication noise of wide-bandwidth InP/InGaAsP/InGaAs avalanche photodiodes." *J. Lightwave Technol.*, vol. 7, no. 3, pp. 473–477, 1989.

C. Hu, K. A. Anselm, B. G. Streetman, and J. C. Campbell, "Noise characteristics of thin multiplication region GaAs avalanche photodiodes," *Appl. Phys. Lett.*, vol. 69, no. 24, pp. 3734–3736, 1996.

K. A. Anselm, H. Nie, C. Hu, C. Lenox, P. Yuan, G. Kinsey, J. C. Campbell, and B. G. Streetman, "Performance of Thin Separate Absorption, Charge, and Multiplication Avalanche Photodiodes," *IEEE J. Quantum Electron.*, vol. 34, no. 3, pp. 482–490, 1998.

K. F. Li, D. S. Ong, J. P. R. David, G. J. Rees, R. C. Tozer, P. N. Robson, and R. Grey, "Avalanche multiplication noise characteristics in thin GaAs $p^+$-i-$n^+$ diodes," *IEEE Trans. Electron Dev.*, vol.45, no. 10, pp. 2102–7, 1998.

J. C. Campbell, W. T. Tsang, G. J. Qua, and B. C. Johnson, "High-Speed InP/InGaAsP/InGaAs Avalanche Photodiodes Grown by Chemical Beam Epitaxy," *IEEE J. Quantum Electron.*, vol. 24, no. 3, pp. 496–500, 1988.

J. C. Campbell, B. C. Johnson, G. J. Qua, and W. T. Tsang, "Frequency Response of InP/InGaAsP/InGaAs Avalanche Photodiodes," *IEEE J. Lightwave Technol.*, vol. 7, no. 5, pp. 778–784, 1989.

D. T. Ekholm, J. M. Geary, J. N. Hollenhorst, V. D. Mattera, Jr., and R. Pawelek, "High Bandwidth Planar InP/InGaAs Avalanche Photodiodes," *IEEE Trans. on Electron Dev.*, vol. 35, no. 12, pp. 2434, 1988.

T. Kagawa, Y. Kawamura, and J. Iwamura, "A Wide-Bandwidth Low-Noise InGaAsP-InAlAs Superlattice Avalanche Photodiode with a Flip-Chip Structure for Wavelengths of 1.3 and 1.55 µm," *IEEE J. Quantum Electron.*, vol. 29, no. 5, pp. 1387–1392, 1988.

S. Hanatani, H. Nakamura, S. Tanaka, C. Notsu, H. Sano, K. Ishida, "Superlattice Avalanche Photodiode with Gain-Bandwidth Product Larger Than 100 GHz for Very-High-Speed Systems," *International Conf. On Integrated Opt. and Opt. Fiber Comm.*, pp. 187–188, San Jose, Calif., 1993.

I. Watanabe, M. Tsuji, K. Makita, and K. Taguchi, "Gain-Bandwidth Product Analysis of InAlGaAs-InAlAs Superlattice Avalanche Photodiodes," *IEEE Photon. Tech. Lett.*, vol. 8, no. 2, pp. 269–271, 1996.

I. Watanabe, S. Sugou, H. Ishikawa, T. Anan, K. Makita, M. Tsuji, and K. Taguchi, "High-Speed and Low-Dark-Current Flip-Chip InAlAs/InAlGaAs Quaternary Well Superlattice APD's with 120 GHz Gain-Bandwidth product," *IEEE Photon. Tech. Lett.*, vol. 5, no. 6, pp. 675–677, 1993.

I. Watanabe, M. Tsuji, M. Hayashi, K. Makita, and K. Taguchi, "Design and Performance of InAlGaAs/InAlAs Superlattice Avalanche Photodiodes," *IEEE J. Lightwave Technol.*, vol. 15, no. 6, pp. 1012–1019, 1997.

H. Nie, K. A. Anselm, C. Hu, S. S. Murtaza, B. G. Streetman, and J. C. Campbell, "High-Speed Resonant-Cavity Separate Absorption and Multiplication Avalanche Photodiodes with 130 GHz Gain-Bandwidth Product," *Appl. Phys. Lett.*, vol. 70, no. 2, pp. 161–163, 1997, K. A. Anselm, S. S. Murtaza, C. Hu, H. Nie, B. G. Streetman, and J. C. Campbell, "A Resonant-Cavity, Separate-Absorption-and-Multiplication, Avalanche Photodiode with Low Excess Noise Factor," *IEEE Electron Dev. Lett.*, vol. 17, no. 3, pp. 91–93, 1996.

P. Yuan, H. Chad, K. A. Anselm, C. Lenox, H. Nie, H. L. Holmes, B. G. Streetman, and J. C. Campbell, "Impact Ionization Characteristics of III-V Semiconductors in a Wide Range of Multiplication Region Thickness," *IEEE J. Quantum Electron.*, accepted.

K. F. Li, D. S. Ong, J. P. R. David, R. C. Tozer, G. J. Rees, P. N. Robson, and R. Grey, "Low Excess Noise Characteristics in Thin Avalanche Region GaAs Diodes," *Electron. Lett.*, vol. 34, no. 1, pp. 125, 1997.

K. M. van Vliet, A. Friedmann, and L. M. Rucker, "Theory of carrier multiplication and noise in avalanche devices—Part II: Two-carrier processes," *IEEE Trans. Electron Dev.*, vol ED-26, pp. 752–764, 1979.

J. S. Marsland, "On the effect of ionization dead spaces on avalanche multiplication and noise for uniform electric field," *J. Appl. Phys.*, vol. 67, pp. 1929–1933, 1990.

J. S. Marsland, R. C. Woods, and C. A. Brownhill, "Lucky drift estimation of excess noise factor for conventional avalanche photodiodes including the dead space effect," *IEEE Trans. Electron Dev.*, vol. 39, pp. 1129–1134, 1992.

Y. Okuto and C. R. Crowell, "Ionization coefficients in semiconductors: A nonlocal property," *Phys. Rev. B*, vol. 10, pp. 4284–4296, 1974.

H. Shichijo and K. Hess, "Band-structure-dependent transport and impact ionization in GaAs," *Phys. Rev. B*, vol. 23, pp. 4197–4207, 1981.

K. F. Brennan, "Calculated electron and hole spatial ionization profiles in bulk GaAs and superlattice avalanche photodiodes," *IEEE J. Quantum Electron.*, vol. 24, pp. 2001–2006, 1988.

N. Sano and A. Yoshii, "Impact-ionization theory consistent with a realistic band structure of silicon," *Phys. Rev. B*, vol. 45, pp. 4171–4180, 1992.

J. Bude and K. Hess, "Thresholds of impact ionization in semiconductors," *J. Appl. Phys.*, vol. 72, pp. 3554–3561, 1992.

V. Chandramouli and C. M. Maziar, "Monte Carlo analysis of bandstructure influence on impact ionization in semiconductors," *Solid State Electron.*, vol. 36, pp. 285–290, 1993.

Y. Kamakura, H. Mizuno, M. Yamaji, M. Morifuji, K. Tanighchi, C. Hamaguchi, T. Kunikiyo, and M. Takenaka, "Impact ionization model for full band Monte Carlo simulation," *J. Appl. Phys.*, vol. 75, pp. 3500–3506, 1994.

G. M. Dunn, G. J. Rees, J. P. R. David, S. A. Plimmer, and D. C. Herbert, "Monte Carlo simulation of impact ionization and current multiplication in short GaAs p⁺in⁺ diodes," *Semicond. Sci. Technol.*, vol. 12, pp. 111–120, 1997.

D. S. Ong, K. F. Li, G. J. Rees, J. P. R. David, and P. N. Robson, "A simple model to determine multiplication and noise in avalanche photodiodes," *J. Appl. Phys.*, vol. 83, pp. 3426–3428, 1998.

A. Spinelli, A. Pacelli, and A. L. Lacaita, "Dead space approximation for impact ionization in silicon," *Appl. Phys. Lett.*, vol. 68, pp. 3707–3709, 1996.

A. Spinelli and A. L. Lacaita, "Mean gain of avalanche photodiodes in a dead space model," *IEEE Trans. Electron Dev.*, vol. 43, pp. 23–30, 1996.

R. McIntyre, personal communication, McIntyre Photon Detection Consultants, 1998.

D. E. Aspnes, S. M. Kelso, R. A. Logan, and R. Bhat, "Optical properties of $Al_xGa_{1-x}As$," *J. of Appl. Phys.*, vol.60, no.2, pp. 754–67, July 1986.

M. Garriga, P. Lautenschlager, M. Cardona, and K. Ploog, "Optical properties of AlAs," *Solid State Comm.*, vol. 61, no.3, pp. 157–160, 1987.

D. E. Aspnes, and A. A. Studna, "Dielectric functions and optical parameters of Si, Ge, GaP, GaAs, GaSb, InP, InAs, and InSb from 1.5 to 6.0 eV," *Phys. Rev. B*, vol.27, no.2, pp. 985–1009, January 1983.

B. Yang, personal communication, the University of Texas at Austin, 1999.

R. Williams, "Ohmic Contacts," *Gallium Arsenide Processing Techniques*, Ch. 11, pp. 225–257, Artech, House, 1990.

G. A. Samara, "Temperature and pressure dependences of the dielectric constants of semiconductors," *Phys. Rev. B*, vol. 27, no.6, pp. 3494–3505, 1983.

R. E. Fern, and A. Onton, "Refractive index of AlAs," *J. Appl. Phys.*, vol.42, no.9, pp. 3499–3500, 1971.

K. Seeger, "Temperature dependence of the dielectric constants of semi-insulating III-V compounds," *Appl. Phys. Lett.*, vol. 54, no. 13, pp. 1268–1269, 1989.

B. G. Streetman, *Solid State Electronic Devices*, 4$^{th}$ ed., Prentice Hall, Englewood Cliffs, N.J., 1995.

T. Gonzalez, C. Gonzalez, J. Mateos, D. Pardo, L. Reggiani, O. M. Bulashenko, and J. M. Rubi, "Universality of the ⅓ Shot-Noise Suppression Factor in Nondegenerate Diffusive Conductors," *Phys. Rev. Lett.*, vol. 80, no.13, pp. 2901–2904, 1998.

A. Reklaitis, and L. Reggiani, "Monte Carlo Study of Shot Noise Suppression," *J. Appl. Phys.*, vol.82, no.6, pp. 3161–3163, 1997.

E. Starikov, P. Shiktorov, V. Gruzinskis, L. Varani, J. C. Vaissiere, J. P. Nougier, T. Gonzalez, J. Mateos, D. Pardo, and L. Reggiani, "Transfer Impedance Calculations of Electronic Noise in Two-Terminal Semiconductor Structures," *J. Appl. Phys.*, vol.83, no.4, pp. 2052–2066, 1998.

Toshiaki Kagawa et al., "InGaAsP-InAlAs Superlattice Avalanche Photodiode," *IEEE Journal of Quantum Electronic*, vol. 28, No. 6, p. 1420, Jun. 1, 1992.

Watanabe, I. et al., "High-Speed and Low-Dark-Current Flip-Chip InAlAs/InAlGaAs Quaternary Well Superlattice APD's with 120 GHZ Gain-Bandwidth Product," *IEEE Photonics Technology Letters*, vol. 5, No. 6, pp. 675–677, Jun. 1, 1993.

Hanatani S. et al., "Flip-Chip InAlAs/InGaAs Superlattice Avalanche Photodiodes with Back-Illuminated Structures," *Microwave and Optical Technology Letters*, vol. 7, No. 3, pp. 103–107, Feb. 20, 1994.

Tsuji, S. et al, "Staircase avalanche photodiode," Apr. 7, 1994, U.S. Pat. No. 5,539,221.

Taguchi, K., "Low noise avalanche photodiode having an avalanche multiplication layer of InAlAs/InGaAlAs," Nov. 8, 1993, U.S. Pat. No. 5,432,361.

Yoo, J., et al, "Avalanche photodiode having a multiplication layer with superlattice," Nov. 10, 1993, U.S. Pat. No. 5,369,292.

Watanabe, I., "Avalanche photodiode including a multiplication layer and a photoabsorption layer," Dec. 21, 1992, U.S. Pat. No. 5,338,947.

Tsuji, M., et al, "Avalanche photodiode with hetero-periodical structure," Jan. 27, 1992, U.S. Pat. No. 5,204,539.

Makita, K., "Avalanche photodiode having a thin multilayer superlattice structure sandwiched between barrier and well layers to reduce energy loss," Apr. 18, 1991, U.S. Pat. No. 5,187,553.

Tomita, A., "Avalanche Photodiode," Nov. 17, 1989, U.S. Pat. No. 4,982,255.

Matsushima, Y. et al, "Avalanche photo diode with quantum well layer," Aug. 5, 1986, U.S. Pat. No. 4,731,641.

P. Yuan, O. Baklenov, H. Nie, A. L. Holmes, B. G. Streetman, J. C. Campbell, "High-Speed and Low-Noise Avalanche Photodiode Operating at 1.06 μm," *IEEE Journal of Selected Topics in Quantum Electronics*, to be published.

P. Yuan, O. Baklenov, H. Nie, A. L. Holmes, B. G. Streetman, J. C. Campbell, "High-Speed Quantum-Dot Resonant-Cavity SACM Avalanche Photodiodes Operating at 1.06 μm," IEEE/LEOS Summer Topical Meeting, San Diego, Calif., July, 1999.

P. Yuan, O. Baklenov, H. Nie, A. L. Holmes, B. G. Streetman, J. C. Campbell, "High-Speed Quantum-Dot Resonant-Cavity SACM Avalanche Photodiodes Operating at 1.06 μm,," 57$^{th}$ Device Research Conference, Santa Barbara, Calif., June, 1999.

H. Nie, C. Lenox, G. Kinsey, P. Yuan, A. L. Holmes, Jr., B. G. Streetman, J. C. Campbell, "High Speed and High Gain-Bandwidth-Product Resonant-Cavity InGaAs/IAlAs Avalanche Photodiodes for Optical Fiber Communications," OFC '99, San Diego, Calif., February, 1999.

M. M. Hayat, B. E. A. Saleh, and M. C. Teich, "Effect of dead space on gain and noise of double-carrier-multiplication avalanche photodiodes," *IEEE Trans. Electron Dev.*, vol. 39, pp. 546–552, 1992.

M. M. Hayat, W. L. Sargent, and B. E. A. Saleh, "Effect of dead space on gain and noise in Si and GaAs avalanche photodiodes," *IEEE J. Quantum Electron.*, vol. 28, pp. 1360–1365, 1992.

K. F. Li, D. S. Ong, J. P. R. David, G. J. Rees, R. C. Tozer, P. N. Robson, and R. Grey, "Avalanche multiplication noise characteristics in thin GaAs p⁺-i-n⁺ diodes," *IEEE Trans. Electron Dev.*, to be published.

J. M. Higman, and K. Hess, personal communication, University of Illinois at Urbana-Champaign, 1987.

C. Lenox, H. Nie, P. Yuan, G. Kinsey, A. L. Holmes, Jr., B. G. Streetman, J. C. Campbell, "Resonant-Cavity InGaAs/InAlAs Avalanche Photodiodes with Gain-Bandwidth-Product of 290 GHz," *IEEE Photonics Technology Letters*, vol.11, no. 9, pp. 1162–1164, September 1999.

S. D. Personik, "Receiver Design for Digital Fiber-Optic Communication Systems, Part I and II," *Bell Syst. Tech. J.*, vol. 52, pp. 843–886, 1973.

B. Kasper, J. C. Campbell, "Multigigabit-per-Second Avalanche Photodiode Lightwave Receivers," *J. Lightwave Tech.*, vol. 5, no. 10, pp. 1351–1364, 1987.

EG&G Optoelectronics Division Catalog, 1997.

J. C. Campbell, D. L. Huffaker, H. Deng, and D. G. Deppe, "Quantum dot resonant cavity photodiode with operation near 1.3 mm wavelength," Electron. Lett., vol. 33, pp. 1337–1339, 1997.

H. Nie, O. Baklenov, P. Yuan, C. Lenox, B. G. Streetman, and J. C. Campbell, "Quantum-Dot Resonant-Cavity Separate Absorption, Charge, and Multiplication Avalanche Photodiode Operating at 1.06 µm," IEEE Photonics Tech. Lett., vol. 10, no. 7, pp. 1009–1011, 1998.

H. Nie, "Resonant-Cavity Separate Absorption and Multiplication Avalanche Photodiodes with High Speed and High Gain-Bandwidth Product," Ph.D. dissertation, University of Texas at Austin, 1998.

O. Baklenov, H. Nie, K. A. Anselm, J. C. Campbell, and B. G. Streetman, "Multi-stacked quantum dot resonant-cavity photodetector operating at 1.06 um," Electronics Letters, vol.34, no.7, pp. 694–695, April 1998.

O. Hildebrand, W. Kuebart, K. W. Benz, and M. H. Pilkuhn, "$Ga_{1-x}Al_xSb$ avalanche photodiodes: resonant impact ionization with very high ratio of ionization coefficients," IEEE J. Quantum Electron., vol. 17, no.2, pp. 284–288, 1981.

O. Hildebrand, W. Kuebart, and M. H. Pilkuhn, "Resonant enhancement of impact in $Ga_{1-x}Al_xSb$," Appl. Phys. Lett., vol. 37, no. 9, pp. 801–803, 1980.

It will be appreciated to those skilled in the art having the benefit of this disclosure that this invention is believed to provide avalanche photodiodes with an impact-ionization-engineered multiplication region. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An avalanche photodiode comprising a multiplication layer, wherein the multiplication layer comprises a well region and a barrier region, wherein the well region comprises a material having a carrier ionization probability higher than a carrier ionization probability of a material used to form the barrier region, and wherein the carrier ionization probability of the material of the well region and the carrier ionization probability of the material of the barrier region selected to modulate the multiplication layer such that impact ionization may occur substantially in the well region proximate boundaries of the well region.

2. The avalanche photodiode of claim 1, wherein the multiplication layer has a thickness of less than about 0.5 µm.

3. The avalanche photodiode of claim 1, wherein the multiplication layer has a thickness of less than about 0.5 µm such that a probability of ionization in the barrier region is reduced.

4. The avalanche photodiode of claim 1, wherein the well region has a thickness of less than about 100 nm.

5. The avalanche photodiode of claim 1, wherein the barrier region has a thickness of about 100 nm.

6. The avalanche photodiode of claim 1, wherein the well region comprises a first well region, wherein the multiplication layer further comprises a second well region, wherein the first well region is spaced from the second well region by the barrier region, and wherein the second well region comprises a material having a higher carrier ionization probability than the material used to form the barrier region.

7. The avalanche photodiode of claim 1, wherein the material of the well region comprises a binary compound of Group IIIB and Group VB elements.

8. The avalanche photodiode of claim 1, wherein the material of the well region comprises a ternary compound of Group IIIB and Group VB elements.

9. The avalanche photodiode of claim 1, wherein the material of the barrier region comprises a binary compound of Group IIIB and Group VB elements.

10. The avalanche photodiode of claim 1, wherein the material of the barrier region comprises a ternary compound of Group IIIB and Group VB elements.

11. The avalanche photodiode of claim 1, wherein the material of the well region comprises gallium and arsenic.

12. The avalanche photodiode of claim 1, wherein the material of the well region comprises indium, gallium and arsenic, and wherein the material of the barrier region comprises aluminum, indium, and arsenic.

13. The avalanche photodiode of claim 1, wherein the material of the well region comprises indium and phosphorous, and wherein the material of the barrier region comprises aluminum, indium, and arsenic.

14. The avalanche photodiode of claim 1, further comprising a substrate layer, wherein the substrate comprises gallium and arsenic.

15. The avalanche photodiode of claim 1, further comprising a substrate layer, wherein the substrate comprises indium and phosphorus.

16. The avalanche photodiode of claim 1, wherein the carrier ionization probability of the material of the well region and the carrier ionization probability of the material of the barrier region are selected to modulate the multiplication layer such that the barrier region is configured as an acceleration field for carriers.

17. The avalanche photodiode of claim 1, further comprising p and n regions, wherein the p and n regions comprise aluminum, gallium, and arsenic.

18. The avalanche photodiode of claim 1, wherein an average electric field for a gain in the multiplication layer is less than an average electric field for the gain in an additional multiplication layer, and wherein the additional multiplication layer comprises the material of the well region.

19. An avalanche photodiode comprising a multiplication layer, wherein the multiplication layer comprises a well region and a barrier region, wherein the well region comprises a material having a carrier ionization probability higher than a carrier ionization probability of a material used to form the barrier region, wherein the material of the well region comprises a binary compound of Group IIIB and Group VB elements, wherein the carrier ionization probability of the material of the well region and the carrier ionization probability of the material of the barrier region are selected to modulate the multiplication layer such that the barrier region is configured as an acceleration field for carriers.

20. The avalanche photodiode of claim 19, wherein the multiplication layer has a thickness of less than about 0.5 µm.

21. The avalanche photodiode of claim 19, wherein the well region has a thickness of less than about 100 nm.

22. The avalanche photodiode of claim 19, wherein the barrier region has a thickness of about 100 nm.

23. The avalanche photodiode of claim 19, wherein the well region comprises a first well region, wherein the multiplication layer further comprises a second well region, wherein the first well region is spaced from the second well region by the barrier region, and wherein the second well region comprises a material having a higher carrier ionization probability than the material used to form the barrier region.

24. The avalanche photodiode of claim 19, wherein the material of the barrier region comprises a binary compound of Group IIIB and Group VB elements.

25. The avalanche photodiode of claim 19, wherein the material of the barrier region comprises a ternary compound of Group IIIB and Group VB elements.

26. The avalanche photodiode of claim 19, wherein the material of the well region comprises gallium and arsenic.

27. The avalanche photodiode of claim 19, wherein an average electric field for a gain in the multiplication layer is less than an average electric field for the gain in an additional multiplication layer, and wherein the additional multiplication layer comprises the material of the well region.

28. An avalanche photodiode comprising a multiplication layer, wherein the multiplication layer comprises a well region and a barrier region, wherein the well region comprises a material having a carrier ionization probability higher than a carrier ionization probability of a material used to form the barrier region, wherein the material of the barrier region comprises a binary compound of Group IIIB and Group VB elements, wherein the carrier ionization probability of the material of the well region and the carrier ionization probability of the material of the barrier region are selected to modulate the multiplication layer such that the barrier region is configured as an acceleration field for carriers.

29. The avalanche photodiode of claim 28, wherein the multiplication layer has a thickness of less than about 0.5 μm.

30. The avalanche photodiode of claim 28, wherein the multiplication layer has a thickness of less than about 0.5 μm such that a probability of ionization in the barrier region is reduced.

31. The avalanche photodiode of claim 28, wherein the barrier region has a thickness of about 100 nm.

32. The avalanche photodiode of claim 28, wherein the well region comprises a first well region, wherein the multiplication layer further comprises a second well region, wherein the first well region is spaced from the second well region by the barrier region, and wherein the second well region compnses a material having a higher carrier ionization probability than the material used to form the barrier region.

33. The avalanche photodiode of claim 28, wherein the material of the well region comprises a ternary compound of Group IIB and Group VB elements.

34. The avalanche photodiode of claim 28, wherein the material of the well region comprises gallium and arsenic.

35. The avalanche photodiode of claim 28, wherein an average electric field for a gain in the multiplication layer is less than an average electric field for the gain in an additional multiplication layer, and wherein the additional multiplication layer comprises the material of the well region.

36. The avalanche photodiode comprising a multiplication layer, wherein the multiplication layer comprises a well region and a barrier region, wherein the well region comprises a material having a carrier ionization probability higher than a carrier ionization probability of a material used to form the barrier region, wherein the material of the barrier region comprises aluminum, gallium, and arsenic, wherein the carrier ionization probability of the material of the well region and the carrier ionization probability of the material of the barrier region are selected to modulate the multiplication layer such that the barrier region is configured as an acceleration field for carriers.

37. The avalanche photodiode of claim 36, wherein the multiplication layer has a thickness of less than about 0.5 μm.

38. The avalanche photodiode of claim 36, wherein the multiplication layer has a thickness of less than about 0.5 μm such that a probability of ionization in the barrier region is reduced.

39. The avalanche photodiode of claim 36, wherein the well region has a thickness of less than about 100 nm.

40. The avalanche photodiode of claim 36, wherein the well region comprises a first well region, wherein the multiplication layer further comprises a second well region, wherein the first well region is spaced from the second well region by the barrier region, and wherein the second well region comprises a material having a higher carrier ionization probability than the material used to form the barrier region.

41. The avalanche photodiode of claim 36, wherein the material of the well region comprises a binary compound of Group IIIB and Group VB elements.

42. The avalanche photodiode of claim 36, wherein the material of the well region comprises a ternary compound of Group IIIB and Group VB elements.

43. The avalanche photodiode of claim 36, wherein the material of the well region comprises gallium and arsenic.

44. The avalanche photodiode of claim 36, wherein an average electric field for a gain in the multiplication layer is less than an average electric field for the gain in an additional multiplication layer, and wherein the additional multiplication layer comprises the material of the well region.

45. An avalanche photodiode comprising a multiplication layer, wherein the multiplication layer comprises a well region and a barrier region, wherein the well region comprises a material having a carrier ionization probability higher than a carrier ionization probability of a material used to form the barrier region, wherein the material of the well region comprises a binary compound of Group IIIB and Group VB elements, wherein the well region comprises a first well region, wherein the multiplication layer further comprises a second well region, wherein the first well region is spaced from the second well region by the barrier region, and wherein the second well region comprises a material having a higher carrier ionization probability than the material used to form the barrier region, and wherein an average electric field for a gain in the multiplication layer is less than an average electric field for the gain in an additional multiplication layer, and wherein the additional multiplication layer comprises the material of the well region.

46. The avalanche photodiode of claim 45, wherein the multiplication layer has a thickness of less than about 0.5 μm.

47. The avalanche photodiode of claim 45, wherein the well region has a thickness of less than about 100 nm.

48. The avalanche photodiode of claim 45, wherein the barrier region has a thickness of about 100 nm.

49. The avalanche photodiode of claim 45, wherein the material of the barrier region comprises a binary compound of Group IIIB and Group VB elements.

50. The avalanche photodiode of claim 45, wherein the material of the barrier region comprises a ternary compound of Group IIIB and Group VB elements.

51. The avalanche photodiode of claim 45, wherein the material of the well region comprises gallium and arsenic.

52. An avalanche photodiode comprising a multiplication layer, wherein the multiplication layer comprises a well region and a barrier region, wherein the well region comprises a material having a carrier ionization probability higher than a carrier ionization probability of a material used to form the barrier region, wherein the material of the well region comprises a binary compound of Group IIIB and Group VB elements, wherein an average electric field for a gain in the multiplication layer is less than an average electric field for the gain in an additional multiplication layer, and wherein the additional multiplication layer comprises the material of the well region.

53. The avalanche photodiode of claim 52, wherein the multiplication layer has a thickness of less than about 0.5 μm.

54. The avalanche photodiode of claim 52, wherein the well region has a thickness of less than about 100 nm.

55. The avalanche photodiode of claim 52, wherein the barrier region has a thickness of about 100 nm.

56. The avalanche photodiode of claim 52, wherein the material of the barrier region comprises a binary compound of Group IIIB and Group VB elements.

57. The avalanche photodiode of claim 52, wherein the material of the barrier region comprises a ternary compound of Group IIIB and Group VB elements.

58. The avalanche photodiode of claim 52, wherein the material of the well region comprises gallium and arsenic.

59. An avalanche photodiode comprising a multiplication layer, wherein the multiplication layer comprises a well region and a barrier region, wherein the well region comprises a material having a carrier ionization probability higher than a carrier ionization probability of a material used to form the barrier region, wherein the material of the barrier region comprises a binary compound of Group IIIB and Group VB elements, wherein an average electric field for a gain in the multiplication layer is less than an average electric field for the gain in an additional multiplication layer, and wherein the additional multiplication layer comprises the material of the well region.

60. The avalanche photodiode of claim 59, wherein the multiplication layer has a thickness of less than about 0.5 μm.

61. The avalanche photodiode of claim 59, wherein the multiplication layer has a thickness of less than about 0.5 μm such that a probability of ionization in the barrier region is reduced.

62. The avalanche photodiode of claim 59, wherein the barrier region has a thickness of about 100 nm.

63. The avalanche photodiode of claim 59, wherein the well region comprises a first well region, wherein the multiplication layer further comprises a second well region, wherein the first well region is spaced from the second well region by the barrier region, and wherein the second well region comprises a material having a higher carrier ionization probability than the material used to form the barrier region.

64. The avalanche photodiode of claim 59, wherein the material of the well region comprises a ternary compound of Group IIIB and Group VB elements.

65. The avalanche photodiode of claim 59, wherein the material of the well region comprises gallium and arsenic.

66. An avalanche photodiode comprising a multiplication layer, wherein the multiplication layer comprises a well region and a barrier region, wherein the well region comprises a material having a carrier ionization probability higher than a carrier ionization probability of a material used to form the barrier region, wherein the material of the barrier region comprises aluminum, gallium, and arsenic, wherein the well region comprises a first well region, wherein the multiplication layer further comprises a second well region, wherein the first well region is spaced from the second well region by the barrier region, and wherein the second well region comprises a material having a higher carrier ionization probability than the material used to form the barrier region, and wherein an average electric field for a gain in the multiplication layer is less than an average electric field for the gain in an additional multiplication layer, and wherein the additional muliiplication layer comprises the material of the well region.

67. The avalanche photodiode of claim 66, wherein the multiplication layer has a thickness of less than about 0.5 μm.

68. The avalanche photodiode of claim 66, wherein the multiplication layer has a thickness of less than about 0.5 μm such that a probability of ionization in the barrier region is reduced.

69. The avalanche photodiode of claim 66, wherein the well region has a thickness of less than about 100 nm.

70. The avalanche photodiode of claim 66, wherein the well region comprises a first well region, wherein the multiplication layer further comprises a second well region, wherein the first well region is spaced from the second well region by the barrier region, and wherein the second well region comprises a material having a higher carrier ionization probability than the material used to form the barrier region.

71. The avalanche photodiode of claim 66, wherein the material of the well region comprises a binary compound of Group IIIB and Group VB elements.

72. The avalanche photodiode of claim 66, wherein the material of the well region comprises a ternary compound of Group IIIB and Group VB elements.

73. The avalanche photodiode of claim 66, wherein the material of the well region comprises gallium and arsenic.

74. An avalanche photodiode comprising a multiplication layer, wherein the multiplication layer comprises a well region and a barrier region, wherein the well region comprises a material having a carrier ionization probability higher than a carrier ionization probability of a material used to form the barrier region, wherein the material of the barrier region comprises aluminum, gallium, and arsenic, wherein an average electric field for a gain in the multiplication layer is less than an average electric field for the gain in an additional multiplication layer, and wherein the additional multiplication layer comprises the material of the well region.

75. The avalanche photodiode of claim 74, wherein the multiplication layer has a thickness of less than about 0.5 μm.

76. The avalanche photodiode of claim 74, wherein the multiplication layer has a thickness of less than about 0.5 μm such that a probability of ionization in the barrier region is reduced.

77. The avalanche photodiode of claim 74, wherein the well region has a thickness of less than about 100 nm.

78. The avalanche photodiode of claim 74, wherein the well region comprises a first well region, wherein the multiplication layer further comprises a second well region, wherein the first well region is spaced from the second well region by the barrier region, and wherein the second well region comprises a material having a higher carrier ionization probability than the material used to form the barrier region.

79. The avalanche photodiode of claim 74, wherein the material of the well region comprises a binary compound of Group IIIB and Group VB elements.

80. The avalanche photodiode of claim 74, wherein the material of the well region comprises a ternary compound of Group IIIB and Group VB elements.

81. The avalanche photodiode of claim 74, wherein the material of the well region comprises gallium and arsenic.

* * * * *

UNITED STATES PATENT AND TRADEMARK OFFICE
CERTIFICATE OF CORRECTION

PATENT NO. : 7,045,833 B2 Page 1 of 1
APPLICATION NO. : 09/969133
DATED : May 16, 2006
INVENTOR(S) : Campbell et al.

It is certified that error appears in the above-identified patent and that said Letters Patent is hereby corrected as shown below:

Claim 1, col. 75, line 45, please delete "barrier region selected" and substitute therefor --" barrier region are selected"--.

Claim 33, col. 77, line 50, please delete "Group IIB" and substitute therefor --" Group IIIB" --.

Signed and Sealed this

Tenth Day of October, 2006

JON W. DUDAS
*Director of the United States Patent and Trademark Office*